United States Patent [19]
Okada et al.

[11] Patent Number: 6,093,243
[45] Date of Patent: Jul. 25, 2000

[54] SEMICONDUCTOR DEVICE AND ITS FABRICATING METHOD

[75] Inventors: Takako Okada, Tokyo; Shigeru Kambayashi, Kawasaki; Moto Yabuki, Tokyo; Shinji Onga, Fujisawa; Yoshitaka Tsunashima, Inagi; Yuuichi Mikata, Kawasaki; Haruo Okano, Tokyo, all of Japan

[73] Assignee: Kabushiki Kaisha Toshiba, Kawasaki, Japan

[21] Appl. No.: 08/959,331

[22] Filed: Oct. 28, 1997

Related U.S. Application Data

[62] Division of application No. 08/478,765, Jun. 7, 1995, Pat. No. 5,879,447, which is a division of application No. 08/056,443, Apr. 30, 1993, Pat. No. 5,582,640.

[30] Foreign Application Priority Data

| Apr. 30, 1992 | [JP] | Japan | 4-111795 |
| Jul. 17, 1992 | [JP] | Japan | 4-191180 |
| Sep. 14, 1992 | [JP] | Japan | 4-245289 |

[51] Int. Cl.$^7$ .................................................. C30B 1/04
[52] U.S. Cl. .................................. 117/8; 117/9; 438/253; 438/250; 438/251; 438/255; 438/381; 438/393; 438/395; 438/399
[58] Field of Search .................................. 438/253, 250, 438/251, 252, 254, 255, 256, 381, 393, 394, 395, 396, 397, 398, 399; 117/8, 9

[56] References Cited

U.S. PATENT DOCUMENTS

| 4,371,421 | 2/1983 | Fan et al. . |
| 4,565,584 | 1/1986 | Tamura et al. . |
| 4,692,343 | 9/1987 | Price et al. . |
| 4,808,546 | 2/1989 | Moniwa et al. . |

(List continued on next page.)

FOREIGN PATENT DOCUMENTS

| 63-299109 | 12/1988 | Japan . |
| 3-272165 | 12/1991 | Japan . |
| 4-132212 | 5/1992 | Japan . |

OTHER PUBLICATIONS

H. Watanabe et al., "Device Application and Growth Mechanism of Hemispherical–grained Si–film,".

M.W. Geis et al., "Crystallographic Orientation of Silicon on an Amorphous Substrate Using an Artificial Surface–relief Grating and Laser Crystallization," Appl. phys. Lett. 35(1), Jul. 1, 1979, pp. 71–74.

H. Wantanabe et al., "New Stacked Capacitor Structure Using Hemispherical–grained Polycrystalline–silicon Electrodes," Appl. Phys. Lett. 58(3), Jan. 21, 1991, pp. 251–253.

H. Watanabe et al., "An Advanced Fabrication Technology of Hemispherical Grained (HSG) Poly–Si for High Capactance Storage Electrodes," Extended Abstracts of the 1991 International Conference on Solid State Devices and Materials, Yokohama, 1991, pp. 478–480.

*Primary Examiner*—Robert Kunemund
*Attorney, Agent, or Firm*—Finnegan, Henderson, Farabow, Garrett & Dunner, L.L.P.

[57] ABSTRACT

A single crystal and a polycrystal having an excellent crystal quality and providing a highly reliable semiconductor device are formed by solid phase growth at low temperatures. An amorphous thin film is deposited on a substrate such that an average inter-atomic distance of main constituent element of the amorphous thin film is 1.02 times or more of an average inter-atomic distance of the elements in single crystal, and crystallization energy is applied to the amorphous thin film to perform solid phase growth to thereby form a single crystal. In another embodiment of the present invention, an amorphous semiconductor thin film is formed on a substrate or an insulating film such that an average inter-atomic distance distribution of main constituent element of the film substantially coincides with an average inter-atomic distance distribution of the element in a single crystal, and crystallization energy is applied to the amorphous semiconductor thin film to cause solid phase growth to thereby form a single crystalline semiconductor thin film.

1 Claim, 115 Drawing Sheets

U.S. PATENT DOCUMENTS

| | | | |
|---|---|---|---|
| 4,902,642 | 2/1990 | Mao et al. | |
| 5,278,093 | 1/1994 | Yonehara. | |
| 5,591,664 | 1/1997 | Wang et al. | 438/254 |
| 5,595,928 | 1/1997 | Lu et al. | 438/253 |
| 5,597,754 | 1/1997 | Lou et al. | 438/255 |
| 5,604,146 | 2/1997 | Tseng | 438/253 |
| 5,757,050 | 5/1998 | Adler et al. | 257/347 |
| 5,757,063 | 5/1998 | Tomita et al. | 438/471 |
| 5,866,444 | 2/1999 | Yamazaki et al. | 438/635 |
| 5,871,853 | 2/1999 | Azuma et al. | 438/250 |

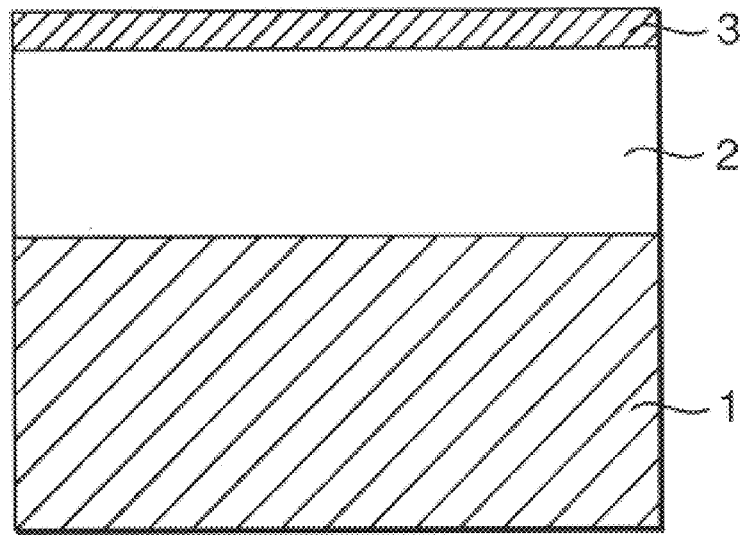
FIG.44
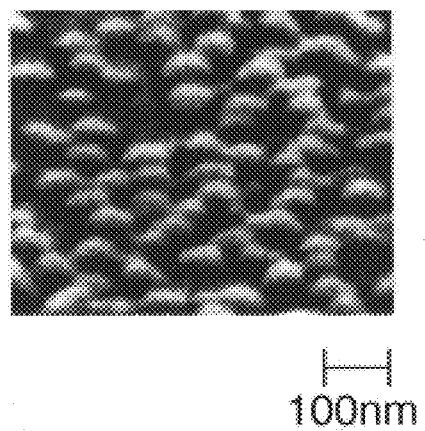 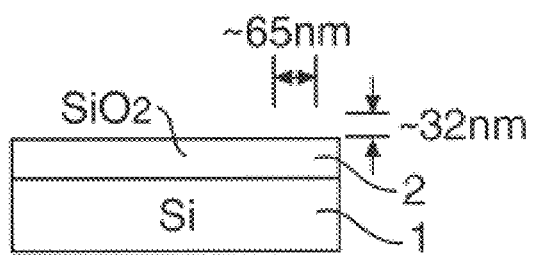
FIG.45(a)  FIG.45(b)

SEM PHOTOGRAPH

 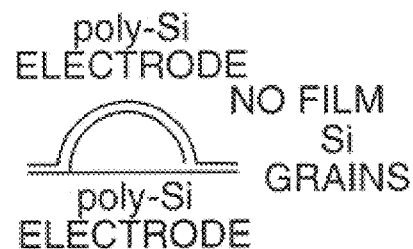
SECTIONAL TEM PHOTOGRAPH     100Å
FIG.62

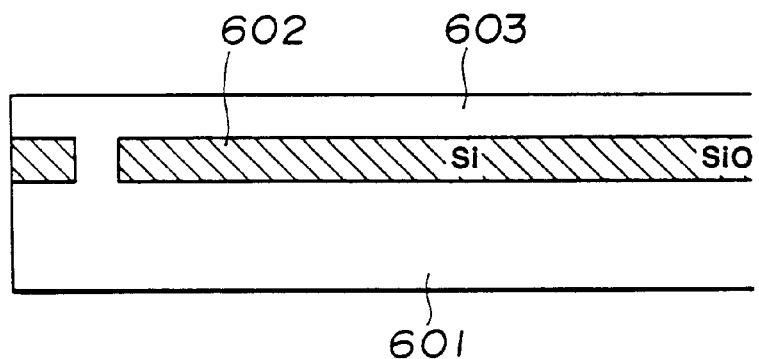
FIG.77
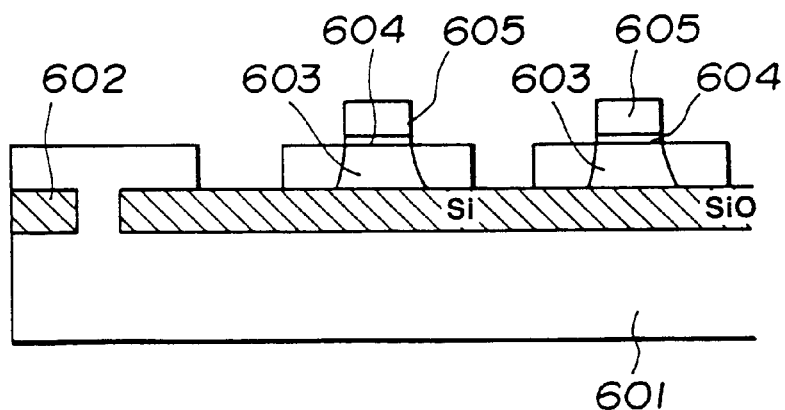
FIG.78(a)
FIG.78(b)

| | | DISTANCE FROM SEED (μm) | | | | | | | |
|---|---|---|---|---|---|---|---|---|---|
| | | 3 | 5 | 10 | 15 | 20 | 25 | 30 | 35 |
| N-ch | V$_T$ (V) | 0.8 (0.03) | 0.8 (0.03) | 0.8 (0.02) | 0.8 (0.03) | 0.8 (0.03) | 0.7 (0.02) | 0.8 (0.04) | 0.7 (0.03) |
| | μ (cm²/VS) | 610 (6) | 610 (5) | 600 (7) | 610 (6) | 610 (5) | 610 (7) | 610 (6) | 610 (5) |
| P-ch | V$_T$ (V) | -0.5 (0.02) | -0.6 (0.02) | -0.5 (0.02) | -0.5 (0.02) | -0.5 (0.02) | -0.6 (0.03) | -0.5 (0.02) | -0.6 (0.03) |
| | μ (cm²/VS) | 230 (5) | 234 (6) | 232 (5) | 240 (6) | 235 (3) | 237 (6) | 241 (7) | 235 (5) |

( ): STANDARD DEVIATION
V$_T$: THRESHOLD VOLTAGE
μ: MOBILITY

FIG. 80

THIS INVENTION

SURFACE

UNDERLYING
LAYER

600°C 30fs LATER

SURFACE

UNDERLYING
LAYER

600°C 70fs LATER

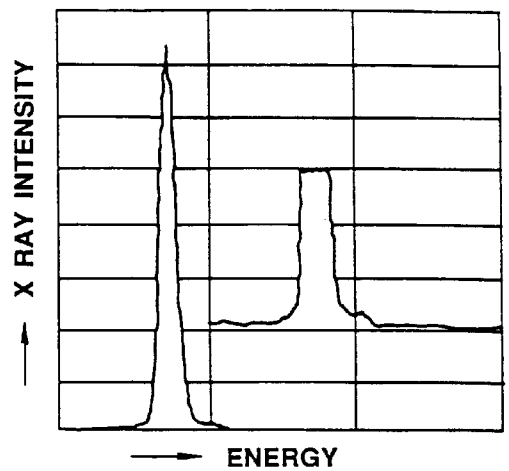
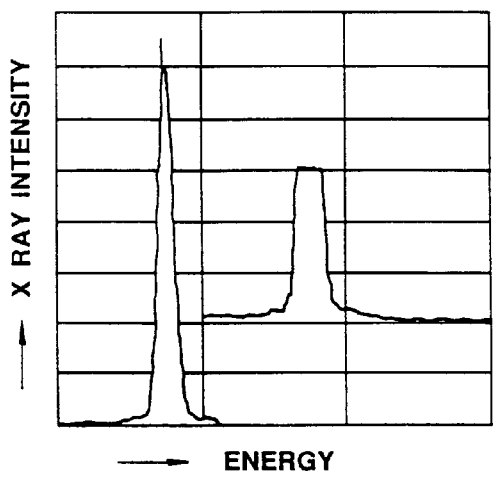
DEVICE a
FIG.150(a)
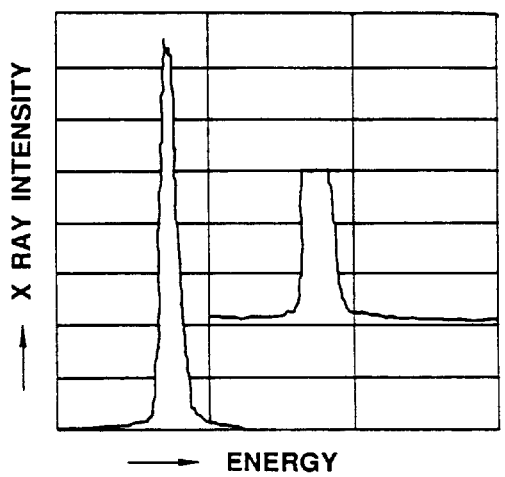
DEVICE b
FIG.150(b)
PRIOR ART

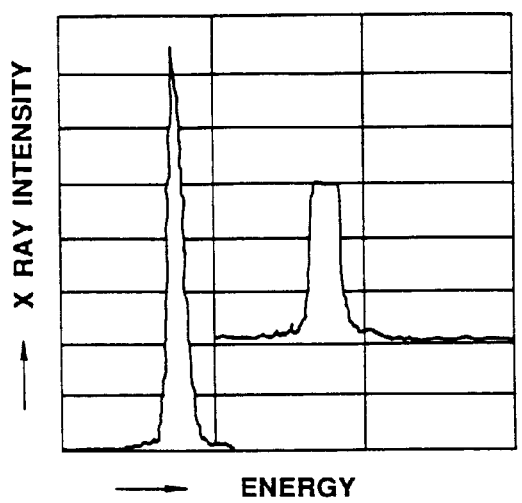
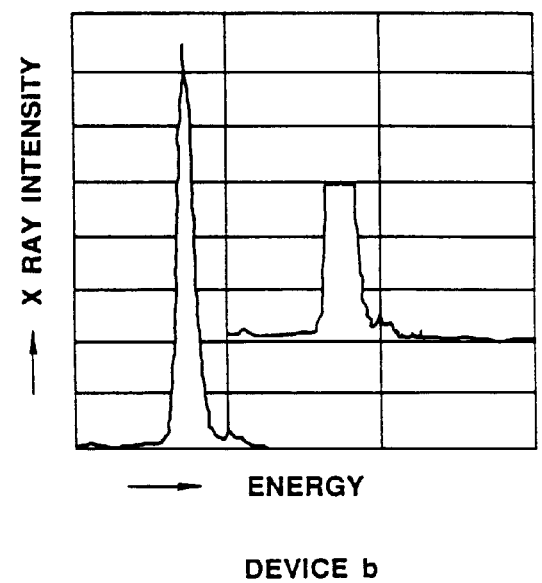
DEVICE a
DEVICE b
FIG.151(a)
**FIG.151(b)
PRIOR ART**

SEMICONDUCTOR DEVICE AND ITS FABRICATING METHOD

This is a division of application Ser. No. 08/478,765, filed Jun. 7, 1995, now U.S. Pat. No. 5,879,447 which is a division of application Ser. No. 08/056,443, filed Apr. 30, 1993, now U.S. Pat. No. 5,582,640, granted Dec. 10, 1996.

BACKGROUND OF THE INVENTION

1. Field of the Invention

The present invention relates to a semiconductor device and a method of fabricating the same and more particularly, to formation of single crystal and polycrystal based on solid phase growth.

2. Description of the Related Art

For a higher LSI integration, attempts have been made not only to reduce the size of semiconductor devices in the LSI circuit but also to construct LSI circuit in a laminated structure. There has been a proposal that not only operation circuits and memory circuits are laminated but also a light receiving part, a signal transfer part, a high-speed operating part such as a BiMOS and a capacitor are laminated in this order from its top layer. Such formation of semiconductor devices in the laminated structure has great possibility in applying it to a wide range of new multi-functional devices. It also serves to reduce the number of fabricating steps. For this reason, studies and developments in this field have been in progress in Japan as well as foreign nations.

One of the basic structures for laminated type devices is SOI (Si on insulator) substrate structure. Conventional techniques for laminated process include (1) a wafer bonding technique, (2) an SIMOX (separation by implanted oxygen) technique and (3) solid-phase growth technique. In an example of the solid-phase growth technique (3), an amorphous semiconductor film 3 (e.g., amorphous Si film) is previously deposited on a necessary part (such as a silicon oxide film 2 (insulator film) formed on a silicon substrate 1) at a low temperature of about 300–600° C. to form an SOI as shown in FIG. 134(a), and the SOI is heat treated for example at a low temperature of about 500–600° C. to be crystallized in a single crystal form in solid phase condition, whereby a single crystalline silicon layer 4 as shown in FIG. 134(b) is formed. In the drawings, reference numeral 2 denotes a silicon oxide film which is formed through spontaneous oxidation. As seen from the temperature range of the SOI formation step, the processing temperature is very low so that there occurs substantially no redistribution of impurities which were doped into the substrate before the procedure reaches the SOI step. The solid-phase growth technique in SOI formation has an advantage that the technique can be readily employed in the fabrication steps of semiconductor devices and thus the laminated structure can be easily formed.

Although the solid phase growth technique is advantageous in many points, there are some disadvantages still to be eliminated. Because of the disadvantages, this technique is not being used widely at present.

In conventional solid phase growth technique, the lateral length of solid phase growth is about 1 to 2 $\mu$m. This is too short to carry a device thereon. To extend the growth length, impurities is previously doped into the amorphous film at an impurity concentration of about $10^{20}$/cm$^3$. However, the impurity doped region is not suited for the formation of devices. Further, the crystallization in the solid phase growth region is not always in a desirable condition. For example, when an MOS device is prepared according to the conventional method, its mobility is 200–400 cm$^2$/Vsec in an enhancement type n-MOS device, which is ½–⅓ of the mobility of an ordinary device prepared on a single crystalline substrate. Further, the solid phase growth length depends largely on factors caused by the thermal phenomenon. More specifically, in a non-crystalline region, during a period when solid phase growth takes place from a seed, atoms constituting the amorphous film are repeatedly subjected to separation and aggregation at a specific frequency depending on its process temperature. Once an aggregation of the atoms exceeds a predetermined size at a given probability, the growth starts and advances quickly using the aggregation as its seed. As a result, a crystal grown from a proper seed hits against a crystal grown from the aggregation of atoms so as to stop its growth or to degrade the quality of the crystal. Further, since the crystal growth depends on the thermal factors, the solid phase growth length is distributed with probability. As a result, when several millions or more of re-crystallization regions are to be created, large variance in the length tends to occur, thereby decreasing the reliability.

In the conventional technique, it is considered that thicker film produces better crystal. There is a report of an experiment describing that, in a single crystallization film formed by a horizontal solid-phase growth with use of a seed, a thicker film creates a single crystal in a broader region. Further, in order to move atoms through heat treatment alone to such an extent as to change the shape of the substance, the temperature must be increased as high as nearly its melting point. In addition, since the mechanism of the solid phase growth has not been fully clear yet, the present situation is that new processes cannot be developed and new applications cannot be invented. Therefore, the conventional solid phase growth technique has been employed at most in forming a polycrystalline silicon load transistor or a polycrystalline silicon fuse ROM.

Accordingly, in the field of the solid phase growth technique, it is essential to work for the following subjects.
1. To increase the solid phase growth length
2. To improve the quality of crystal grown in a solid phase growth region
3. To improve the reliability of the solid phase growth

SUMMARY OF THE INVENTION

In view of the above circumstances, it is an object of the present invention to provide a high quality single crystal by a solid phase growth technique at low temperatures.

Another object of the present invention is to provide semiconductor devices and semiconductor integrated circuits by using the solid phase growth technique.

Still another object of the present invention is to form electrodes each having a very small occupied area and a large surface area so as to provide capacitors of very small size and large capacitance by using the solid phase growth technique.

Further object of the present invention is to provide diodes having excellent performances by using the solid phase growth technique.

Still further object of the present invention is to provide thin-film transistors and semiconductor integrated circuits having uniform characteristics and high reliability.

In accordance with the present invention, in forming an amorphous semiconductor thin film on a substrate or on an insulating film, distribution of the average inter-atomic distance for the main element in the amorphous semiconductor film is previously changed to thereby control the shape and quality of the recrystallized film. In the first method, the film is formed under the conditions that the average inter-atomic distance of the main element constituting the amorphous film is 1.02 times or more of the average inter-atomic distance of the single crystal, and re-crystallization energy is applied to the film while keeping the conditions that the average inter-atomic distance of the main element is 1.02 times or more of the average inter-atomic distance of the single crystal so as to perform solid phase growth and form a single crystalline semiconductor thin film. In the second method, the average inter-atomic distance of the main element constituting the amorphous film is set to be substantially equal to the average inter-atomic distance of the single crystal.

The present invention is characterized in that the amorphous semiconductor thin film is formed at a deposition rate at which the average inter-atomic distance of the film is 1.02 times or more of the average inter-atomic distance of a single crystal at the deposition temperature, and that the inter-atomic relation is kept loose immediately before its re-crystallization and the re-crystallization is carried out with one rush at the time of the heat treatment by applying-re-crystallization energy such as by heat treatment. There are several ways of attaining the above conditions. The formation of the amorphous film having an average inter-atomic distance 1.02 times or more of the average inter-atomic distance of a single crystal greatly depends on the deposition rate and film thickness during the heat treatment. For example, in the case of silicon, as a result of experiments with different temperatures and gas compositions, it has been observed that, when film formation is carried out under such conditions that the film formation rate R satisfies the following equation, a film having average inter-atomic distance 1.02 times or more of a single crystal can be obtained.

$$\log R(\text{Å}/min) \geq -10614/T(K) + 14.857$$

Further, in obtained an amorphous film having an average inter-atomic distance 1.02 times or more of a single crystal, the impurity concentration at the heat treatment temperature, the underlying material in the heat treatment and the quality of the amorphous film are also influential factors.

That is, the following items are considered.
(1) Carrying out film deposition at a deposition rate within a specific range for each heat treatment temperature.
(2) Preparing a film having a thickness within a specific range at each heat treatment temperature.
(3) Preparing a film having a thickness within a specific range and a dopant impurity concentration within a specific range at each heat treatment temperature.
(4) Preparing an underlying material at each heat treatment temperature and a film having thickness within a specific range.

In addition:
(5) For the purpose of keeping the surface of the amorphous film in a condition that the inter-atomic relation is loosened, using an apparatus for creating an atmosphere in which the surface of the amorphous film is cleaned.
(6) For the purpose of keeping the surface of the amorphous film in a condition that the inter-atomic relation is loosened or of further amplifying the loosened relation, using an apparatus for coating another film on the amorphous film and subjecting to a heat treatment.

After formation of the amorphous film, the temperature may be once lowered and then the film may be again subjected to a heat treatment. When applying re-crystallization energy through the heat treatment, the above-mentioned conditions including keeping the surface cleaned must be satisfied so that the film has an average inter-atomic distance 1.02 times or more of a single crystal. In place of thermal energy, electron beam irradiation or ultraviolet ray irradiation may be used as the re-crystallization energy.

Although the present invention is described as being applied to a semiconductor or semiconductor amorphous mainly covalent bond, the present invention may also be applied to metal if some modification is made on the process conditions such as underlying layer or film thickness, degree of vacuum, etc.

For example, in the third method of the present invention, an amorphous thin film of less than 80 no (more desirably, less than 20 nm) thick is deposited on a substrate having an insulating film formed thereon, the insulating film being provided therein with an opening, so that the average inter-atomic distance of the obtained amorphous thin film is 1.02 times or more of the average inter-atomic distance of its single crystal; and crystallization energy is applied to the amorphous thin film while maintaining a surface of the amorphous thin film in a cleaned condition in a non-oxidation atmosphere to cause single crystallization based on solid phase growth and to form a single crystalline thin film. It is desirable that the heat treatment is carried out at a vacuum level as high as less than $10^{-4}$ Torr and more desirably less than $10^{-6}$ Torr. Further, the heat treatment is carried out desirably in an inactive gas atmosphere such as high-purity argon, nitrogen or helium. The heat treatment temperature is set to be desirably between 450 and 600° C. Furthermore, it is desirable that the amorphous thin film formation step and the heat treatment step are carried out continuously without breaking the vacuum within an identical chamber.

In a fourth method of the present invention, an amorphous thin film is deposited on a substrate having an insulating film formed thereon, the insulating film being provided therein with an opening, the amorphous thin film being thin to an extent that free atoms can arrive at its surface from a boundary between the amorphous thin film and said insulating film, so that the resultant amorphous thin film has an average inter-atomic distance 1.02 times or more of the inter-atomic distance of a single crystal; and crystallization energy is applied to the surface of the amorphous thin film in a non-oxidation atmosphere while maintaining the surface of the amorphous thin film in such a free surface condition that free atoms on the surface can freely reach the boundary to cause a single crystal based on solid phase growth. In this case, the then average inter-atomic distance is monitored with respect to an amorphous silicon film deposited on a $SiO_2$ provided on a separate silicon substrate.

In the fifth method of the present invention, an opening is made in an insulating film covering an surface of a substrate to expose part of the surface of the substrate, and a first amorphous thin film of less than 20 nm thick is deposited on the substrate, so that an average inter-atomic distance of the first amorphous thin film is 1.02 times or more of an average inter-atomic distance of a single crystal;

crystallization energy is applied in a non-oxidation atmosphere the surface of the first amorphous thin film while maintaining the surface in a free surface condition to cause single crystallization based on solid phase growth with use of the substrate as a crystal seed to form a first single crystalline thin film; a second amorphous thin film of less than 80 nm thick is deposited on the single crystalline thin film; and crystallization energy is applied in a non-oxidation atmosphere the surface of the second amorphous thin film while maintaining the surface in a free surface condition to cause single crystallization based on solid phase growth with use of the substrate as a crystal seed to form a single crystalline thin film. It is desirable that the step of applying the crystallization energy to the first amorphous semiconductor thin film is a step of heating in a vacuum level as high as less than $10^{-4}$ Torr and more desirably less than $10^{-6}$ Torr. Desirably, electrically active elements with respect to the first amorphous semiconductor are contained. Further, prior to the deposition of the first amorphous thin film, the electrically active elements with respect to the first amorphous semiconductor are contained in the surface of the insulting film. More desirably, the similar process is carried out even over the second amorphous thin film.

In the sixth method of the present invention, an amorphous thin film is deposited on a surface of an insulating film so as to meet the deposition rate condition shown by the aforementioned equation to obtain an amorphous thin film having an average inter-atomic distance equal to or more than 1.02 times of an average inter-atomic distance of a single crystal; and crystallization energy is applied to the amorphous thin film to cause crystallization and at the same time to cause atom aggregation to thereby form a granular single crystal. Desirably, the surface of the film is kept in such a free condition the atoms can freely move within the film, silicon atoms are moved and aggregated simultaneously with the crystallization to thereby form the granular single crystal, paying attention to variation in the total energy (Gibbs' free energy).

In the seventh method of the present invention, a single crystalline semiconductor thin film is formed on an insulating film based on solid phase growth from an opening of the insulating film covering a surface of a substrate; and a source/drain region is formed within the single crystalline semiconductor thin film to thereby form an MOS device. A plurality of devices are formed within the single crystalline semiconductor thin film formed as extended based on solid-phase growth from the opening of the insulating film covering the surface of the substrate to a position far from the opening. That is, in a semiconductor integrated circuit which comprises a single crystalline semiconductor thin film formed on an insulating film based on solid phase growth from an opening of the insulating film covering the surface of a substrate and also comprises a plurality of device regions formed within the single crystalline semiconductor thin film to be semiconductor devices respectively; the number of such openings is arranged to be smaller than the number of such device regions.

In the eighth method of the present invention, in depositing an amorphous thin film on a substrate or an insulating film, in particular, an average inter-atomic distance distribution of main element of the amorphous thin film is adjusted to be substantially correspond to an average inter-atomic distance distribution of a single crystal; and crystallization energy is applied to the amorphous thin film to cause solid phase growth to thereby form a single crystal.

That is, in the present invention, the amorphous semiconductor thin film is adjusted to keep substantially the same density before and after the crystallization whereby a stress as low as impossible to attain in the prior art can be attained in the crystallization and remarkable enlargement of the crystallization dimension and improvement in the film quality can be realized.

It is desirable that an amorphous film is employed having an average inter-atomic distance substantially equal to the average inter-atomic distance of its single crystal, that is, corresponding to 0.98–1.02 times that of the single crystal, and more desirably 0.995–1.005 times thereof. The formation of the amorphous film having such average inter-atomic distances greatly depends on the deposition rate and film thickness during the heat treatment. For example, in the case of silicon, as a result of experiments with different temperatures and gas compositions, it has been observed that, when film formation is carried out under such conditions that the film formation rate R satisfies the following equation, a film having average inter-atomic distance less than 1.02 times of a single crystal can be obtained.

$$\log R(\text{Å/min}) < -10614/T(K) + 14.857$$

Further, in obtaining an amorphous film having an average inter-atomic distance substantially equal to that of a single crystal, the impurity concentration at the heat treatment temperature, the underlying material in the heat treatment and the quality of the amorphous film are also influential factors.

That is, the following items are considered. (1) Carrying out film deposition at a deposition rate within a specific range for each heat treatment temperature. (2) Preparing a film having a thickness within a specific range at each heat treatment temperature. (3) Preparing a film having a thickness within a specific range and a dopant impurity concentration within a specific range at each heat treatment temperature. (4) Preparing an underlying material at each heat treatment temperature and a film having thickness within a specific range.

In pace of thermal energy, electron beam irradiation or ultraviolet ray irradiation may be used as the re-crystallization energy. Further, the irradiation of both electron beam and ultraviolet ray may also be used.

Although the present invention is described as being applied to a semiconductor or semiconductor amorphous mainly covalent bond, the present invention may also be applied to metal if some modification is made on the metal.

In the ninth method of the present invention, for example, an amorphous thin film is deposited on a substrate, while measuring an average inter-atomic distance of main element of the amorphous thin film and also controllably making the average inter-atomic distance substantially equal to an average inter-atomic distance of a single crystal; and crystallization energy is applied to the amorphous thin film to cause solid phase growth to thereby form a single crystal. The measurement of the average inter-atomic distance is carried out, for example, by a Raman scattering method.

In the tenth method of the present invention, an amorphous silicon thin film is deposited on a substrate; silicon ions are implanted into the amorphous silicon thin film to make an average inter-atomic distance of the amorphous silicon thin film equal to an average inter-atomic distance of a silicon single crystal; and crystallization energy is applied to the amorphous silicon thin film to cause solid phase growth and to thereby form a silicon single crystal.

Further, in the eleventh method of the present invention, the average inter-atomic distance is selectively change for respective regions and the amount of ions implanted is selectively controlled for the respective regions according to the change value.

In the twelfth method of the present invention, an amorphous silicon thin film is deposited on a raised and recessed surface (insulating film, semiconductor film, electrically conductive film, etc.) so that an average inter-atomic distance of main element of the amorphous thin film substantially is an average inter-atomic distance of a single crystal of the main element; and crystallization energy is applied to the amorphous silicon thin film to cause solid phase growth to thereby form a single crystal. The raised and recessed surface is formed desirably to be steps having a line-and-space (minimum line width) of 20 to 40 nm.

In the thirteenth method of the present invention, in a semiconductor device in which both an MOS semiconductor device and bipolar semiconductor device are provided on an identical substrate, wherein the bipolar device has a base region which is a part of a single crystalline semiconductor thin film formed based on solid phase growth from a drain region of the MOS semiconductor device exposed by an opening of an insulating film covering the MOS semiconductor device and also has a base region electrically connected to the drain region of the MOS semiconductor device through the opening.

In the fourteenth method of the present invention, a granular semiconductor or an insulator layer made of separate grains is provided on the substrate or on the thin film formed on the substrate to be used as a device region, so that a diameter of each of the grains is smaller than a distance between the adjacent grains.

In the fifteenth method of the present invention, a granular single crystalline silicon made of separate grains is provided on the substrate or on the thin film formed on the substrate to be used as a device region, so that a diameter of each of the grains is smaller than a distance between the adjacent grains.

In the sixteenth method of the present invention, the single crystalline silicon has a vertical axis with respect to the surface of the underlying substrate or thin film, so that the vertical axis is orientated substantially in a <100> direction.

In a semiconductor device of a seventeenth method of the present invention, the granular single crystalline silicon has a grain diameter distribution in which more than 90% of grains contained in the granular single crystalline silicon have diameters belonging to a grain diameter range of ±20% with respect to the most frequently appearing grain diameter.

In the eighteenth method of the present invention, a diode is provided which comprises a semiconductor region of a first electrical conduction type formed on a substrate and a granular single crystalline silicon of a second electrical conduction type formed on the semiconductor region, so that semiconductor region and the granular single crystalline silicon formed a pn junction of the diode.

The nineteenth method of the present invention is featured in that an amorphous silicon thin film is deposited on a substrate including a semiconductor region of a first electrical conduction type through an insulating film having a predetermined thickness to form a silicon thin film of a second electrical conduction type; crystallization energy is applied to the amorphous silicon thin film to cause solid phase growth to thereby form a granular single crystalline silicon of the second electrical conduction type; and the insulating film is subjected to a heat treatment for shrinkage to cause the semiconductor region of the first electrical conduction type to be contacted with the granular single crystalline silicon to form a pn junction to thereby form a diode.

In the twentieth method of the present invention, a capacitor is provided which comprises a lower electrode made of a first electrically conductive layer and also of a second electrically conductive granular layer formed on the first conductive layer, a capacitor insulating film formed on the first electrode, and a second electrode formed with respect to the first electrode, thus increasing the capacitor area caused by the raised and recessed granular surface of the second electrically conductive layer.

In the twenty-first method of the present invention, a first electrically conductive layer having an insulating film formed thereon is formed; an amorphous thin film is deposited on the first electrically conductive layer; the amorphous thin film is subjected to a heat treatment to cause solid phase growth to thereby form a granular single crystal; the insulating film is subjected to a heat treatment for shrinkage to cause electrical conduction between the first electrically conductive layer and the granular single crystal to thereby form a first electrode made of the first electrically conductive layer and granular single crystal; and a capacitor insulating film and a second electrode are formed on the first electrode. In this case, the amorphous thin film is formed so that the average inter-atomic distance of main element of the film is more than 1.02 times of the average inter-atomic distance of the element in a single crystal. Further, the amorphous thin film may be deposited so that the average inter-atomic distance of main atoms of the film is substantially equal to the average inter-atomic distance of the element in a single crystal.

Desirably, in the heat treatment, the amorphous thin film is heated while the surface of the film is kept in its clean state in a non-oxidation atmosphere to cause solid phase growth and single-crystallization to thereby form a single crystalline thin film. The heat treatment is carried out desirably at a vacuum level of less than $10^{-4}$ Torr and more desirably less than $10^{-6}$ Torr. It is also desirable that the heat treatment is carried out in an inactive gas atmosphere such as argon, nitrogen or helium or in a reduction atmosphere as hydrogen. Further, the heat treatment temperature is set to be desirably between 450 and 600° C. It is also desirable that the amorphous thin film deposition step and the heat treatment step are continuously chamber.

In the twenty-second method of the present invention, a thin film transistor is provided which comprises a polycrystalline silicon film formed on an insulating film covering a surface of a substrate so that a grain boundary of the polycrystalline silicon film is formed along an axis vertical to the surface of the underlying substrate, and a source/drain region formed within the polycrystalline silicon film.

In the twenty-third method of the present invention, an amorphous thin film is deposited on an insulating film covering on a substrate and subjected to a heat treatment to cause solid phase growth to thereby form a polycrystalline silicon film whose grain boundary is formed along an axis vertical to the surface of the underlying substrate; and a thin film transistor is formed which comprises a source/drain region within the polycrystalline silicon film.

In the course of recrystallizing the film from the amorphous state to the single crystal, when an undesirable crystalline nucleus is generated and grown, this disadvantageously results in that not only crystal quality becomes degraded but also the dimension of the re-crystallization cannot be extended. In order to improve the crystal quality and extend the crystallization length (the single crystalline formation rage), it is necessary to perform re-crystallization as fast as possible.

The inventors of the present applications, as a result of many various tests and much examination and consideration, has paid attention to the average inter-atomic distance and found a fully novel method. This method, which is intended to control motions in the respective atoms within the amorphous semiconductor during the solid phase growth, is based on application of a new phenomenon. For this reason, the action of the phenomenon is not fully explained scientifically yet. Accordingly, explanation will be made in the following on the basis of inventors' close examination of the test results.

In the depositing an amorphous film at a high rate, the surface of the film is previously kept in its clean surface and the film thickness is made small. This enables the atoms of the film to be put in such a state that bonding between atoms is established to some extend but loose. This leads to increase in the average inter-atomic distance dimension which forms an important part of the present invention. When energy is applied, e.g., through a heat treatment, to the film while keeping the increased average inter-atomic distance, atoms in the vicinity of the surface of the film becomes easy to move. It has been found that, in the case where the amorphous film is contacted with a single crystalline exposure portion as a so-called 'seed', when the re-crystallization is carried out from the 'seed' crystal with one rush before a re-crystallization portion is undesirable generated, the re-crystallization region dimension can be enlarged.

IT has been also found that, in the case where the amorphous film is not contacted with a single crystalline exposure portion as a so-called 'seed', when a film as thin as below a predetermined thickness is prepared, the amorphous part can crystallize as aggregated into a defect-free single crystalline film of grains. In this case, each of the grains form a single crystal. However, the inventors of the present application has also found that these grains can be made uniform in size by suitably selecting the film thickness, temperature, underlying film, etc.

Further, since atoms are made easy to move, control can be attained over the reduction of the crystallization heat treatment temperature, the shortening of the heat treatment time, the reduction of defects and the adjustment of crystalline orientation.

In a conventional solid phase growth technique using a thick film, as shown in FIG. 135, crystal growth is advanced at a low temperature, so that atoms within the film cannot move freely unlike epitaxial growth, which results in that, when a lattice misalignment takes place for some of atoms, this misalignment undesirable remains as a crystalline defect. It has been found that a misalignment in atomic position during silicon growth remains as a distortion in the resultant crystal which results in generation of many defects such as twins, or that the presence of even an oxide substance or the like causes a start of its peripheral distortion with the result of easy generation of defects.

For the purpose of advancing crystallization without causing any crystal defects, in accordance with the present invention, the point is that, in order to suppress such misalignment and distortion, atoms within the amorphous film 3 can be made to move freely even at low temperatures, that is, as shown in FIG. 1, solid phase growth is caused while keeping the surface of the amorphous film in its clean state, so that atoms on the surface of the film can be made free, whereby excessive atoms resulting in a distortion are escaped from the surface or lacking atoms are supplemented from the surface. Thus, another important point is also that not only the surface is made free in atoms but also the amorphous semiconductor film is made to have a thickness of below 80 nm or desirably below several tens of nm so that the surface state can be transmitted to the crystal growth boundary. As a result, a distortion or the like caused by the solid phase growth at temperatures of below 600° C. can be released from the surface and therefore a defect-free single crystalline layer can be formed.

In accordance with the third method of the present invention, for example, when a thin amorphous film of below 80 nm thick is deposited on a semiconductor substrate and heated in a non-oxidation atmosphere while the surface of the amorphous thin film is kept in its free state to cause solid phase growth and single crystallization to thereby form a single crystalline silicon thin film; there can be formed a good single crystalline thin film which is free of defects. Although the lower limit of the film thickness is not specifically put when the film formation limit is taken into consideration, it is desirable that, when an ultra-thin film can be formed in theory, the film thickens lower limit is several times of the lattice diameter.

In this way, heat treatment is carried out while allowing free movement of atoms and suppressing generation of defects caused by the misalignment of atomic position, to form a good single crystalline thin film. Since impurity diffusion rate is very small at temperatures of below 600° C. and impurities within the single crystal cannot shift, no movement of impurities takes place from the underlying substrate into the amorphous film or from the amorphous film advance in single crystallization to the underlying substrate.

In the conventional method, since the amorphous semiconductor film is exposed to atmosphere prior to solid phase growth, the amorphous film is formed thereon with a spontaneous oxide film, whereby atoms on the surface of the film are coupled to the oxygen of the oxide film and thus are fixed. It has been common that, even when the film is not exposed to atmosphere, atoms on the surface of the film are oxidized and fixed in a heat treatment atmosphere of solid phase growth, so that solid phase growth is carried out wit the atoms being fixed or bound.

Discussions have seldom been made about the heat treatment atmosphere during solid phase growth. The heat treatment has been sometimes carried out at a vacuum level of about $10^{-3}$ Torr as a usual value or in an inactive gas atmosphere. However, the vacuum atmosphere at the usual vacuum level of about $10^{-3}$ Torr or the usual inactive gas atmosphere contains traces of oxygen, which leads to formation of a spontaneous thin oxide film.

The inventors of the present application have succeeded in forming a defect-free single crystalline film, by setting the heat treatment atmosphere at a high vacuum level, by using an inactive atmosphere controlled to a high purity to shut out oxygen from the atmosphere nearly to its perfect non-oxygen level, and by subjecting a film to a heat treatment under such conditions while keeping the surface of the film in its free state. In performing the formation and solid phase growth of the amorphous thin film in separated chambers respectively, it is necessary to previously remove a spontaneous oxide film on the film in a reduction atmosphere prior to the execution of the solid phase growth process.

Impurities having a concentration different from the underlying substrate may be previously doped into the amorphous semiconductor film, so that a single crystalline layer having different impurity concentrations can be formed in a very shallow region of the surface of the substrate. It is also possible to change the material itself of the amorphous film to form a single crystalline layer made of a different material.

For the purpose of controlling the concentration of electrically conductive impurities within the amorphous film, the following manners are used. When it is desired to utilize gas pyrolysis reaction, during the film formation, a gas containing the electrically conductive impurities is doped into the chamber simultaneously with the introduction of a gas containing semiconductor material to dope the electrically conductive impurities into the film. When impurities are present in the underlying substrate, the amorphous film not containing any impurities is formed so that an intrinsic layer can be formed on a P or N type substrate in the limited vicinity of its surface and below several tens of nanometer deep therefrom, which can be highly effectively utilized in making a semiconductor smaller. As another manner, a UHV method is also useful in which a target of semiconductor material is evaporated to deposit it on the substrate kept in a high vacuum level. The evaporation of the semiconductor material may be carried out, for example, by a heating process with use of a heater, a heating process of applying an energy beam such as an electron beam to the semiconductor material, or by a sputtering process of accessing such ions as argon ions and hitting them to the target to drive out atoms from the target. Even in either process, when electrically conductive impurities other than the semiconductor material are used as the target and evaporated together, an amorphous film having an impurity concentration different from the underlying substrate can be formed. It goes without saying that the target may be made of a semiconductor material containing the electrically conductive impurities.

In this method, when the heat treatment is carried out desirably at a high vacuum level of below $10^{-4}$ Torr, the oxygen concentration becomes very low so that the formation of a surface oxide film can be suppressed, whereby a good quality of single crystalline film can be formed.

Further, when the heat treatment is carried out desirably in an inactive gas atmosphere such as highly pure argon, nitrogen or helium, the oxygen concentration becomes very low so that the formation of a surface oxide film can be suppressed, whereby a good quality of single crystalline thin film can be formed.

In the method, when the heat treatment temperature is set desirably at a temperature of between 450 and 600° C., substantially no diffusion of impurities can be realized and good boundary characteristics can obtained.

In the method, further, when the amorphous thin film deposition step and the heat treatment step are carried out preferably continuously without breaking the vacuum state within the identical chamber, there can be highly easily formed a good single crystalline thin film.

In the fourth method of the present invention, an amorphous thin film is deposited on a semiconductor substrate to be thin in the distance between its surface and its boundary with the semiconductor substrate so that free atoms on the surface of the film can freely reach the boundary, and the film is heated in a non-oxidation atmosphere while keeping its free surface state to cause solid phase growth and single crystallization to thereby form a single crystal, whereby atoms on the film surface can freely move and a distortion-free, good single crystalline thin film can be formed.

In the fifth method of the present invention, an opening is made in an insulating film formed on a semiconductor substrate to expose part of the surface of the substrate, a first amorphous thin film of below 20 nm thick is deposited on the substrate, the amorphous thin film is heated in a non-oxidation atmosphere while keeping the surface thereof in its free state to cause solid phase growth and single crystallization with the substrate used as a crystal seed to thereby form a first single crystalline thin film, whereby atoms can freely move and a film having a good crystal quality can be obtained. Thereafter, a second amorphous thin film of below 80 nm thick is deposited on the single crystalline semiconductor thin film, the second amorphous thin film is heated in a non-oxidation atmosphere while keeping the surface of the second film in a free state to cause solid phase growth and single crystallization with the substrate used as a crystal seed to thereby form a second single crystalline thin film. Thus, atoms can also move freely, a film having a good crystal quality can be obtained, and a semiconductor layer having a blanket shape can be preferably formed at a low temperatures.

In this method, when the step of heating the first amorphous semiconductor thin film is carried out preferably at a high vacuum level of below $10^{-6}$ Torr, atoms on the surface of the film can be migrated more easily and the single crystallization can be promoted so that a wide range of single crystallization to a position far away from the opening surface of the seed can be realized.

Further, when electrically active elements are contained in the first amorphous semiconductor, the single crystallization rate can be increased.

In addition, even when elements electrically active to the first amorphous semiconductor are contained in the surface of the insulating film prior to the deposition of the first amorphous semiconductor thin film, the single crystallization rate can be increased.

In the sixth method of the present invention, an amorphous thin film is deposited on an insulating film so that the amorphous film has an average inter-atomic distance corresponding to more than 1.02 times of the average inter-atomic distance of its single crystal, and atoms are aggregated simultaneously with the crystallization to form a granular single crystalline layer, whereby single crystalline grains having a very good crystal quality and a uniform grain size can be easily formed regardless of the lithography accuracy.

In the seventh method of the present invention, a single crystalline thin film having a good crystal quality is electrically connected to a substrate through an opening so that a current resulting from impact ions generated in the vicinity of a drain can be passed through the substrate, whereby there can be obtained a MOS transistor which is table in element operation. Further, since a channel region can be made as an ultra-thin film having a good crystal quality, high speed operation can be attained. Also, since the channel can be formed as a layer (intrinsic layer) having substantially no impurities contained therein, there can be obtained a high electron mobility transistor in which the movement of carriers cannot be prevented by impurities. Moreover, since a single crystalline thin film having a good crystal quality can be extended to a position far away from the single opening (seed), when the solid phase growth from the opening of the insulating film covering the substrate causes the single crystalline semiconductor thin film to be extended to a position far away from the opening to thereby form a plurality of devices, the formation of a thin film having a good crystal quality can be realized without any restrictions by other device regions. In this connection, the formation of the single crystalline thin film is carried out by the first, second, eighth or ninth method.

The inventors of the present application, as a result of considerations of the tests, have also found that, in the conventional method, the impossibility of extension of the growth distance to a far position and the random distribution of the growth distance result from the fact that the growth front (boundary between the amorphous and the crystalline) advances at a varying rate, that is, the front is wavy.

It has been also found that the degraded crystal quality results from the fact that, when the growth front is extended to more than about 1 μm, generation of twins is abruptly enhanced. It has been seen that, in the current existing process, in particular, the maximum of the growth front providing a relatively good crystal quality is about 1 QW&LW, which is insufficient in preparation of an active device.

The inventors have closely examined and conducted many experiments, and found a fully novel method focused on the average inter-atomic distance. That is, the inventors have examined the above causes with use of a high-resolution transmission electron microscopy and a high-resolution microscope Raman spectroscopy, and found a new method which can positively produce a single crystal having a good crystal quality. Also has been found a method which can be applied to produce single crystalline grains perfectly orientated.

In more detail, the inventors examined the growth distance/time dependence of horizontal solid phase growth with use of a small-size electric furnace, evaluated in details its growth front with use of a transmission electron microscopy and measured the stress distribution of the film by a Raman spectroscopy. As a result, the inventors have noticed that there is a very important relationship between the growth distance, preferential growth plane, crystal defect and residual stress, fond on the basis of the knowledge thereof, how to promote the solid phase growth and how to improve the crystal quality of single crystal, and further formed and experimentally confirmed perfectly-orientated single crystalline grains.

In particular, form the purpose of attain low stress in crystallization, an average inter-atomic distance is set to be nearly equal to the average inter-atomic distance of its single crystal. This average inter-atomic distance setting depends largely on the atomic densities at the respective heat treatment temperatures. This is also influenced by the following factors (1) to (3), in addition to the above. (1) Impurity concentrations at the respective heat treatment temperatures. (2) Surface state at the respective heat treatment temperatures. (3) The material and structure of the underlying film at the respective heat treatment temperature.

More specifically, it has been found that, in the course of crystallization from amorphous to single crystalline, when the amorphous and single crystalline are different in average inter-atomic distance, the crystallization causes a stress which in turn changes the plane orientation of the crystallization boundary and also induces crystal defects, whereby the dimension of the crystallization cannot disadvantageously be extended sufficiently.

In order to eliminate such a disadvantage, the average inter-atomic distance of the amorphous film is set to be substantially equal to the average inter-atomic distance of its single crystal (more than 0.98 times that of the single crystal and less than 1.02 times thereof, and preferably less than 1.01 times thereof), whereby, in the crystallization, the stress can be suppressed, the quality of the crystal can be improved, and the single crystalline distance can be extended. As a result, it has been also found that self single crystal can grow from the surface to form perfect single crystalline grains.

The action of this method based on the new phenomenon has not been fully explained scientifically yet.

According to the eighth method of the present invention, a single crystal having a good crystal quality and free of such crystal defects as twins can be extended to a far position.

In the ninth method of the present invention, an amorphous thin film is deposited on a substrate while measuring the average inter-atomic distance of main element of the thin film by the Raman scattering spectroscopy or the like and controlling the deposition conditions in such a manner that the average inter-atomic distance substantially coincides with the average inter-atomic distance of its single crystal, so that density variation in the crystallization can be made small, whereby stress generation can be suppressed and a good single crystal can be obtained.

In the tenth method of the present invention, the implant value of the deposited amorphous silicon thin film is determined by measuring the average inter-atomic distance of silicon of the amorphous silicon thin film; ion implantation with use of silicon ions is carried out on the basis of the determined implant value to make the average inter-atomic distance of the amorphous film closer to the average inter-atomic distance of its single crystal until the average inter-atomic distance of the amorphous becomes substantially equal to that of the single crystal; and the amorphous silicon thin film is subjected to a heat treatment. As in the second method, since the density change during the crystallization is small, the stress generation can be suppressed and a good single crystal can be obtained.

Since the re-crystallization is advanced from the location closer to the seed, the inter-atomic distance of the crystal at a location farther away from the seed is larger. Taking this respect into consideration, in the eleventh method of the present invention, ion implantation is carried out selectively in a predetermined region prior to the re-crystallization. That is, the average inter-atomic distance of silicon of the deposited amorphous silicon thin film is measured for each of its respective regions, a calculated amount of silicon ions are implanted into each region on the basis of the measured value to reach its predetermined average inter-atomic distance for each region so that the average inter-atomic distance of the amorphous film becomes substantially equal to the average inter-atomic distance of the single crystal, and then the amorphous silicon thin film is subjected to a heat treatment. Since the density change in the crystallization is small, the stress generation can be suppressed and a good single crystal can be obtained.

In the twelfth method of the present invention, further, an amorphous thin film is deposited in a substrate (insulating film, semiconductor film, electrically conductive film) having a raised and recessed surface thereon so that the average inter-atomic distance of the main element of the amorphous film substantially coincides with the average inter-atomic distance of the element in a single crystal, crystallization energy is applied to the amorphous thin film to cause solid phase growth and to form a single crystal, which results in that distortion generation is suppressed and there can be formed a single crystal which has a good crystal quality and a good orientation. In this case, the raised and recessed portion is formed to be desirably between 20 and 40 nm in minimum line width.

In the thirteenth method of the present invention, a bipolar device comprises a base region which form a part of a single crystalline semiconductor thin film formed based on solid phase growth of a drain region of an MOS semiconductor device exposed to an opening of an insulating film covering the MOS semiconductor device, and the base region is electrically connected to the drain region of the MOS semiconductor device through the opening. As a result, the crystal quality of the connected part can be made very good, contact resistance can be made small, the semiconductor device can be made at low temperatures in spite of its laminated structure, and deterioration of the underlying device can be prevented. Further, since the current value can be amplified by the bipolar device, when the current value of the underlying MOS semiconductor device is amplified to provide a large current output, the semiconductor device can be operated at a high speed.

In the fourteenth method of the present invention, a granular semiconductor or insulating layer of separated grains is formed on a substrate or on a thin film formed on the substrate so that the grain-to-grain distance is smaller than the grain diameter, and the granular layer is used as a device region. Thus, there can be obtained a semiconductor device which has good characteristics and a high reliability.

The formation of the granular layer is carried out by the first, second, eighth or ninth method.

In the fifteenth method of the present invention, a granular single crystalline silicon of grains is formed on a substrate or on a thin film formed on the substrate so that the grain-to-grain distance is smaller than the grain diameter, and the granular layer is used as a device region. Thus, there can be obtained a semiconductor device which has good characteristics and a high reliability. The formation of the granular layer is carried out by the first, second, eighth or ninth method.

In the sixteenth method of the present invention, the single crystalline silicon has a vertical axis with respect to the surface of the underlying substrate or thin film, so that the vertical axis is orientated substantially in a <100> direction, whereby even when a fine device is formed, its characteristics can be made less in variations and its reliability can be made high.

In a semiconductor device of the seventeenth method of the present invention, the granular single crystalline silicon has a grain diameter distribution in which more than 90% of grains contained in the granular single crystalline silicon have diameters belonging to a grain diameter range of ±20% with respect to the most frequently appearing grain diameter, which results in that, even when a fine device is formed, its reliability can be made high.

In the eighteenth method of the present invention, a diode is provided which comprises a semiconductor region of a first electrical conduction type formed on a substrate and a granular single crystalline silicon of a second electrical conduction type formed on the semiconductor region, so that semiconductor region and the granular single crystalline silicon form a pn junction of the diode, which results in that there can be obtained a diode which has very good characteristics and is less in variations.

In the nineteenth method of the present invention, as a result of many tests, a granular, second electrically conductive layer can be easily formed on an electrically conductive layer having an insulating film thereon. However, when the method is applied to a diode, it has been found that it is necessary to electrically connect the granular, second electrically conductive layer to a first semiconductor region (electrically conductive layer), but this can be realized through the shrinkage of a heat treatment. In view of this respect, an amorphous silicon thin film is deposited on a substrate including a semiconductor region of a first electrical conduction type through an insulating film having a predetermined thickness to form a silicon thin film of a second electrical conduction type; the amorphous silicon thin film is subjected to a heat treatment to cause solid phase growth to thereby form a granular single crystalline silicon of the second electrical conduction type; and the insulating film between the semiconductor region of the first electrically conduction type and the granular single crystalline silicon is subjected to a heat treatment to be shrank and disappear to cause the semiconductor region of the fist electrical conduction type to be contacted with the granular single crystalline silicon to form a pn junction to thereby form a diode. As a result, there can be obtained a fine diode which has a very good characteristics and less in variations. The formation of the granular layer is also carried out by the first, second, eighth or ninth method.

In the twentieth method of the present invention, since the lower electrode of the capacitor is made of an electrically conductive layer, the capacitor area can be increased due to the raised and recessed surface.

In the twenty-first method of the present invention, it is necessary to electrically connect the granular second electrically conductive layer to the first electrically conductive layer. However, it has been found that this electrical connection can be realized through the shrinkage of the insulating film by a heat treatment. The invention has been made on this result and thus there can be highly easily obtained a capacitor which has a large capacitance. The formation of the granular, second electrically conductive layer can be easily realized also by the first, second, eighth or ninth method of the present invention.

In the twenty-second method of the present invention, a thin film transistor is provided which comprises a polycrystalline silicon film formed on an insulating film covering a surface of a substrate so that a grain boundary of the polycrystalline silicon film is formed along an axis vertical to the surface of the underlying substrate, and a source/drain region formed within the polycrystalline silicon film. As a result, the number of grain boundaries within the channel can be made uniform so that there can be obtained a thin film transistor which is less in the variations of its characteristics and thus is stable operated.

In the twenty-third method of the present invention, an amorphous thin film is deposited on an insulating film covering on a substrate and subjected to a heat treatment to cause solid phase growth to thereby form a polycrystalline silicon film whose grain boundary is formed along an axis vertical to the surface of the underlying substrate; and a thin film transistor is formed within the polycrystalline silicon film. As a result, there can be obtained a thin film transistor which is less in the variations of its characteristics and thus is stable operated. When an amorphous film is deposited on an insulating film having a raised and recessed surface, atoms can more freely move and crystalline orientation can be easily aligned.

The gist of the invention has been disclosed in the foregoing by the inventors of the present application. The semiconductor thin film prepared according to the present invention is actually far excellent over the conventional film. At the current stage, the inventors fail to fully analyze the reason as mentioned above.

However, the inventors have closely examined the results, prepared a computer simulator that is novel and strict based on physics theory, and reached such a level that its principle can be explained. Explanation will be made as to the new simulator made by the inventors as well as the analysis based on the simulator.

The point of the simulator system is the calculation of forces between Si atoms and the calculation of their atom potentials. The inventors previously fully examined what kind of potential should be most suitably employed for Si semiconductor and believed that Tersoff potential is best for such an objective to which the present invention is directed, i.e., a system which contains re-crystallization phenomenon or amorphous. The inventors added a unique improvement to the Tersoff potential and also added thereto mathematically highly strict modifications and derivations. In other words, when the magnitude of the potential is known, forces applied to particles and velocities thereof and so on will be easily found.

According to the inventors, all potential on i-th Si atom can be expressed based on the uniquely improved Tersoff as follows.

$$\Sigma(1/2)(V_{ij}+V_{ji}) \qquad (1)$$

Since the potential of the improved Tersoff by the inventors is to be applied to a force between 3 particles or more, $V_{ij} \neq V_{ji}$ in the equation (1). When 'i' denotes the position number of a target Si particle and 'j' denotes another particle number in the vicinity of the particle, the above Vij is written as follows.

$$V_{ij}=f_C(r_{ij})\{a_{ij}f_R(r_{ij})+b_{ij}f_A(r_{ij})\} \quad (2)$$

where, 'r' denotes a distance between particles, $f_C(r_{ij})$ is known as cut-off function, $f_R(r_{ij})$ denotes repulsion force, and $f_A(r_{ij})$ denotes attraction force. Further, $a_{ij}$ is cut-off coefficient when coordination number is taken into account and $b_{ij}$ is also cut-off coefficient when coordination nubmer is taken into account. The improved Tersoff of the inventors implicitly takes the effect of the force between 3 particles or more into consideration by providing a special parameter to the coordination number. Quantities $f_R$ and $f_A$, which are modifications of Morse type potential, are expressed as $f_A(r)=A\exp(-\lambda_1 r)$ and as $f_A=-B\exp(-\lambda_2 r)$, respectively, where $\lambda_1$ and $\lambda_2$ are both constants that correspond in magnitude to reciprocals of about inter-atomic distance. Substituting the $f_R$ and $f_A$ into the equation (2) results in:

$$V_{ij}=f_C(_{ij})\{a_{ij}A\exp(-\lambda_1 r_{ij})-b_{ij}B\exp(-\lambda_2 r_{ij})\}$$

The cut-off function $f_c(r_{ij})$ has the following values.

$$f_c(r) = 1 \qquad (r \leq R-D) \quad (3)$$
$$f_c(r) = 1/2 - 1/2\sin\{(\pi/2)(r-R)/D\}$$
$$\qquad (R-D < r < R+D)$$
$$f_c(r) = 0 \qquad (r \geq R+D)$$

The dimension R is usually selected to include the first adjacent zones alone of a target structure. The value of R is usually 0.2–0.3 nm. Next, the effective coordination number $b_{ij}$ is defined as the following equation (4) using the aforementioned cut-off function, in the improved Tersoff by the inventors.

$$b_{ij}=(1+\beta^n\zeta_{ij}^n)^{-1/2n} \quad (4)$$

where $$\zeta_{ij}=\Sigma f_C(r_{ik})g(\theta_{ijk})\exp\{\lambda_3^3(r_{ij}-r_{ik})^3\} \quad (5)$$

where k≠i, j. Since $'_{ij}$ is the environmental factor resulting from the input of the third atom 'k'. $\zeta_{ij}\neq\zeta_{ji}$. therefore, $b_{ij}\neq b_{ji}$. Further, as described in equation (1), $V_{ij}\neq V_{ji}$. Furthermore, $g(\theta)$ is a bond angle factor which is written as follows.

$$g(\theta)=1+(c^2/d^2)-c^2/(d^2+\cos^2\theta) \quad (6)$$

where θ is assumed to take as shown in FIG. 136. Before finding θ, $r_{ij}$ is expressed in a rectangular coordinate system, as follows.

$$r_{ij}=[\{(x_j-x_i)^2+(y_j-y_i)^2+(z_j-z_i)^2\}]^{1/2} \quad (7)$$

The factor $r_{ik}$ can be found in the similar manner. Then its inner product $P_{ijk}$ is given as follows.

$$P_{ijk}=(x_j-x_i)(x_k-x_i)+(y_j-y_i)(y_k-y_i)+(z_j-z_i)(z_k-z_i) \quad (8)$$

From these equations, the following equation (9) is obtained.

$$\cos\theta_{ijk}=P_{ijk}/(r_{ij}r_{ik}) \quad (9)$$

where R=3.0 angstroms, D=0.2 angstroms, A=3264.7 eV, B=95.373 eV, C=4.8381.

$$\lambda_1=3.2394 \text{ angstroms}, \lambda_2=1.3258 \text{ angstroms}, \lambda_3=\lambda_2. \quad (10)$$

β=0.33675, n=22.956, and d=2.0417

From the above preparation, the inventors conducted highly strict calculations relating to the calculation of the forces between Si atoms and the calculation of motion velocities. When the potential equation (2) is differentiated by position coordinates, the x components of vectors of forces exerted to particles 'i' and 'j' are given by (11) and (12), respectively.

$$-(1/2)(\partial V_{ij}/\partial x_i) \quad (11)$$

$$-(1/2)(\partial V_{ij}/\partial x_j) \quad (12)$$

However, in actually finding these, the inventors carefully examined the contribution of each variable and prepared a strict higher-order partial differential equation. In calculating angle and radial components, the inventors arranged and examined its sequence as shown in FIG. 137.

The values of the components (11) and (12) were found according to the partial differential equation and on the basis of a relationship shown in FIG. 137, as follows.

$$-(1/2)(\partial V_{ij}/\partial x_i) = \quad (13)$$
$$-(1/2)[(\partial V_{ij}/\partial r_{ij})(\partial r_{ij}/\partial x_i)+(\partial V_{ij}/\partial \zeta_{ij})\{(\partial \zeta_{ij}/\partial r_{ij})(\partial r_{ij}/\partial x_i)+$$
$$\sum((\partial \zeta_{ij}/\partial r_{ik})\times(\partial r_{ik}/\partial x_i)+\sum((\partial \zeta_{ij}/\partial \cos\theta_{ijk})(\partial \cos\theta_{ijk}/\partial x_i))\}]$$

A reduction of the partial differential equation on 'i' is similarly as follows.

$$-(1/2)(\partial V_{ij}/\partial x_j) = \quad (14)$$
$$-(1/2)[(\partial V_{ij}/\partial r_{ij})(\partial r_{ij}/\partial x_j)+(\partial V_{ij}/\partial \zeta_{ij})\{(\partial \zeta_{ij}/\partial r_{ij})(\partial r_{ij}/\partial x_j)+$$
$$\sum((\partial \zeta_{ij}/\partial \cos\theta_{ijk})\times(\partial \cos\theta_{ijk}/\partial x_j))\}]$$

For easy comparison between the equations (13) and (14), corresponding blank terms were left as they were.

Similarly, a reduction of the partial differential equation on 'k' is as follows. For easy comparison between the equations (13) and (15), corresponding blank terms were left as they were.

$$-(1/2)(\partial V_{ij}/\partial x_k)=-(1/2)[(\partial V_{ij}/\partial \zeta_{ij})\{(\partial \zeta_{ij}/\partial r_{ik})(\partial r_{ik}/\partial x_k)+ \quad (15)$$
$$(\partial \zeta_{ij}/\partial \cos\theta_{ijk})(\partial \cos\theta_{ijk}/\partial x_k)\}]$$

When the partial differential equation is actually solved for $V_{ij}$ with use of the equation (2), its result is:

$$\partial V_{ij}/\partial r_{ij} = (\partial f_c(r_{ij})/\partial r_{ij})\{A\exp(-\lambda_1 r_{ij}) - b_{ij}B\exp(-\lambda_2 r_{ij})\} + \qquad (16)$$
$$f_c(r_{ij})\{-\lambda_1 A\exp(-\lambda_1 r_{ij}) + \lambda_2 b_{ij}B\exp(-\lambda_2 r_{ij})\}$$
$$= A\exp(-\lambda_1 r_{ij})\{(\partial f_c(r_{ij})/\partial r_{ij}) - \lambda_2 f_c(r_{ij})\} -$$
$$B\exp(-\lambda_2 r_{ij})\{(\partial f_c(r_{ij})/\partial r_{ij})) - \lambda_2 f_c r_{ij})\}b_{ij}$$

$$\partial f_c(r_{ij})/\partial r_{ij} \text{ is} \qquad (17)$$
$$\partial f_c(r_{ij})/\partial r_{ij} = (-\pi/4D)\cos\{(\pi/2)(r-R)/D\}$$
$$(R - D < r < R + D)$$
$$\partial f_c(r_{ij})/\partial r_{ij} = 0 \quad \text{(Otherwise)}$$
Also, $$\partial V_{ij}/\partial \zeta_{ij} = (\partial V_{ij}/\partial b_{ij})(\partial b_{ij}/\partial \zeta_{ij}) \qquad (18)$$
$$= -Bf_c(r_{ij})\exp(-\lambda_2 r_{ij})(-1/2n) \times$$
$$(1 + \beta^n \zeta_{ij}^n)^{-1/2n-1} \beta^n \zeta_{ij}^{n-1}$$
$$= Bf_c(r_{ij})\exp(-\lambda_2 r_{ij})b_{ij}(\beta \zeta_{ij})^n /$$
$$[2\{1 + (\beta \zeta_{ij})^n\}\zeta_{ij}]$$

Further, $$\partial \zeta_{ij}/\partial r_{ij} = 3\lambda_3{}^3 \sum f_c(r_{ik})g(\theta_{ijk})\exp\{\lambda_3{}^3(r_{ij}-r_{ik})^3\}(r_{ij}-r_{ik})^2 \qquad (19)$$

$$\partial \zeta_{ij}/\partial r_{ik} = (df_c(r_{ij})/dr_{ij})g(\theta_{ijk})\exp\{\lambda_3{}^3(r_{ij}-r_{ik})^3\} - \qquad (20)$$
$$3\lambda_3{}^3 f_c(r_{ik})g(\theta_{ijk}) \times \exp\{\lambda_3{}^3(r_{ij}-r_{ik})^3\}(r_{ij}-r_{ik})^2$$

$$\partial \zeta_{ij}/\partial \cos\theta_{ijk} = f_c(r_{ik})\exp\{\lambda_3{}^3(r_{ij}-r_{ik})^3\} \qquad (21)$$
$$(\partial g(\theta_{ijk})/\partial \cos\theta_{ijk})$$
$$= f_c(r_{ik})\exp\{\lambda_3{}^3(r_{ij}-r_{ik})^3\}$$
$$[2c^2\cos\theta_{ijk}/\{d^2 + \cos^2\theta_{ijk}\}^2]$$

Finally, $$\partial r_{ij}/\partial x_i = (x_i - x_j)/r_{ij} \qquad (22)$$
$$= -\partial r_{ij}/\partial x_j$$

Further, $$\partial r_{ij}/\partial x_i = (x_i - x_k)/r_{ik} \qquad (23)$$
$$= -\partial r_{ij}/\partial x_k$$

$$\cos\theta_{ijk}/\partial x_i = \{1/(r_{ij}r_{ik})\}\partial P_{ijk}/\partial x_i + P_{ijk}[(1/r_{ik})[\partial/\partial x_i\{1/r_{ik}\} + \qquad (24)$$
$$(1/r_{ij})\{\partial/\partial x_i(1/r_{ik})\}$$
$$= \{1/(r_{ij}r_{ik})\}(x_i - x_k + x_i - x_j) -$$
$$P_{ijk}[\{(x_i - x_j)/r_{ik}r_{ij}{}^3)\} +$$
$$\{(x_i - x_k)/(r_{ij}r_{ik}{}^3)\}]$$
$$= (1/r_{ik})[\{(x_i - x_j)/r_{ij}\} - \{(x_i - x_k)/r_{ik}\cos\theta_{ijk}\}] +$$
$$(1/r_{ij})[\{(x_i - x_k)/r_{ik}\} - \{(x_i - x_j)/r_{ij}\cos\theta_{ijk}\}]$$

$$\partial \cos\theta_{ijk}/\partial x_j = (-1/r_{ij})[\{(x_i - x_k)/r_{ik}\} - \{(x_i - x_j)/r_{ij}\cos\theta_{ijk}\}] \qquad (25)$$

$$\partial \cos\theta_{ijk}/\partial x_k = (-1/r_{ik})[\{(x_i - x_j)/r_{ij}\} - \{(x_i - x_k)/r_{ik}\cos\theta_{ijk}\}] \qquad (26)$$

The above calculation shave been conducted with respect to the x direction. Thus, it is necessary to prepare the corresponding equations with respect to the other y and z directions. In this case, 'x' in the above equation scan be replaced merely by 'y' or 'z'.

The inventors further advanced the above volume-constant calculation. This volume-constant calculation is applied when atoms move in a system but the overall volume of the system is kept constant. The aforementioned technique is based on the volume-constant calculation and thus no special attention is paid to volume change. In the latter case, it is generally necessary to establish a Lagrange's motion equation taking into consideration the internal energy of kinetic energy, potential energy, entropy, volume, etc. The lagrangian is expressed as follows.

$$L(r_i, \partial t, V, \partial V/\partial t) =$$
$$(1/2)\sum_m (\partial r_i/\partial t)^2 - U + \{(1/2)(M(\partial V/\partial t)^2\} - P_E V$$

where $P_E$ is an external pressure and U is a potential energy. In a pressure-constant calculation, the volume V varies in such a manner that the internal pressure becomes equal to the external pressure. M is virtual mass. The Langrange's equation is established on the basis of the virtual mass. That is, the following equation is satisfied, $$(\partial L(q_j, q'_j)/\partial q_j) - d(\partial L/\partial q'_j)/dt) = 0$$

Calculation is advanced based on this equation. With respect to even this part, the inventors also conducted the strict calculation.

As has been explained above, in the present system, the motions of the respective Si atoms were strictly examined. Accordingly, although the basic outputs are the position, velocity, force, etc. of each particle with respect to time, various macroscopic factors can be also calculated. As an example, a thermal conductivity can be found. The inventors examined the accuracy and basic operation of the system on the basis of the found thermal conductivity. In this system, further, some device is taken so that single crystal can be handled as finite temperature. In some of the conventional calculation systems, single crystal is handled as absolute zero, which results in that thermal flux becomes infinite and thus thermal conductivity cannot calculated accurately. In order to avoid this, the inventors added 'thermal bath' to both ends of a crystal to manage the energy transfer therebetween. As a result of the calculation, as shown in FIG. 138, a value of 180 Watts/meter/Kelvin is obtained. This value seems satisfactory within an error range of about 20% because its usual value is 148–150 Watts/meter/Kelvin in general literatures.

First, with use of the simulator, a varying motion of each particle of the amorphous thin film on an oxide film with time is precisely examined. For example, shown in FIG. 139 are photographs of motions of respective particles at the growth front when the crystal growth is advancing at 600° C. It will be seen from the photographs that the atomic density within the amorphous thin film is lowered in the vicinity of the growth front.

The following is the analysis results with use of the aforementioned simulator.

First, careful examination is made as to the varying motions of the particles of the amorphous thin film on the oxide film with use of the simulator. Its results are shown in Table 1.

TABLE 1

|  |  | 600° C. | 525° C. | 400° C. |
|---|---|---|---|---|
| Surface without $SiO_2$ | $\Delta x$ | 0.3135 Å | 0.3011 Å | 0.2782 Å |
|  | $\Delta v$ | 6.388 × 10$^{-3}$ Å/fs | 6.102 × 10$^{-3}$ Å/fs | 5.617 × 10$^{-3}$ Å/fs |

TABLE 1-continued

|  |  | 600° C. | 525° C. | 400° C. |
|---|---|---|---|---|
| Surface with SiO$_2$ | ∂x | 0.1792 Å | 0.1700 Å | 0.1542 Å |
|  | ∂v | 7.216 × 10$^{-3}$ Å/fs | 7.011 × 10$^{-3}$ Å/fs | 6.572 × 10$^{-3}$ Å/fs |

In the calculation, in particular, an average computational dimension is first found from the Si atoms fluctuation distribution and a square root of sum of the squares of values deviated from the found average computational dimension value is expressed in terms of ∂x. An average of the ∂x values in the depth direction corresponds to the aforementioned average inter-atomic distance. In Table 1, the calculation is made with respect to the particles ranging from the surface layer of the amorphous thin film to a depth of about 1 angstrom from the surface immediately before the re-crystallization. As seen from Table 1, the ∂x is 0.3135 angstroms at 600° C. for example, and the lower ∂x values are for the oxide film coated on the amorphous thin film immediately before the re-crystallization. That is, the ∂x is 0.1792 angstroms at 600° C. Even in this case, the calculation is made with respect to the particles ranging from the surface layer of the amorphous thin film to a depth of about one angstrom from the surface.

It will be appreciated from the comparison between the two values that, when the atomic fluctuation dimension for the amorphous film coated thereon with the oxide film is smaller than the case of the non-coated oxide film. When the influence range of the ∂x fluctuation is checked, it has been found that the influence remains until about 200 angstroms at about 600° C.

Further, as shown in Table 1, at 525° C. ∂x=0.3011 angstroms when the surface oxide film is not coated on the amorphous thin film while ∂x=0.1700 angstroms when the surface oxide film is coated thereon. Further, at 400° C. as shown in Table 1, ∂x=0.2782 angstroms when the surface oxide film is not coated on the amorphous thin film while ∂x=0.1542 angstroms when the surface oxide film is coated thereon.

From the analysis of the simulation results by the inventors, the following interpretation may be made. That is, when the semiconductor thin film is made thinner as mentioned above, the average inter-atomic distance is increased so that atoms can move highly easily. Accordingly, under such a condition, not only the recrystallization can be established starting from the 'seed' portion at a very high rate but also a very good quality of crystal can be obtained. FIG. 6, (a) and (b) show a relationship between calculated and actually measured values of the film thickness and average inter-atomic distance. In FIG. 6, the abscissa represents the depth direction of the film thickness and the ordinate represents the average inter-atomic distance. It will be seen from the drawing that the thinner the film is the larger the average inter-atomic distance is.

It has also been confirmed that, in the absence of the 'seed' portion, the amorphous film is sequentially solidified into grains. In this case, it has been found that, according to the inventors' calculation, once the amorphous film start its solidification into grains, the internal energy cannot be discharged anywhere, so that the temperature is correspondingly increased and the re-crystallization is further promoted.

The prepared simulator predicts that, before the re-crystallization, the thinner the film is the more the bonding state of the amorphous film surface and interior thereof is 'loose', and only the underlying boundary provides its structure information.

The inventors have analyzed why the amorphous film is solidified into grains with use of the aforementioned simulator, and confirmed that the grain solidification results from the force tending to make the internal energy less.

From the foregoing consideration, it has been confirmed that, as the inventors' examination results, the quality of the resultant single crystalline film is not associated with the partial oxygen pressure of the film forming gas at all, that is, it is based on a fully another phenomenon. According to the method suggested by the inventors, a very good single crystal is obtained and such defects as twins are not observed in the crystal at all.

In the absence of the 'seed' portion, the inventors' calculation has showed that the crystallization starts from its surface side, extends downward and the atom density of a zone of the tip front of the crystal growth becomes low. It has also been found from the simulation results that tensile distortion takes place in the low atom density zone.

Further, when the amorphous thin film is heated to about 600° C., the re-crystallization starts. At this time, a low atom density zone is generated in the amorphous film in the vicinity of the growth front. Generally speaking, an amorphous film is formed by a CVD process under ordinary film formation conditions, the density of the formed amorphous film is smaller than that of its single crystal and the average inter-atomic distance thereof is larger than that of its single crystal. This is because the re-crystallization requires the density to increase, so that much atoms of the amorphous film side are attracted toward the crystal side. As the crystallization advances, reduction in the density at the crystallization front becomes remarkable. However, when an amorphous film having an average inter-atomic distance nearly equal to the average inter-atomic distance of its single crystal is previously prepared, such as a low density zone will not appear. Accordingly, the crystallization distance can be extended to a far position.

In order to prove the above, the following experiments were conducted. First, as shown in FIG. 140, an insulating film is formed on an (100) silicon substrate and an opening is partially made in the insulating film to be used as a sample with the partly opened silicon substrate as a 'seed'. An amorphous silicon film of 200 nm thick is deposited on the sample under conventional deposition conditions of a temperature of 525° C. and a SiH$_4$ partial pressure of one Torr, the resultant wafer is subjected to a heat treatment of 600° C., and then subjected to measurements of the growth in the (100) direction.

The resultant amorphous film is measured with use of an optical microscope, which is shown in FIG. 141(a). FIG. 141(a) shows a typical photograph taken by the optical microscope direct from its top, in which a white zone refers to an already single-crystallized zone. It will be seen from the photograph that the crystallization is uniformly extended from the 'seed' to 1 μm with a good reproduction ability, and a further additional heat treatment causes the growth front to extend in a wavy manner. FIG. 141(b) shows a typical time dependence of growth distance obtained when the film is subjected to a heat treatment at 600° C. for 5 minutes and its photographs are taken several times and the growth distance is measured from the movement of the growth front during horizontal solid phase growth. In the drawing, a straight line is not passed through its origin. However, this is considered due to the reason that the crystal growth starts to extend first directly upwardly from the 'seed' and then horizontally, so that the horizontal growth rate is delayed by a time corresponding to its upwardly-extended growth. It will be seen from the drawing, when a growth rate is found from the gradients of the respective lines 'a' and 'b', the growth rate, though somewhat varied, is 100 nm/min. in a growth range of between 1.5 and 2.0 µm and then decreased to ¼ of 100 nm/min. Once the growth starts to be delayed, the growth rate cannot be restored to the initial rate and the growth front becomes wavy. And the growth hits against the crystal generated as started from the non-seed portion, at which state the growth is stopped.

Next, observation is made as to the extending growth front (boundary between the amorphous silicon and crystal) by a transmission electron microscopy (TEM), and its detailed analysis is made. Given as typical ones in FIGS. 142, 143, 144 and 145 are cross-sectional photographs of the growth ends of the resultant films where the growth is extended to 0.5 µm and to 2 µm, respectively. As a result, it has been found that these correspond to a (110) silicon plane preferential growth and a (111) silicon plane preferential growth mode, respectively.

This is shown by a model form in FIG. 146. That is, it has been found that, as the growth is extended horizontally in the (100) direction, the preferential growth plane varies.

Further, the inventors measured stresses within the film by a Raman microscopy, which results are given in FIG. 147. As will be seen from FIG. 147 that substantially no stresses appear in the 'seed' and the stress reaches about $3 \times 10^9$ dyn/cm$^2$ at a position away about 1 µm from the seed.

From these facts, a change in the preferential growth plane from the (110) silicon plane to the (111) silicon plane is considered as follows.

First, the shearing yield stress of silicon seems to be $2–3 \times 10^9$ dyn/cm$^2$ at temperatures during the crystallization and this stress value seems to occur at a position to which the growth is extended more than 0.5 µm horizontally from the 'seed'. It is considered that this stress causes a shift of the (111) silicon plane and change of the (111) silicon plane to the preferential growth. According to his theory, as the growth advances the (111) twin subsequently takes place, so that the stress becomes constant and the crystal quality is not restored when the distance from the seed is more than 1 µm. This is proved in fact by FIG. 26 showing the cross-sectional TEM photograph where the (111) twin appears. Further, though the dimensional position is somewhat erroneous, the change point of the growth rate corresponds to the generation position of the (111) plane preferential growth mode.

In this way, it has been found that the stress within the film affects the crystal growth highly disadvantageously. For the purpose of reducing the stress, the inventors has examined various causes of the stress generation, noticed the fact that the stress does not appear in the 'seed' portion and is increased with the growth, and found that the stress is caused by the volume change during the crystallization of the film as one of the causes.

As the film grows, its volume also varies. This is considered due to the fact that, even when the film is made up of identical atom elements, the bonding length between atoms is different between the single crystalline and amorphous states. Therefore, the inventors believed that, even when an amorphous film is employed, the stress can be made to disappear therein so long as the average inter-atomic distance of the amorphous film is previously set to be equal to the average inter-atomic distance of its single crystal.

Based on such consideration and expectation, an amorphous thin film having an average inter-atomic distance nearly equal to that of its single crystal is previously formed and subject to a horizontal solid phase growth process. As expected, there could be obtained a single crystalline thin film which is free of such crystal defects as twins and has a good crystal quality.

In this way, when the amorphous is contacted with a single crystalline exposure portion as a so-called 'seed' and the re-crystallization is carried out with one rush at a high rate with the 'seed' crystal, the re-crystallization dimension zone can be enlarged, before an undesirable re-crystallization portion takes place.

Meanwhile, in the case where the amorphous film is not contacted with the single crystalline exposure portion as the so-called 'seed', when a thin film having a thickness of less than of a predetermined value is prepared, the amorphous portion is aggregated and crystallized into a granular, defect-free single crystalline layer of grains.

The present invention provides a fully novel method zeroed in on the inter-atomic distance. The effects of the method based on such a new phenomenon in accordance with the present invention cannot be fully explained scientifically yet, but a least at the current stage, the present invention will be explained in connection with out experimental examples.

BRIEF DESCRIPTION OF THE DRAWINGS

FIG. 38 illustrates a Raman measuring system used in the fourteenth embodiment of the present invention;

FIG. 44 a sample structure used in the sixteenth embodiment of the present invention;

FIGS. 45(a) and 45(b) illustrate an SEM image of silicon grains formed in accordance with the fifteenth embodiment of the present invention;

FIG. 62 illustrates a TEM image of the silicon thin-film obtained by the nineteenth embodiment of the present invention;

FIG. 77 illustrates variations in the characteristics of the MOS transistor formed on an underlying substrate before and after the steps;

FIGS. 78(a) and 78(b) illustrate steps of a method for manufacturing a semiconductor device in accordance with the twenty-third embodiment of the present invention;

FIG. 80 illustrates relationships between the distance from a seed and the characteristics in the transistors formed through the steps;

FIGS. 150(a) and 150(b) illustrate phosphorus concentrations in recrystallized films measured with use of a high resolution electronic microscope EDX;

FIGS. 151(a) and 151(b) illustrate phosphorus concentrations in gate oxide films measured with use of the same electronic microscope EDX;

DETAILED DESCRIPTION OF THE INVENTION

Embodiments of the present invention will be explained in detail with reference to the accompany drawings.

In order to obtain a Si single crystalline thin film, an amorphous Si film having an average inter-atomic distance corresponding to 1.02 times or more of the average inter-atomic distance of Si single crystal is previously used, and in order to suppress the growth of an oxide film on the amorphous film to loosen the inter-atomic distance immediately before solid phase growth, the film is subjected to a heat treatment in a non-oxidization atmosphere, e.g., in an $N_2$ atmosphere.

Figure 2:
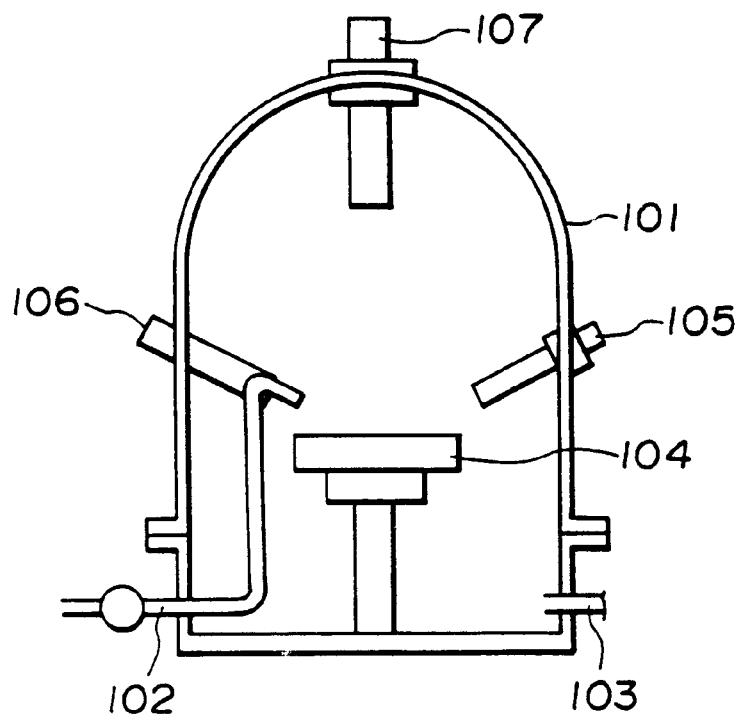
FIG. 2 is a thin-film forming apparatus used in the first embodiment of the present invention.

Turning first to FIG. 2, there is schematically shown a thin-film forming apparatus in accordance with a first embodiment of the present invention, which apparatus comprises a chamber 101, a inlet 102 for introducing therethrough a material gas for film deposition, an exhaust port 103, an a sample table 104 for carrying thereon a sample for a thin film to be formed thereon. The present embodiment is arranged to introduce, for example, a $H_2$ gas, an $SiH_4$ gas or a disilane gas as the material gas and as necessary, a doping gas may also be introduced. Although the single inlet is provided in the drawing for simplicity, the material gas inlet and the doping gas inlet may be separately provided close to the sample table as necessary. The sample table 104 is provided with a heating mechanism for suitably increasing or decreasing the temperature of the table. In the illustrated example, there is also provided an estimation device ( a special reflection high energy electron diffraction (RHEED) device for judgment of crystal quality which includes a beam radiating means 105 for radiating a beam onto the sample and a light receiving tube 106 for receiving electrons reflected on the sample to accurately monitor the 'average inter-atomic distance'. The beam irradiating means and the light receiving tube can cooperate to direct light onto the sample and to reflect the incident light thereon at a very angle that may be suitably modified. Provided above the sample table is a special Raman spectroscope 107 which forms one of the constituent elements of the crystal quality estimation device.

Figure 3A:
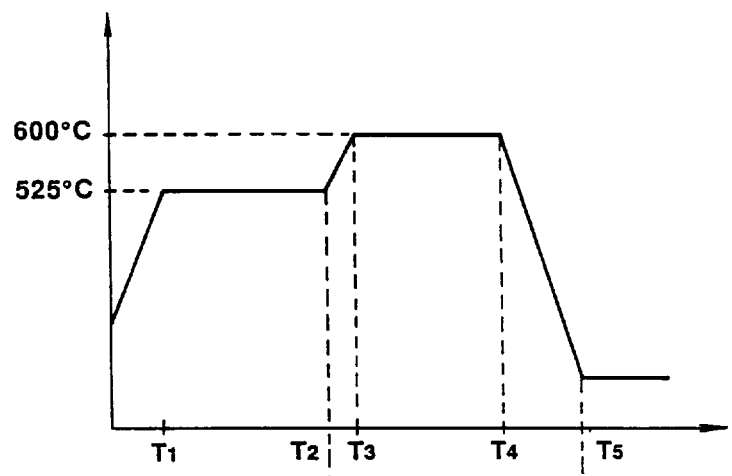
FIGS. 3(*a*) and 3(*b*) schematically illustrate a sequence of film deposition in the first embodiment of the present invention.

Explanation will be made as to how to form a thin film with sue of the above thin-film forming apparatus. FIGS. 3(a) and (b) schematically show a film deposition sequence in the first embodiment of the present invention. In FIG. 3, abscissa represents time and ordinate represents temperature. FIGS. 4(a) to (c) shows steps of a method for forming a thin film. In FIG. 3, the temperature in the ordinate is measured by means of a thermocouple attached onto the sample table 104 of FIG. 2. Of course, the thermocouple is previously fully calibrated.

First of all, as shown in FIG. 4(a), a silicon oxide film 202 is previously deposited on a p-type single crystalline (100) silicon substrate 201, which is subjected to a photolithography process to make an opening 203. For the purpose of cleaning the substrate, etc. prior to deposition of a thin film and at a time point earlier than a time $T_1$ in FIGS. 3(a) and (b), the above laminate is subjected to a cleaning operation at a predetermined temperature with a predetermined gas composition.

Subsequently, as shown in FIG. 4(b), an amorphous silicon film 204 of 31.5 nm thick is deposited on the cleaned laminate. A duration between points $T_1$ and $T_2$ in FIG. 3 corresponds to a so-called film forming process and the film forming temperature is 525° C. in the present first embodiment.

The resultant laminate is subjected to a heat treatment in an $N_2$ atmosphere for re-crystallization. This heat process corresponds to a duration between time points $T_3$ and $T_4$ in FIG. 3 and the processing temperature is, e.g., 600° C. Thereafter, the temperature is gradually decreased and the resultant laminate is taken out after a time point $T_4$. In this way, such a single crystalline silicon film 205 as shown in FIG. 4(c) is obtained. When film formation is carried out with the processing temperature and gas composition changed in the film forming process between the time points $T_1$ and $T_2$ under such a condition that a film forming rate R satisfies the following equation, films having average inter-atomic distances of 1.02 or more were obtained.

$$\log R(\text{Å/min}) \geq -10614/T(K) + 14.857$$

Figure 5:
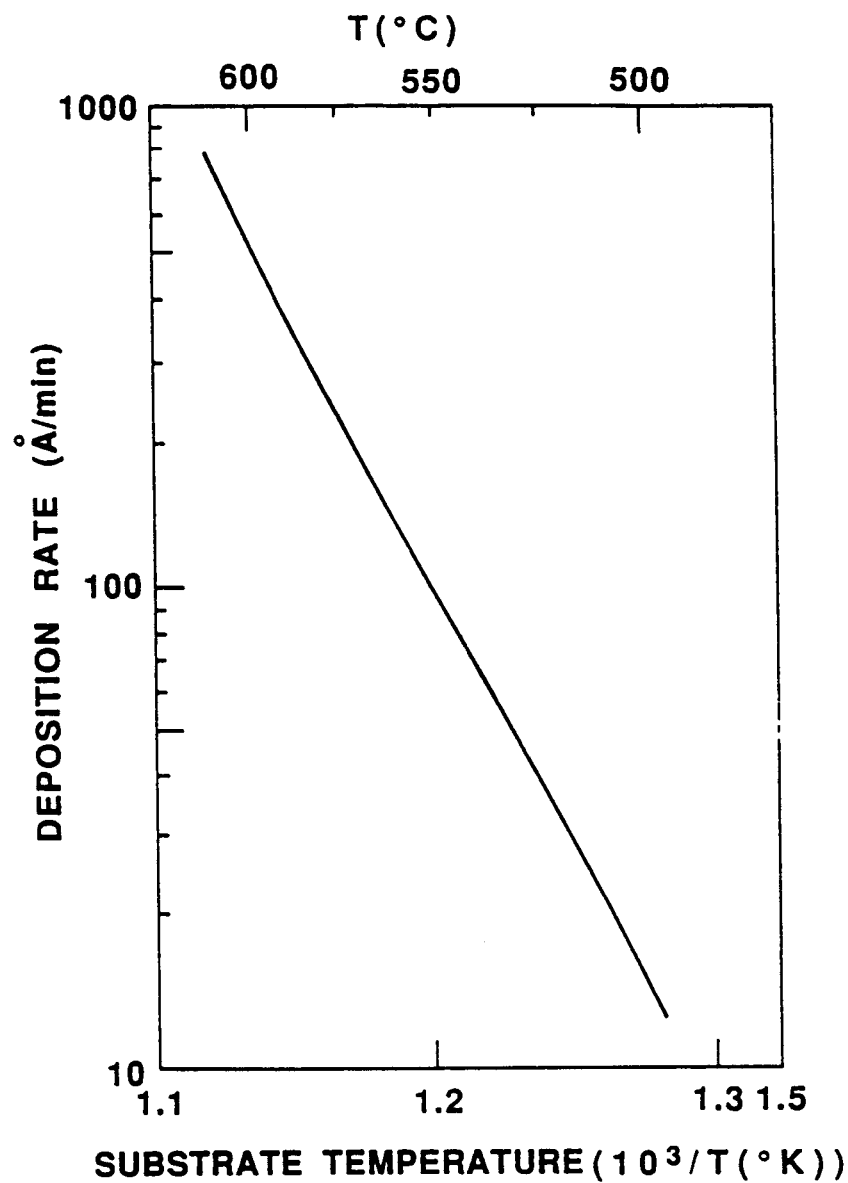
FIG. 5 illustrates a relationship between film forming rate and substrate temperature for obtaining an amorphous silicon film having an average inter-atomic distance of 1.02 or more in the first embodiment of the present invention.

An area satisfying the above condition is given in FIG. 5. In an area other than the condition-satisfied area, no films having an average inter-atomic distance of above 1.02 could be obtained.

In this embodiment, for the purpose of holding the average inter-atomic distance to be 1.02 times or more of the average inter-atomic distance of silicon single crystal, a vacuum condition is maintained in the chamber 101 of FIG. 2 to avoid adhesion of an oxide film on the amorphous silicon film 203. And under such a condition, re-crystallization is carried out at a temperature of 600° C. corresponding to the processing temperature of the process duration between time points $T_3$ and $T_4$.

Figure 3B:
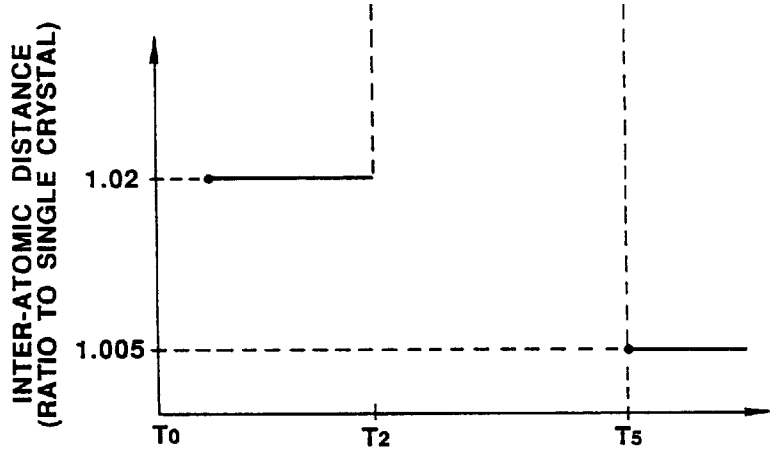
Figure 4A:
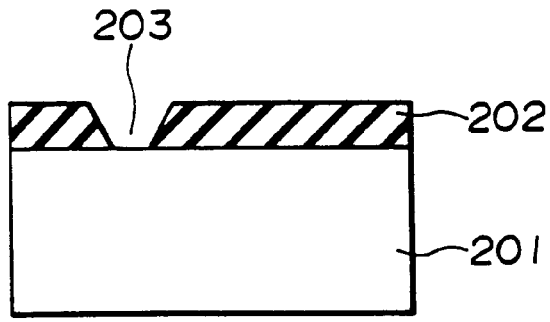
FIGS. 4(*a*) thru 4(*c*) illustrate thin-film forming steps in the first embodiment of the present invention.
Figure 4B:
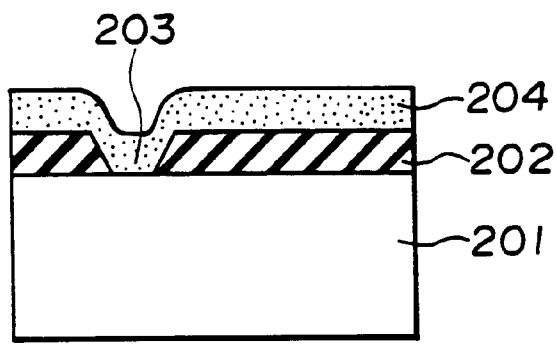
Figure 4C:
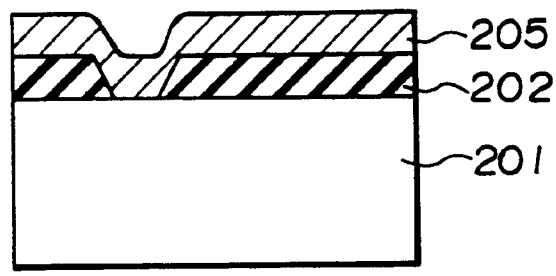

FIG. 3(b) schematically shows a transition of, e.g., the property of the film used here. The film property is evaluated, for example, with use of such a special RHEED device 105 and 106 and a special Raman spectroscope as shown in FIG. 2. Measured results are given in FIG. 3(b). In the drawing, abscissa denotes time and ordinate denotes average inter-atomic distance. At the time point $T_2$, that is, at the time of completion of the film formation, the average inter-atomic distance of the amorphous silicon film 203 on the silicon oxide film 202 corresponded to 1.02 times of the average inter-atomic distance of the silicon single crystal. At the time point $T_2$ at which the re-crystallization is already completed, the average inter-atomic distance corresponded to 1.005 times of the average inter-atomic distance of the silicon single crystal.

Figure 6A:
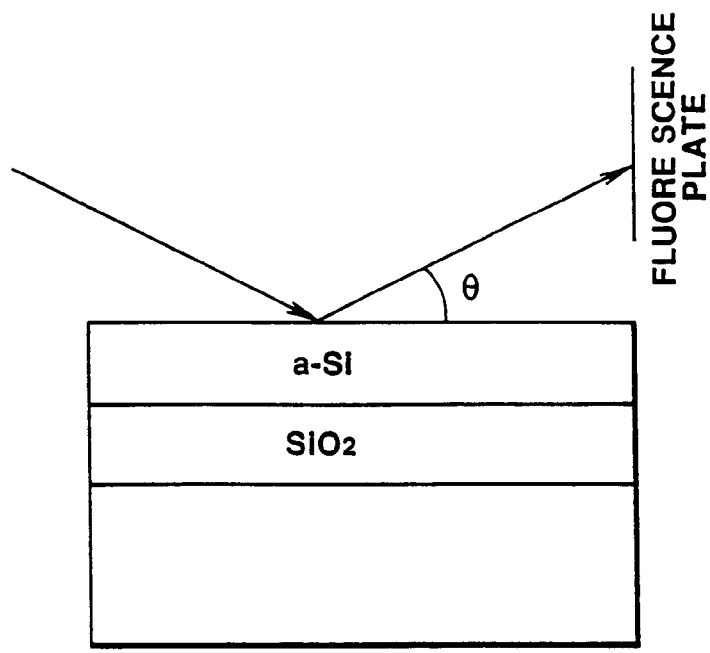
FIGS. 6(*a*) and 6(*b*) illustrate measured results of a relationship between the average inter-atomic distance and the depth from the surface of a semiconductor thin-film in accordance with the first embodiment of the present invention.

Thereafter, the property of the film in the chamber of FIG. 2 is evaluated, which evaluation results are given in FIG. 6. More specifically, FIG. 6(a) shows its measuring principle.

Figure 6B:
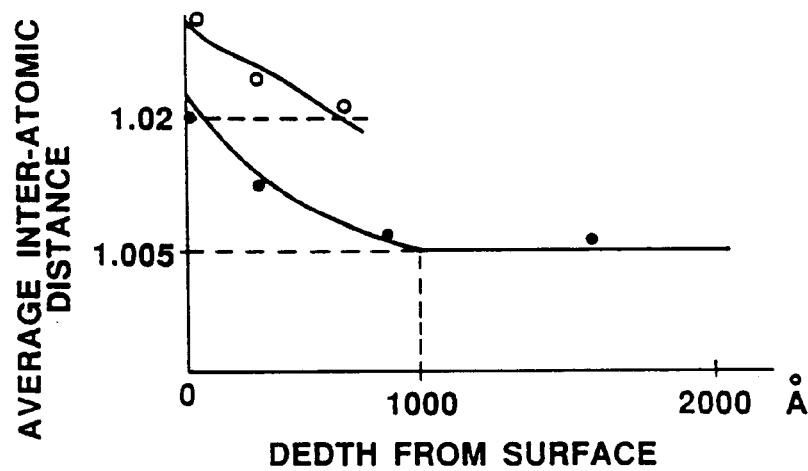
Figure 7:
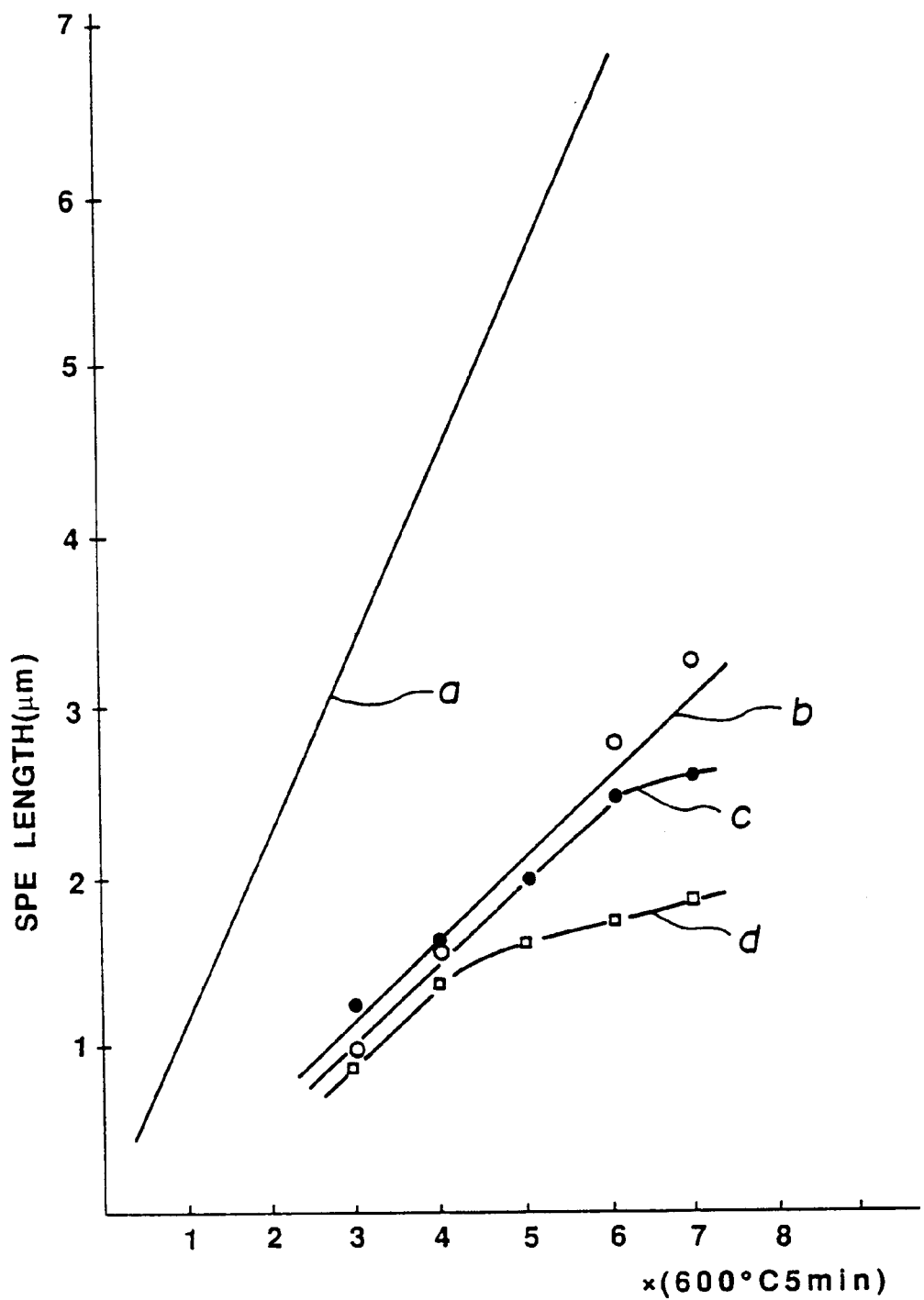
FIG. 7 illustrates results of horizontal solid-phase growth rate in a method of the first embodiment of the present invention and in a prior art for their comparison.

As will be seen from FIG. 6(b), the average inter-atomic distance is 1.02 or more in a depth zone from the film surface down to about 80 nm, and the deeper the distance is from the film surface the smaller the average inter-atomic distance is. FIG. 7 shows measured results with respect to horizontal solid phase growth rate, in which abscissa denotes re-crystallization time. In other words, this corresponds to the duration between the time points $T_3$ and $T_4$. The ordinate denotes horizontal re-crystallization distance. The longer the dimension of the horizontal distance is, its is more suitably utilized for an SOI device. And when the crystalline defects of the re-crystallization zone are more minimized, its application to the SOI device can be more advantageous. In FIG. 7, a curve 'a' corresponds to the aforementioned embodiment and curves 'b', 'c' and 'd' correspond to examples by the conventional method for comparison therebetween. In either case, the amorphous film is deposited to be 200 nm thick and on the way, is exposed to atmosphere without paying any special care. Thereafter, the film is placed in another furnace to be subjected to an annealing process in an $N_2$ atmosphere at 600° C. for one hours. The then average inter-atomic distance is 1.001. The conventional films thus recrystallized were low in re-crystallization rate and also contained many twins.

As will be seen from the drawing, the film based on the method of the embodiment of the present invention grows with a gradient corresponding to about 1.7 times of the gradients of the conventional films. As the gradient or growth rate becomes faster, the crystal quality becomes better and the crystal grows further.

As described in the above operation, in the course of re-crystallization from amorphous to single crystal, if there is such a part that causes undesirable generation of a crystalline nucleus, this leads to not only its undesirable crystal quality but also to such a disadvantage that the re-crystallization dimension grows insufficiently. Thus, for the purpose of improving the crystal quality and obtaining the sufficiently grown crystallization distance, it is necessary to cause the re-crystallization at a rate as fast as possible. The results of the embodiment of the present invention indicates that, as appreciated from the above data, the invention offers good results to both of the 'crystallization rate' and 'crystal quality'. For attaining the above purpose, impurities are heavily doped or pressure is applied in the conventional method, whereas, fully novel method focused on the average inter-atomic distance is employed in the present invention.

In this way, the surface of the amorphous silicon film is cleaned to previously make the film thickness small, whereby atoms are coupled to some extent but the bonding between atoms is loose and relatively free, which results in that the dimension of the average inter-atomic distance can be increased. When heat treatment is carried out with the increased average inter-atomic distance being maintained, atoms on the surface of the amorphous silicon film tend to be able to easily move. Re-crystallization started from a single crystal exposure portion as a 'seed' with one rush at a high rate, and the re-crystallization dimension zone could be expanded before another re-crystallization portion undesirable generates.

Although the $N_2$ atmosphere has been employed in the re-crystallization step in this embodiment, a hydrogen or argon atmosphere may be instead used as necessary. Further, the solid phase growth temperature has been set higher than the deposition temperature in this embodiment, but the solid phase growth temperature may be set lower than the deposition temperature and be subjected to a heat treatment for a long time or the solid phase growth may be optically promoted. Furthermore, heat treatment may be carried out by means of electron beam.

Explanation will then be made in connection with a second embodiment of the present invention.

As an integrated circuit becomes very small, the size of a semiconductor device reaches its limit. Thus, the semiconductor device be reduced not only two-dimensionally but also three-dimensionally, that is, reduction of a channel region be attained not only by making small the interval between its source and drain but also by reducing the channel region its depth direction as well. For example, in the case of an MOS device, when a narrow channel length shorter than 0.1 $\mu$m is desired, it becomes necessary to make as a low-concentration layer only the surface proximity of a channel through which a current actually flows. In the reduction of device size, such a technique as a method for forming a very thin single crystalline layer will be indispensable in future. Further, when the present invention is applied to a bipolar transistor, the transistor can be operated at a higher speed by making the base region thinner. Therefore, the present invention finds a wide range of applications.

Figure 8A:
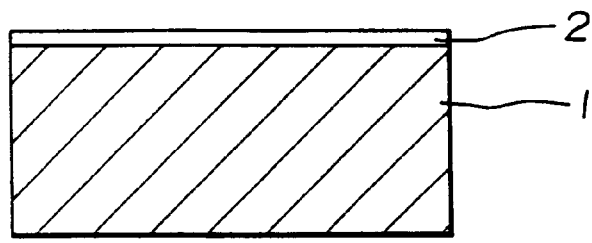
FIGS. 8(*a*) thru 8(*c*) illustrate steps of a thin-film forming method of the second embodiment of the present invention.
Figure 8B:
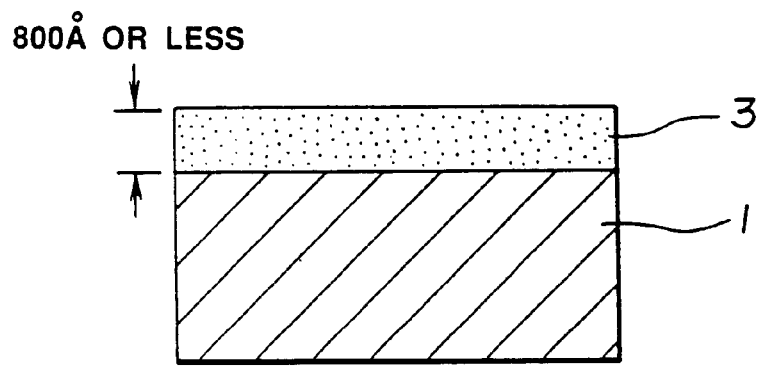
Figure 8C:
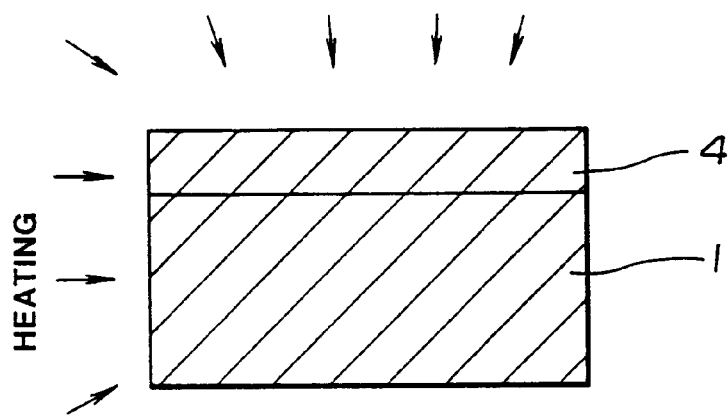

FIG. 8 shows a method for manufacturing a thin single crystalline silicon layer that can be used as a base region of a bipolar transistor in accordance with the second embodiment of the present invention.

First of all, as shown in FIG. 8(a), the surface of a silicon substrate is cleaned with 0.1% of hydrogen fluoride (HF) aqueous solution to remove a spontaneous oxide film 2 formed on the substrate. The cleaned substrate is placed in the apparatus of FIG. 2.

Then the temperature is increased to 525° C. while a hydrogen gas at 1 Torr and 10000 SCCM is introduced into the apparatus. Under a condition that the temperature is kept at 525° C., a silane gas at 3 Torr and 500 SCCM is introduced into the apparatus for two minutes so that the pyrolysis reaction of the silane gas causes deposition of an amorphous film on the substrate. The then average inter-atomic distance of the amorphous film corresponded to 1.02 times of the average inter-atomic distance of the single crystal. In this case, the average inter-atomic distance is monitored with use of an amorphous film deposited on a silicon oxide film provided on a separate substrate. When the thickness of an amorphous film 3 is set to be below 80 nm, the average inter-atomic distance is gradually increased from the average inter-atomic distance corresponding to 1.02 times of the average inter-atomic distance of the single crystal.

When a diborane gas in introduced together with the silane gas, a p-type semiconductor layer can be formed; while when a phosphine gas in introduced together with the silane gas, an n-type semiconductor film can be formed. In the illustrated example, only the silane gas is introduced.

Figure 1:
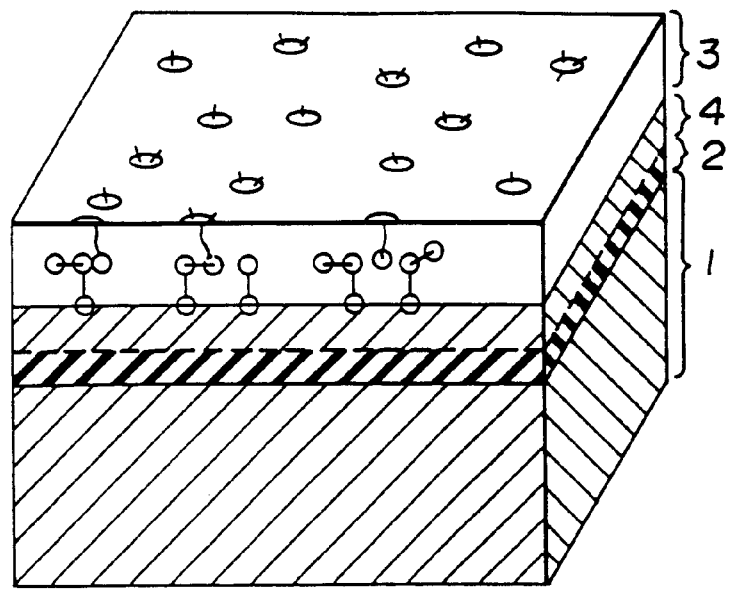
FIG. 1 is a diagram for explaining the principle of forming a semiconductor thin-film in accordance with the present invention.

In this way, the silane gas is introduced to form the amorphous silicon film 3. After this, a high purity of hydrogen gas is again introduced so that, while preventing oxidization of the surface of the amorphous silicon film, the temperature is raised to 600° C. and the film is kept for 10 hours. Even when the hydrogen gas is replaced by a high purity of argon gas, helium gas, or nitrogen gas, the same effects were obtained. Further, the chamber may be kept at a high vacuum level of below $10^{-4}$ Torr. In this way, during the heat treatment of the film in the non-oxidization atmosphere at 600° C., solid phase growth causes crystallization to take place from the underlying silicon substrate, whereby the amorphous silicon film 3 is changed to a single crystalline silicon layer 4, as shown in FIG. 8(*c*). At this time, it is considered that the average inter-atomic distance of the amorphous silicon corresponding to 1.02 times that of the single crystal is in its loose bonding state so that, as illustrated in FIG. 1, silicon atoms freely move out of the surface of the amorphous film and as the solid phase growth advances, excess silicon atoms move out of the surface or lacking silicon atoms are supplemented from the surface, whereby a high quality of single crystal can grow without any crystalline defects.

Figure 9:
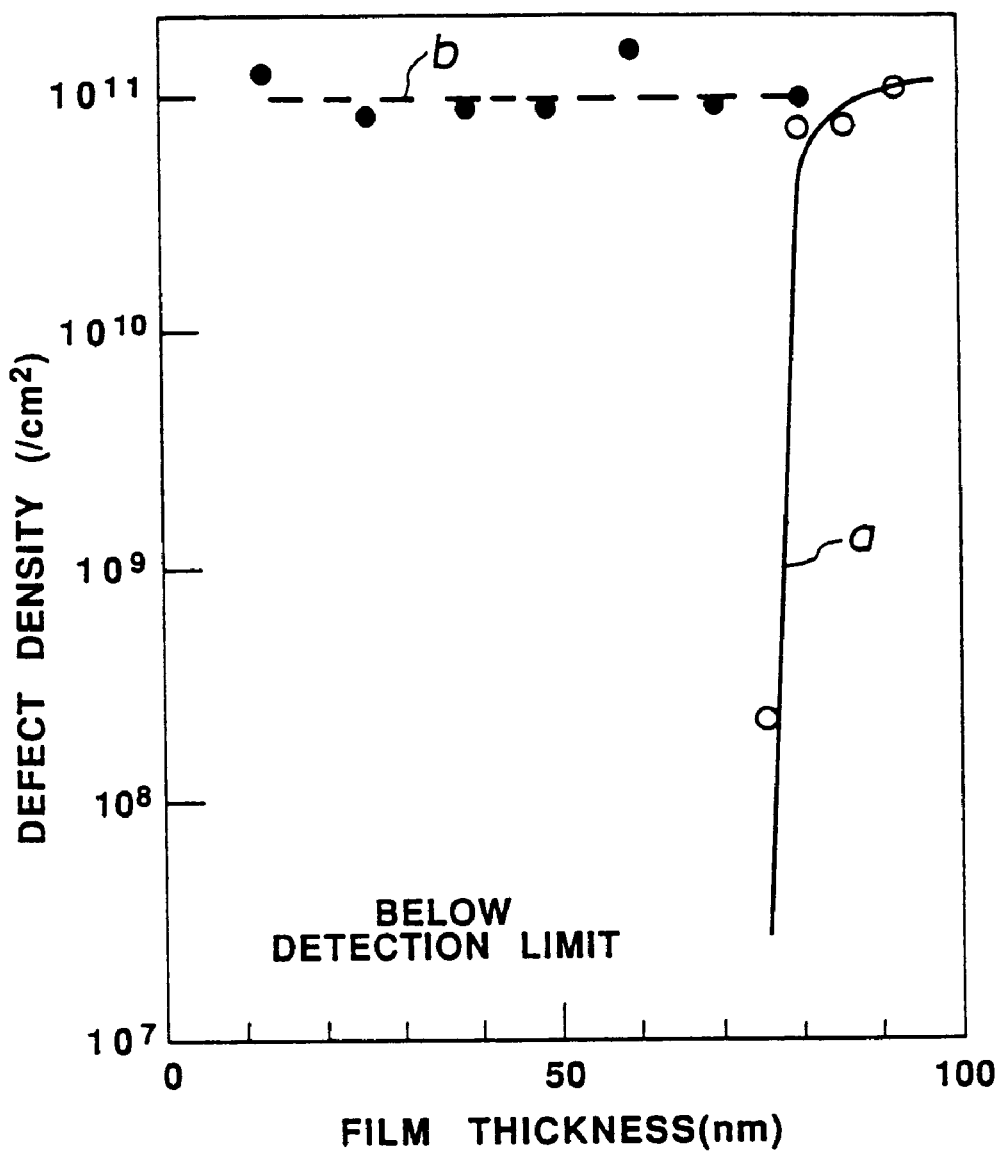
FIG. 9 illustrates relationships between the thickness of an amorphous silicon film and the defect density of a single crystalline silicon thin-film in the second embodiment of the present invention and in a prior art.

In order to measure a range where silicon atoms can move, a range where atom supplement from the surface can be realized or a range where the bonding potential of active silicon atoms on the surface can exert; the film thickness is changed to change the average inter-atomic distance of the amorphous film, and under conditions where the other conditions are exactly the same with respect to the different film thicknesses, the defect density is measured. More specifically, differences in defect density between two types of single crystalline films; one in which the growth of the amorphous silicon film and solid phase growth take place in the same channel and solid phase growth is carried out in the absence of the oxide film thereon and the other in which amorphous silicon films having various thicknesses are formed and as in the prior art, once shifted to another reaction furnace to form spontaneous oxide films thereon and thereafter solid phase growth is caused; were measured. Its measured results are given in FIG. 9. As seen from the drawing, it is desirable to set the thickness of the amorphous silicon film to be below 80 nm and when the film thickness is set to be above 80 nm, these effects cannot be exerted with the result of generation of crystalline defects.

Figure 10:
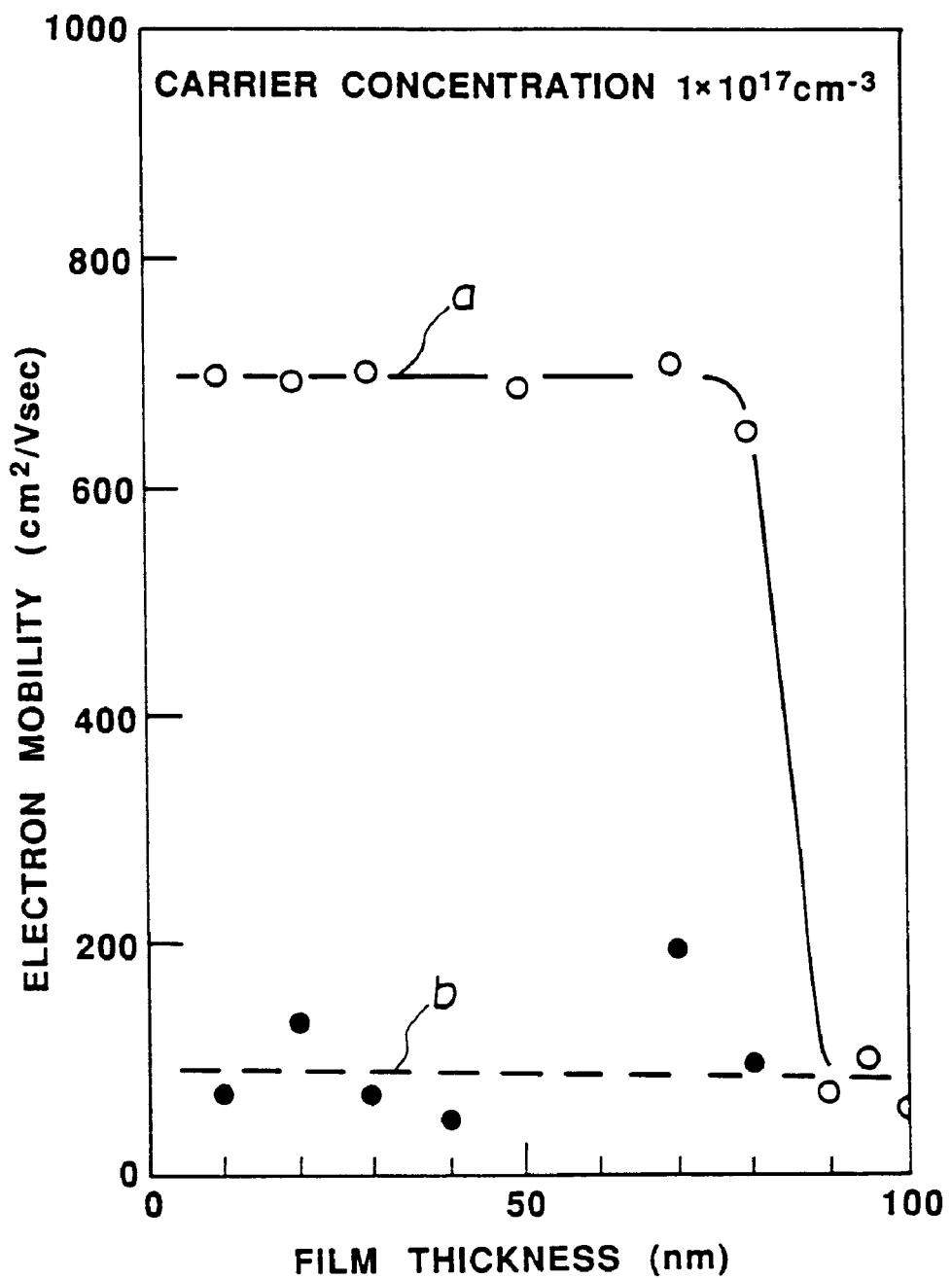
FIG. 10 illustrates relationships between the thickness of the amorphous silicon film and the electron mobility in the second embodiment of the present invention and in the prior art.
Figure 134A:
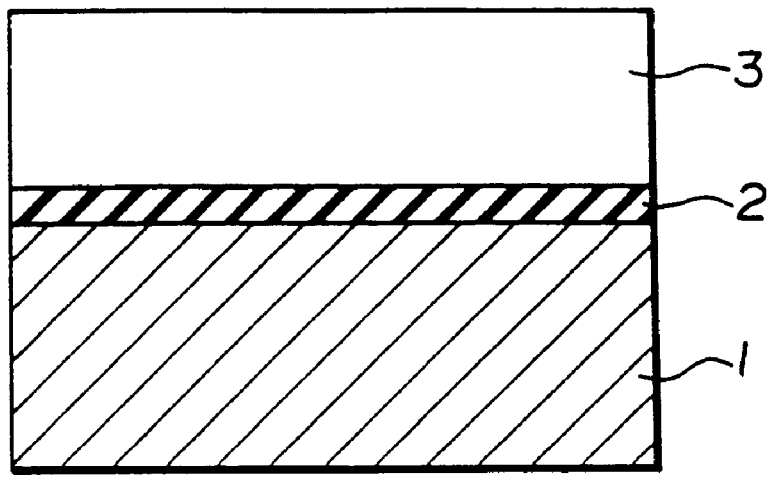
FIGS. 134(a) and 134(b) illustrate steps of a conventional method for forming a semiconductor thin film.
Figure 134B:
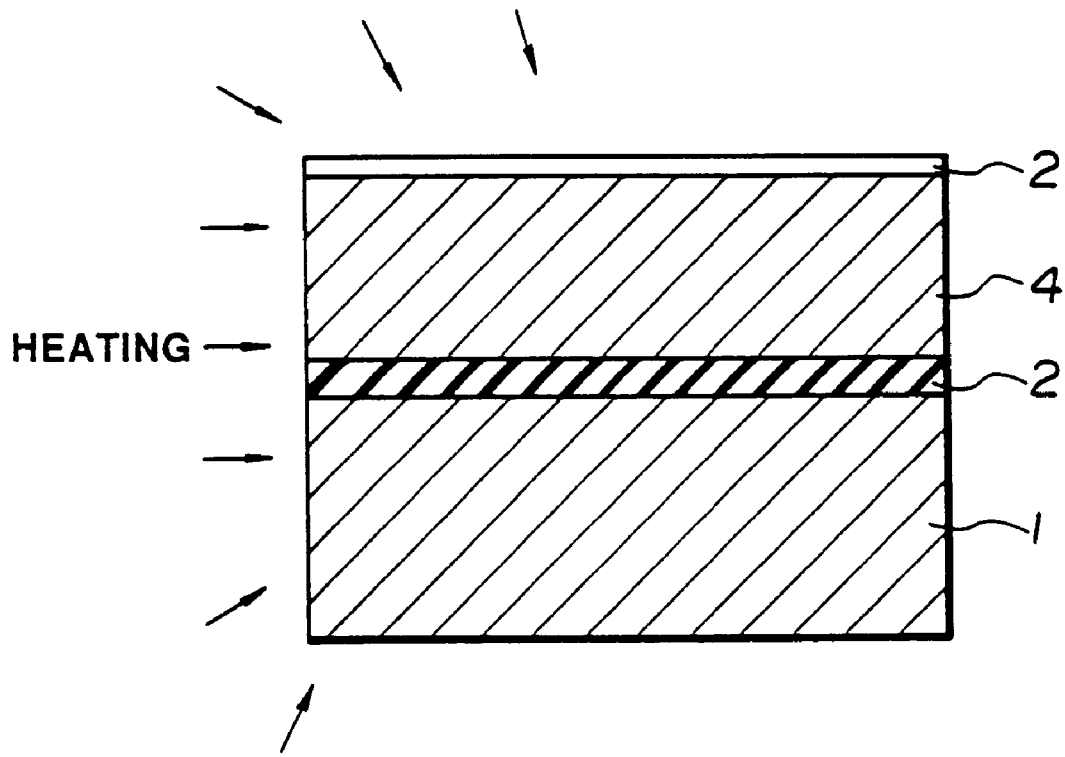
Figure 135:
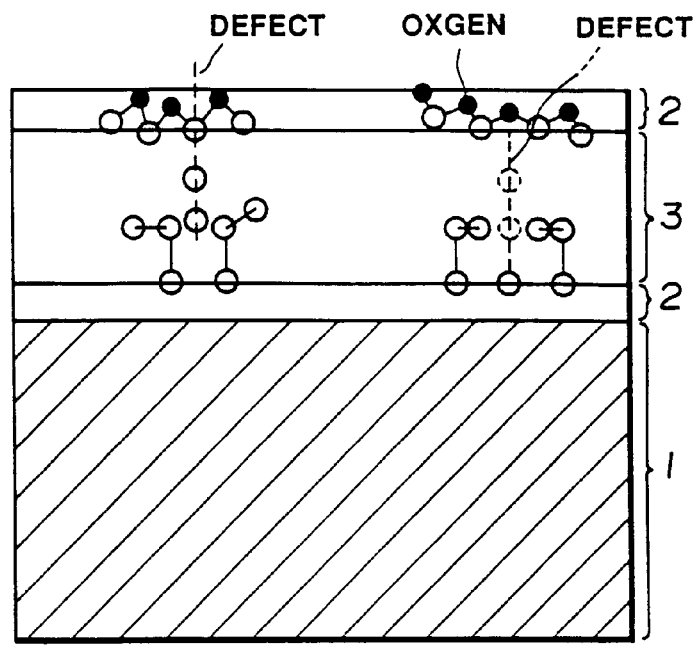
FIG. 135 is a diagram for explaining how the semiconductor thin film is formed in the prior art.
Figure 136:
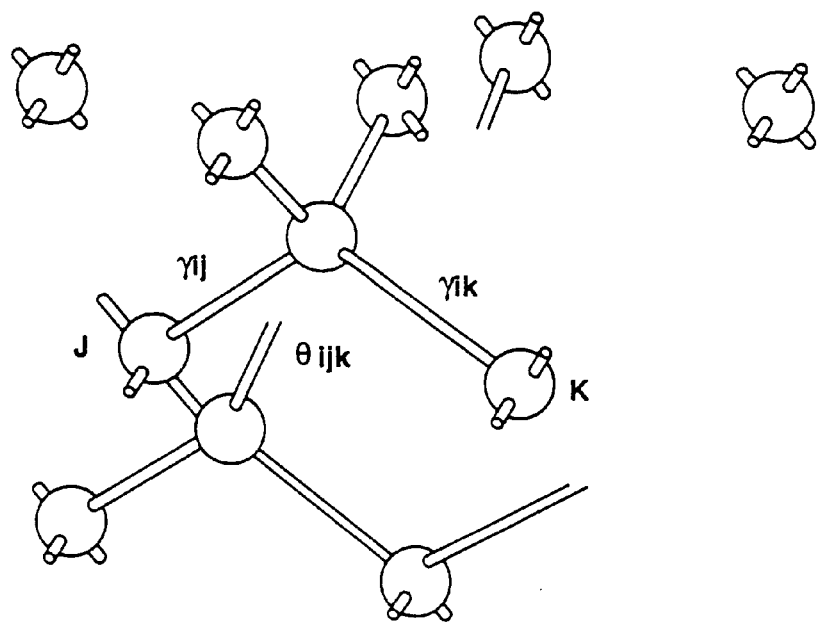
FIG. 136 illustrates a fundamental model of a simulator used to verify the present invention.
Figure 137:
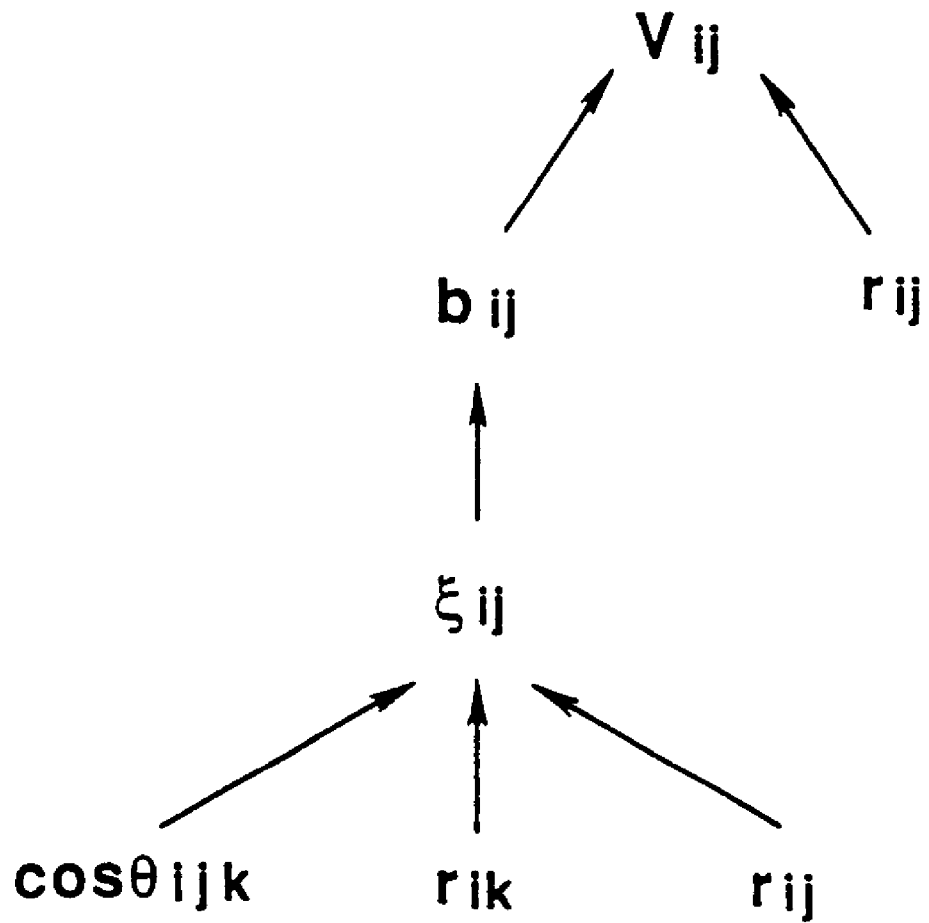
FIG. 137 illustrates variables of the simulator used to verify the present invention.
Figure 138A:
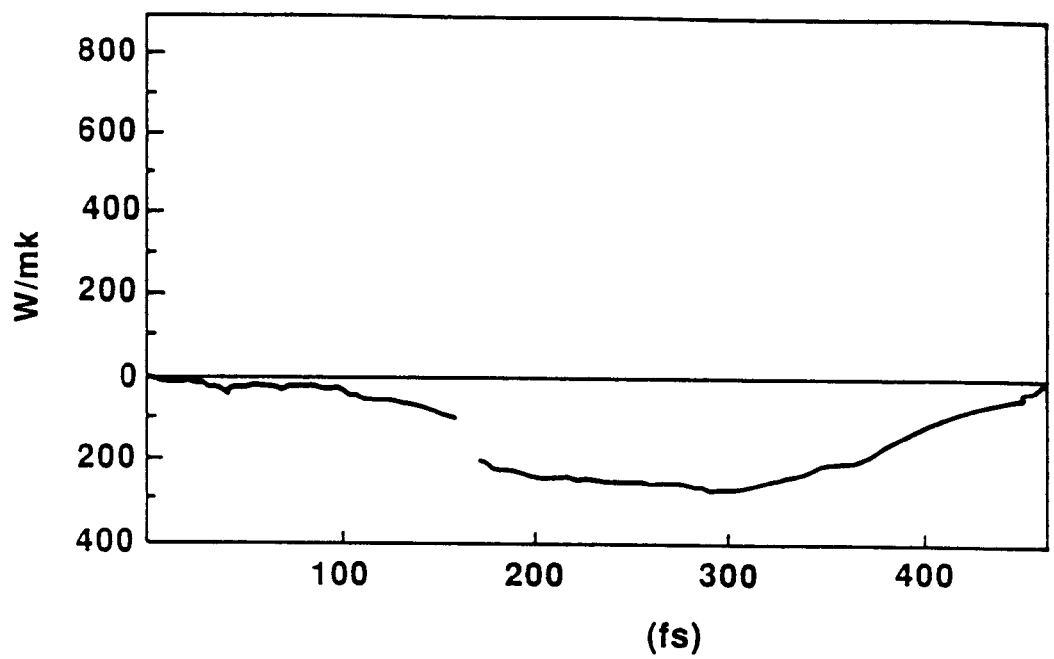
FIGS. 138(a) and 138(b) illustrate a basic output of the simulator used to verify the present invention.
Figure 138B:
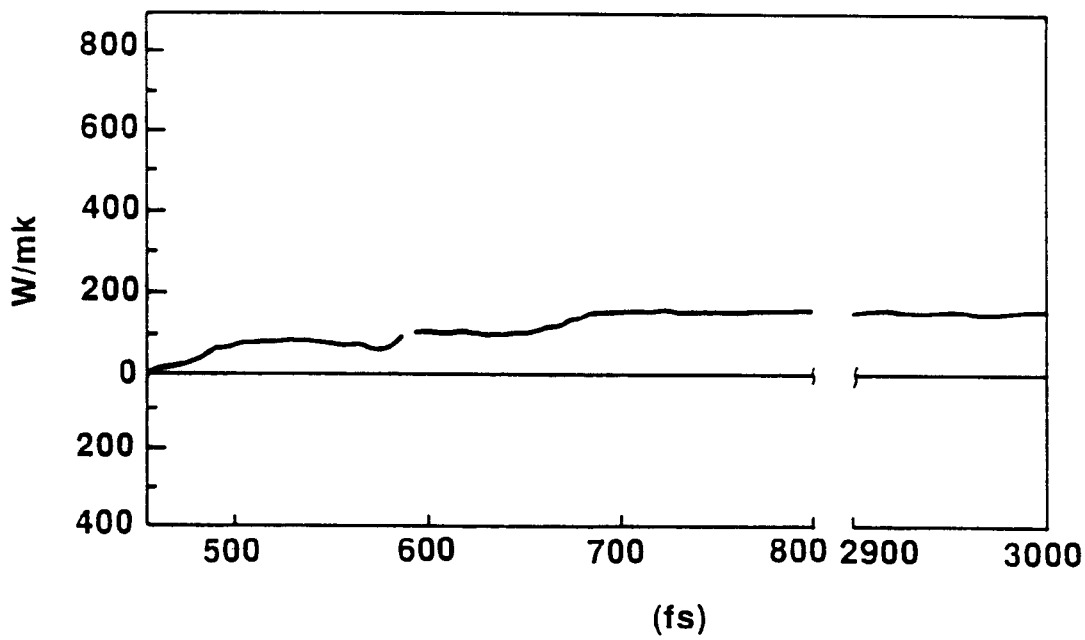
Figure 139A:
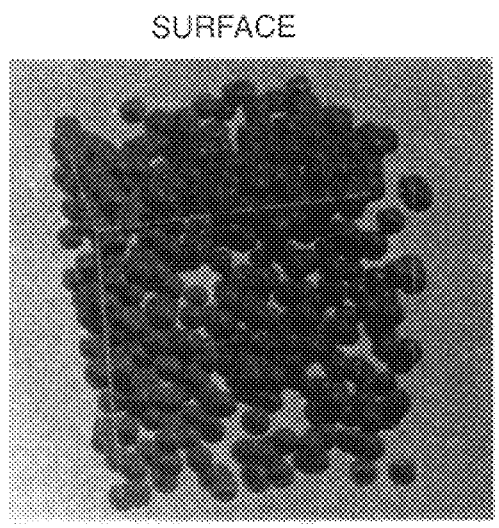
FIGS. 139(a) and 139(b) illustrate electron beam diffraction images of single crystalline thin-film samples formed by the conventional method.
Figure 139B:
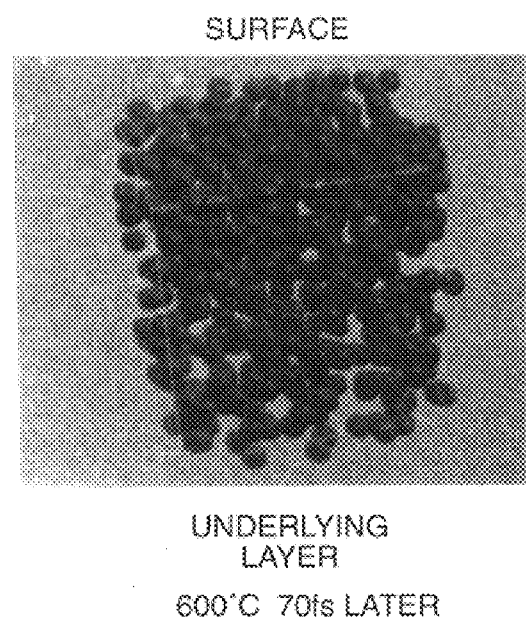
Figure 140:
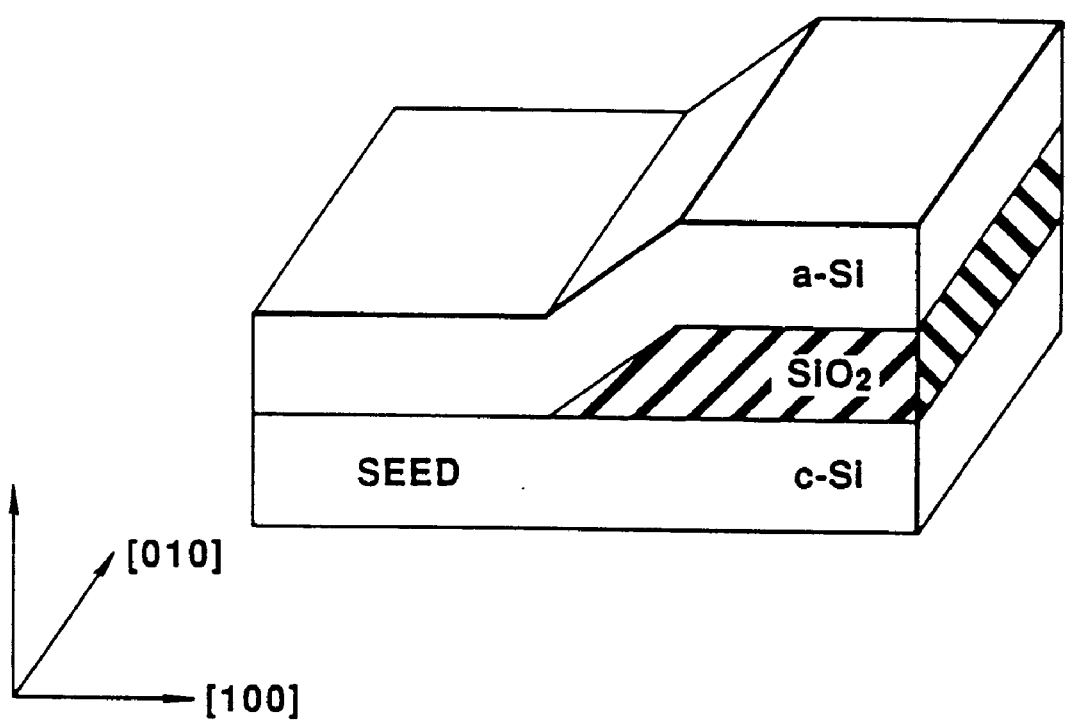
FIG. 140 illustrates a sample structure for explaining the prior art method.
Figure 141A:
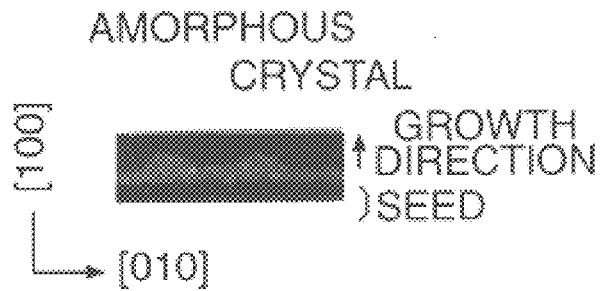
FIGS. 141(a) and 141(b) illustrate an optical microscopic photograph of the single crystalline thin-film obtained by the conventional method and a time dependence characteristic thereof with respect to growth distance.
Figure 141B:
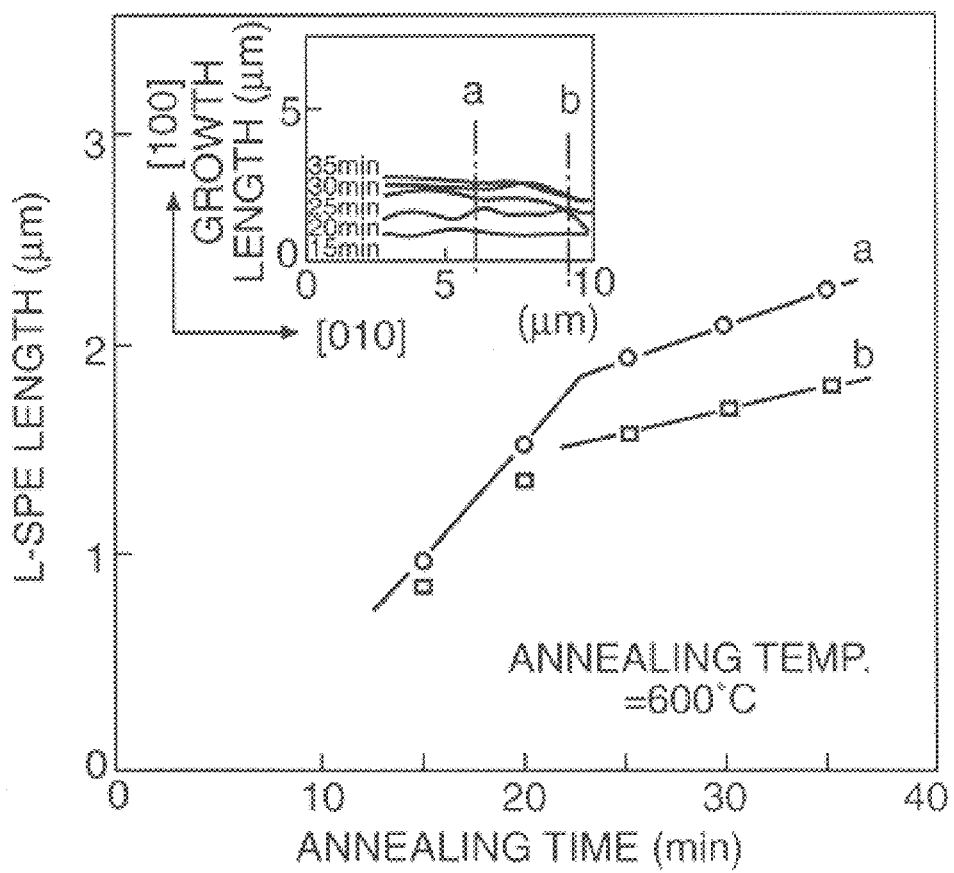
Figure 142:
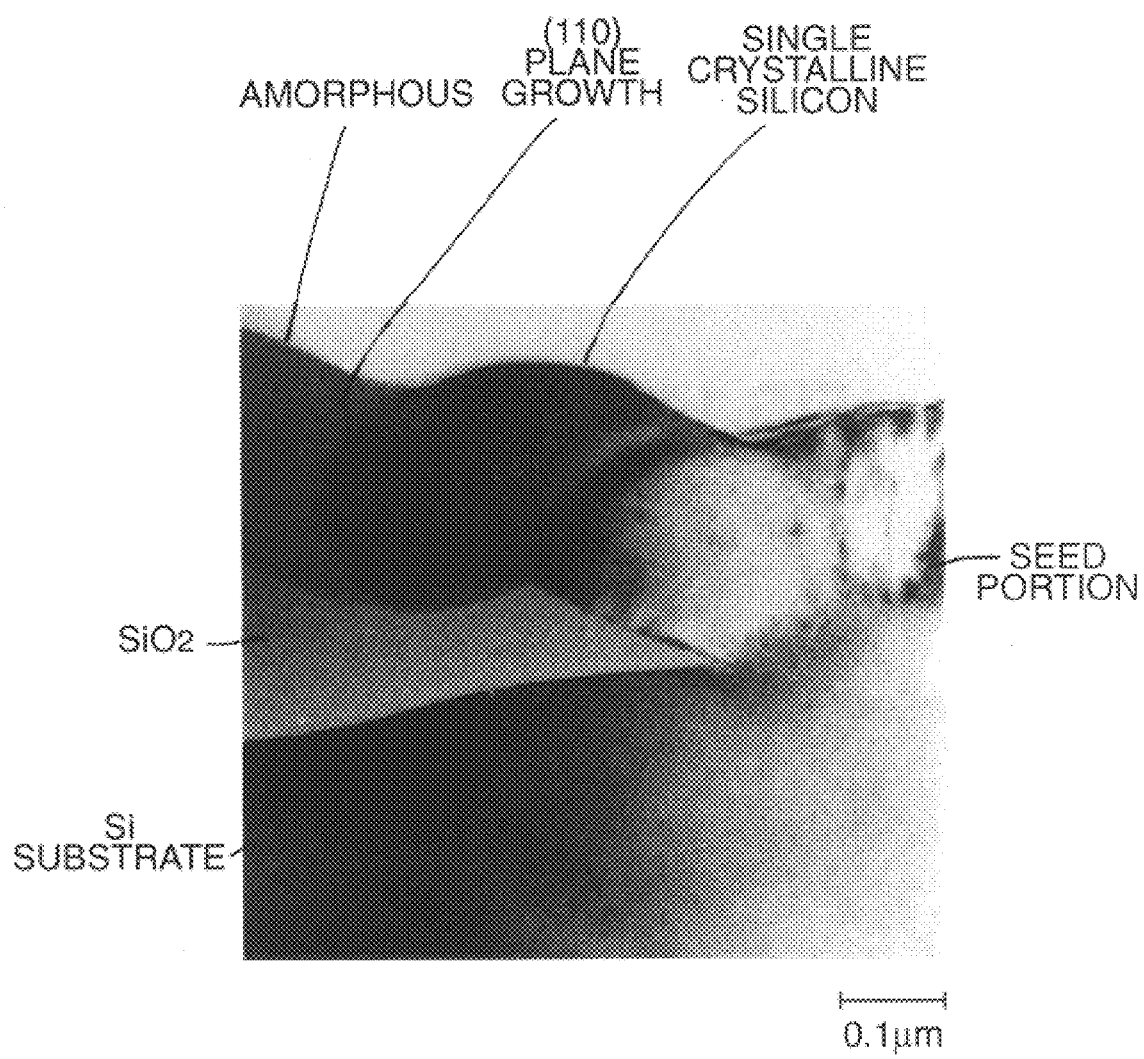
FIGS. 142 to 145 illustrate different TEM images of the semiconductor tin film obtained through the steps, respectively.
Figure 143:
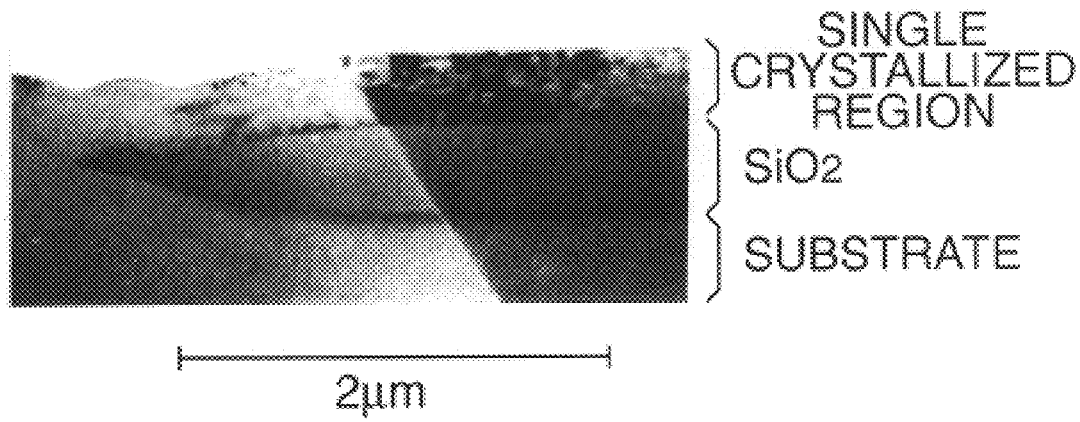
Figure 145:
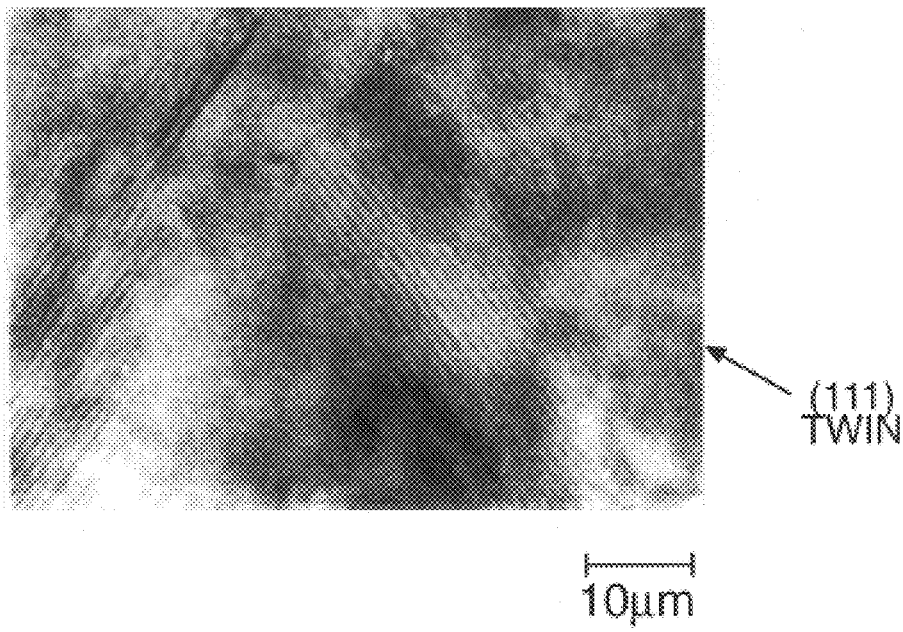
Figure 144:
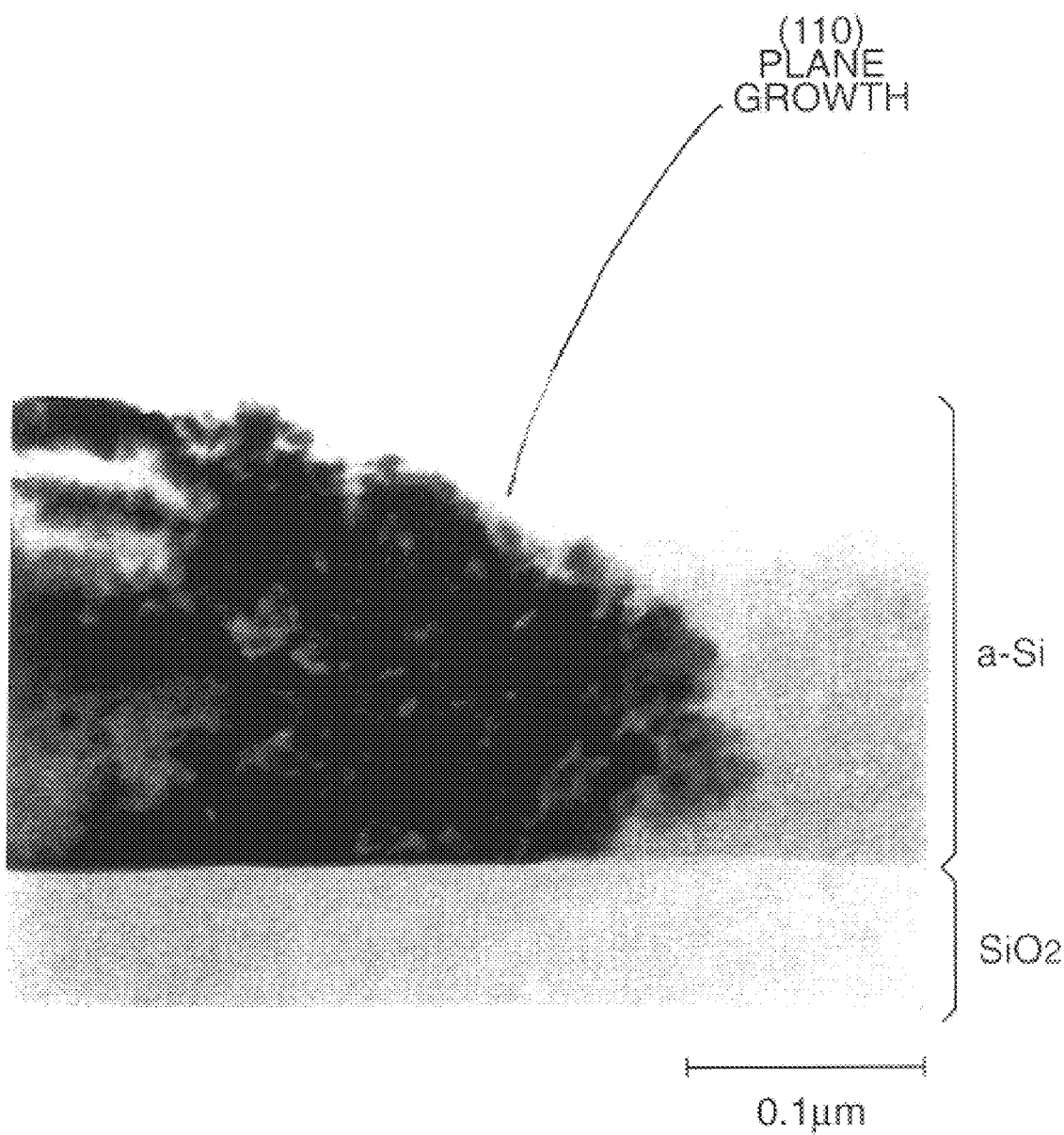
Figure 146:
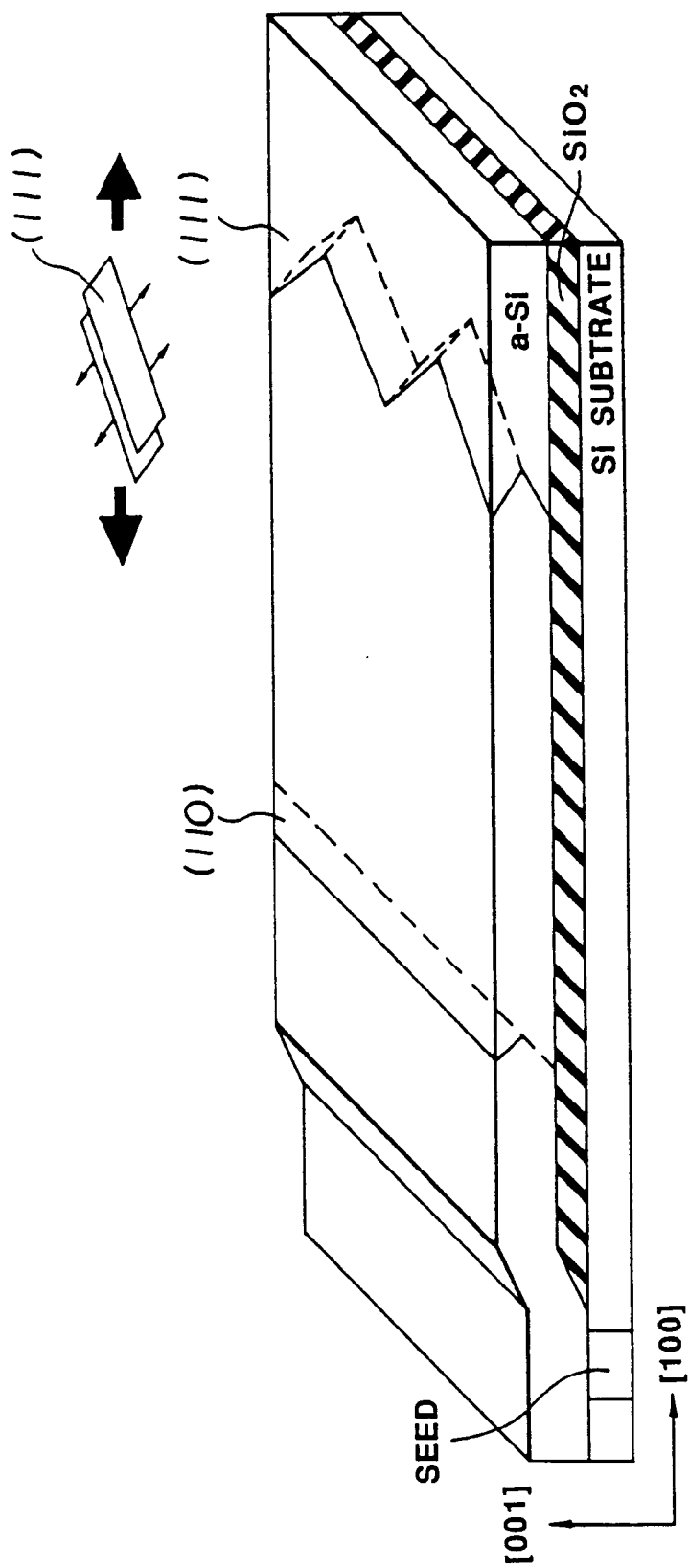
FIG. 146 illustrates a model diagram for explaining how the semiconductor thin film grows in the prior art.
Figure 147:
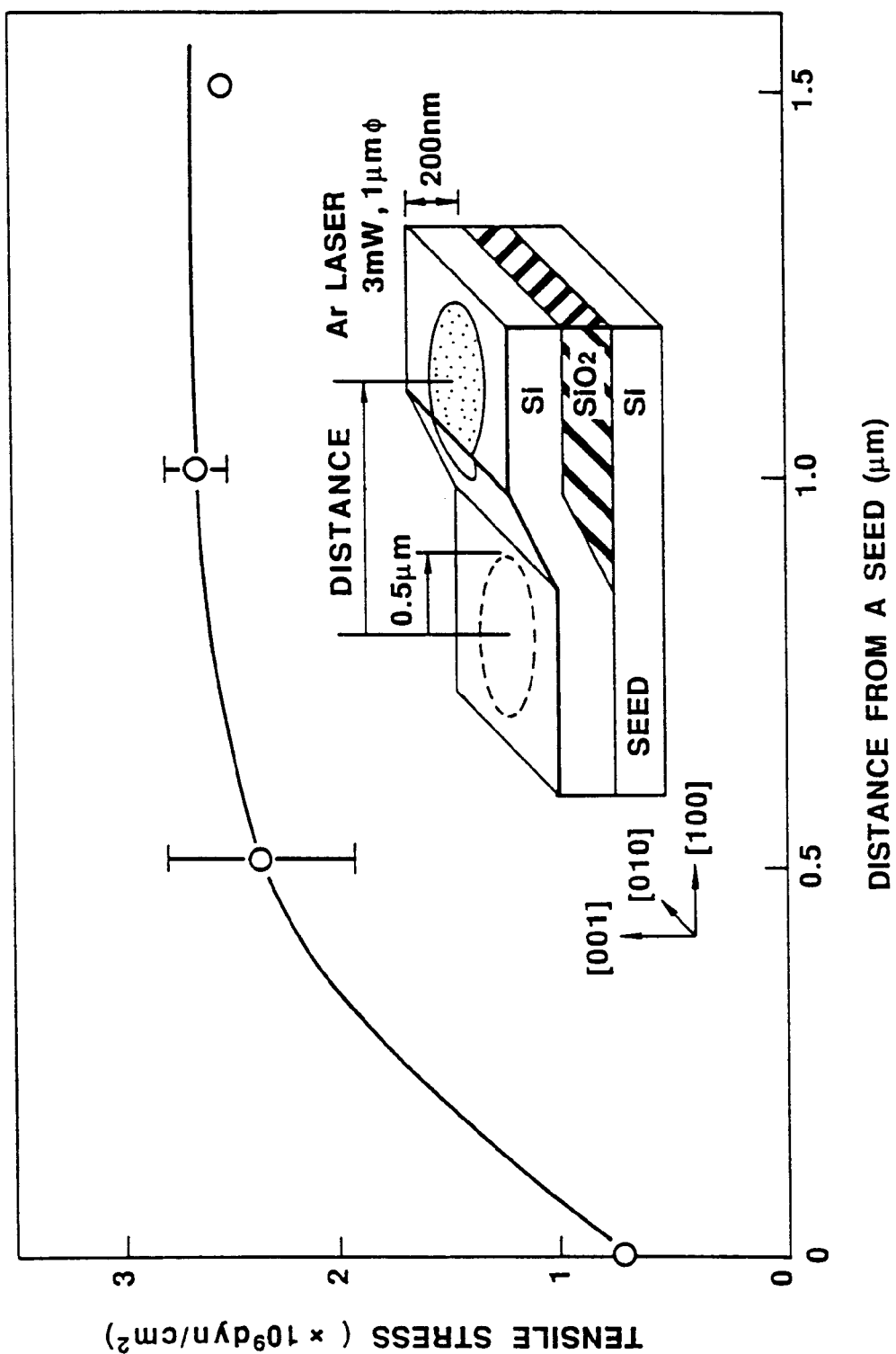
FIG. 147 illustrates a stress distribution of the semiconductor thin film in the prior art.
Figure 148A:
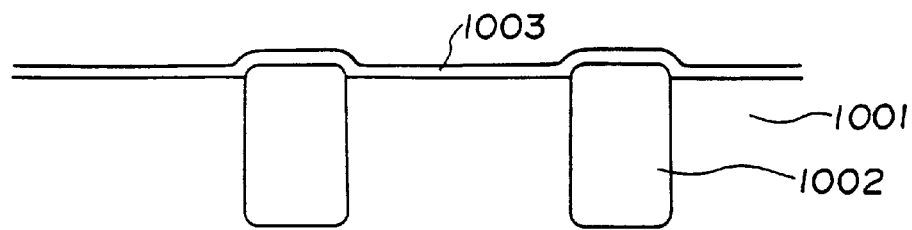
FIGS. 148(a) thru 148(h) illustrate steps in a method for manufacturing a MOS device in accordance with the thirty-first embodiment of the present invention.
Figure 148B:
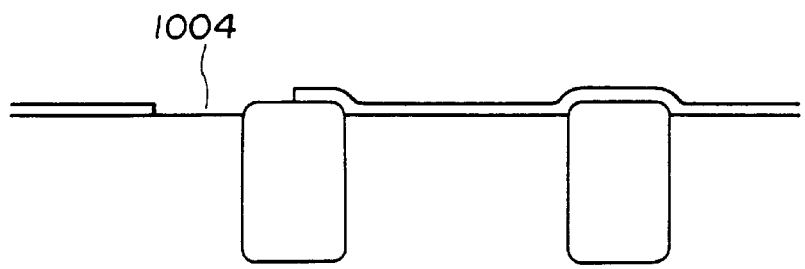
Figure 148C:
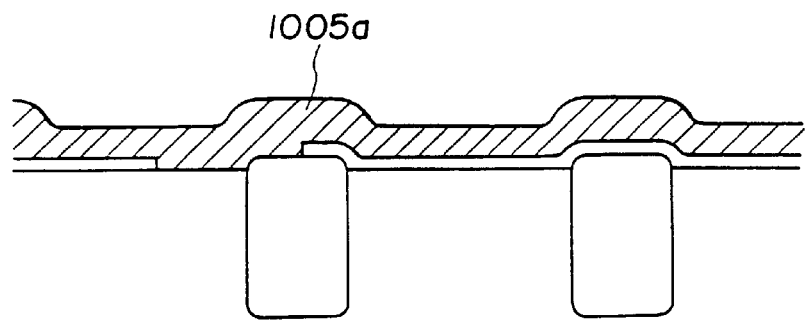
Figure 148D:
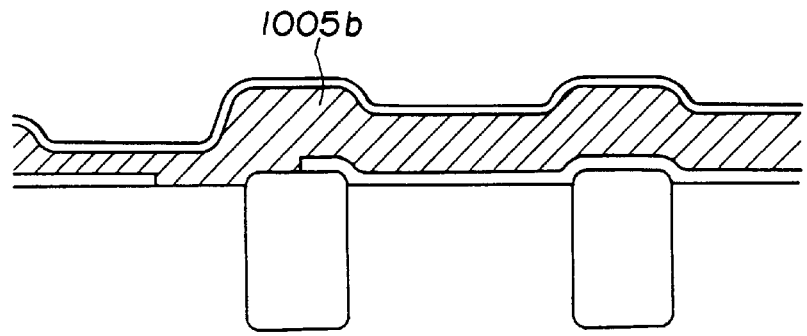
Figure 148E:
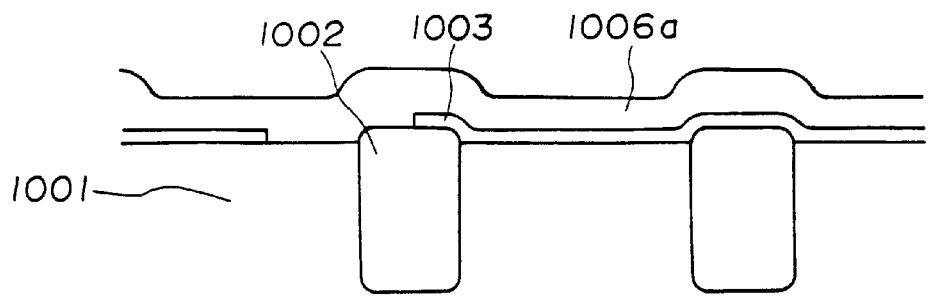
Figure 148F:
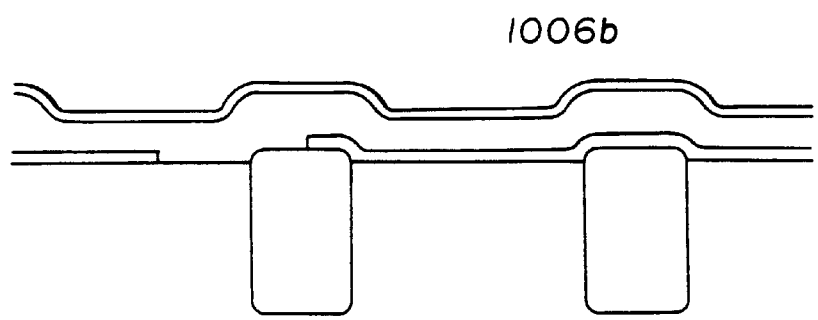
Figure 148G:
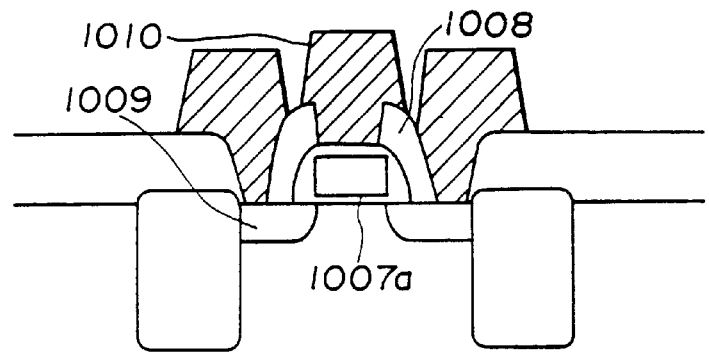
Figure 148H:
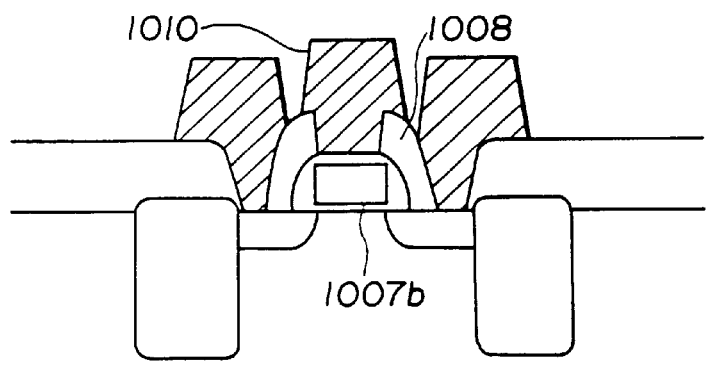

Next, relationship between electron mobility and amorphous film thickness were measured with respect to two types of films having various thicknesses and average inter-atomic distances; one in which the free surface is maintained without oxide film thereon (curve 'a' in FIG. 10), and the other in which after formation of the amorphous film, the film is once taken out in atmosphere or the atmosphere of the solid phase growth process is set to be an oxidization atmosphere so that an oxide film is present on the amorphous film (curve 'b' in FIG. 10). The measure results are given in FIG. 10. In the method of the present invention in the absence of oxide film, when the film thickness is below 80 nm, that is, when the average inter-atomic distance of the amorphous film 1.02 times or more of the average inter-atomic distance of the single crystal, its electron mobility is large, but as the film thickness is above 80 nm, the electron mobility becomes smaller. On the other hand, in the conventional method in the presence of the oxide film on the amorphous film, its electron mobility is small. It will be appreciated from the drawing that the absence of the oxide film and keeping the average inter-atomic distance at a value 1.02 times or more of the average inter-atomic distance of the single crystal play a very important role on the electron mobility. Given for comparison in FIG. 134 are diagrams for explaining how the solid phase growth takes place when the surface of an amorphous film is oxidized and its average inter-atomic distance is smaller than 1.02 times of the average inter-atomic distance of the single crystal, in which case atoms are positioned at random in the amorphous film and as the crystallization growth advances. the respective atoms are gradually located at their regular crystal lattice positions. At this time, the number of atoms arranged at random does not coincide with the number of atoms located at their regular lattice positions. This means that such noncoincidence of the number takes place more often when this is applied more locally, so that, as shown in FIG. 135, excess atoms are present between lattices and the number of atoms to be located at their lattice positions becomes insufficient as the crystallization growth advances. In spite of the fact, their atoms, although forming an amorphous structure, have their bond and thus the mobility is small and cannot move fully freely. Thus, these atoms undesirable remain in the single crystalline film in the form of lattice deformations, crystalline defects or twins. For this reason, in the conventional method, when crystallization is carried out with the solid phase growth after the formation of the amorphous film, a number of crystalline defects remain in the single crystal. The crystalline defects, which are known as twins or laminating faults, include many point defects, dislocation nets and helical dislocations.

The third embodiment of the present invention will next be explained. Although the amorphous silicon film has grown in the hydrogen atmosphere in the foregoing embodiment, heat treatment is carried out to attain single crystallization while drawing vacuum with use of a turbo molecular pump to keep at a high vacuum level of $1\times10^{-4}$ Torr in this embodiment. In more detail, the pyrolysis reaction of the silane gas is used to deposit amorphous silicon at a deposition rate of 10 nm/min. with a pressure of 3 Torr, a flow rate of 200 SCCM and a temperature of 525° C., the silane gas is introduce in the apparatus chamber for 5 minutes and then stopped. After this, while drawing the vacuum of the chamber at a vacuum level of $1\times10^{-4}$ Torr with use of the turbo molecular pump, the film is subjected to a heat treatment at 600° C. for 10 hours to form a single crystalline thin film of 50 nm thick. In the conventional method, a rotary pump is used to vacuumize the chamber to a vacuum level of about $10^{-2}$ Torr to form a spontaneous oxide film due to the presence of trace amounts of oxygen. In the present invention, the rotary pump is replaced by the turbo molecular pump so that a very high level of vacuum can be obtained.

In this case, no crystalline defects could be observed by a transmission electron microscope (TEM). The film thickness is changed, but no crystalline defects could be observed by the transmission electron microscope with respect to films having thicknesses of below 80 nm and having average inter-atomic distances 1.02 times or more of the average inter-atomic distance in the single crystal.

Explanation will then be made as to a fourth embodiment of the present invention.

In this embodiment, a phosphine gas is introduced together with the silane gas to provide a carrier concentration of $1\times10^{17}$ cm$^{-3}$ at the time of formation of an amorphous film to thereby form a single crystallized film. The mobility of the single-crystallized film is measured in accordance with the Hall effect. Measured results were similar to those shown in FIG. 10. In the conventional method, when an oxide film is present on the surface of the amorphous film, it is impossible to obtain a single crystal having a high mobility and a good crystal quality even if the amorphous film is thin. On the other hand, according to the method of the present invention, by using an amorphous film having a thickness of below 80 nm or having an average inter-atomic distance 1.02 times or more of the average inter-atomic distance of the single crystal and by carrying out solid phase growth, its crystal quality can be greatly improved and its mobility can be improved to the limit of the mobility available for the single crystalline silicon.

Explanation will next be made as to a fifth embodiment of the present invention.

Figure 11:
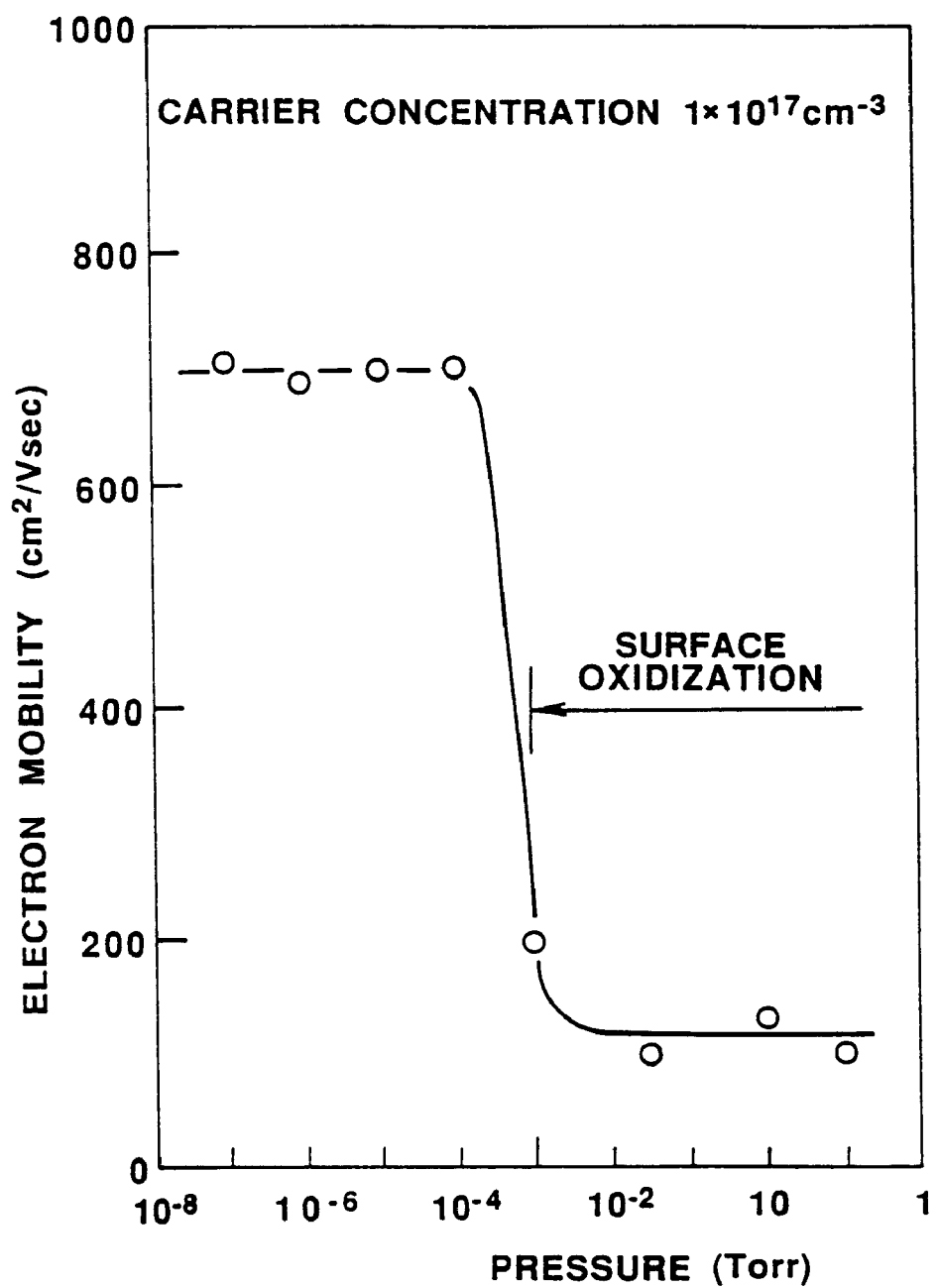
FIG. 11 illustrates a relationship between the vacuum degree and electron mobility at the time of annealing operation in the second embodiment of the present invention.

In this embodiment, for the purpose of measuring the pressure dependence of the embodiment during heat treatment, amorphous silicon is formed to be 50 nm thick in the same manner as in the foregoing embodiment, after which the pressure is changed, the films were subjected to a heat treatment at 600° C. for 10 hours, and the heat-treated films were subjected to measurements with respect to Hall mobility. The then films just after the formation had an average inter-atomic distance corresponding to 1.025 times of the average inter-atomic distance of the single crystal. As a result, when the vacuum level is worse than $1 \times 10^{-3}$ Torr, the mobility of the film after the crystallization abruptly dropped as shown in FIG. 11. As a result of observing the surfaces of the films during the heat treatment by the reflection high energy electron diffraction (RHEED) method, it has been found that, at vacuum levels worse than $1 \times 10^{-3}$ Torr, diffraction images indicative of the silicon crystal cannot be obtained even after completion of the crystallization and the film is covered with oxide. As a result of examining variations in the average inter-atomic distance with time before and after the solid phase growth, it has been observed that the average inter-atomic distance of the film immediately after the film formation is 1.03 times that of the single crystal, but the film is left to stand in the furnace, during which the average inter-atomic distance is gradually decreased or shrank and immediately before the solid phase growth, it is shrank to 1.005. This fact is enumerated one of evidences supporting or substantiating the shrinkage effect of the average inter-atomic distance of the present invention.

Further, as a sixth embodiment of the present invention, a film forming method will be explained in which an reduction atmosphere is employed to prevent oxidization of the surface of an amorphous silicon film during solid phase growth. Due to air leakage from a joint between pipes or reevaporation of molecules adsorbed on the walls of the furnace, oxygen and water vapor is present in the furnace. Such oxygen and vapor were pushed away from the furnace with the introducing hydrogen gas to thereby put a reduction atmosphere in the furnace. When the pressure of the hydrogen gas is made high to increase the flow rate of the gas, the oxidization of the surface of the film can be suppressed, the average inter-atomic distance of the deposited amorphous film is maintained until the solid phase growth is just started, whereby any defects in the single crystal can be avoided and its mobility can be improved. In this case, an n-type silicon substrate having an arsenic concentration of $2 \times 20^{19}$ atoms/cm$^3$ is used as an underlying substrate, on which substrate an intrinsic amorphous silicon film of 20 nm thick is formed and subjected to a heat treatment in the reduction atmosphere using hydrogen at 580° C. for one hour to form a single crystalline silicon film. The deposited amorphous silicon film of 20 nm thick had an average inter-atomic distance corresponding to 1.03 times that of the single crystal. This value is monitored with use of an amorphous silicon separately deposited on an oxide silicon.

Figure 12:
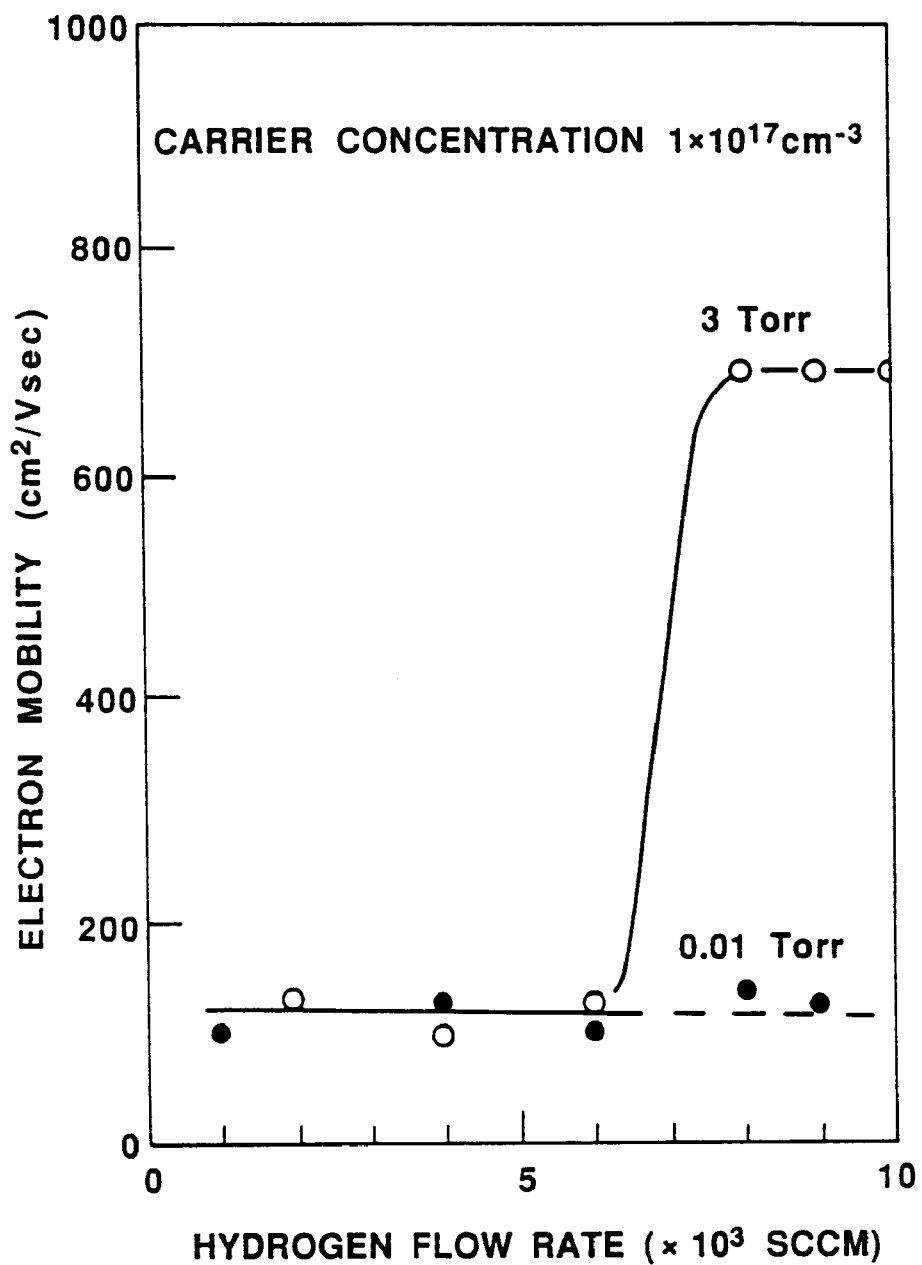
FIG. 12 illustrates a relationship between the hydrogen flow rate and electron mobility at the time of annealing operation in the second embodiment of the present invention.

Shown in FIG. 12 are measured results of a relationship between hydrogen flow rate and electron mobility when the hydrogen flow rate is varied. As will be seen also from the drawing, as the hydrogen flow rate increases, the electron mobility is increased.

Even when the hydrogen reducing atmosphere is replaced by an inactive gas atmosphere such as argon, helium or nitrogen, substantially the same effects could be obtained.

Figure 13:
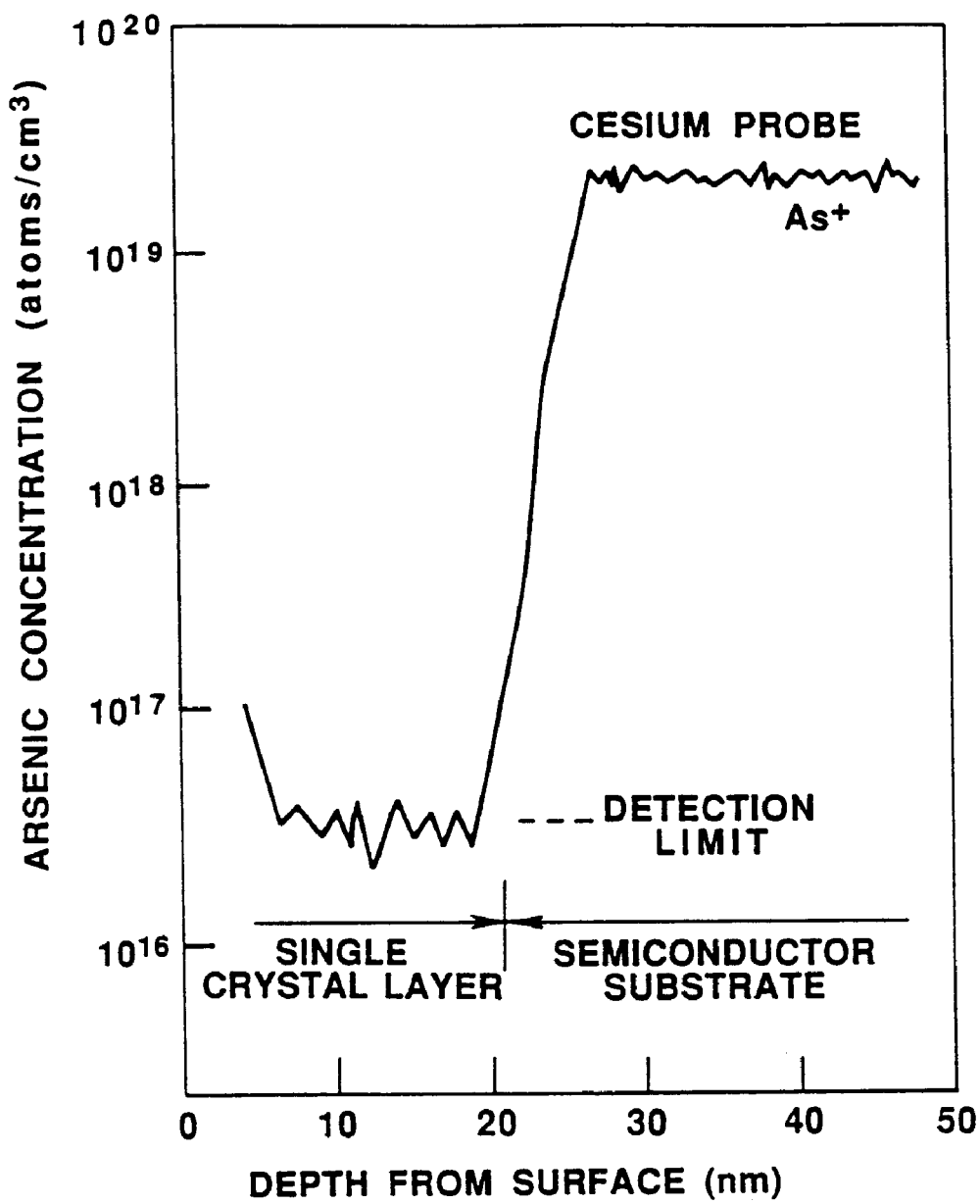
FIG. 13 illustrates a relationship between the arsenic concentration and the depth from the surface of a semiconductor thin-film in accordance with the sixth embodiment of the present invention.

The impurity distribution of the film immediately after completion of the single crystallization is analyzed by a secondary ion mass spectroscopy (SIMS) method, which results are given in FIG. 13 as an example. An underlying substrate is of an n-type semiconductor having an arsenic concentration of $2 \times 10^{19}$ cm$^{-3}$ but a single crystalline thin film of 20 nm thick formed on the semiconductor substrate by the method of the present invention remained intrinsic, that is, contained no electrically conductive impurities of such a low level that is below the detection limit of the SIMS method and thus cannot be detected.

The above has been explained in connection with an example using a chemical vapor deposition (CVD) method based on the pyrolysis reaction of the gas containing silicon. But, even when a evaporation process or sputtering process is employed for the amorphous silicon film in place of the CVD method, substantially the same effects could be obtained. It goes without saying that even when silicon is replaced by germanium, substantially the same effects can be obtained.

As the seventh embodiment of the present invention, explanation will be made as to a method for forming an MOS type transistor with use of this apparatus.

Figure 14A:
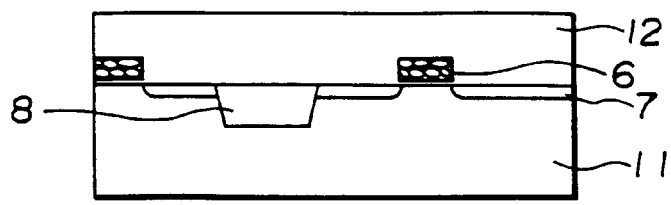
FIGS. 14(a) thru 14(e) illustrate steps of a method for manufacturing a semiconductor thin-film in accordance with the seventh embodiment of the present invention.

As shown in FIG. 14(a), the first-layer semiconductor device is formed on a silicon substrate 11 and then a silicon oxide film 12 is deposited to be about 1 μm on the entire surface of the silicon substrate by the CVD method. In this concentration, the first-layer semiconductor device is an MOS FET having a gate electrode 6 and a source/drain region 7 and reference numeral 8 denotes an insulator film for device isolation.

Figure 14B:
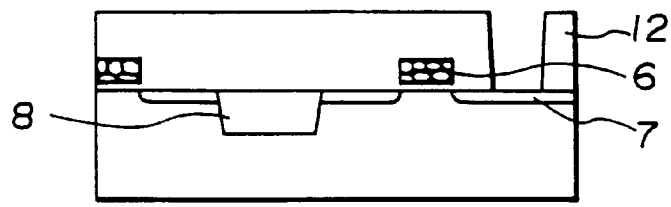

As shown in FIG. 14(b), next, resist is coated on the resultant laminate and the laminate is subjected to an exposure/development process, after which a desired area of silicon oxide film 12 is subjected to a reactive ion etching process and at the time of single crystallizing the stacking layer part, the surface of the silicon substrate is exposed to provide seed crystals and the residual resist is removed. The silicon substrate is cleaned with acid or the like and then is transported into the amorphous silicon reaction furnace with the silicon surface kept cleaned.

In formation of a deposited amorphous film, after the wafer is transported in the reaction furnace, the interior of the reaction furnace is first vacuumized. Much care have to be paid so as to avoid the growth of a spontaneous oxide film. The substrate temperature is raised to a level between 450 and 550° C.

Figure 14C:
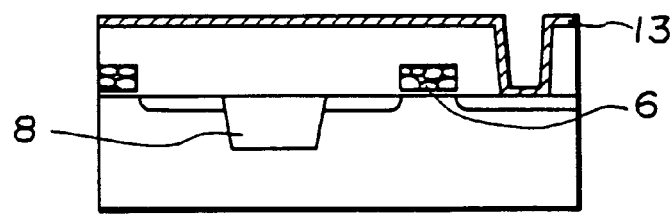

In depositing amorphous silicon with use of a silane gas and to obtain a high quality of amorphous silicon, it is necessary to keep the substrate temperature within a temperature range of 500 to 550° C.; whereas, when a disilane gas is employed, it is necessary to keep the substrate temperature within a range of 450 to 550° C. The silane or disilane gas is introduced within the reaction furnace so that the pyrolysis reaction of such a silane-series gas causes an amorphous silicon 13 to be deposited on the entire surface of the substrate (FIG. 14(c)). In this connection, diborane or phosphine may be mixed into the silane-series gas to deposit an amorphous silicon film containing boron or phosphorus. This amorphous silicon layer is made to have a thickness below 20 nm. At the stage where a desired film thickness below 20 nm was obtained, the introduction of the silane-series gas into the reaction furnace is stopped, the in-furnace temperature is reduced. The deposition rate is controlled by the gas flow rate and so on and the film formation is carried out under such a condition as to satisfy the aforementioned deposition rate equation.

Figure 14D:
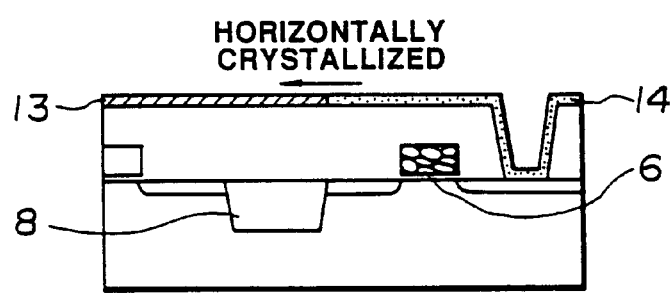

Subsequently, the interior space of the apparatus furnace is subjected to a vacuum drawing operation to have a high vacuum level below $10^{-7}$ Torr, the in-furnace temperature is raised to about 600° C., and the thin amorphous silicon film is crystallized to form a single crystalline silicon layer 14 (FIG. 14(d). In this step, the amorphous silicon is crystallized horizontally from the interface between the surface of the amorphous silicon and the silicon substrate as the seed of the solid phase growth. Since the average inter-atomic distance of the amorphous film is kept at a value at the time of the deposition in a high vacuum level, the atom bonding in the amorphous film is kept in the loose state. Since the silicon-atom bonding at the surface of the amorphous and single crystalline silicon is incomplete, silicon atoms can move highly easily and can move on the surface as migrants. Further, when the film is made as thin as below 20 nm, the surface migration of atoms influences the entire interior of the film and thus the all atoms of the interior of the film are kept in highly movable state. For this reason, the crystallization rate is large so that before random crystalline nucleation preventing the single crystallization takes place, single crystallization is realized up to the farthest of the seed. When the crystallization was caused, for example, at 600° C., the single crystallization was effected to a length of 20 μm. The crystal growth may be set to be further low. In this case, however, a processing time longer than in the former case becomes necessary. For example, at a temperature of 580° C., a processing time of more than 20 hours was necessary. Further, when boron or phosphorus atoms were introduced into the amorphous silicon at a concentration of about $10^{20}$ atoms/cm$^3$, the crystallization rate was raised and the single crystallized area was expanded to 100 μm. In addition, when such elements electrically active to silicon as phosphorus or boron were previously doped into the surface of the underlying insulator film at a high concentration, a further broad area could be single crystallized. Even when the insulating film per se was made of glass containing phosphorus or boron, substantially the same effects could be obtained. In view of the foregoing, it is considered that when not only the migration of atoms on the surface but also the movement of atoms at the boundary between amorphous silicon and substrate material is facilitated, the crystal growth rate becomes high with the result of the broader single-crystallized area.

Further, prior to the crystallization of the amorphous silicon, the wafer may be once transported out of the reaction furnace and may be subjected to an ion implantation process to dope therein boron or phosphorus atoms. In the latter case, after the wafer is again transported into the furnace, it is necessary to again remove the spontaneous oxide film prior to the solid phase growth to again loosen the average inter-atomic distance.

Figure 15:
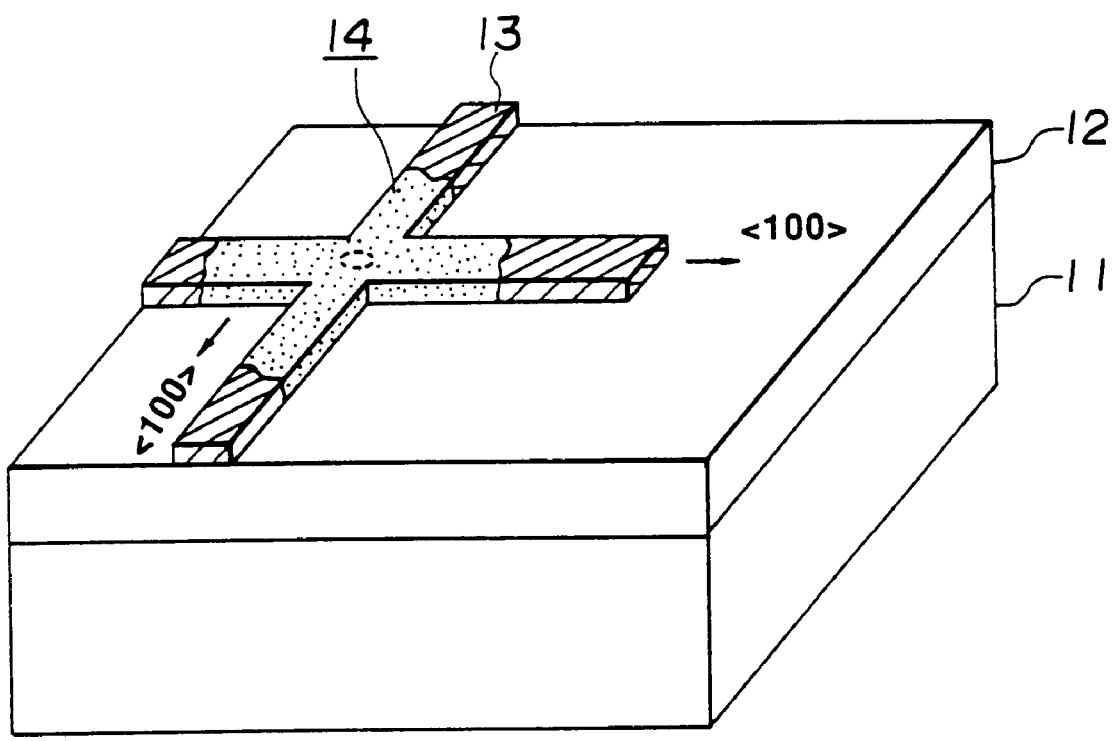
FIG. 15 is a modification of a method for manufacturing a semiconductor device using the semiconductor thin-film.

As a modification, prior to the single crystallization, the amorphous layer may be formed into a desired shape. In this case, the amorphous layer is coated with resist and subjected to an exposure/development process, after which the silicon of the layer is subjected to a reactive ion etching (RIE) process to remove the remaining resist. It is already confirmed that the solid phase growth rate varies depending on its growth direction and the growth rate becomes highest in an <100> direction. For this reason, the amorphous layer was formed to have such a shape that its longer sides were oriented in the <100> directions as shown in FIG. 15. The wafer was transported into the furnace and the spontaneous oxide film on the amorphous silicon is subjected to the aforementioned reducing reaction to be removed therefrom. Thereafter, the solid phase growth was effected at a high vacuum level.

Figure 14E:
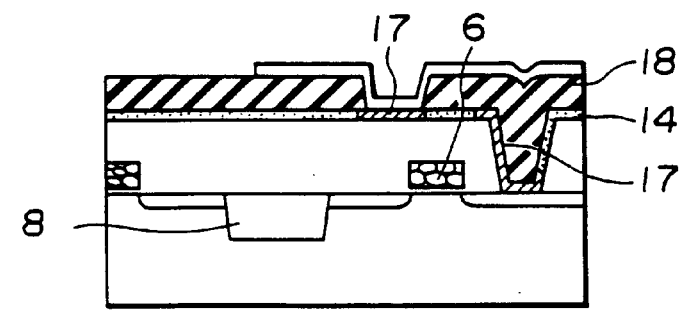

Through the above steps, a high quality of single crystalline silicon thin film 14 is formed. However, if not specifically required, the single crystalline thin film having a thickness of below 20 nm may be used as it is to form a device. In this case, the mobility was rather large and such an NMOS transistor as to have a mobility exceeding 1000 cm$^2$/Vsec. was obtained. However, in formation of the device, unlike an ordinary device, it is necessary to take good device for contact formation of the source and drain. That is, firstly an insulating film 18 is formed on the single crystalline silicon thin film 14 and a contact H is made in the area of the insulating film 18 contacted with one of the source and drain. To this end, even when any one of the reactive ion etching (RIE) process, chemical dry etching (CDE) process or the use of a fluorine-series aqueous solution is used, this causes the single crystalline film to be subjected to an piercing operation due to overetching. In order to reduce the contact resistance, not polycrystalline silicon usually employed but such silicide such as tungsten silicide was used to form a wiring 19. For example, when the tungsten silicide is formed, a mixture gas of tungsten hexafluoxide and hydrogen was employed. Alternatively, the wiring may be formed by cleaning the exposure part of the single crystalline thin film for the contact area, and by continuously depositing and crystallizing heavily-doped thin-film amorphous silicon of below 20 nm thick thereon according to the present invention. In either case, good contact characteristics were obtained and such a high electron mobility device (such as a transistor) as mentioned could be formed (FIG. 14(e)).

The eighth embodiment of the present invention will be explained in connection with an example where amorphous silicon deposition and crystallization based on heat treatment are twice carried out to form a thick single crystalline layer.

The first amorphous silicon deposition and crystallization are carried out in exactly the same manner as in the above sixth embodiment shown in FIGS. 14(a) to (d) to obtain a single crystalline silicon film 14 as shown in FIGS. 16(a) to (d).

Figure 16A:
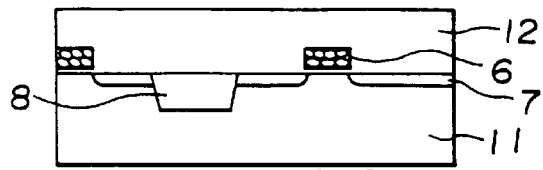
FIGS. 16(a) thru 16(g) illustrate steps of a method for manufacturing a semiconductor thin-film in accordance with the eighth embodiment of the present invention.
Figure 16B:
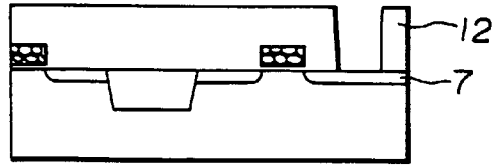
Figure 16C:
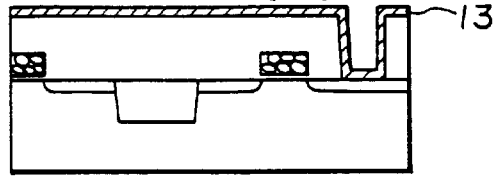
Figure 16D:
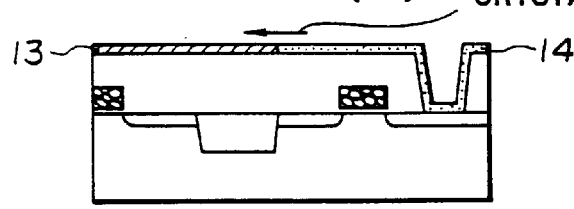
Figure 16E:
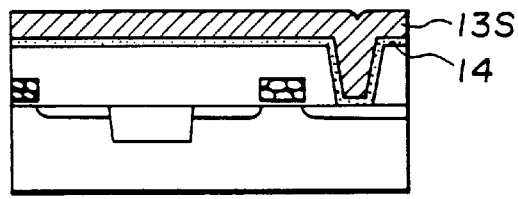
Figure 16F:
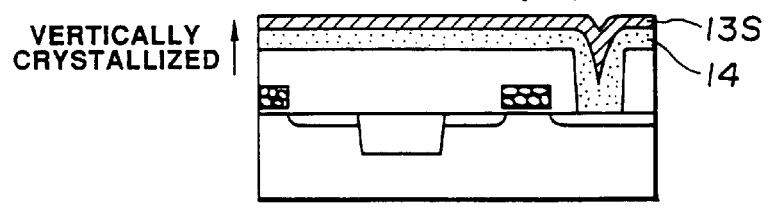

Thereafter, the second amorphous silicon deposition and crystallization are carried out. That is, after the resultant wafer is subjected to a heat treatment for formation of the first single crystalline silicon film, the temperature of the reaction furnace is set to be within a range of 450 to 550° C. as it is without opening the reaction furnace, a silane-series gas is introduced into the reaction furnace to deposit an amorphous silicon film 13s to 200 nm thick (FIG. 16(e)), and then the gas introduction is stopped. At this time, the silicon substrate 11 may be transported out of the furnace and be crystallized in another annealing furnace. The in-furnace temperature is raised to about 600° C. so that, as shown in FIG. 16(f), the amorphous film is vertically single crystallized with used of the previously-crystallized film 14 as a seed. When the amorphous film 13s of 200 nm was deposited, the single crystallization could be easily realized vertically and the single crystalline silicon film 14 was obtained.

Figure 16G:
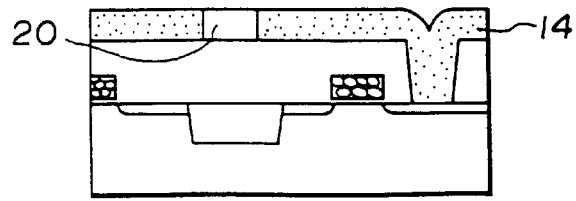

Thereafter, the silicon substrate is transported out of the vacuum furnace, subjected to a chemical vapor deposition process (CVD) to deposit a silicon oxide film and a resist thereon, and then subjected to an exposure/development process, i.e., the underlying silicon oxide film is subjected by its desired area to a reactive ion etching process with use of the resist as a mask. The residual resist is removed and the single-crystallized silicon is subjected by its desired area to a reactive ion etching process with use of the silicon oxide film as a mask. A silicon oxide film 20 is deposited by the CVD process and then flattened by a bias sputtering process. After this, the silicon oxide film is subjected to a wet etching process until the single crystalline silicon layer is exposed (FIG. 16(g)). In this way, the first and second single crystalline silicon layer 14 isolated by the silicon oxide film 20 is obtained. The thickness of the single crystalline silicon layer 14 is 220 nm.

A method for manufacturing a MOS transistor as the second layer will be explained in the following.

A second-layer silicon substrate is subjected to a channel doping process for control of a threshold value, to deposit a CVD silicon oxide film of 20 nm thick as a gate insulating film and to deposit a CVD polysilicon film of 200 nm thick as a gate electrode. The resultant silicon substrate is coated with resist, subjected to an exposure/development process, that is, the polysilicon is subjected to a reactive ion etching process to form a gate electrode, and further a source/drain region is subjected to an ion implantation process with use of electrically conductive impurities. The dose is determined by taking the thickness of the second-layer silicon film into consideration.

For example, when the film thickness was 50 nm and the dose was $1 \times 10^{15}$ cm$^{-2}$, a high As ion concentration of $1 \times 10^{20}$ cm$^{-3}$ was obtained. The film is subjected to an active annealing process to activate electrically conductive impurities. Further deposited on the resultant film is a CVD silicon oxide film which in turn is provided therein with openings for formation of source and drain electrodes, after which the electrodes and a wiring layer is formed.

In the present invention, the formation of the amorphous film may be formed by a sputtering process or a UHV process. For example, a silicon substrate having an insulating film partly exposing the substrate is kept at a high vacuum level of below $10^{-10}$ Torr so that high-purity silicon as a target is evaporated by means of electron beam to be deposited on the silicon substrate. At this time, the deposition caused the formation of an amorphous silicon film of 20 nm thick having an average inter-atomic distance corresponding to 1.03 times that of the single crystal on the insulating film. After this, when the silicon substrate was heated at 600° C. for 5 hours while kept at a high vacuum level, a single crystalline silicon thin film could be formed on the insulating film.

Explanation will next be made as to the ninth embodiment of the present invention.

Figure 17:
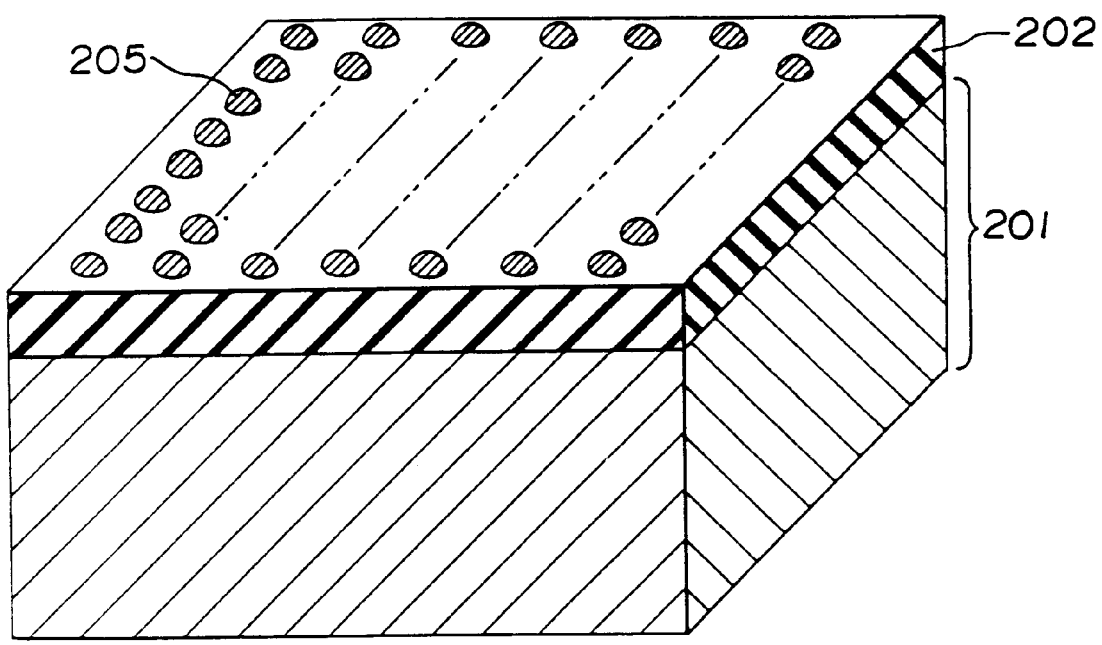
FIG. 17 illustrates a semiconductor thin-film formed in the ninth embodiment of the present invention.

The present embodiment is featured in that a granular single crystalline silicon 205 is formed as shown in FIG. 17. Even in the present invention, like the foregoing embodiment 1, in obtaining a single crystalline silicon thin film, an amorphous silicon film having an average inter-atomic distance equal to or more than 1.03 times that of silicon single crystalline was previously used and was subjected to a heat treatment in an N$_2$ non-oxidization atmosphere to suppress the growing adhesion of an oxide film on the amorphous film.

The same film forming apparatus as shown in FIG. 2 was employed for film formation. The same thin-film forming sequence as shown in FIG. 3(a) was also employed. However, a sample structure was somewhat different is shape from that in the foregoing embodiment. More specifically, the silicon oxide film 202 has been provided therein with the opening as shown in FIG. 4 in the foregoing embodiment 1, whereas no opening is provided in the film as shown in FIGS. 18(a) to (c) in the embodiment 9.

Figure 18A:
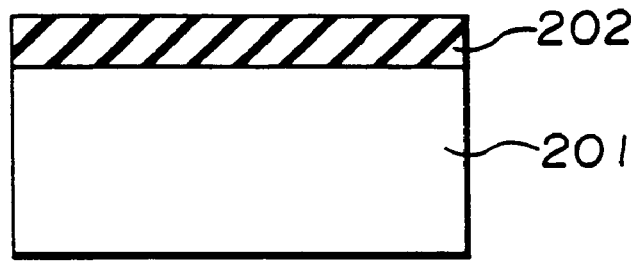
FIGS. 18(a) thru 18(c) illustrate steps of a method for manufacturing a semiconductor thin-film in accordance with the ninth embodiment of the present invention.
Figure 18B:
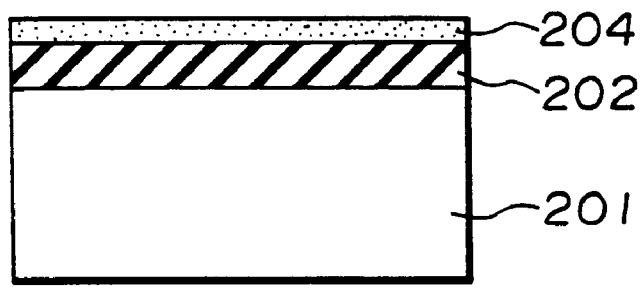

A silicon oxide film 202 is first formed as shown in FIG. 18(a) and then an amorphous silicon film 204 is deposited on the film 202 as shown in FIG. 18(b). The thickness of the amorphous silicon film 204 was 331.5 nm in the embodiment 1, but was set to be 20 nm in this embodiment. As mentioned in the beginning of the explanation of the embodiment 9, a result of measuring the deposited film immediately after its formation indicated that its average inter-atomic distance corresponds to 1.03 times that of the single crystalline silicon substrate.

Figure 18C:
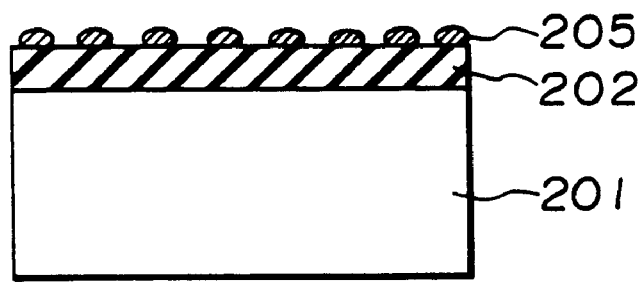
Figure 19:
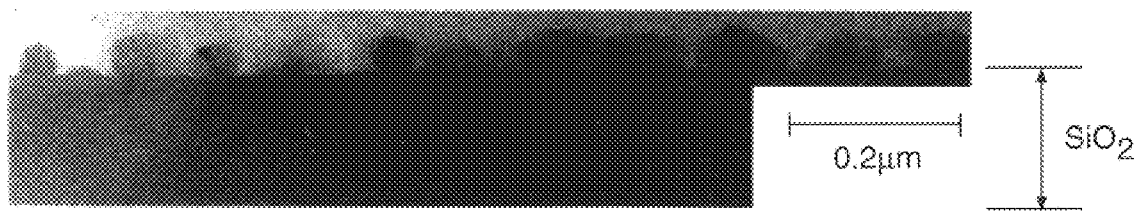
FIG. 19 is a photograph illustrating a single crystalline thin-film obtained in the steps of the method for manufacturing the semiconductor thin-film in the ninth embodiment of the present invention.
Figure 20:
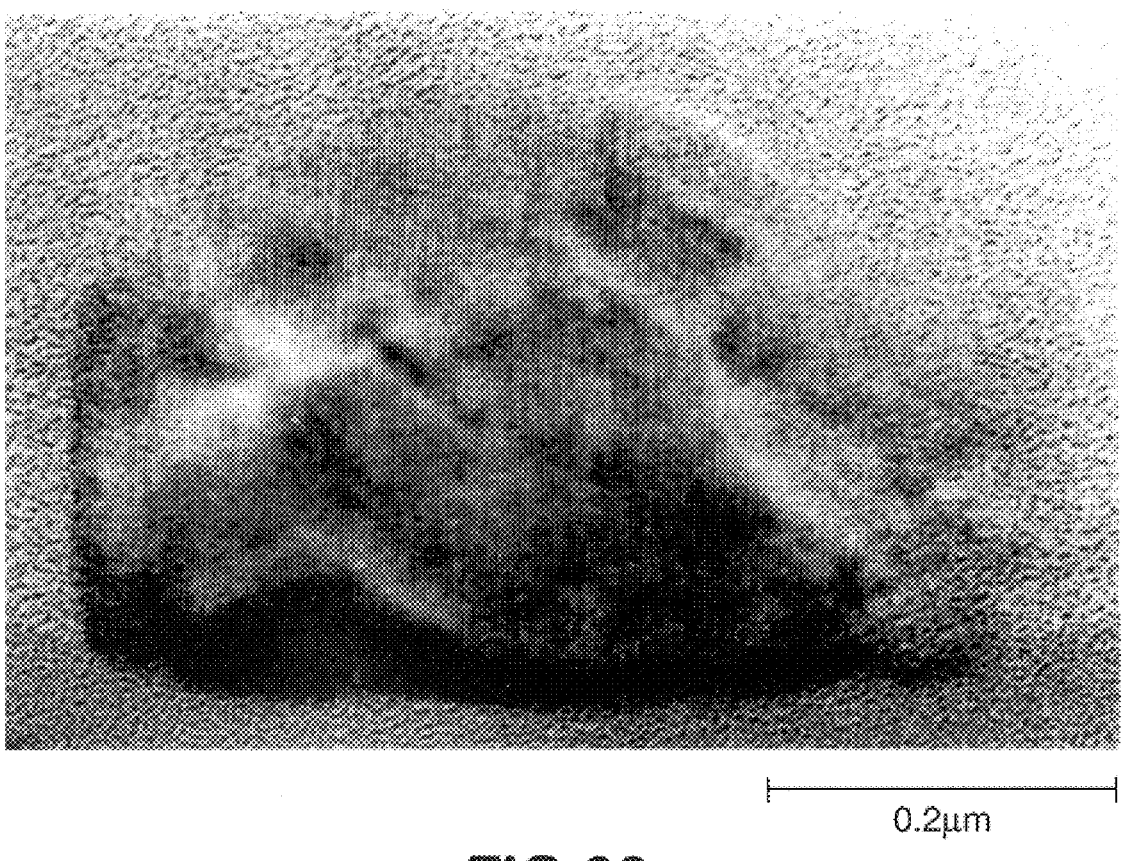
FIG. 20 is another photograph illustrating the single crystalline thin-film obtained in the steps of the method for manufacturing the semiconductor thin-film in the ninth embodiment of the present invention.
Figure 21A:
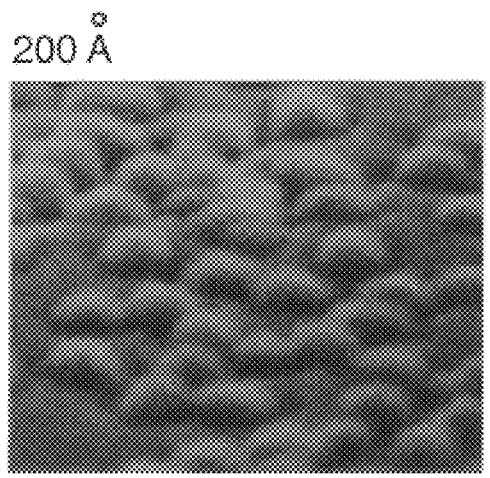
FIGS. 21(a) thru 21(f) illustrate photographs and sectional views illustrating the single crystalline thin-film obtained in the steps of the method for manufacturing the semiconductor thin-film in the ninth embodiment of the present invention.
Figure 21B:
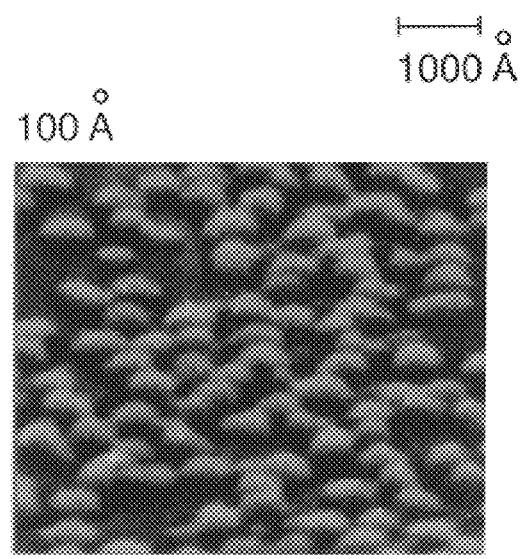
Figure 21C:
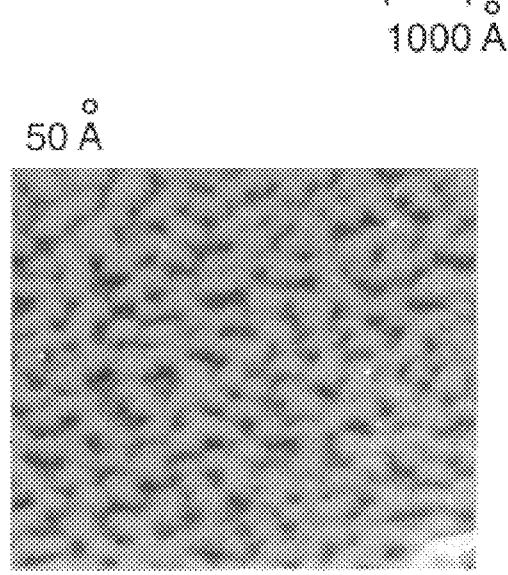
Figure 21D:
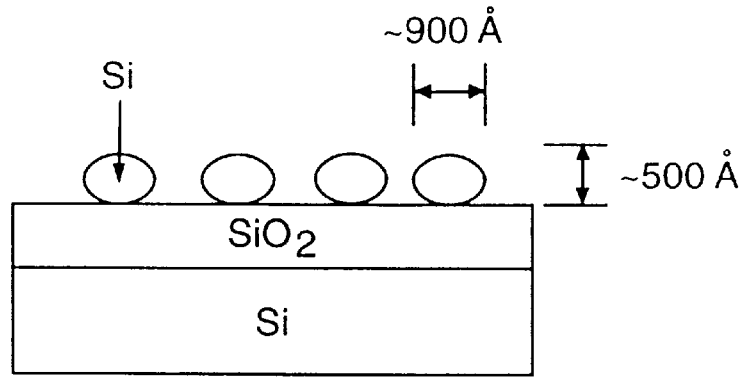
Figure 21E:
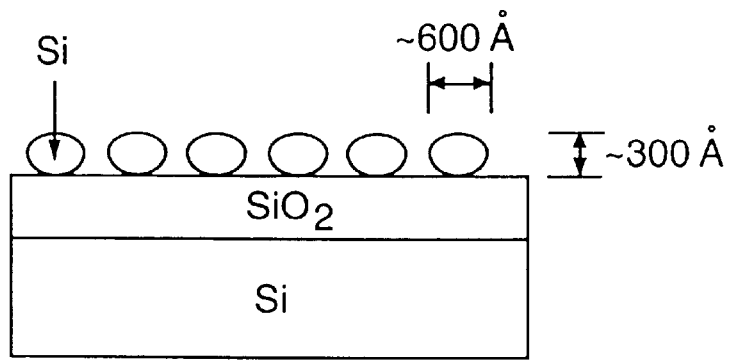
Figure 21F:
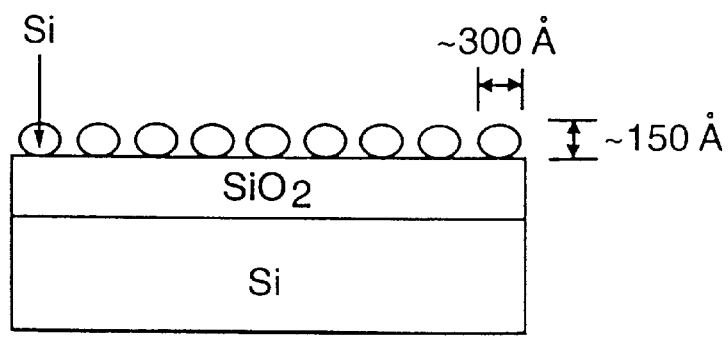

Thereafter, as shown in FIG. 18(c), the resultant wafer is subjected to a heat treatment at 600° C. for 5 hours to form a single crystalline silicon 205 thereon. In this embodiment 1 were used. That is, in order to suppress the adhesion of a spontaneous oxide film on the silicon, the same furnace for example was employed. As already explained above, in this case, the amorphous silicon film was formed so that, during the re-crystallization, the film was not contacted with a single crystalline silicon exposure portion as a so-called 'seed'. As a result, as shown by a TEM photograph in FIG. 19, the amorphous portion aggregated as crystal-grown and a good quality of single crystalline grains completely free of defects were obtained. As shown by a TEM photograph in FIG. 20, as a result of its close observation of the single crystal, a <001> silicon axis grows in a direction vertical to the underlying silicon oxide.

The inventors of the present invention has found that the grains can be formed to have a uniform size by suitably selecting the film thickness, temperature, underlying film, etc. FIGS. 21(a) to (f) show results when the initial amorphous silicon films were set to be 20, 10 and 5 nm, respectively. These initial amorphous silicon films had average inter-atomic distances of 1.03, 1.032 and 1.034 times that of the single crystalline silicon film, respectively. In either case, a very good quality of single crystal was obtained.

Explanation will then be made as to a tenth embodiment of the present invention.

In this embodiment, for obtaining a Ge single crystalline thin film, an amorphous Ge film previously having an average inter-atomic distance 1.02 times or more that of the Ge single crystal was used, and then subjected to a heat treatment in an N$_2$ non-oxidization atmosphere to suppress the growing adhesion of an oxide film on the amorphous film. As in the embodiment 1, the same film forming apparatus as shown in FIG. 2 was employed.

Figure 22A:
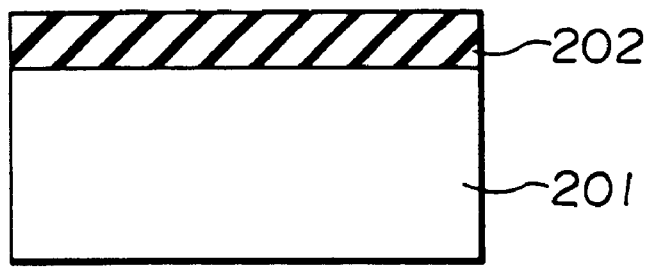
FIGS. 22(a) thru 22(c) illustrates steps of a method for manufacturing a semiconductor thin-film in accordance with the tenth embodiment of the present invention.

Further used in this embodiment was the same form deposition sequence as FIG. 3(a). The sample structure was made similar to that in the embodiment 9 of FIG. 18(a), as shown in FIG. 22(a). In other words, in this embodiment, no opening was made in the film.

Figure 22B:
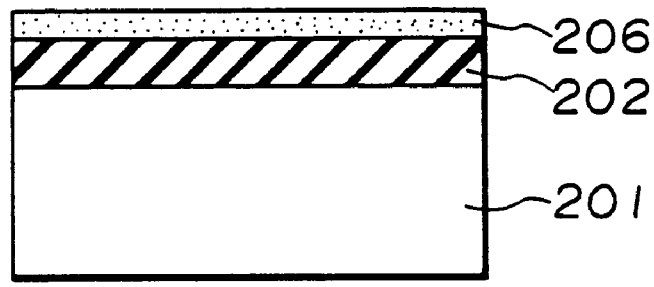

Under such deposition conditions that the average inter-atomic distance of germanium of the film is 1.02 times the average inter-atomic distance of the Ge single crystal, an amorphous germanium 205 was deposited on a film 202 (FIG. 22(b)). At this time, the thickness of the amorphous germanium was, for example, 11.5 nm.

Figure 22C:
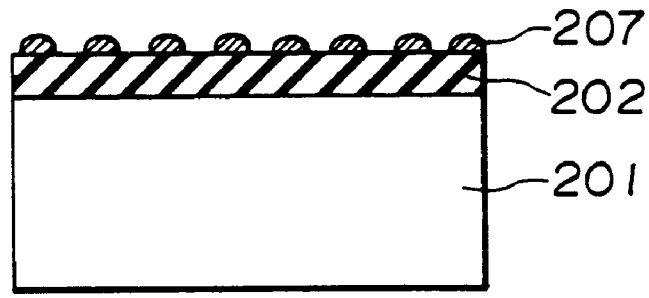

Thereafter, re-crystallization was carried out in the same manner as in the embodiment 1 to form a granular single crystalline germanium film 207 (FIG. 22(c)). That is, for the purpose of suppressing the undesirable adhesion of a spontaneous oxide film on the germanium film, the same furnace as in the embodiment 1 was used.

In this embodiment, during the re-crystallization of the amorphous germanium film, the single crystalline exposure portion as a so-called 'seed' is not contacted therewith. As a result, as in the example of FIG. 18, the amorphous portion aggregated as crystal-grown and a good quality of single crystalline grains completely free of defects were obtained. In addition, the uniaxial orientation of the crystal was obtained.

The inventors of the present invention has found that the grains can be formed to have an arbitrary desired size by suitably selecting the film thickness, temperature, underlying film, etc.

That is, the average inter-atomic distance of the amorphous film is set to correspond to less than 1.02 times of the average inter-atomic distance of the single crystal, the surface of the amorphous film is kept in a free state, atoms are set to be able to freely move within the film, silicon atoms are moved simultaneously with the crystallization to be thereby aggregated, paying attention to variation in the total energy.

This example will be further detailed as an embodiment 11.

Figure 23A:
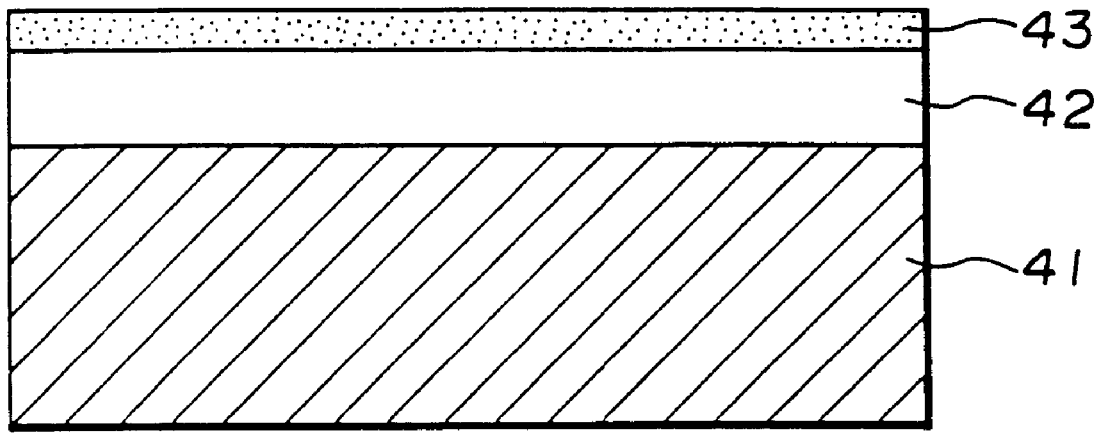
FIGS. 23(a) and 23(b) illustrate steps of a method for manufacturing a semiconductor tin-film in accordance with the eleventh embodiment of the present invention.

As shown in FIG. 23(a), the surface of a silicon substrate 41 is oxidized at 950° C. in a water vapor atmosphere to form thereon a silicon oxide film 42 of 0.1 μm thick. The resultant substrate is further subjected to a CVD process to deposit an amorphous silicon film 43 of 0.02 μm thick thereon. At this time, amorphous silicon film was formed at a silane gas pressure of 1 Torr, at 525° C. for 2 minutes.

Figure 23B:
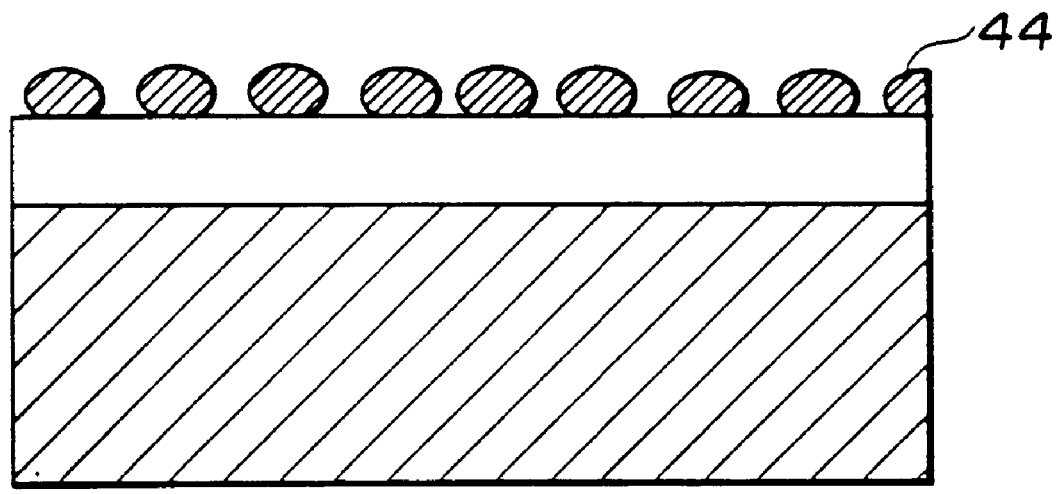
Figure 24:
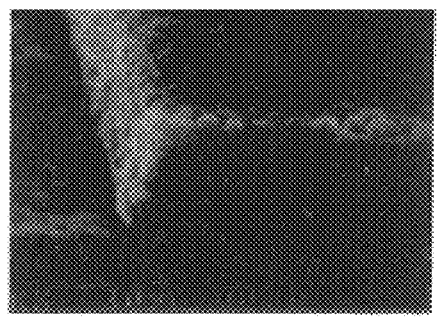
FIG. 24 is a photograph illustrating a single crystalline thin-film obtained in the steps of the method for manufacturing the semiconductor thin-film in accordance with the eleventh embodiment of the present invention.
Figure 25:
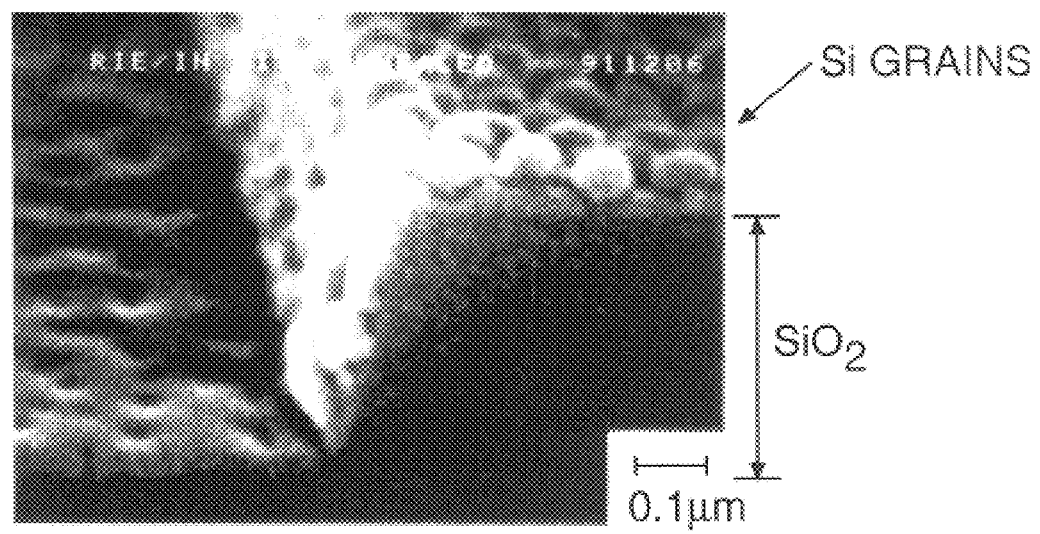
FIG. 25 is another photograph illustrating the single crystalline thin-film obtained in the steps of the method for manufacturing the semiconductor thin-film in accordance with the eleventh embodiment of the present invention.
Figure 26:
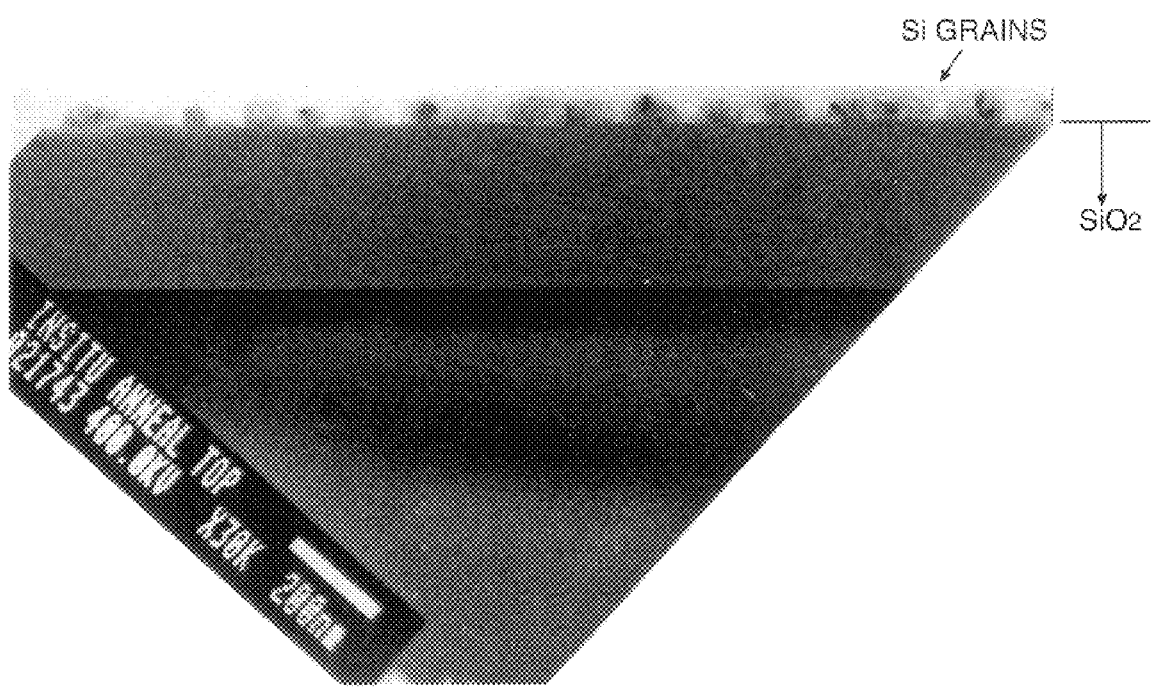
FIG. 26 is a photograph illustrating the single crystalline thin-film obtained in the steps of the method for manufacturing the semiconductor thin-film in accordance with the eleventh embodiment of the present invention.

Thereafter, the introduction of the silane gas is stopped, and the resultant silicon substrate is subjected to an continuous heat treatment at 600° C. for 30 minutes to form a granular layer 44 made of single crystal s as shown in FIG. 23(b). At this time, an argon gas passed through a gas cleaner was continuously introduced into the reaction furnace to suppress the oxidization of the surface of the amorphous silicon. Through the above heat treatment, the amorphous silicon is crystallized and at the same time aggregated as the granular layer made of mutually separated single crystals. The then scanning electron microscopy (SEM) photographs are given in FIGS. 24 and 25, while cross-sectional transmission electron microscopy (TEM) photograph is given in FIG. 26. As will be seen from the photographs, grains are all uniform both in size and inter-grain distance. In addition, the grain size has a good reproducibility, that is, grains are formed controllably to have the same size.

Figure 27:
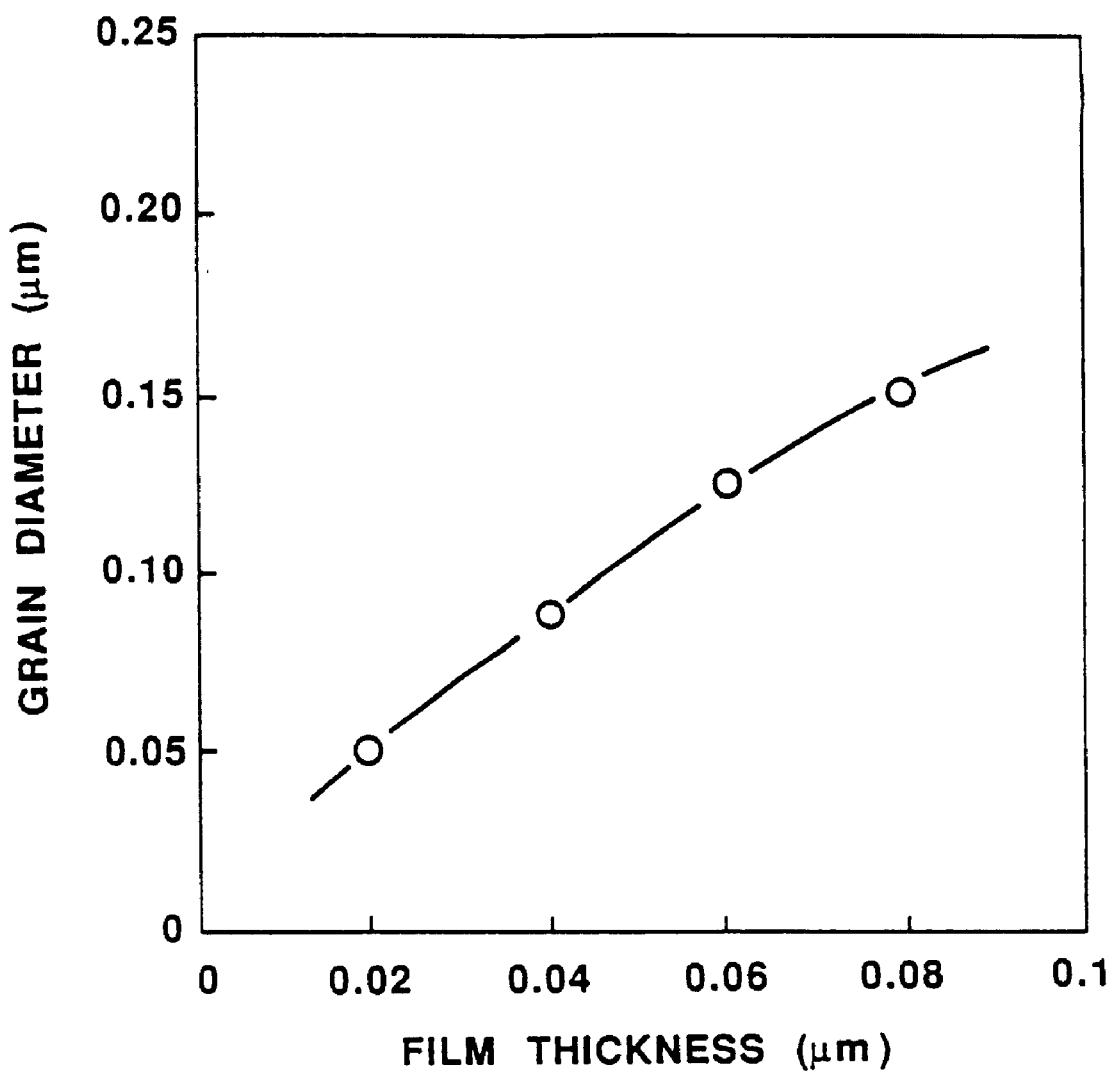
FIG. 27 illustrates a relationship between the thickness of an amorphous film and the diameter of obtained single crystalline grain.

Next, a relationship between the thickness of the amorphous silicon film and the grain size of the film after subjected to a heat treatment at 600° C. for one hour was measured with respect to different amorphous silicon films. Measured results given in FIG. 27. It will be noted from the drawing that the larger the thickness of the initial amorphous silicon film is made the larger the grain size is made.

It is also possible to control the shape of grains aggregated according to the contact degree between the underlying layer and the amorphous silicon.

In other words, when a silicon oxide film is used as the underlying layer, each grain becomes small, whereas, when a (PSG) film is used as the underlying layer, the grain becomes large and flat.

Figure 28:
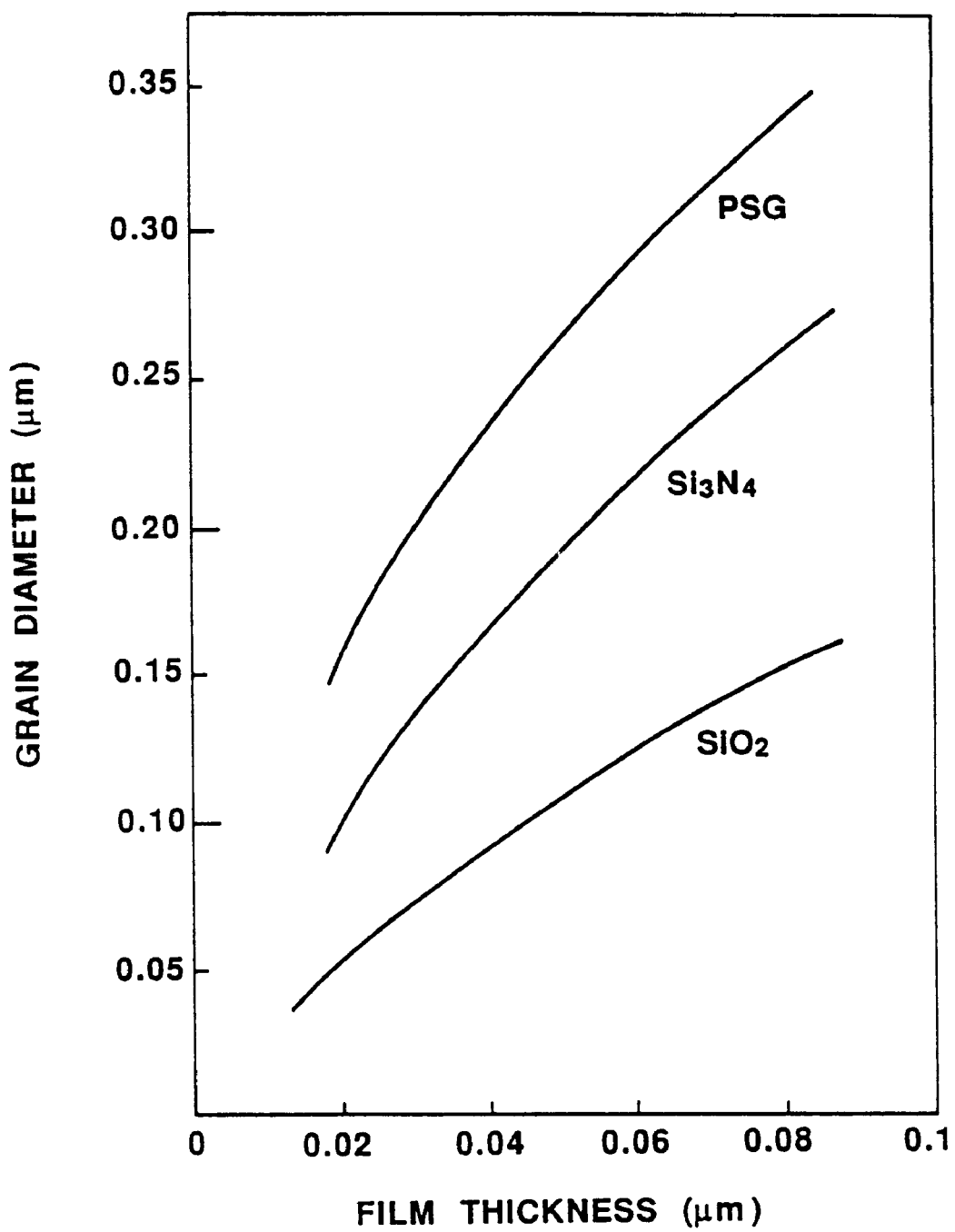
FIG. 28 illustrates relationships between the thickness of the amorphous film and the diameter of obtained single crystalline grain with respect to different underlying insulator film.

Next, a PSG film, a silicon nitride film and a silicon oxide are used as the underlying layer respectively, relationships between the thicknesses of the amorphous silicon films and the diameters of grains of the films after subjected to a heat treatment at 600° C. for one hour are measured and measured results are given in FIG. 28. It will be seen from the drawing that the grain diameter can be controlled even by selecting various underlying layers. Further, even when BSG, BPSG or AsSG film is used, the grain size can be similarly made large.

Furthermore, the similar control can be realized even based on the temperature of heat treatment and the extent of oxidization to the processing atmosphere.

The twelfth embodiment of the present invention will be explained in the following.

Figure 29A:
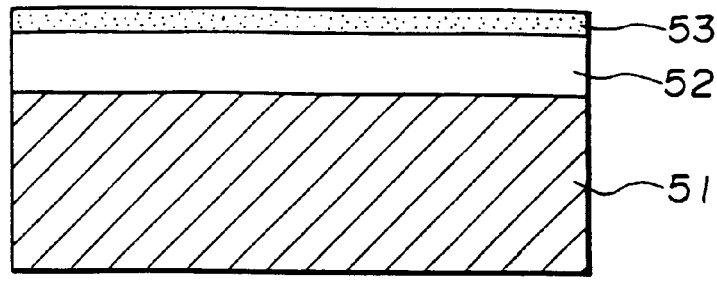
FIGS. 29(a) thru 29(d) illustrate steps of a method for forming a semiconductor thin-film in accordance with the twelfth embodiment of the present invention.

As shown in FIG. 29(a), a silicon oxide film 52 of 0.1 μm thick is formed on a silicon substrate 51 by a CVD process with use of a mixture gas of silane and oxygen at a substrate temperature of 450° C., and then an amorphous silicon film 52 of 0.30 μm is deposited on the silicon oxide film 52 by a CVD process using the silane gas.

Figure 29B:
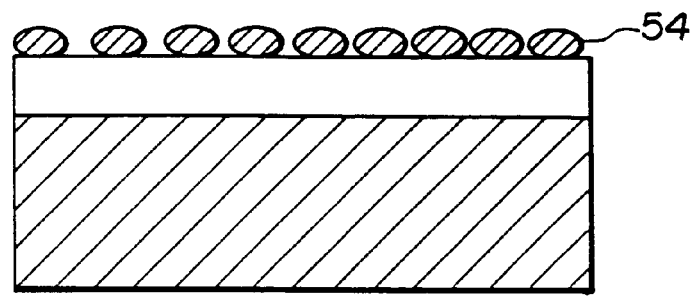

Thereafter, the introduction of the silane gas into the furnace is stopped, the resultant silicon substrate is kept in the furnace for one hour while an oxygen gas is continuously introduced. This causes the amorphous silicon to be crystallized and aggregated to form a granular layer 54 made of single crystals as shown in FIG. 29(b).

Figure 29C:
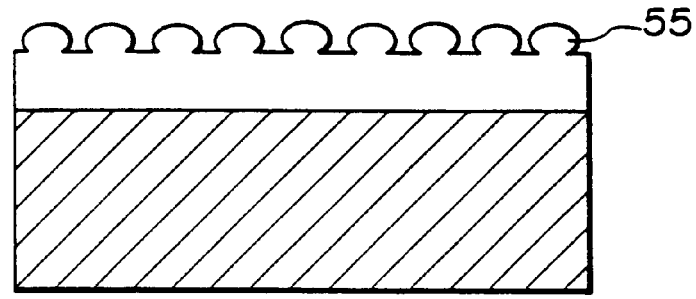

When the resultant substrate is oxidized at 750° C. for 20 hours with use of a mixture gas of hydrochloric acid and water vapor, a silicon oxide film 55 having periodic raised and recessed portions at intervals of about 0.05 μm is formed on the granular layer (FIG. 29(c)).

Figure 29D:
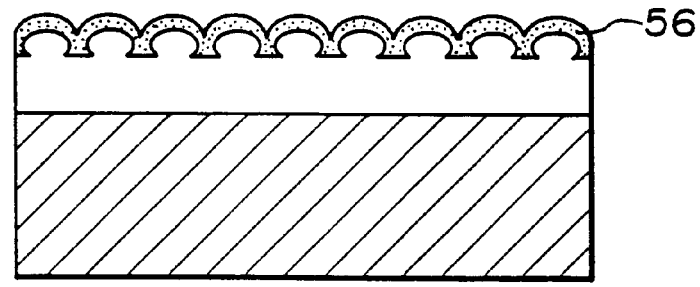

Thereafter, the resultant substrate is subjected to a CVD process with use of a silane gas at a substrate temperature of 630° C. to form a polycrystalline silicon film 56 on the silicon oxide film 55 (FIG. 29(d)).

As a result, the surface of the resultant substrate is raised and recessed at intervals of 0.05 μm so that an electrode having a large unit area can be formed. When the polycrystalline silicon film is used to form the electrode, electrically conductive impurities may be later into the polycrystalline silicon film by ion implantation process to form the electrode and in this case, this formation of the electrode may be also carried out while introducing a diboran gas into the furnace. Since the processing can be effected through all the steps at temperatures below 800° C., even when an MOS device, etc. is already formed in another region, the present invention can be applied.

Further, in the step of FIG. 29(c), when the film formation with use of the silane gas is carried out at a substrate temperature of 550° C. to deposit the amorphous silicon film and the steps are again repeated from the step of FIG. 29(a), deeply raised and depressed surface can be formed.

Furthermore, in the step of FIG. 29(c), even when the silane gas is replaced by a disilane gas and the formation of the amorphous silicon film is formed by a deposition process or a molecular beam epitaxy (MBE) process or another suitable process, substantially the same effects can be obtained, so long as the crystallization is advanced under such a condition that the surface is not oxidized and kept in a free condition.

Explanation will next be made as to the thirteenth embodiment of the present invention wherein the present invention is applied to an MOS capacitor.

Figure 30A:
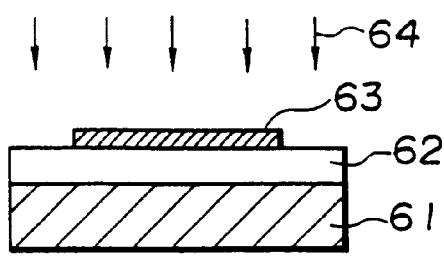
FIGS. 30(a) thru 30(h) illustrate steps of a method for manufacturing a capacitor in accordance with the thirteenth embodiment of the present invention.

As shown in FIG. 30(a), a silicon oxide film 62 of 0.05 μm thick is formed on a silicon substrate 61, a resist pattern 63 is coated on the silicon oxide film, and then the resultant wafer is subjected to an anisotropic ion etching process with use of ions 64 and also with use of the resist pattern 63 as a mask to etch the silicon oxide film.

Figure 30E:
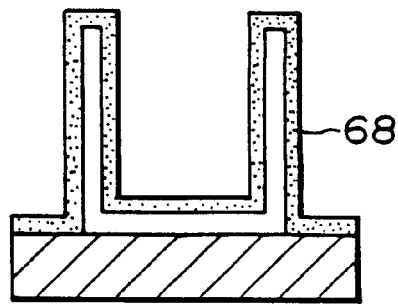
Figure 30B:
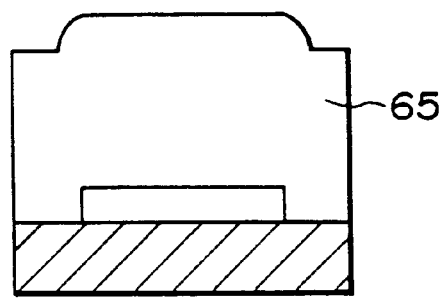
Figure 30F:
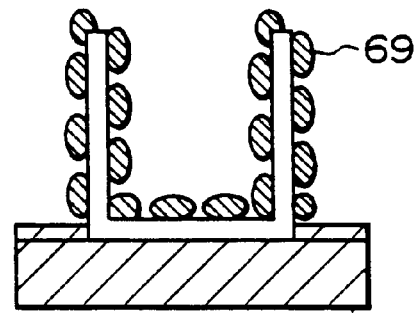

Thereafter, as shown in FIG. 30(b), the resultant wafer is subjected to a CVD process to deposit a silicon oxide film 65 of 0.25 μm thick.

Figure 30C:
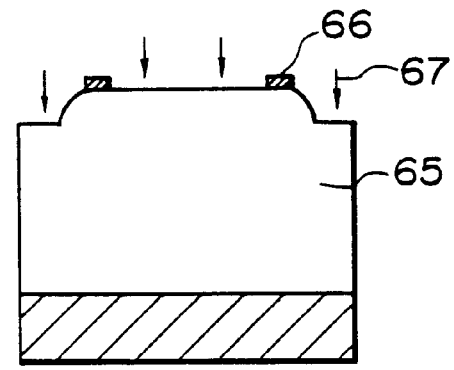
Figure 30G:
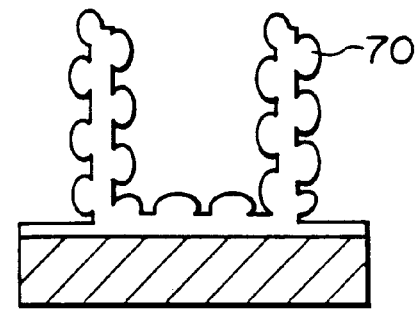

Further, as shown in FIG. 30(c), a resist pattern 66 is formed on the silicon oxide film 65 and then subjected to an anisotropic etching process with use of ions 67.

Figure 30D:
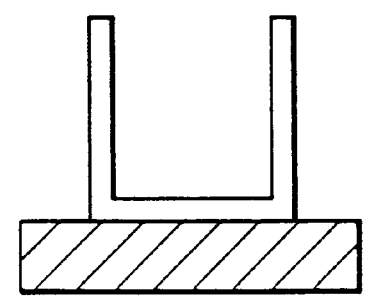
Figure 30H:
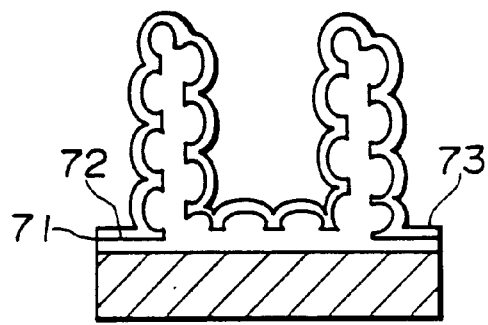

When the etching reaches the silicon substrate 61, the etching is stopped. In this way, such a silicon oxide film having a substantially U-shaped section as shown in FIG. 30(d) is formed. At this point, the etching is adjusted so that, even when overetching is somewhat carried out, the bottom of the silicon oxide film remains.

When the shape processing of the underlying layer is completed, the resultant layer is subjected to a CVD process with use of the silane gas to deposit amorphous silicon film 68 of 0.02 μm thick all thereover, as shown in FIG. 30(e).

Thereafter, the introduction of the silane gas into the furnace is stopped. When the resultant wafer is subjected to a heat treatment at 550° C. for one hour during continuous introduction of the oxygen gas, the amorphous silicon on the silicon oxide film 65 having a substantially U-shaped section is crystallized and aggregated to form a single crystalline granular layer 69 as shown in FIG. 30(*f*). At this time, on the silicon substrate 61, the amorphous silicon does not aggregate and grows into solid phase in the same crystal orientation as the single crystalline silicon substrate to form a flat film.

When the resultant wafer is subjected to an oxidization process with use of a mixture gas of hydrochloric acid and water vapor at 750° C. for 20 hours, a silicon oxide film 70 having regularly raised and recessed portions at intervals of about 0.05 μm is formed on the surface of the wafer (FIG. 30(*g*)).

After this, the resultant wafer is subjected to a CVD process with use of the silane gas at a substrate temperature of 630° C. to form a polycrystalline silicon film 71 as a capacitor electrode, a silicon oxide film 72 as a capacitor insulating film and a polycrystalline silicon film 73 as a capacitor electrode sequentially, thus completing a capacitor (FIG. 30(*h*)).

As a result, a capacitor that has a raised and recessed surface at intervals of 0.05 μm and a large unit area is formed to provide a large effective capacitance.

The fourteenth embodiment of the present invention will then be explained.

Figure 31:
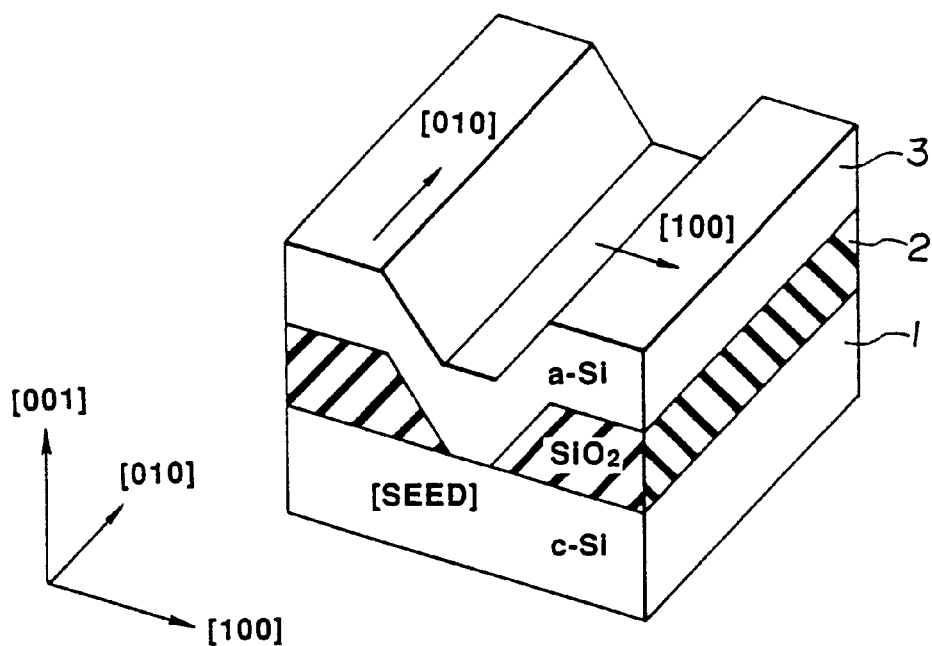
FIG. 31 is a diagram for explaining the principle of a method for forming a semiconductor thin-film in accordance with the fourteenth embodiment of the present invention.

In this embodiment, in order to form an Si single crystalline thin film, as shown in FIG. 31, a silicon oxide film 2 having an opening is formed on a silicon substrate 1, an amorphous Si film 4 is deposited on the silicon oxide film 2 so that its average inter-atomic distance substantially coincides with the average inter-atomic distance of the Si single crystal, and then the resultant wafer is subjected to a heat treatment in an $N_2$ atmosphere to form a silicon single crystal 3.

Figure 32:
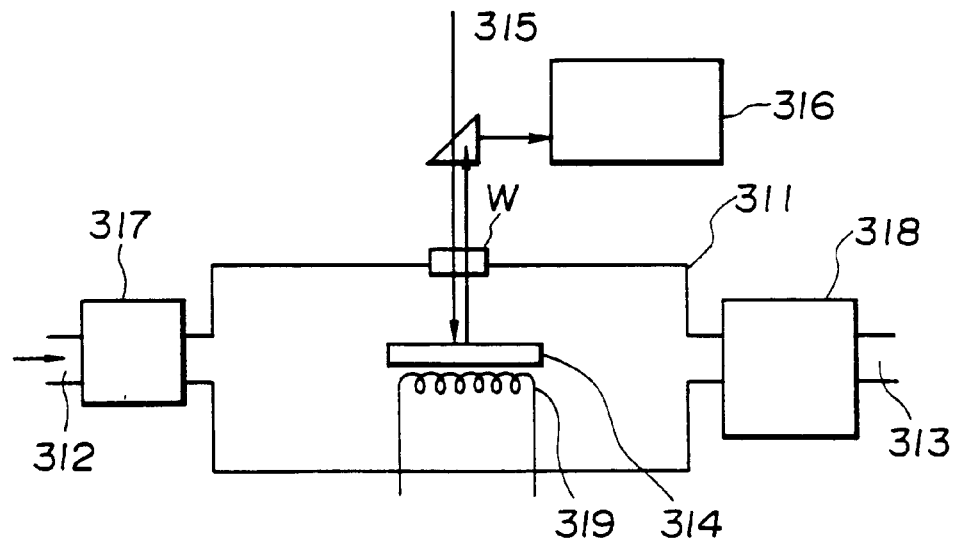
FIG. 32 illustrates a thin-film forming apparatus used in the fourteenth embodiment of the present invention.

FIG. 32 illustrates a schematic block diagram of a thin film forming apparatus used in the fourteenth embodiment of the present invention. This apparatus is featured in that a chamber 311 is provided therein a view port W to which a laser beam source 315 and a spectroscope 316 are disposed so that the density of an amorphous film can be continuously observed by a Raman scattering spectroscopy. More in detail, the chamber 311 is provided with a material gas inlet port 312 for introducing a material gas for film deposition into the chamber and also provided with an exhaust port 313. Provided in the interior of the chamber 311 is a sample table 314. In this embodiment, $H_2$, $SiH_4$ or disilane gas for example is introduced through a mass flow controller 317 as the material gas, and if necessary, a doping gas may also be introduced together therewith. For simplification of the drawing, only one inlet is illustrated but another inlet may be provided to introduce these gases to the proximity of the sample table as necessary. Further, a turbo molecular pump 318 is provided to also adjust the pressure within the chamber and a heater 319 is provided to adjust the temperature of a substrate.

Explanation will be made as to a method for forming a thin film with use of the above apparatus.

A silicon oxide film 82 was previously deposited on a p-type single crystalline (100) silicon substrate 81 and then subjected to a photolithographic process to make an opening therein. In order to cleaning the substrate, etc. prior to the deposition of a thin film, the resultant substrate was subjected to a processing operation at a predetermined temperature with use of a desired gas composition.

Subsequently, an amorphous silicon film 83 of 31.5 nm thick was deposited at a $SiH_4$ partial pressure of 1 Torr at a deposition rate of 7 nm/min, while its average inter-atomic distance was measured with use of a spectroscope. At this time, a substrate temperature was set at 525° C. As will be seen, an output of the spectroscope shows a spectrum having a peak at 480 $cm^{-1}$, and thus the average inter-atomic distance of the amorphous silicon film thus formed produces a spectrum having a peak at 480 $cm^{-1}$, that is, the density is substantially the same as the density of the single crystalline silicon. It has also experimentally been confirmed that, in this case, the average inter-atomic distance of silicon atom and the density reflect on the spectrum position. More specifically, it has been confirmed that when density measurement is carried out by a Rutherford back scattering (RBS) method over a sample whose spectrum is shifted to its low frequency side by 1.01 times, the density is as small as 1/1.01 times the density of the single crystal and its average inter-atomic distance is 1.01 times spread. The average inter-atomic distance of the amorphous film is between 0.98 and 1.02, desirably below 1.01 and more desirably between 0.995 and 1.005 and ideally as closer to 1.

When the film formation of the amorphous silicon was carried out at a film forming rate R under a condition satisfying the following equation by changing the temperature and gas composition, the average inter-atomic distance of the film was between 0.98 and 1.02.

$$\log R\ (\text{Å/min}) < -10614/T(K) + 14.857$$

Figure 33:
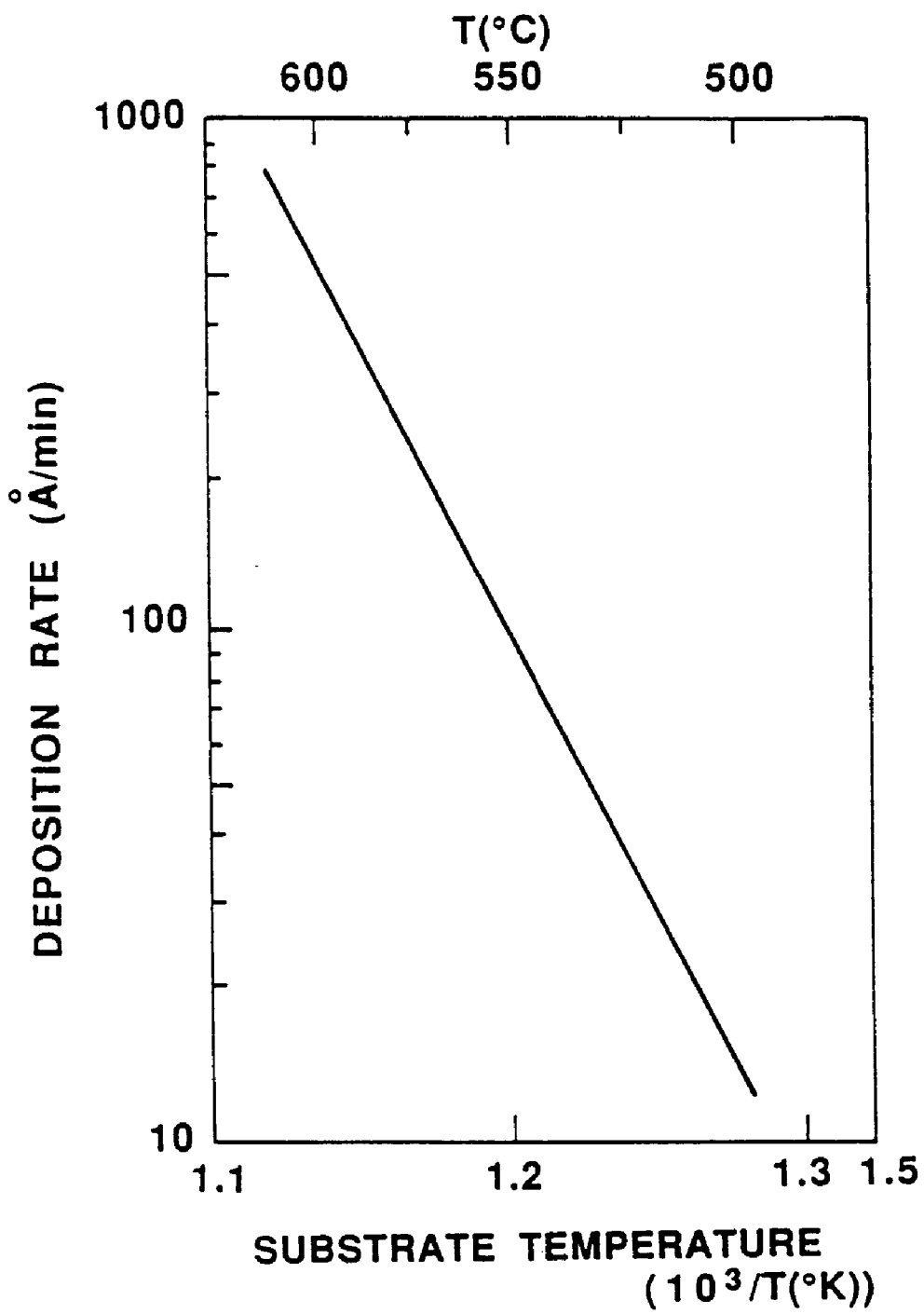
FIG. 33 illustrates a relationship between film forming rate and substrate temperature for obtaining amorphous single crystalline silicon film s having average inter-atomic distances of 0.98 to 1.02.

An area satisfying the above equation is illustrated in FIG. 33. In the other area than the equation-satisfied area, it was impossible to form such a film that its average inter-atomic distance exceeds 1.02.

Figure 34:
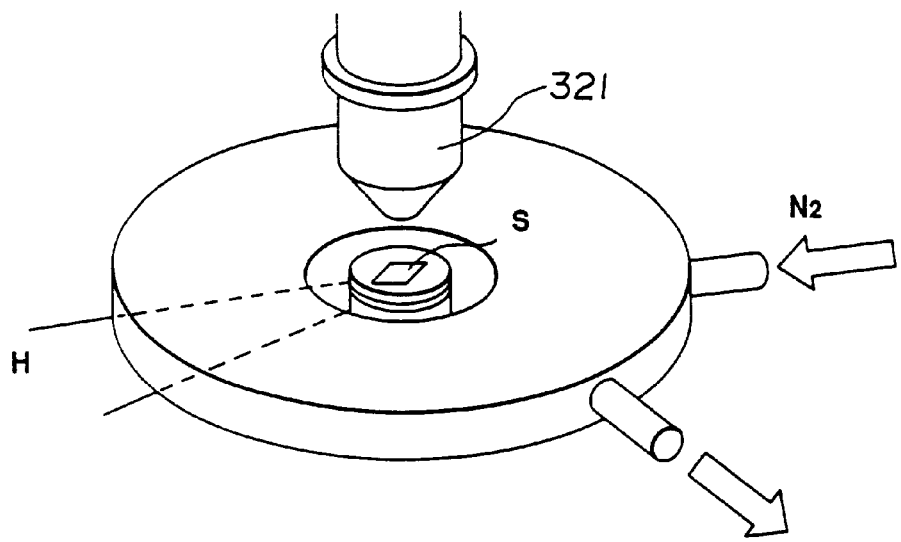
FIG. 34 illustrates a heat treatment apparatus used in the fourteenth embodiment of the present invention.
Figure 35:
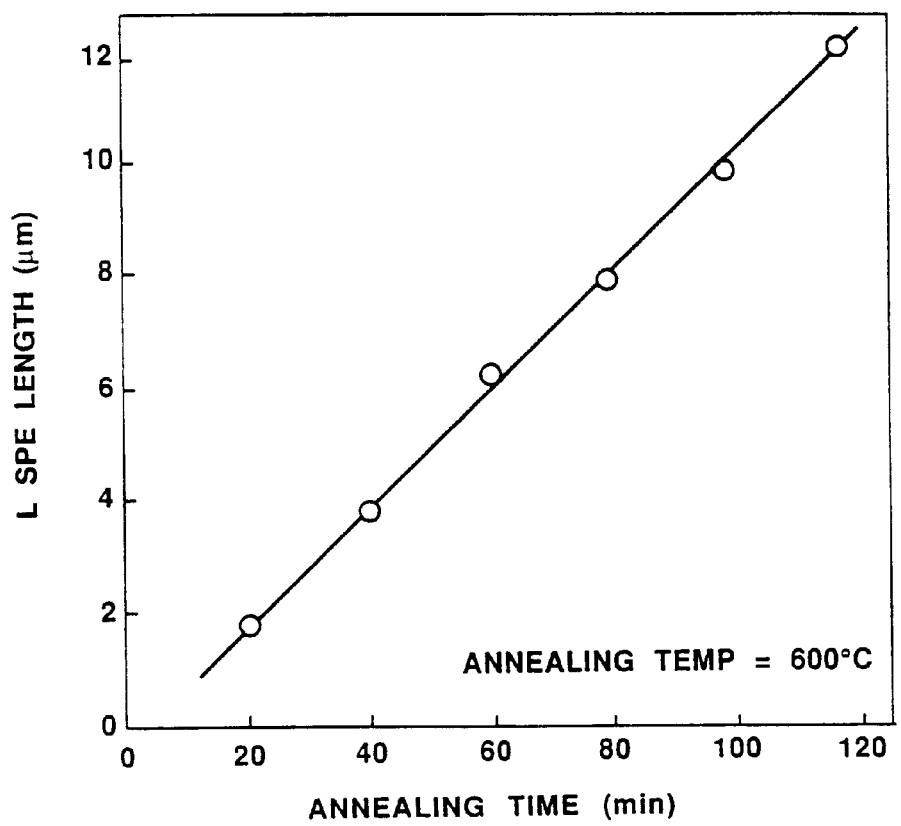
FIG. 35 illustrates time dependence of growth distance in the present invention.

The silicon substrate having the amorphous film formed thereon is taken out from the chamber and then subjected to a heat treatment by using a heater H in an $N_2$ atmosphere for re-crystallization of a sample S as shown in FIG. 34. The processing temperature was for example, 600° C. In this apparatus, a gas inlet communicates with an exhaust port which in turn is connected to a vacuum pump to draw vacuum within the chamber. Next, the time dependence of growth distance horizontally from 'seed' of the sample S was measured with use of an optical microscope 321. In this case, the rising temperature of the furnace was 50° C./min. and the falling temperature thereof was 99° C./min. The heat treatment duration was divided into sub-durations each of several minutes, the film photographs in the respective sub-durations were taken by the optical microscope, and the time dependence of growth distance and variation in growth rate were found. Its results are given in FIG. 35. It will be seen from the drawing that the growth rate is constant the growth distance linearly increases with time.

The boundary between the amorphous silicon and single crystalline silicon, i.e., the shape of growth front as well as crystal defects within the film were observed with use of the transmission electron microscope. As a result, it has been found that, as mentioned above, generation of such a crystal defect as a twin caused by a variation in the preferential growth plane as well as decrease in the growth rate are observed.

Figure 36:
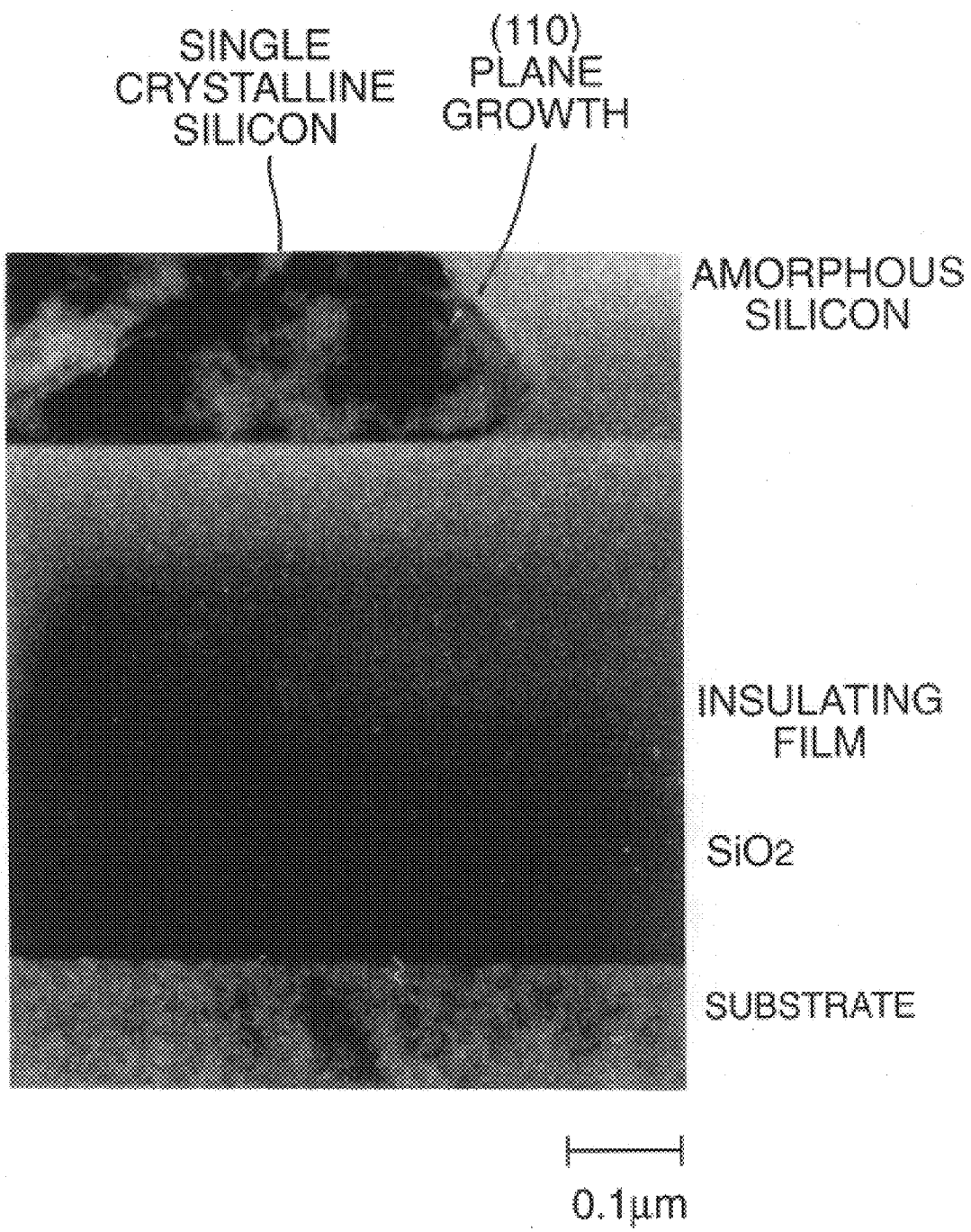
Figure 37A:
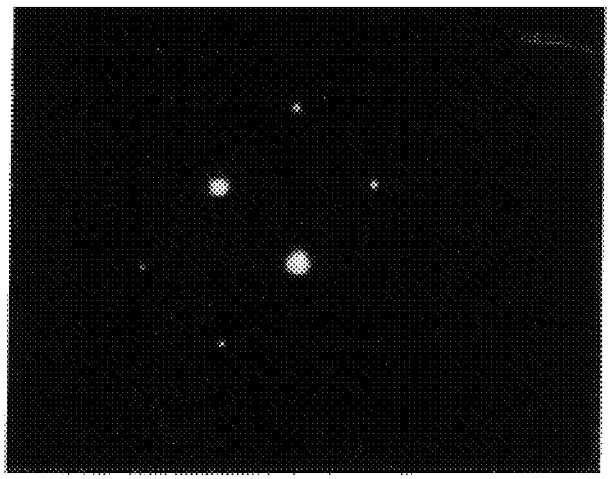
FIGS. 37(a) and 37(b) illustrate a cross-sectional electron-beam diffraction image TEM photograph (with heat treatment for 2 hours) in the fourteenth embodiment of the present invention.
Figure 37B:
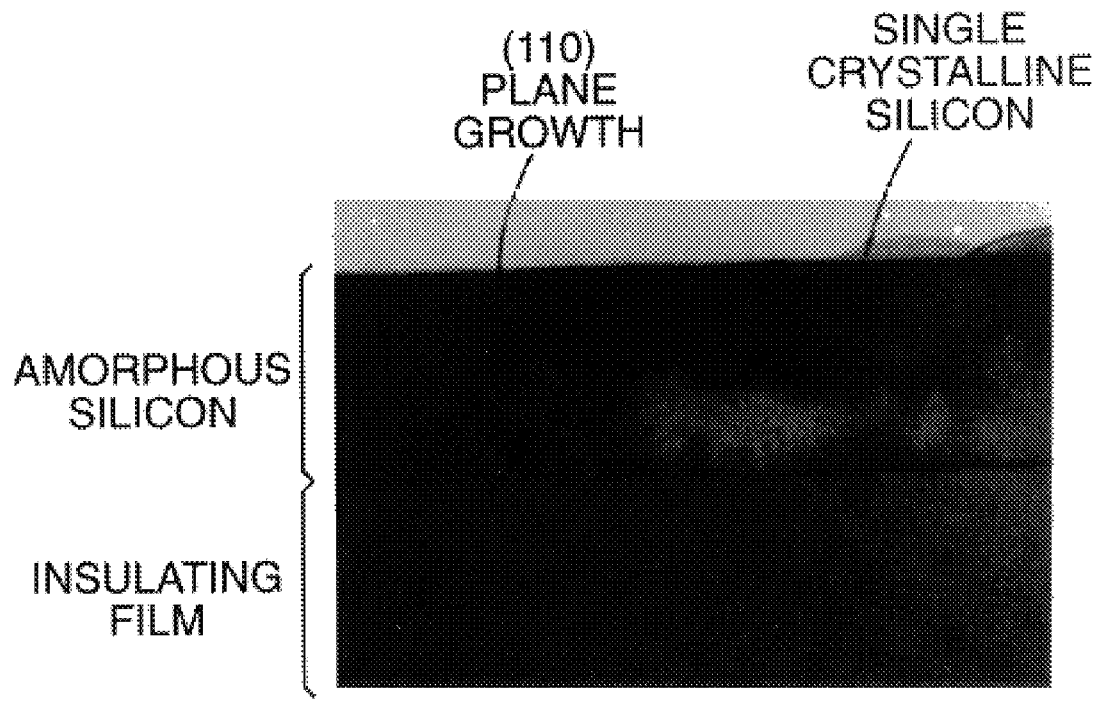

For the purpose of confirming the suppression of the variation in the preferential growth plane, there are prepared two types of film samples one of which was heat treated at 600° C. for 5 minutes and the other was heat treated for 2 hours, and these samples were subjected to observation of the cross-sections of the samples with use of a transmission electron microscope (TEM) at an acceleration voltage of 400 KV with a resolution of 0.1 nm. the photographs are given in FIGS. 36 and 37. FIG. 36 shows a TEM image for the 5-minute heat-treated sample, FIG. 37(*a*) shows an electron beam diffracted image for the 2-hour heat-treated sample, and FIG. 37(*b*) shows a TEM image for the 2-hour heat-treated sample. In particular, with respect to the 2-hour heat-treated sample, it has been confirmed from the electron beam diffracted image that the sample is a good quality of single crystal, that is, the crystallization advances to 12 $\mu$m from 'seed', the growth front also maintains a (100) plane, and the sample contains no such defects as twins in the same crystal orientation as the silicon substrate.

Similar evaluation were made with respect to the amorphous films having average inter-atomic distances corresponding to 0.98–1.02 times that of the single crystal, and in either film, a good quality of single crystal was obtained.

Figure 38:
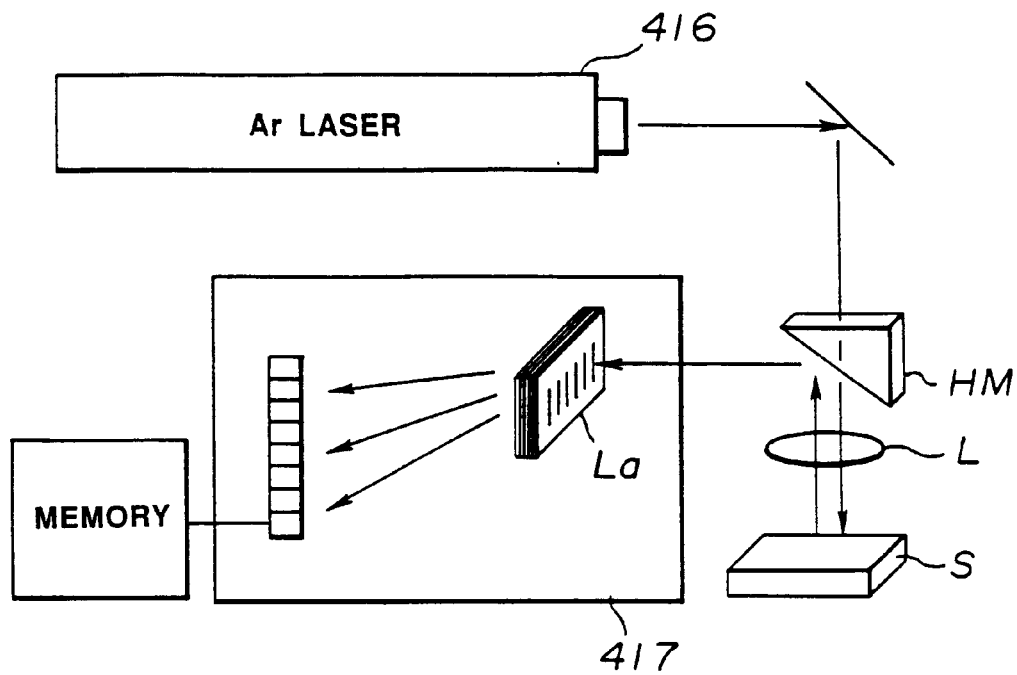
FIG. 38 illustrates a cross-sectional TEM photograph by a transmission electron microscope (TEM) (with heat treatment for 5 minutes) in the fourteenth embodiment of the present invention.

Further, the amorphous films after its single crystallization were actually measured by a Raman microscopy and the effects were confirmed. A spectroscope, which was used in the Raman microscopy was developed by the inventors, is arranged so that, as shown in FIG. 38, a laser beam from an Ar laser 416 is directed through a microscope including a half-mirror HM and a lens L, and onto a 1-$\mu$m-diameter zone on the surface of a sample S so that light scattered by 180 degrees on the zone is introduced into a spectroscope 417 including diffraction grating La and a CCD camera CCD for spectrochemical analysis. Used as a light receiver is a multi-channel charge-coupled device (CCD) camera which receives spectrum at one time to integrate or store it in a memory M to thereby offer a high sensitivity. Measurements were conducted under such conditions that laser wavelength is 514.5 nm, sample irradiation energy is 3 mW and irradiation spot diameter is 1 $\mu$m.

Figure 39:
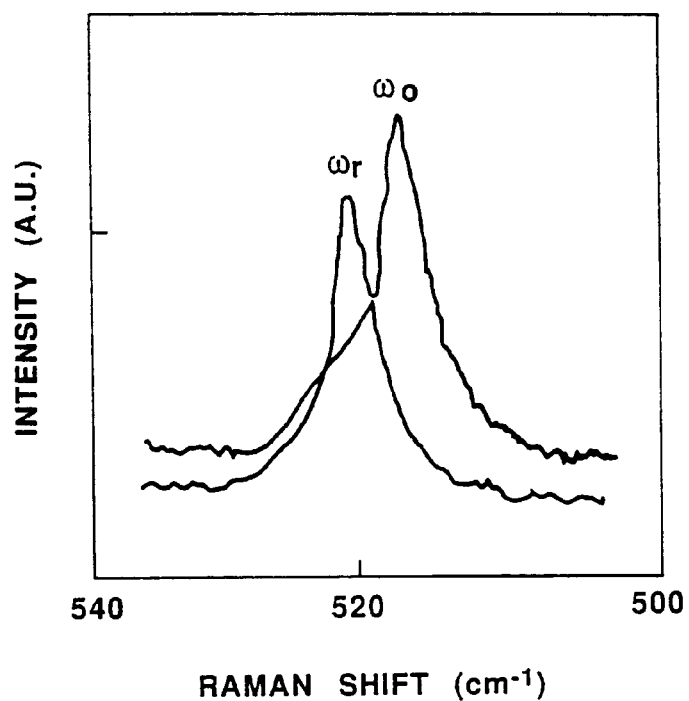
FIG. 39 illustrates Raman peaks measured by the system.
Figure 40:
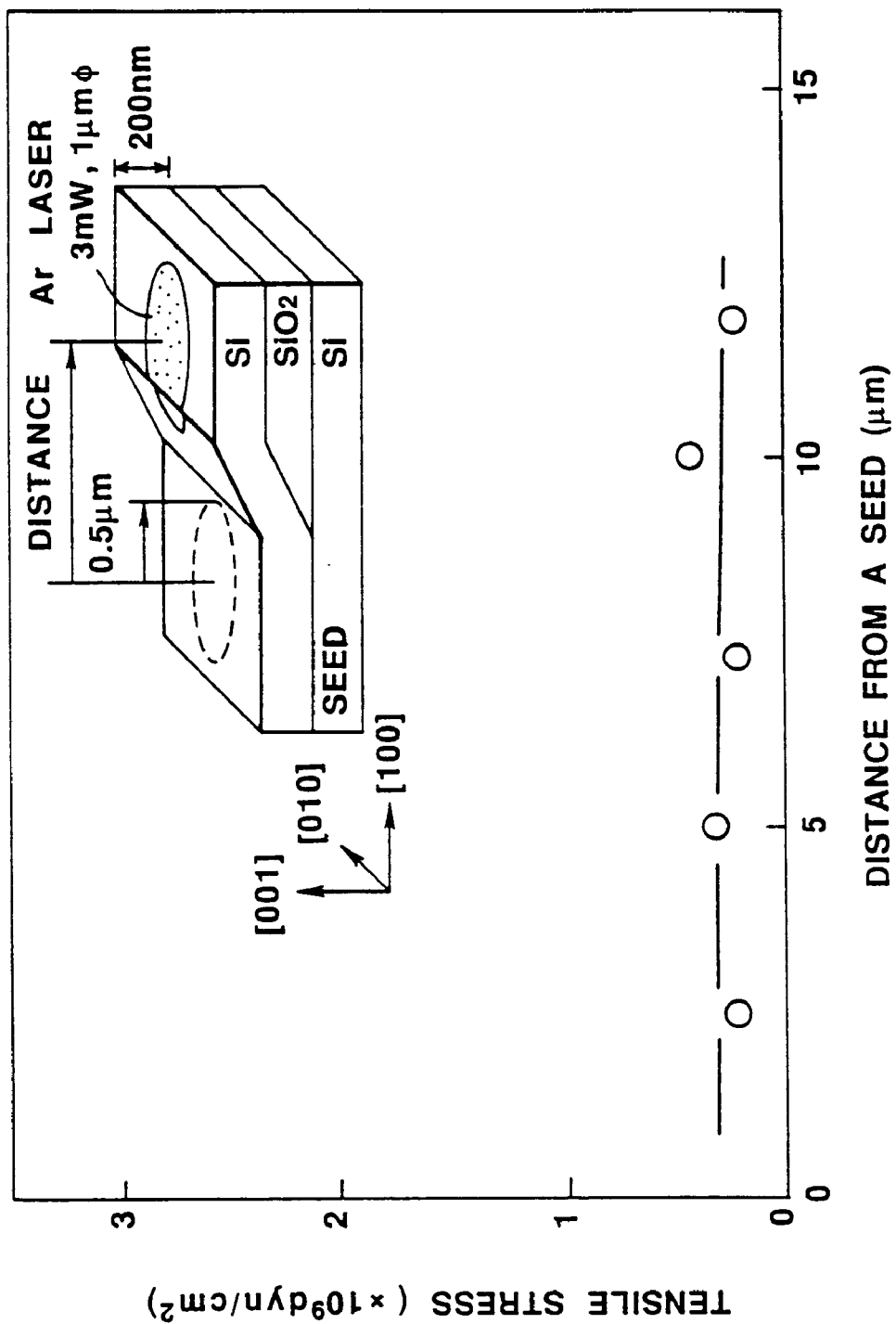
FIG. 40 illustrates a stress distribution in the fourteenth embodiment of the present invention.

Stress ($\sigma$) was calculated in accordance with the following equation using a spectrum peak.

$$\sigma = 2.49 \times 10^9 (\omega_0 - \omega_r) \ (dyn/cm^2)$$

where $\sigma$ denotes stress, $\omega_0$ (cm$^{-1}$) is the wave number of a spectrum peak for the sample, $\omega_r$ (cm$^{-1}$) is the wave number of a spectrum peak for a substrate at room temperature. As an elastic distortion constant, etc. used to calculate this coefficient, those of single crystalline silicon were used. FIG. 39 shows Raman spectra measured by the spectroscope. The stress was found from a shift between the spectra in accordance with the above equation. When a peak is shifted to a low stress side, it is found that the stress is a tensile stress. Here, only the shift was used. The laser beam has a diameter of 1 $\mu$m and an average stress within the 1 $\mu$m-diameter range could be obtained. A stress distribution thus obtained is shown in FIG. 40. It has been confirmed that, even at a position far from the 'seed', substantially no residual stress is present, as the inventors expected. Thus, it has also been confirmed that the tensile stress, which would occur in the prior art film, is generated for film shrinkage.

From the above results, when an amorphous film having a density close to the density of its single crystal is used, the crystallization of the film causes no stress, so that a change in the preferential growth plane from the (110) silicon plane to the (111) silicon plane can be suppressed and the growth can be extended to a far position without decreasing its growth rate with a good crystal quality.

Prior to the deposition of the amorphous film, it is important to keep the surface of the 'seed' portion as clean as possible, in particular, to remove any spontaneous oxide film therefrom. Removal of the spontaneous oxide film from the surface of the 'seed' portion was carried out by means of the reduction reaction of a reactive gas. For example, when the amorphous film was subjected to a reduction process at 850° C. at an SiH$_4$ partial pressure of 7×10$^{-4}$ Torr for 30 minutes, the spontaneous oxide film could be removed perfectly from the amorphous film. It is also important, after the removal of the spontaneous oxide film, to continuously deposit an amorphous film.

Although the re-crystallization step was carried out in an N$_2$ atmosphere, in this embodiment, the N$_2$ gas may be replaced by a hydrogen or argon gas. The solid phase growth temperature was set to be higher than the deposition temperature in this embodiment, but the solid phase growth temperature may be set to be lower than the deposition temperature and the heat treatment may be performed for a long time. Further, the solid phase growth may be optically promoted. The heat treatment may be replaced by electron beam (EB) process or the like.

Explanation will next be made as to the fifteenth embodiment of the present invention.

The present embodiment is featured in that, in order to make the density of an amorphous silicon film 83 coincide with the density of its single crystal, the density of the amorphous silicon film after its formation is measured by a Raman microscopy and then subjected to an ion implantation process by an amount of ions calculated based on the measured density.

Figure 41:
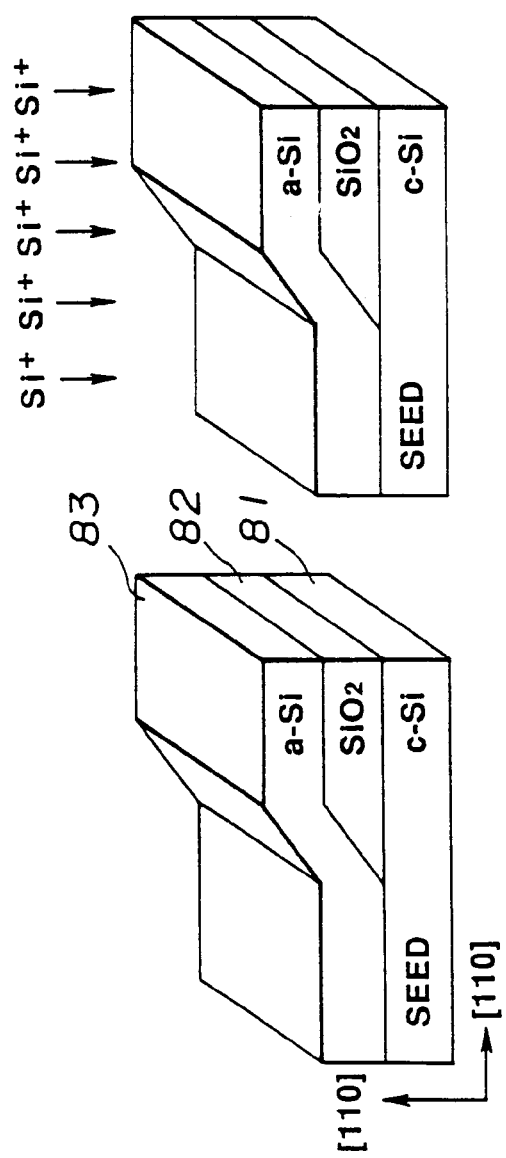
FIGS. 41(a) thru 41(c) illustrate steps of a method for forming a silicon thin film in accordance with the fifteenth embodiment of the present invention.

First, as shown in FIG. 41(*a*), an amorphous silicon film of 0.2 $\mu$m thick was deposited and measured by the Raman microscopy with respect to its density. As a result of the measurement, the film density was 0.97. An optimum ion implantation amount was calculated on the basis of the value of 0.97 and thus the film was subjected to an ion implantation process by 3.75×10$^{20}$ atoms/cm$^2$. In this case, when an acceleration voltage was set to be 80 keV and a dose was set to be 8.3×10$^{14}$ atoms cm$^2$, the density was 1.00.

As shown in FIG. 41(*c*), the resultant wafer was subjected to a heat treatment at 600° C. for 2 hours to form a single crystalline silicon film 3.

Figure 42:
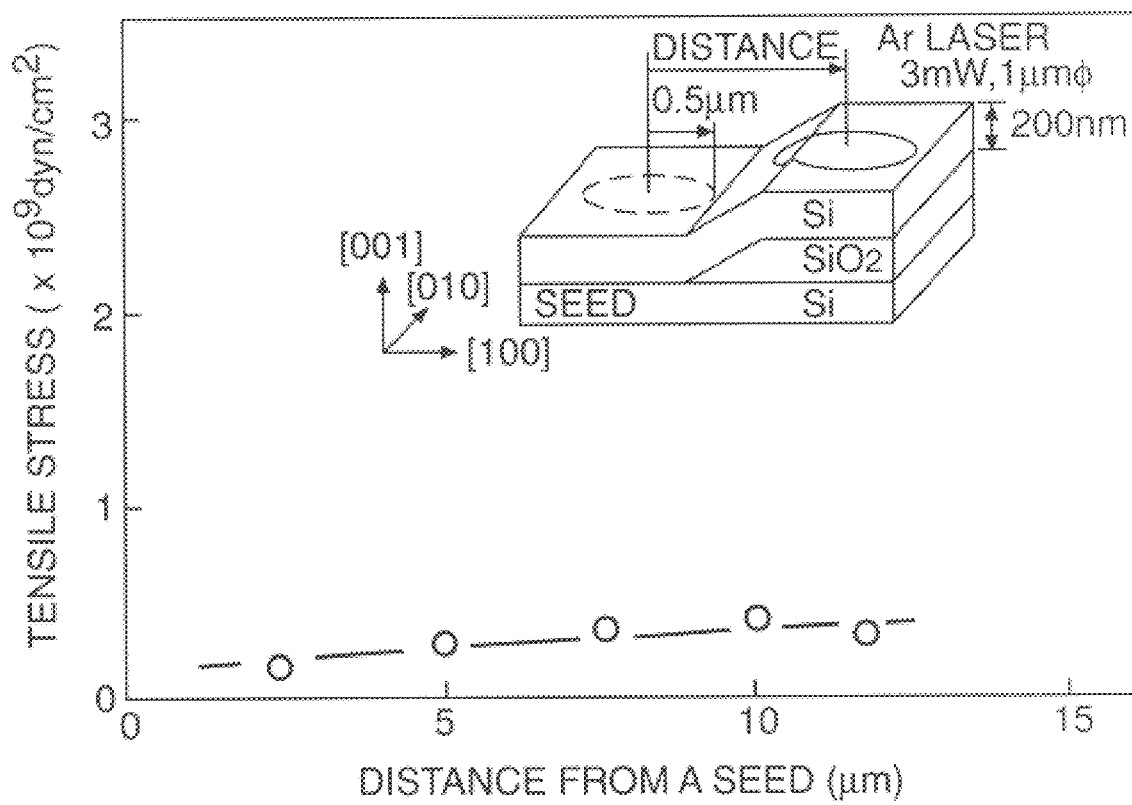
FIG. 42 illustrates a stress distribution in the fifteenth embodiment of the present invention.
Figure 43:
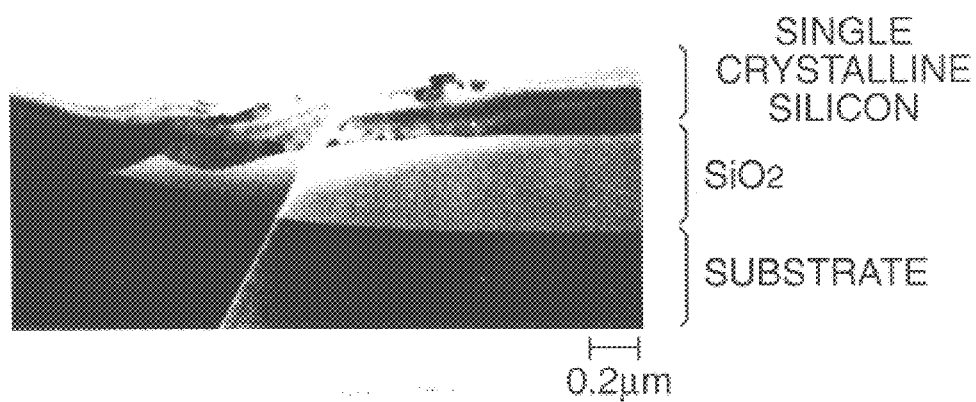
FIG. 43 illustrates a SEM image of the silicon thin film formed in accordance with the fifteenth embodiment of the present invention.

With regard to the single crystalline silicon film thus obtained, no crystal defects was observed, a residual stress was small as shown in FIG. 42, and such a good single crystalline silicon film as shown in FIG. 43 was obtained.

The fourteenth and fifteenth embodiments have been explained in connection with the example using the 'seed'. Next, explanation will be directed to the sixteenth embodiment of the present invention wherein a heat treatment was carried out without using the 'seed'.

First, as shown in FIG. 44, a silicon oxide film 2 was formed on a (100) silicon substrate 1, and then an amorphous silicon film 3 of 20 nm thick was deposited on the silicon oxide film 2 at an SiH$_4$ partial pressure of 2 Torr while keeping a substrate temperature at 515° C. The average inter-atomic distance of the amorphous silicon film was 1.03 times the average inter-atomic distance of its single crystal.

Thereafter, the amorphous silicon film was subjected to an ion implantation process at an acceleration voltage of 20 keV by 5×10$^{15}$ atoms/cm$^2$ of silicon ions. As a result, the average inter-atomic distance of the amorphous silicon film became nearly equal to the average inter-atomic distance of its single crystal.

The resultant wafer was immersed for one minute in a hydrogen fluoride (HF) aqueous solution obtained by diluting hydrogen fluoride 100 times with pure water to remove a spontaneous oxide film from the surface of the amorphous film, and then the surface of the substrate was cleaned.

Within 5 minutes after this, the substrate was moved into the heat treatment apparatus shown in FIG. 32.

Next, the interior of the heat treatment apparatus was vacuumized to a high vacuum level of below $1 \times 10^{-7}$ Torr, heated to a substrate temperature of 550° C., and then kept as it were for 2 hours.

After the substrate temperature was decreased nearly to the room temperature, the vacuum was broken and the silicon substrate was transported out of the apparatus.

Figure 46:
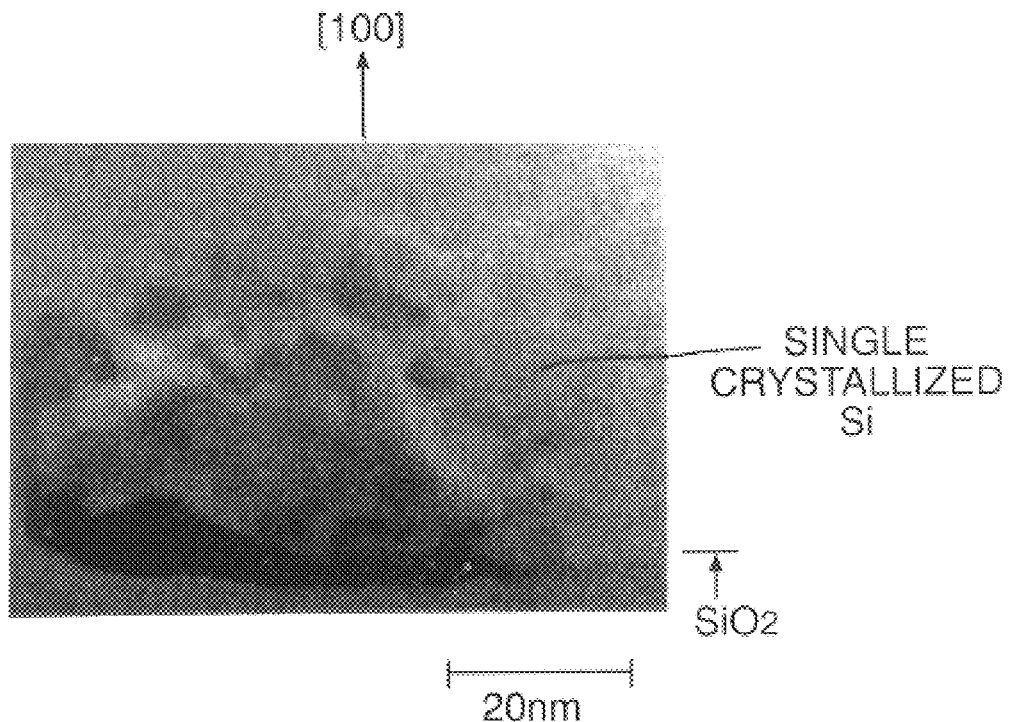
FIGS. 46 illustrates a TEM image of the silicon grains.
Figure 47:
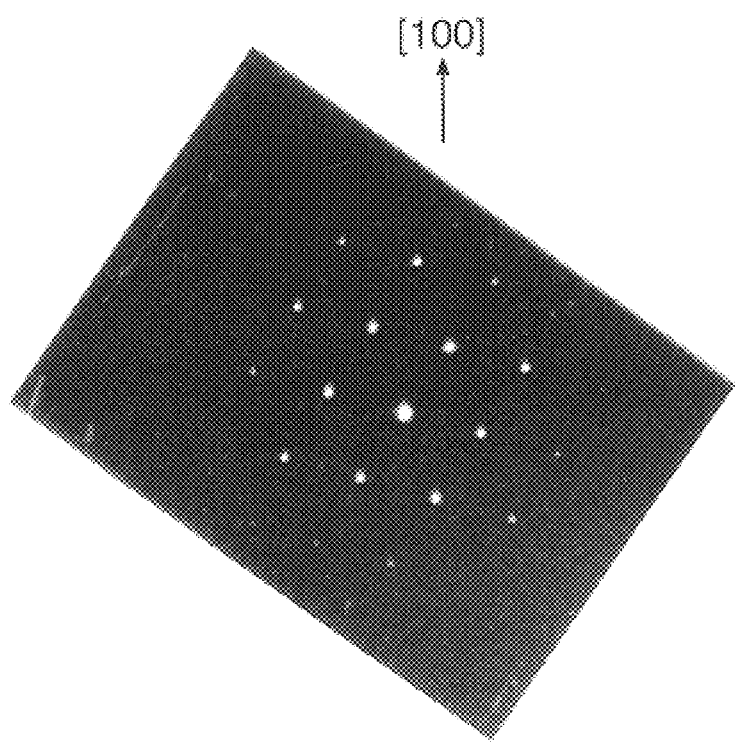
FIG. 47 illustrates an electron beam diffraction image of the silicon grains.

The resultant film thus obtained was observed by a scanning electron microscopy (SEM), which results are given by a photograph and a model diagram in FIG. 45(a) and (b). As will be clear from the drawing, a single crystalline silicon 4 which has uniform-size grains is formed on the insulating film. FIG. 46 shows a result obtained by measuring the structure of one silicon grain by a transmission electron microscopy (TEM). It has been found that an lattice image can be clearly seen and grains are respectively single crystallized. Thus, there was obtained a perfect single crystal free of detects herein. Also, the orientation of these crystal grains was examined by an electron beam diffractometry, which result is given in FIG. 47. It has been observed that the grains have all vertical crystal orientation axes with are directed to the (100) axis. The orientation is a fully new phenomenon and thus has not been fully explained yet. But, all the grains offered a good orientation.

Figure 48:
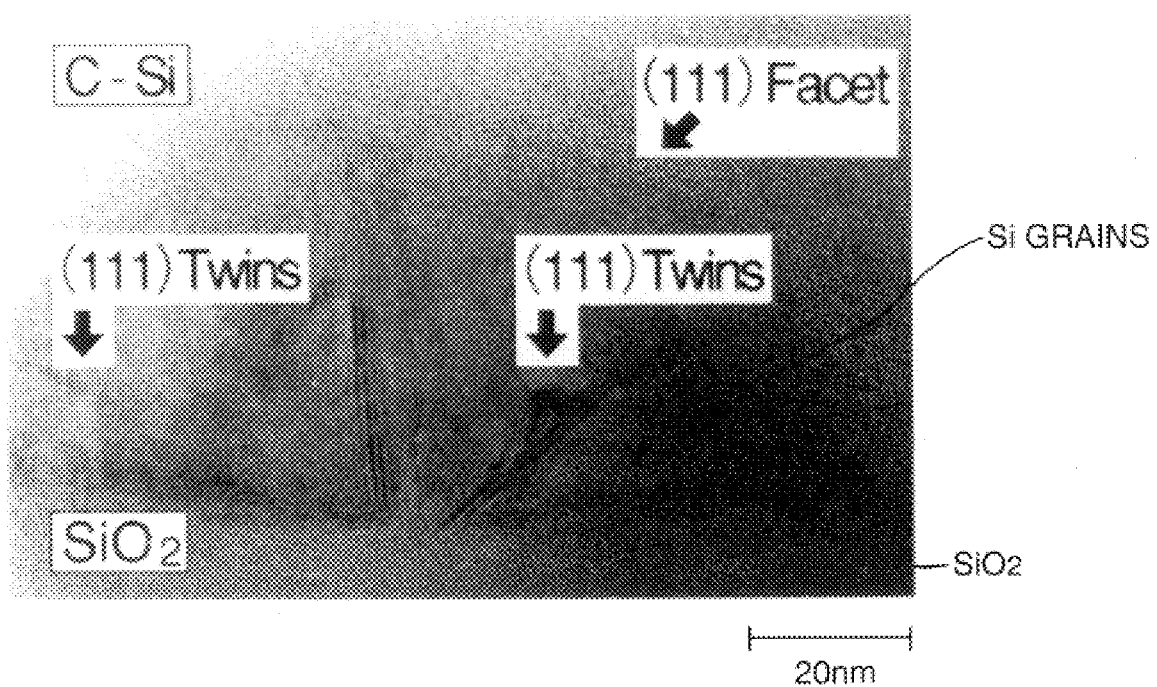
FIG. 48 illustrates a TEM image of silicon grains formed by a conventional method for comparison.
Figure 49:
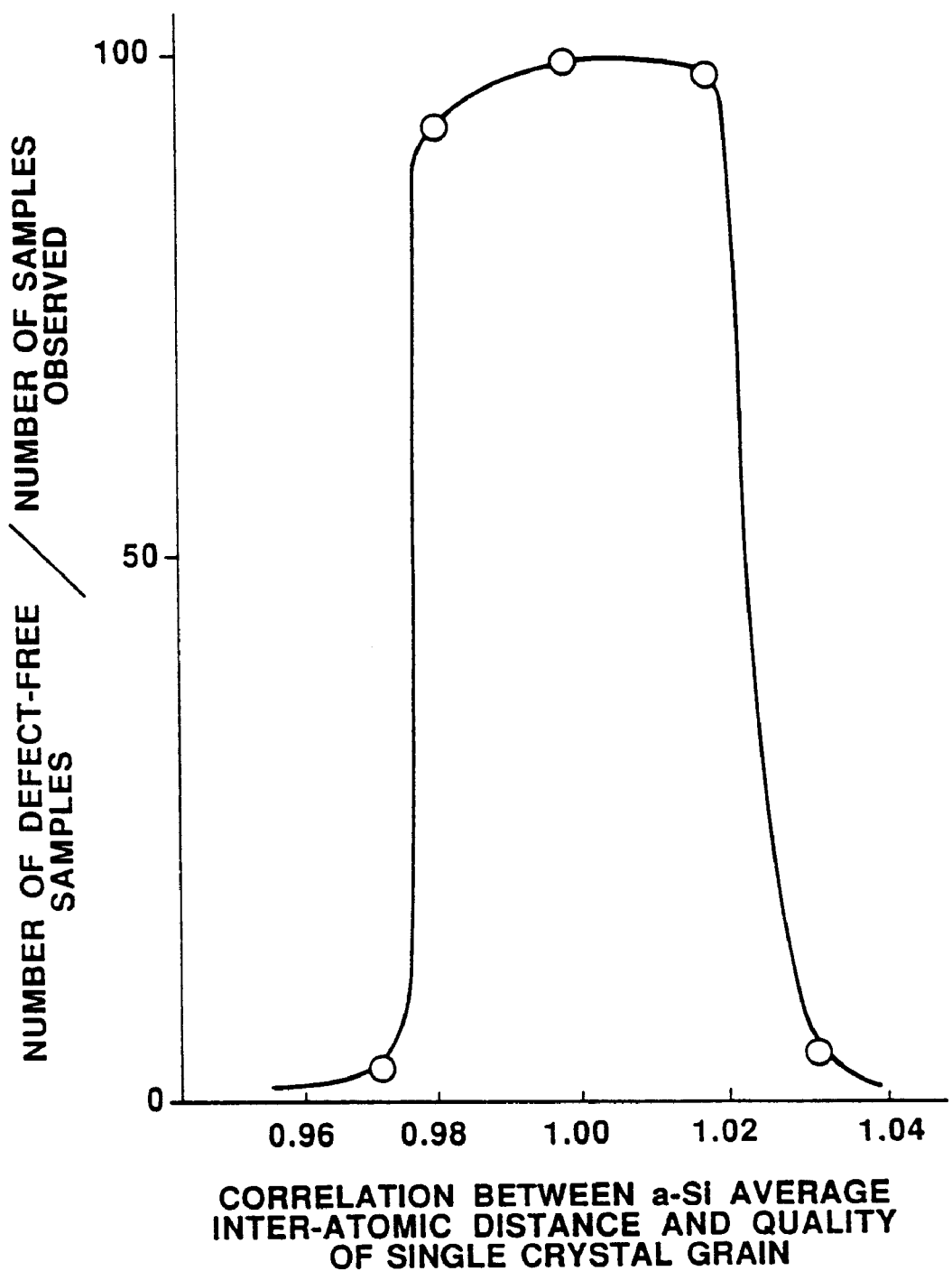
FIG. 49 illustrates a correlation between the average inter-atomic distance of amorphous film and the crystal quality of single crystalline grain.

A similar heat treatment was carried out, except that the silicon ion implantation process was not performed. Its result is shown by a TEM photograph in FIG. 48. Even in this case, a single crystalline silicon of grains having uniform sizes was formed on an insulating film. However, when the lattice image of the grains is carefully examined, such crystal defects as twins can be observed. Further, when the orientation of the grains was examined by an electron beam diffractometry, but the orientation could not specifically be observed. The solid phase growth mechanism and defect generation mechanism of such granular single crystal are not clear yet, but the inventors estimated the mechanisms as follows, from the observation of the TEM image. That is, the inventors considered that the 'crystal nucleus' of the crystal grains is generated on the surface of the amorphous film, because the resultant crystal grains have a substantially spherical shape and the height of the grains from their center corresponds to the thickness of the amorphous film. The single crystallization progresses from the nucleus. The shape of a growth front of the crystallization comprises a sharp plane on the insulating film side. When the growth front advances downwardly (toward the insulating film side) to some extent, a difference in density between the amorphous and single-crystallized films causes generation of a large stress at the growth front. In order to soften the stress, the plane of the growth front is shifted so that crystal defects occur. This consideration matches the simulation results already mentioned above. When various ion implantation amounts were used, resultant films based on ion implantation amount which are well off with respect to $5 \times 10^{15}$ atoms/cm$^2$, showed the similar results. Further, a correlation between the single crystal and crystal quality was measured when the ion implantation amount was varied and the average inter-atoms distance of the amorphous film was varied, which measurement result is given in FIG. 49. It has been found from FIG. 49 that, when the average inter-atomic distance lies between 0.98 times the average inter-atomic distance of its single crystal and 1.02 times thereof.

Explanation will then be made as to the seventeenth embodiment of the present invention. In this embodiment, an insulating film is formed with a raised and recessed surface, on which an amorphous silicon film is formed. The resultant wafer is subjected to a heat treatment for crystallization.

Figure 50A:
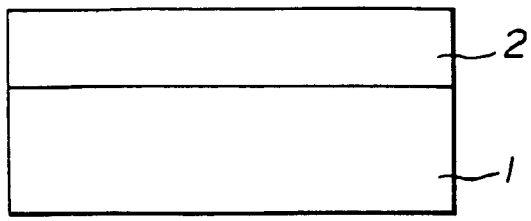
FIGS. 50(a) thru 50(d) illustrate steps of a method for manufacturing a semiconductor thin-film in accordance with the seventeenth embodiment of the present invention.

First, as shown in FIG. 50(a), a (100) silicon substrate 1 is prepared and a silicon oxide film 2 of 300 nm thick is deposited on the silicon substrate 1.

Figure 50B:
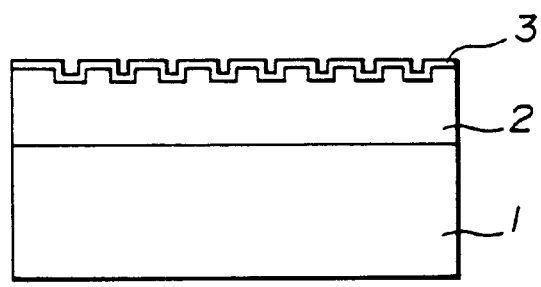

Thereafter, as shown in FIG. 50(b), a resist pattern is coated on the silicon oxide film 2, subjected to an exposure/development process to form a resist pattern, and then subjected to an etching process with use of the formed resist pattern as a mask, whereby the surface of the silicon oxide film is finely raised and recessed about 20 nm deep. Then, the resist pattern is removed from the silicon oxide film, and an amorphous silicon film 3 of 20 nm thick is deposited on the silicon oxide film 2 at a substrate temperature of 515° C. at an SiH$_4$ partial pressure of 0.5 Torr. The average inter-atomic distance of the amorphous silicon film was 1.01 times the average inter-atomic distance of its single crystal.

Next, the resultant wafer was put in the interior of the heat treatment apparatus, the interior thereof was vacuumized to a high vacuum level of below $1 \times 10^{-7}$ Torr, the substrate temperature was raised to 600° C., and the temperature was kept for one hour.

After, the substrate temperature was decreased to the room temperature, the vacuum of the chamber was broken and the silicon substrate was taken out from the chamber.

Figure 50C:
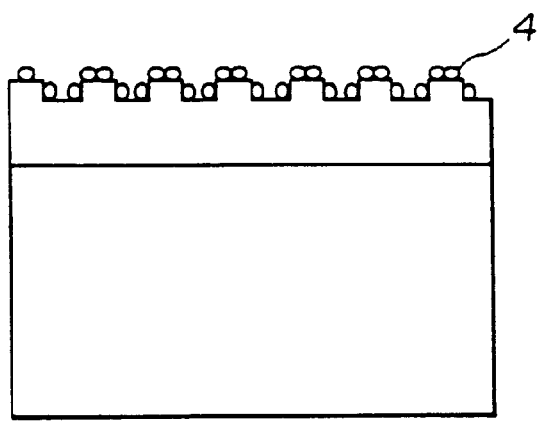

It has been found that, as shown in FIG. 50(c), the resultant film is formed with silicon single crystalline grains which are perfectly aligned in crystal orientation. When some device was taken, for example, by mounting a turbo pump to the film formation device, the similar result could be obtained only by increasing the temperature to 600° C. continuously after the film formation.

Figure 50D:
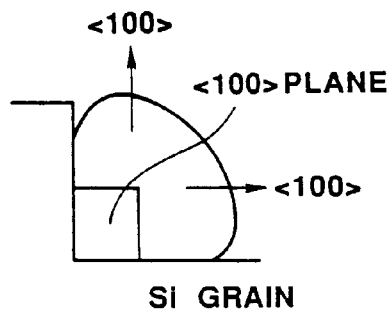

This phenomenon can be explained as follows. That is, as shown by a magnified diagram of FIG. 50(d), when the underlying layer has a raised and recessed surface, the amorphous silicon film deposited on the recessed part is orientated to that the (100) axis of grains is directed to two horizontal and vertical directions, because the side and bottom faces of the recess have the insulating film. Since the crystal orientation is suppressed by the two axes.

Figure 51:
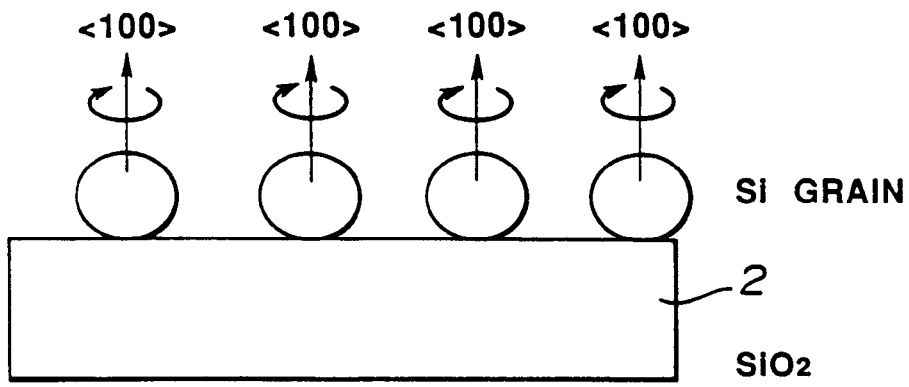
FIG. 51 is a diagram for explaining how silicon grains are formed in the prior art.

When an amorphous silicon film on a flat insulating film is single crystallized to form grains, on the other hand, the single crystallization is carried out so that the (100) axis of the grains is pointed to the vertical direction. However, since the crystal orientation is limited to the single axis, the crystal orientation on the horizontal plane is rotated and not determined as shown in FIG. 51, which results in different orientations of grains.

Figure 52:
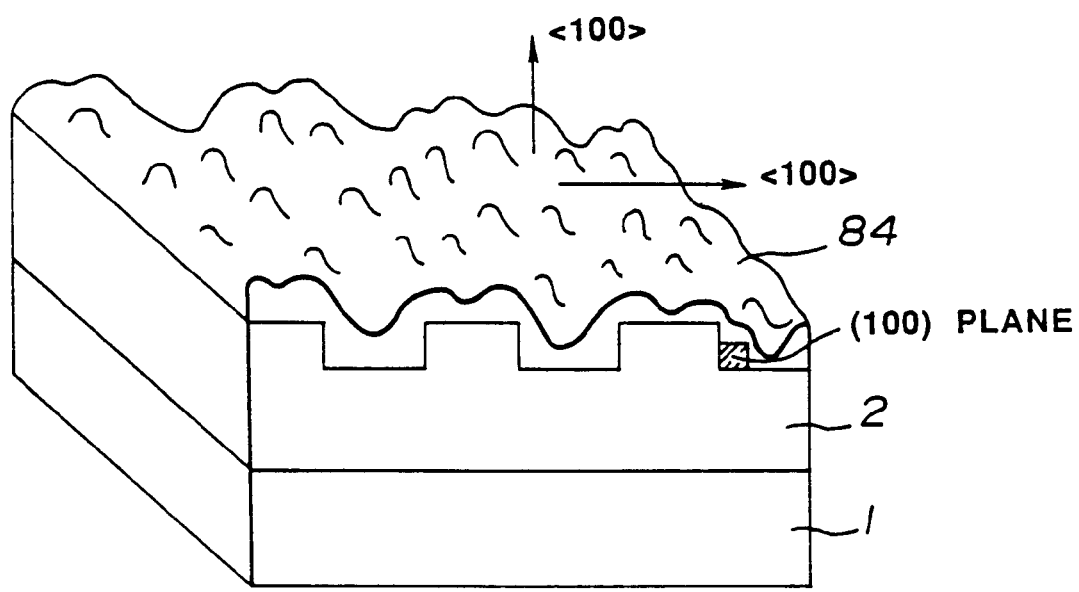
FIG. 52 illustrates a single crystalline thin film obtained by a method for manufacturing a semiconductor thin-film in accordance with the present invention.

Shown in FIG. 52 is an example when an insulating film is formed with a raised and recessed portion, i.e. grooves at fine linear intervals and an amorphous silicon film is deposited on the insulating film. The amorphous silicon film was formed under film formation conditions that the density of the amorphous silicon film is controlled to be substantially equal to the density of its single crystal by measuring the density by the Raman scattering microscopy, and then subjected to a heat treatment. As a result, a single crystalline film could be obtained which is not separated into grains and completely free of defects, because the amorphous silicon film is formed thick.

Further, when a second amorphous silicon film of about 200 nm was deposited on the resultant single crystalline film and subjected to a heat treatment, there could be obtained a single crystalline film which has a crystal quality as good as the single crystalline film obtained by directly depositing on a silicon substrate and by performing a heat treatment.

Explanation will be made as to the eighteenth the embodiment of the present invention. The present embodiment is featured in that fine variations are provided to the surface of an underlying material to control the crystal orientation. More specifically, a fine linear silicon oxide film 2b is formed on a silicon nitride film 2a formed on a silicon substrate. An amorphous silicon film is formed on the resultant wafer and then subjected to a heat treatment to form a single crystalline silicon film.

Figure 53A:
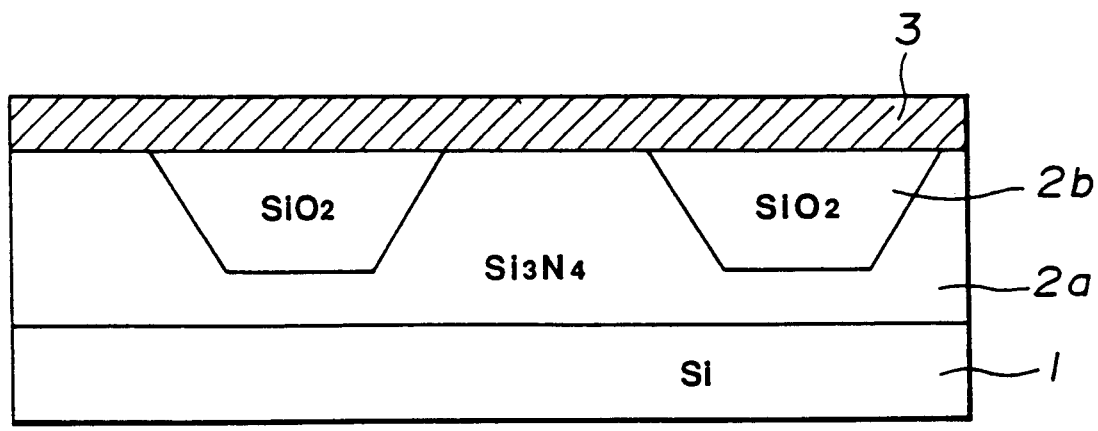
FIG. 53(a) and 53(b) steps in a method for manufacturing a semiconductor thin-film in accordance with the eighteenth embodiment of the present invention.

In more detail, as shown in FIG. 53(a), a silicon nitride film 2a is first formed on a (100) silicon substrate, subjected to an etching process with use of a resist pattern as a mask to form linear recesses of about 50 nm deep, silicon oxide film 2b is deposited thereon for etch back, thereby the silicon oxide film 2b is embedded in the recess. Then, an amorphous silicon film of 10 nm thick is deposited on the resultant wafer. The average inter-atomic distance of the amorphous silicon film was set to be nearly equal to the average inter-atomic distance of its single crystal (that is, 1). The average inter-atomic distance is set to be desirably nearly 1 in this embodiment, but may be set to be between 0.98 and 1.02 and more desirably between 0.995 and 1.005 to produce substantially the same effects.

Figure 53B:
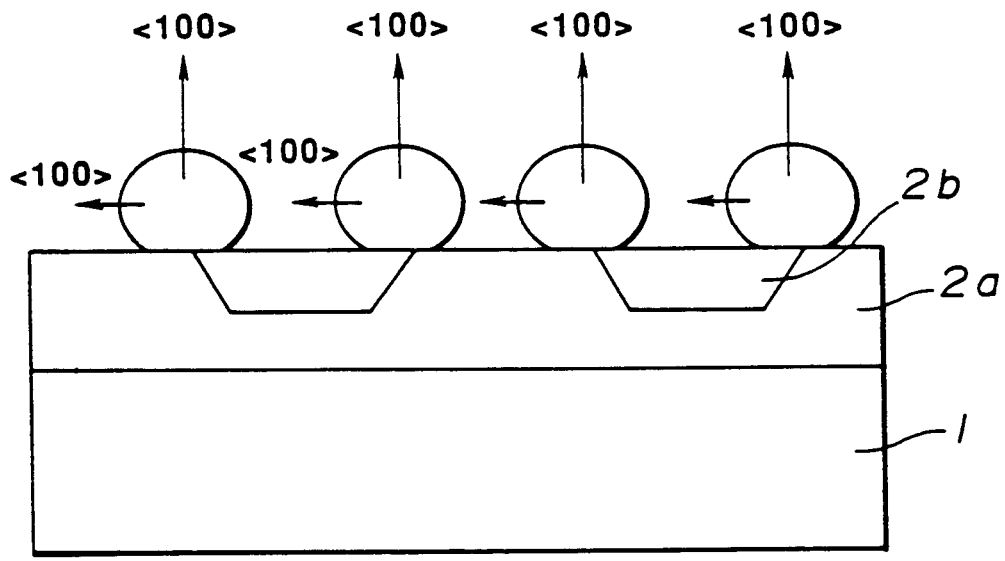

The resultant silicon substrate is place in the vacuum apparatus paying attention not to cause an oxide film to be formed thereon, and subjected to a heat treatment at 530° C. for 2 hours. As a result, a single crystalline silicon grains having a good orientation is formed as shown in FIG. 53(b).

This is considered to be because, when a crystal nucleus is generated on the surface of the amorphous silicon, a potential difference in the boundary caused by the different materials has some effect on the crystal nucleus generation, whereby the in-plane rotation of the crystal nucleus is suppressed.

Even in this case, when a second amorphous silicon film was deposited on a single crystalline film and then subjected to a heat treatment, a single crystalline film having substantially the same crystal quality as a single crystalline film obtained by directly depositing on a silicon substrate and heat treating it could be obtained, that is, a perfect single crystalline film without the 'seed' of the insulating film could be formed.

The thermal conductivity of the silicon nitride film is larger than that of silicon. Thus, when the amorphous film was covered with the silicon nitride film so that its thermal stress causes somewhat shrinkage of the amorphous film, even when a film having an average inter-atomic distance of equal to or more than 1.02 was employed, its crystal quality could be improved.

The present invention is not limited to the use of silicon. Even when such semiconductor as germanium, metal or silicide, which is different in crystal density from the amorphous film, is employed, theses densities can be made to coincide with each other, whereby the crystal quality can be remarkably improved.

The nineteenth embodiment of the present invention will next be explained.

The present embodiment is directed to a method for forming silicon grains on the surface of an electrode to provide a raised and recessed surface for the purpose of effectively increasing a capacitor capacitance.

Figure 54:
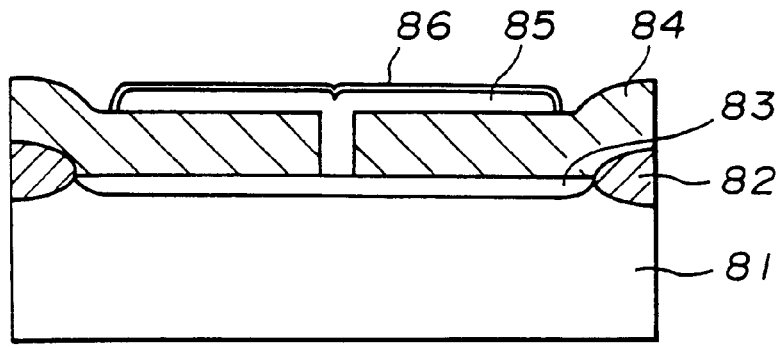
FIGS. 54 to 60 illustrate different sets of a method for manufacturing a capacitor in accordance with the nineteenth embodiment of the present invention, respectively.

First, as shown in FIG. 54, an insulator film 82 for device isolation is formed on a n-type (100) silicon substrate 81 to form a device zone, phosphorus ions are implanted in the device zone to form an n+ diffusion layer 83 as a contact, a silicon oxide film 84 of 500 nm thick is formed on the contact by a chemical vapor deposition (CVD) process, and then an opening is made in the silicon oxide film 84 by a lithography and a dry etching process. Further formed on the silicon oxide film 84 is a polycrystalline silicon film 85 of 100 nm thick by a low pressure chemical vapor deposition (LPCVD) process. The resultant wafer is subjected to a heat treatment at 950° C. in a POCl₃ to diffuse phosphorus ions. Further, during the phosphorus diffusion, a spontaneous oxide film formed on the polycrystalline silicon film is removed with use of ammonium fluoride. The resultant wafer is further subjected to a lithography and an etching process to form a lower electrode 85 which is made of a phosphorus-doped polycrystalline silicon film and which measures 100×200 μm. At this time, a thin spontaneous oxide film 86 of about 1 nm thick is formed on the electrode 85.

Figure 55:
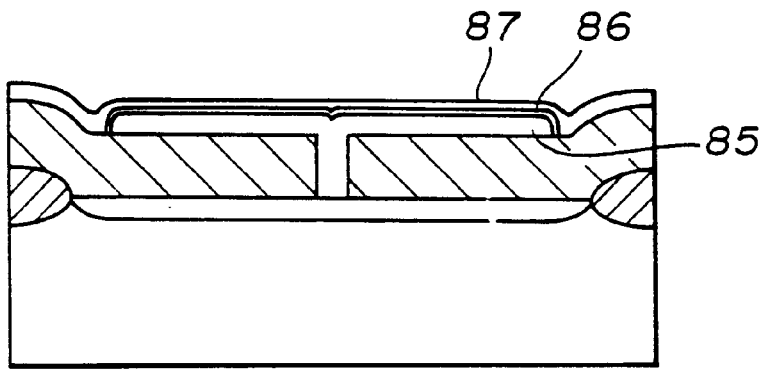

As shown in FIG. 55, the resultant wafer is then subjected to a CVD process with use of an SiH₄ gas at a substrate temperature of 525° C. at a pressure of 1 Torr to form an amorphous silicon film 87 of about 10 nm thick thereon.

Figure 56:
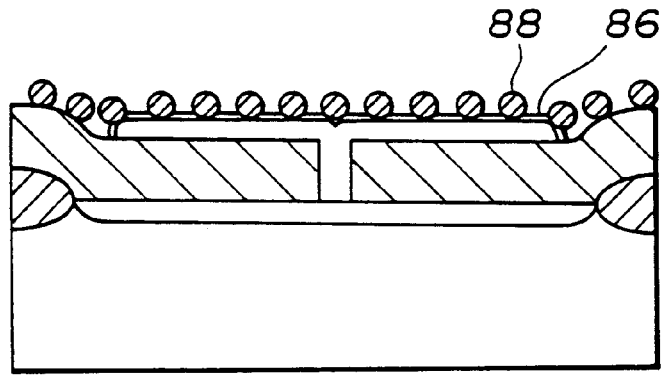

Thereafter, the SiH₄ gas was exhausted from the furnace, instead an Ar gas as a non-oxidization gas was introduced into the furnace, and the resultant wafer was subjected to a heat treatment at 600° C. at a pressure of 1 Torr. As a result, as shown in FIG. 56, the amorphous silicon film 87 is changed to single crystalline silicon grains 88, and thus a favorable raised and recessed surface is formed on the wafer. p The resultant wafer is further subjected to a heat treatment at 800° C. for 30 minutes, which results in that the spontaneous oxide film 86 is extinguished so that the polycrystalline silicon film is electrically connected to the single crystalline silicon grains 88.

Figure 57:
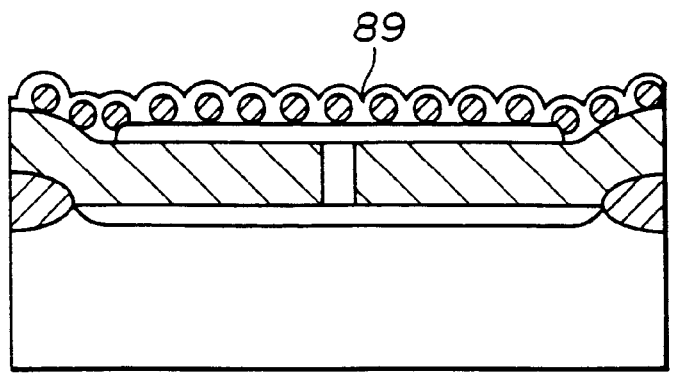
Figure 58:
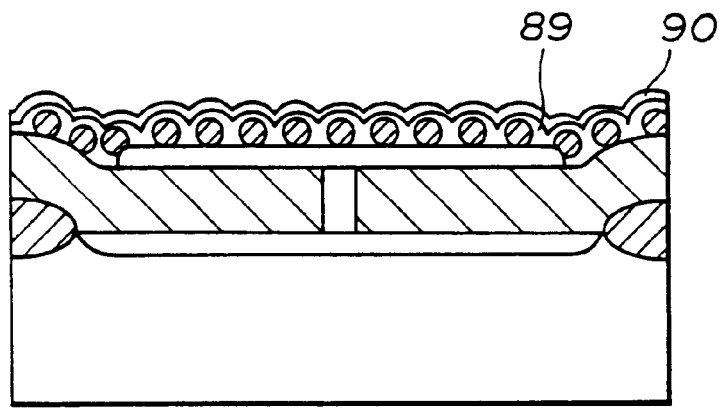

After the spontaneous oxide film between the grains is removed with 1% of hydrogen fluoride (HF) solution, a silicon nitride film 89 of 5.5 nm thick is deposited on the single crystalline silicon grains 88 by the LPCVD process with use of SiH₂Cl₂ and NH₃ (see FIG. 57), and further oxidized in an oxygen atmosphere at 800° C. to form a silicon oxide film or so-called NO film 90 (see FIG. 58).

Figure 59:
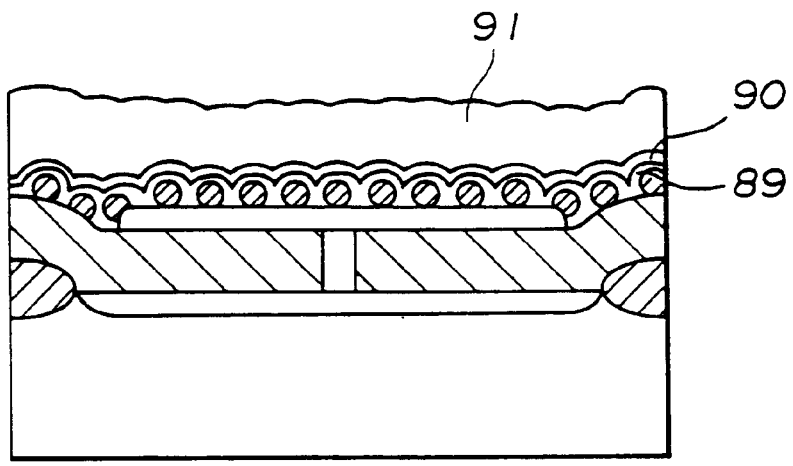
Figure 60:
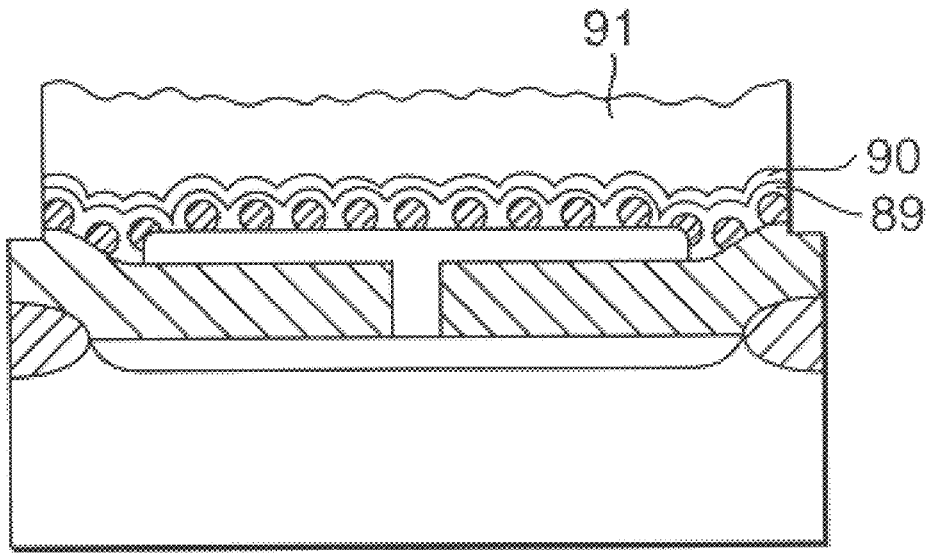

Further deposited on the NO film 90 by the CVD process using a silane gas at a substrate temperature of 630° C. is a phosphorus-doped polycrystalline silicon film (see FIG. 59), which is then subjected to a patterning process to from an upper electrode 91 (see FIG. 60), at which stage a capacitor is completed.

As a result, an electrode having a raised and recessed surface of 0.05 μm, that is, having a large unit surface area can be formed. Since all the steps can be carried out at temperatures of below 800° C. in this way, even when an MOS device or the like is formed in other areas, this method can be applied.

In this embodiment the distribution density of the silicon grains is about 200 grains/μm². When its geometrical surface area is calculated, is has been found that its surface area of the silicon grains of the present invention is increased about 50% when compared with the case in the absence of the silicon grains.

Figure 61:
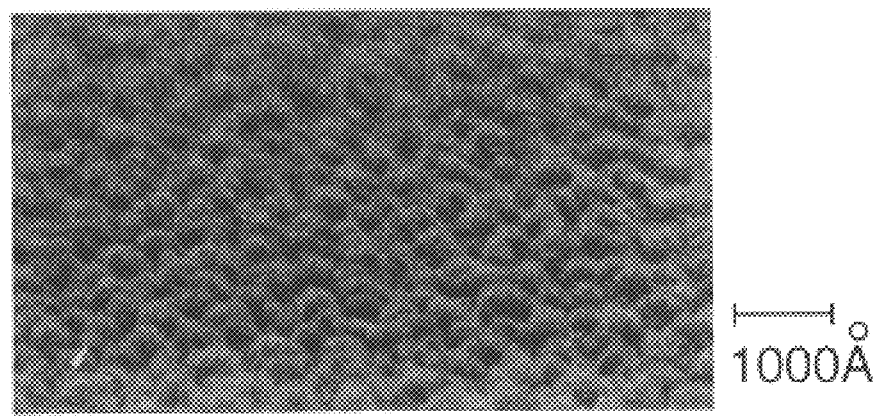
FIG. 61 illustrates a SEM image of a silicon thin-film obtained by the nineteenth embodiment of the present invention.

When the substrate with the amorphous silicon changed to the single crystalline grains in the step of FIG. 56 is exposed to atmosphere and the surface of the substrate is observed by the scanning electron microscopy (SEM), it has been confirmed that, as shown in FIG. 61, the amorphous silicon film 87 is changed to the single crystalline silicon grains 88. It has been confirmed from further detailed observation of the cross-sectional TEM that, as shown in FIG. 62, the single crystalline silicon grains 88 are fully separated from each other at intervals of about 20 nm and have a grain diameter of about 60 nm.

According to this deposition and heating method, silicon grains can be formed with a wide margin and a good reproducibility. Further, by changing the deposition film thickness of the amorphous silicon, underlying material and heat treatment temperature, the grain diameter, grain interval and grain distribution density can be controlled.

In this embodiment, prior to the heat treatment, the average inter-atomic distance of the amorphous silicon has been set to be equal to the average inter-atomic distance of its single crystal. However, the average inter-atomic distance of the amorphous silicon may be set to be 1.02 times or more that of the single crystal.

Figures 63A, 63B, 63C:
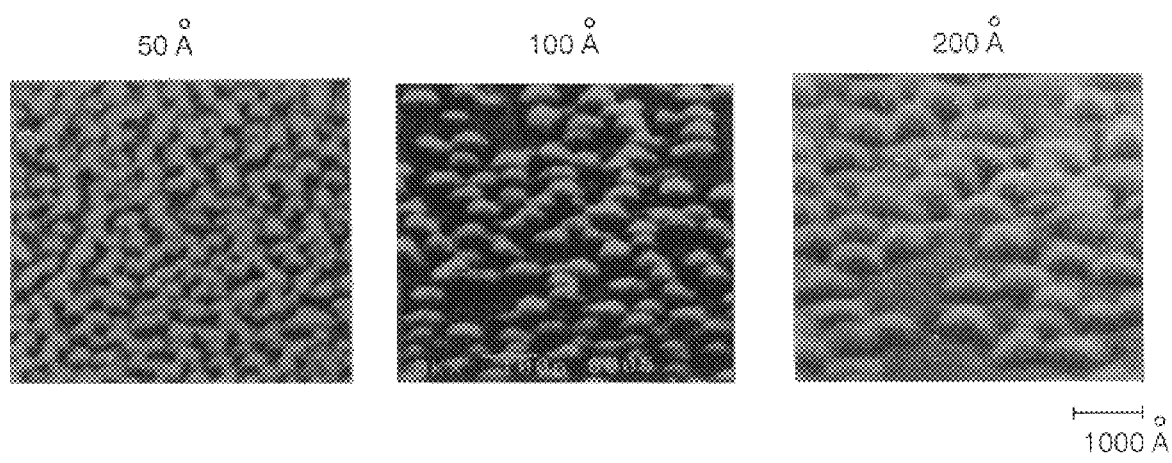
FIGS. 63(a) to 63(c) illustrate amorphous films of different thickness and their surface conditions after subjected to heat treatment for comparison.
Figure 64:
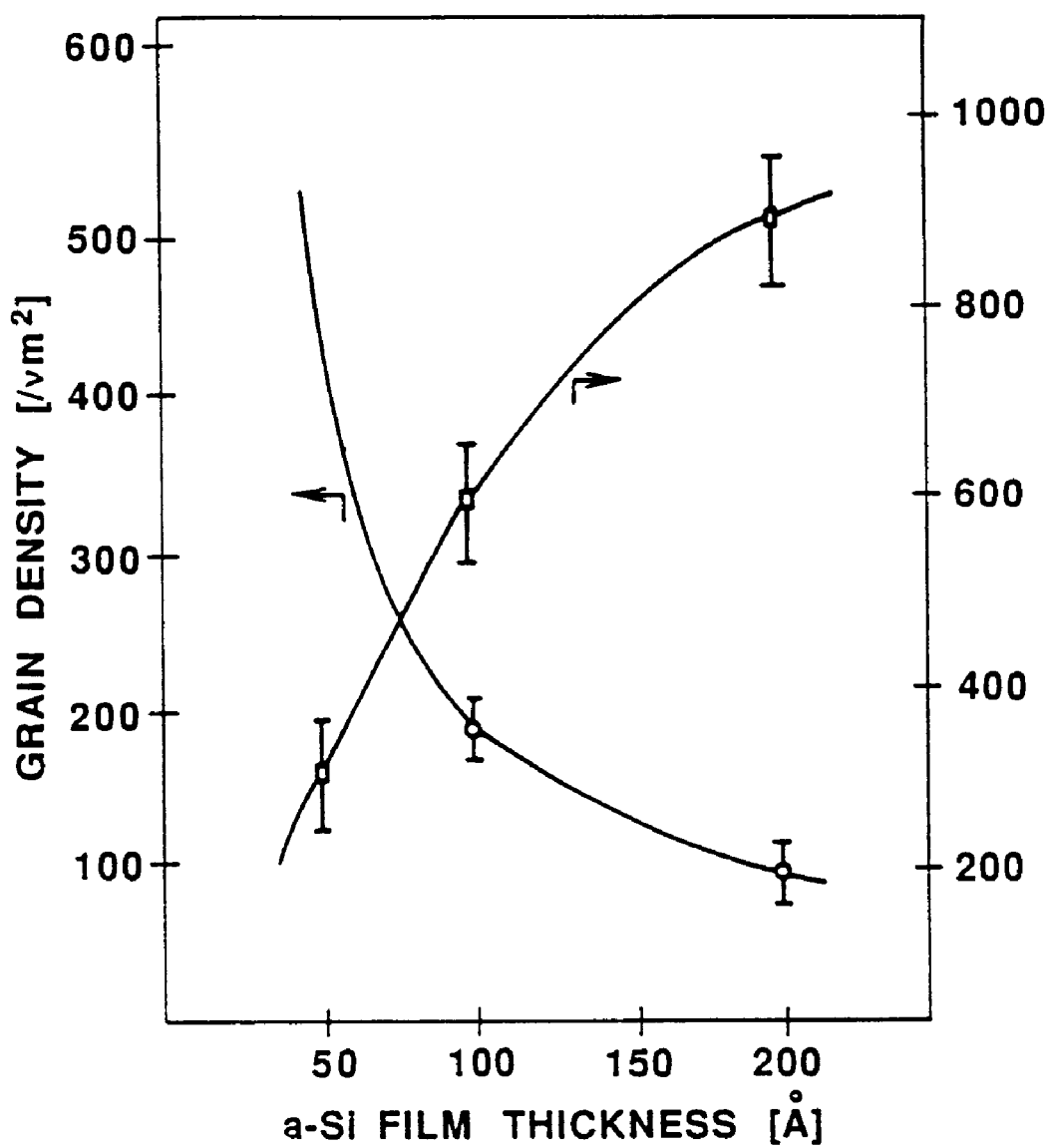
FIG. 64 illustrates relationships between deposited film thickness and grain distribution density.

As an example, the underlying film is made of silicon oxide, the heat treatment temperature is set at 600° C., and the thickness of the amorphous silicon is changed to 5, 10 and 20 nm. SEM photographs of resultant films are shown in FIG. 63. Relationships between the film thickness and grain diameter and between the film thickness and grain distribution density with respect to the resultant films were obtained from the SEM photographs as shown in FIG. 64. It is clear from the results that the grain diameter and distribution density can be selected by controlling the film thickness, the deposition film thickness can be made as very thin as the order of 10 nm, and the grains can be formed regardless of the electrode shape. Thus, easy combination can be realized with such three-dimensional electrode structure as stack structure or trench structure.

Figure 65A:
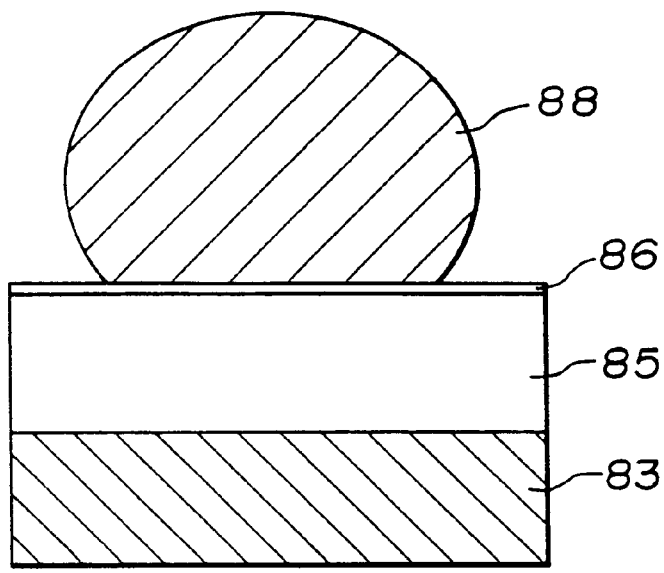
FIGS. 65(a) and 65(b) diagrams for explaining steps for removing a spontaneous oxidization film in the nineteenth embodiment of the present invention.
Figure 65B:
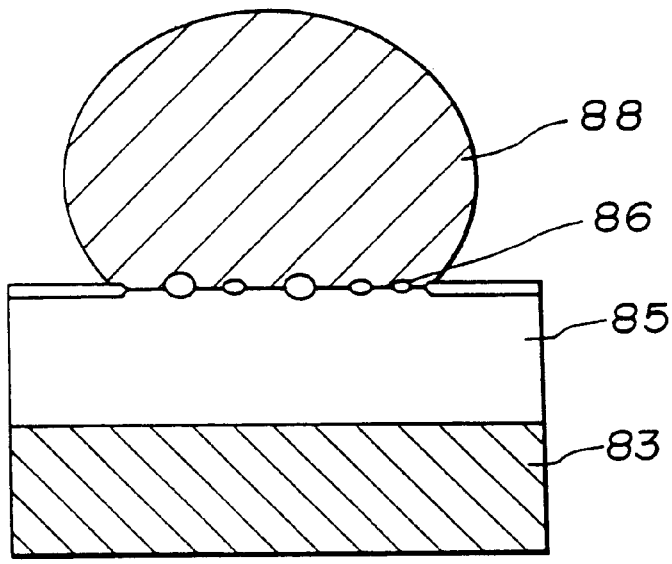

When the single crystalline grains are formed on the spontaneous oxide film 86, subjected to such a heat treatment as shown by magnified diagrams in FIG. 65(*a*) and (*b*), and then phosphorus ions are diffused into the single crystalline grains from the underlying polycrystalline silicon film 85; it has been found that sufficient electrical connection can be realized between the polycrystalline silicon film 85 and the grains 88. The present method utilizes such a fact.

Figure 66:
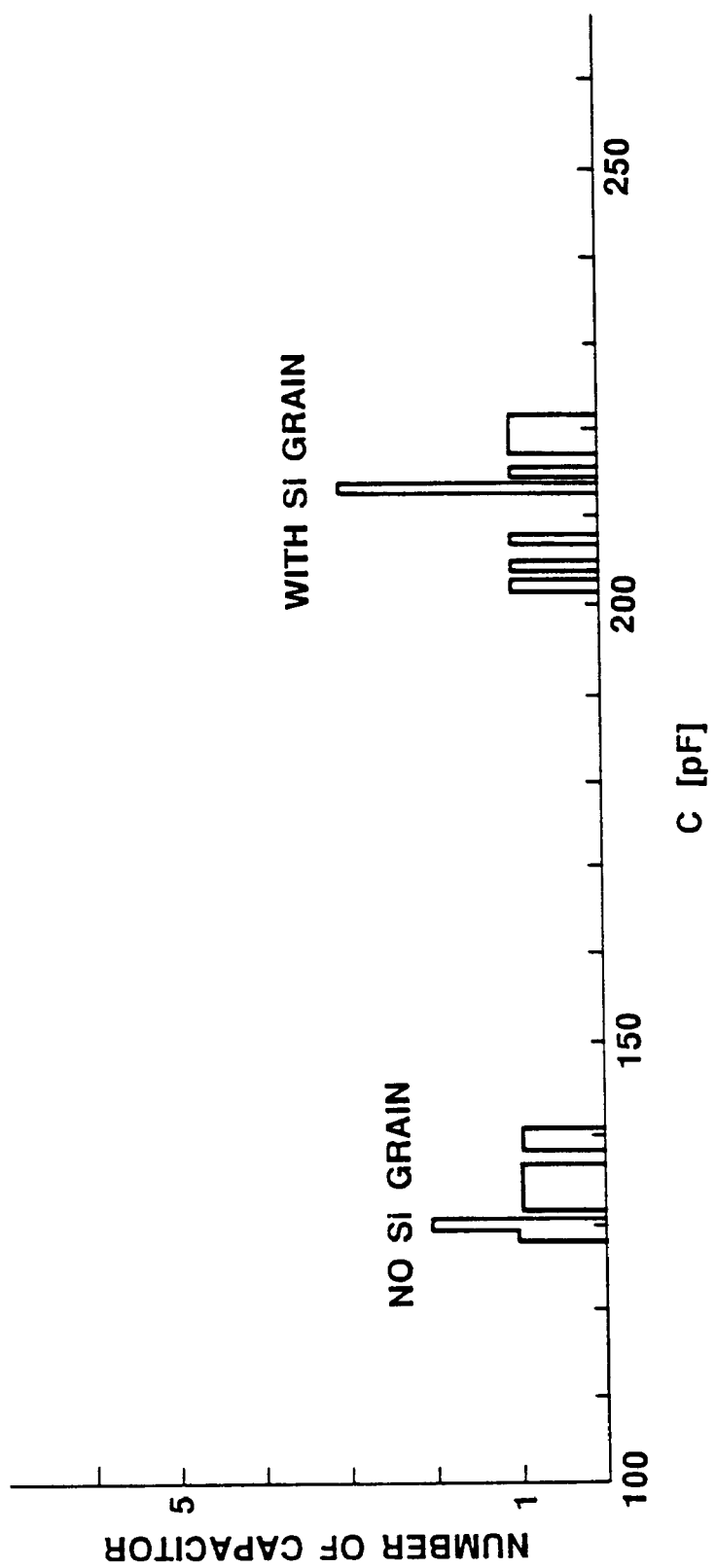
FIG. 66 illustrates capacitances of the capacitors obtained by the nineteenth embodiment of the present invention and capacitances of conventional capacitors for comparison.

The capacitance of the capacitor thus obtained. FIG. 66 shows a histogram showing a relationship between the capacitor capacity and the number of capacitors with respect to the capacitor of the present invention with the formed silicon grains and capacitors of the prior art without such silicon grains. It will be seen from the results that the capacitance of the capacitor of the present invention is increased 1.56 times that of the capacitor of the prior art, with a good reproducibility.

Although the destruction of the spontaneous oxide film has been carried out through the heat treatment in this embodiment, but the heat treatment may be replaced by the use of ion implantation to provide the destruction of the spontaneous oxide film and to provide the electrical connection between the electrode and grains through the introduction if impurities into the silicon grains.

Further, the electrical connection between the grains and electrode may be realized by employing another silicon nitride film, a phosho-silicate glass (PSG) film of a BPSG film as the underlying layer, by similarly forming grains thereon and then by subjecting it to a heat treatment or an ion implantation process. Even with respect to the material of the grains, the material is not limited to silicon, but even when an amorphous thin film made of such semiconductor as germanium or such metal as aluminum or gold is subjected to a heat treatment in a non-oxidization atmosphere, electrically conductive fine grains can be similarly formed.

Explanation will next be made as to the twentieth embodiment of the present invention.

The amorphous silicon film has been formed on the spontaneous oxide film and been subjected to the heat treatment to form the silicon grains in the foregoing nineteenth the embodiment, but the silicon grains may be formed not only on the insulating film but also on the electrically conductive film such as a carbon film. In this embodiment, an amorphous carbon film is formed on a film including a trench, an amorphous silicon film is formed thereon, and subjected to a heat treatment to form silicon grains and to thereby form a trench type capacitor. The present embodiment will explained as to how to provide a raised and recessed surface to a lower electrode of the trench type capacitor. This example is highly advantageous in that, after the formation of the silicon grains, it is unnecessary to remove the insulating film.

Figure 67:
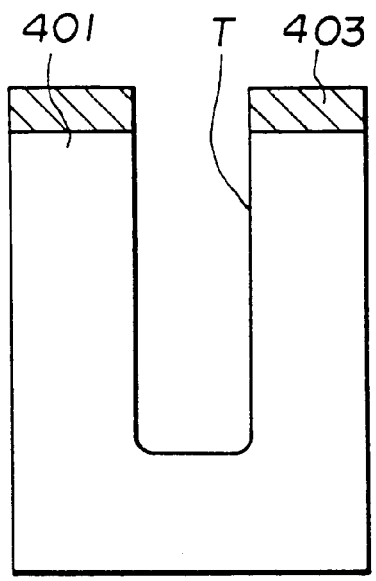
FIG. 67 to 72 illustrate different steps of a method for manufacturing a capacitor in accordance with the twentieth embodiment of the present invention, respectively.

First, as shown in FIG. 67, a silicon oxide film 405 is deposited on an n-type (100) silicon substrate 401. Then, it is subjected to a lithography and a reactive ion etching (RIE) process to make an opening therein, and subjected to a RIE process to form a trench T with use of the opened film 405 as a mask.

Figure 68:
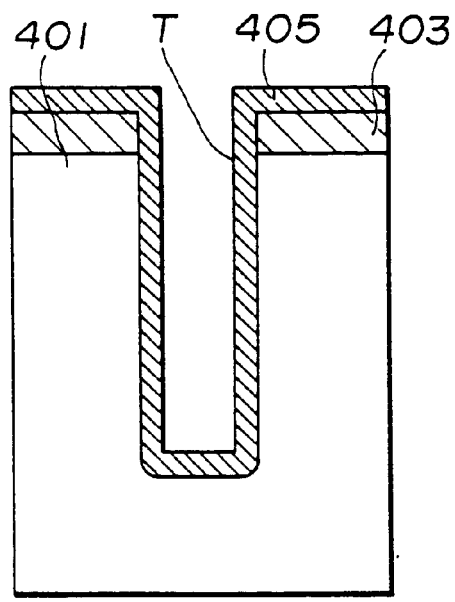
Figure 69:
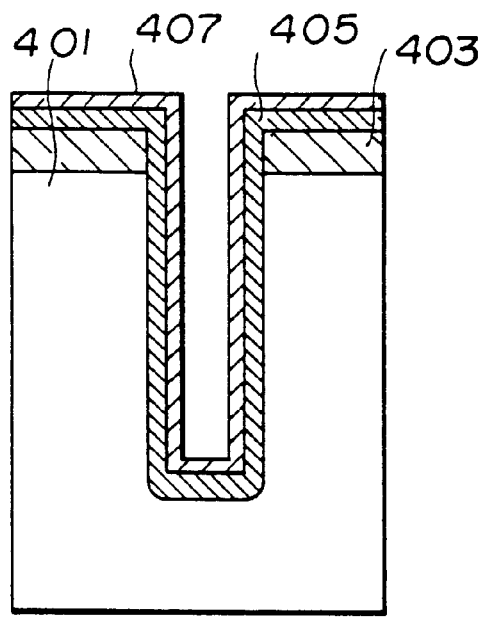

As shown in FIG. 68, the resultant wafer is further subjected to a chemical vapor deposition (CVD) process with use of an acethyene gas as a material gas to form an amorphous carbon film 405. Subsequently after the chamber is exhausted, a mixture gas of $SiH_4$ and $PH_4$ is introduced into the same chamber, and the resultant wafer is subjected to a CVD process at a substrate temperature of 525° C. at a pressure of 1 Torr to deposit a phosphorus-doped amorphous silicon film 407 of about 10 nm, as shown in FIG. 69.

Figure 70:
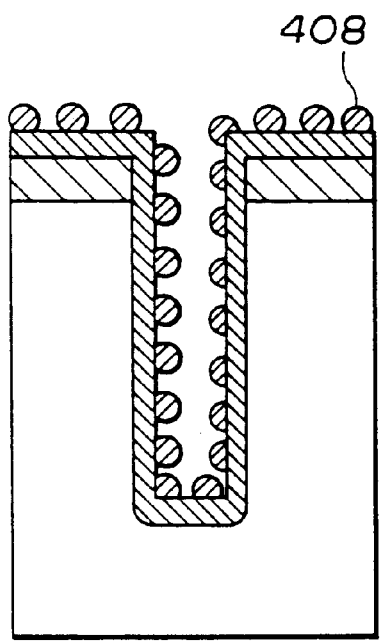

Thereafter, the mixture gas of $SiH_4$ and $PH_4$ was exhausted from the chamber, an argon gas as a non-oxidization gas was instead introduced into the chamber, and the resultant wafer was subjected to a heat treatment at 600° C. for one hour. As a result, as shown in FIG. 70, the phosphorus-doped amorphous silicon film 407 is changed to single crystalline silicon grains 408 so that a favorable raised and recessed surface is provided to the entire surface of the wafer including the inner wall of the trench. The grain diameter and grain interval are different from those in the foregoing nineteenth embodiment, but good silicon grains are formed even in this embodiment.

Figure 71:
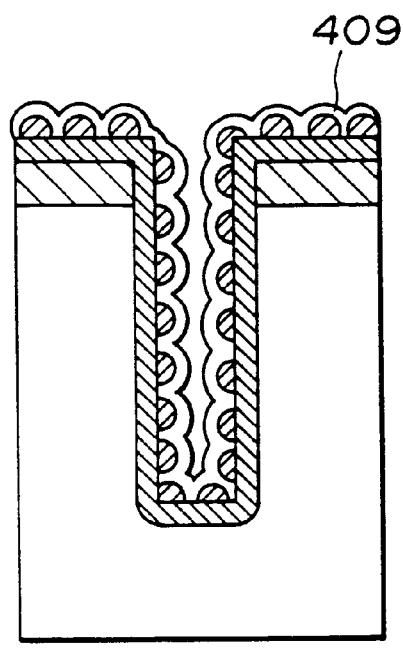

As shown in FIG. 71, a silicon oxide film 409 of 10 nm thick is formed on the silicon grains to thereby form a capacitor insulating film.

Figure 72:
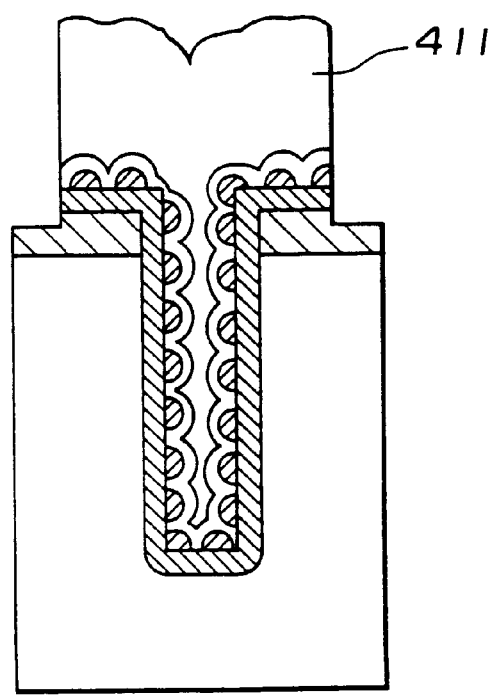

The resultant wafer is subjected to a CVD process using a silane gas at a substrate temperature of 630° C. to deposit a phosphorus-doped polycrystalline silicon film, and then subjected to a patterning process to form an upper electrode 411 (see FIG. 72), thus completing a capacitor.

As a result, an electrode having a raised and recessed surface of 0.05 μm and thus having an increased unit surface area can be formed so that the effective capacitance of the resultant capacitor can be remarkably increased. In this embodiment, in addition to the effects of the nineteenth embodiment, the silicon grains can be formed as contacted directly with the electrode, and thus the step of removing the insulating film can be unnecessary and the steps can be simplified.

Although the lower electrode has been made of carbon in the foregoing embodiment, the lower electrode may be formed as a polycrystalline silicon film and then coated thereon with a carbon film to form silicon grains. Further, the underlying film of the silicon grains is not limited to the carbon film, and such metal as W, Ta, Ni or Ti, such metal/silicon compound as NiSi, TiSi or TiN may be used as the electrode material or electrode coating material to similarly form electrically conductive fine grains on the carbon.

Explanation will be made as to the twenty-first embodiment of the present invention.

The heat treatment has been carried out in the non-oxidization atmosphere continuously after the formation of the amorphous film in the foregoing embodiments. In this embodiment, however, when a spontaneous oxide film was undesirably formed on the amorphous film, the oxide film is removed with use of hydrofluoric acid or the like and then subjected to the heat treatment to thereby form the silicon grains. The present embodiment will be detailed in the following.

Figure 73A:
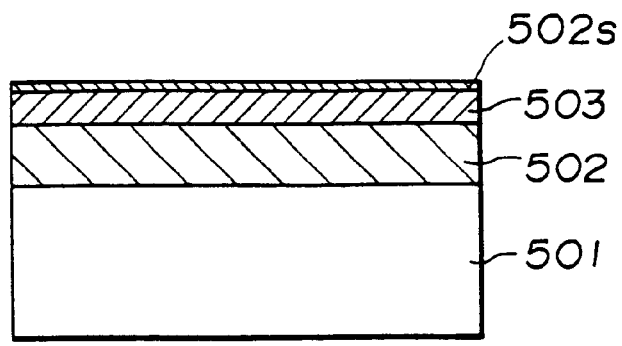
FIGS. 73(a) thru 73(c) steps of a method for forming a semiconductor thin film in accordance with the twenty-first embodiment of the present invention.

First, as shown in FIG. 73(a), an n-type (100) silicon substrate 501 is subjected to a thermal oxidation process at 1000° C. for 15 minutes to form a silicon oxide film 502 of 500 nm thick thereon. The resultant wafer is further subjected to a CVD process with use of a $SiH_4$ gas at a substrate temperature of 525° C. at a pressure of 1 Torr to deposit an amorphous silicon film 503 of about 10 nm thick on the silicon oxide film 502. The resultant wafer is exposed to atmosphere. At this time, a spontaneous oxide film 502s is formed on the amorphous silicon film 503. Under this condition, even when the resultant wafer is subjected to a heat treatment as in the foregoing embodiments 19 and 20, the film is changed to the polycrystalline silicon thin film and no fine silicon grains is not formed.

Figure 73B:
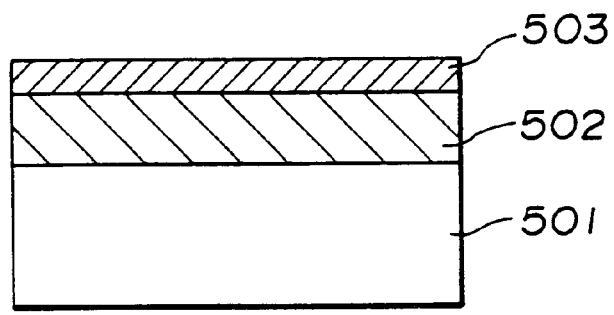

The spontaneous oxide film 502e is removed with 5% of hydrogen fluoride (HF) solution so that the surface of the amorphous silicon film 503 is exposed as shown in FIG. 73(b), and then the resultant substrate is transported into the vacuum chamber while keeping the substrate from being again oxidized and keeping the chamber at a temperature of below 25° C.

Figure 73C:
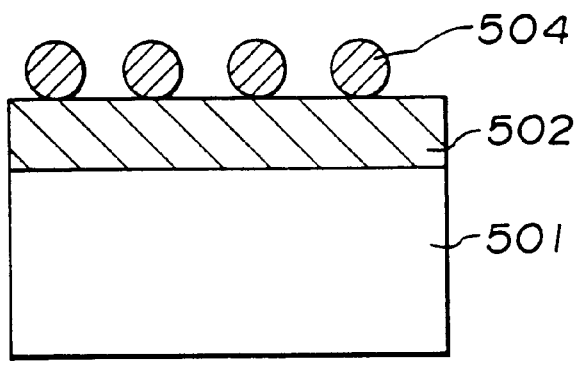
Figure 74:
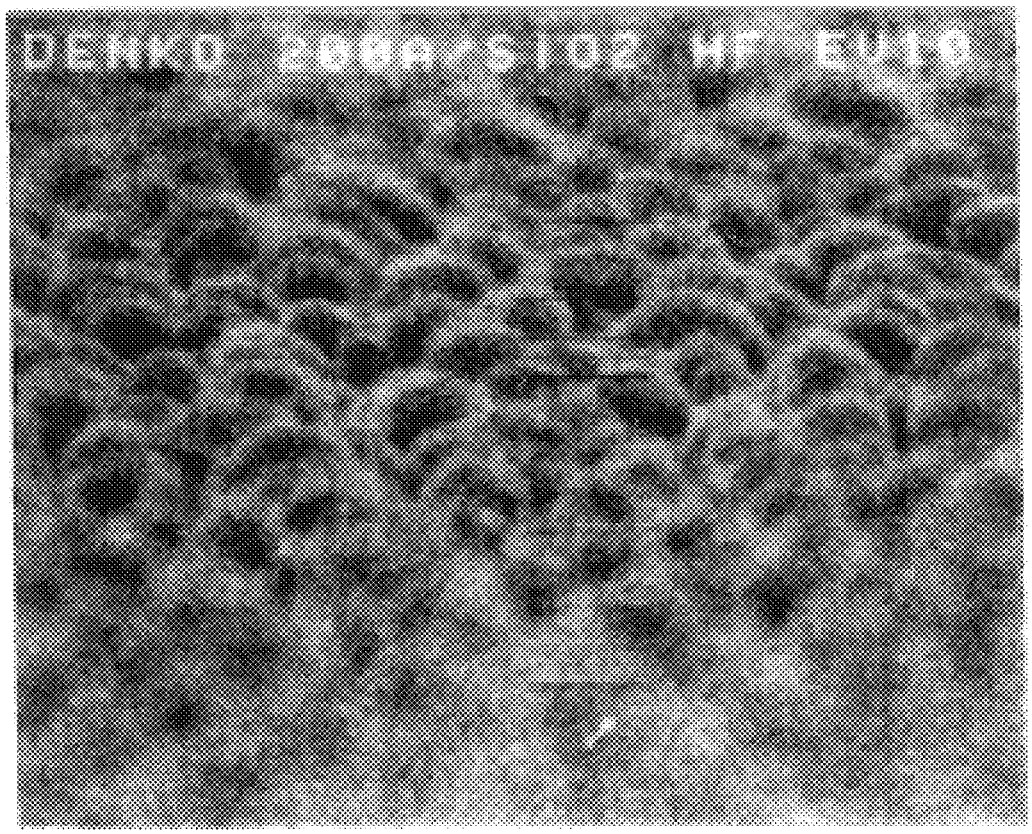
FIG. 74 illustrates a SEM image of the semiconductor thin film obtained by the steps.

The interior of the chamber is exhausted to a vacuum level of $1 \times 10^{-8}$ Torr, the temperature is increased, and then the substrate is subjected to a heat treatment at 600° C. for one hour. As a result, as shown in FIG. 73(c), single crystalline silicon grains 504 are formed. Thereafter, the resultant substrate is taken out from the chamber into atmosphere and subjected to a SEM observation. As a result of the observation, such silicon grains as shown in FIG. 74 are confirmed.

In this way, even after the oxide film is once formed on the amorphous silicon film, when the oxide film is removed, and then subjected to the heat treatment in a high vacuum atmosphere or in a non-oxidization atmosphere while preventing its re-oxidization, good silicon grains can be obtained even when the heat treatment cannot be carried out continuously. This is a highly valid method in actual capacitor forming steps.

Although the explanation has been made as to the application to the capacitor in the foregoing embodiment, the application of the present invention is not limited to the capacitor, but when it is desired to increase the surface area, the invention is highly valid in device formation because a raised and recessed surface can be easily provided at low temperatures.

Explanation will next be made as to the twenty-second embodiment of the present invention.

Figure 75A:
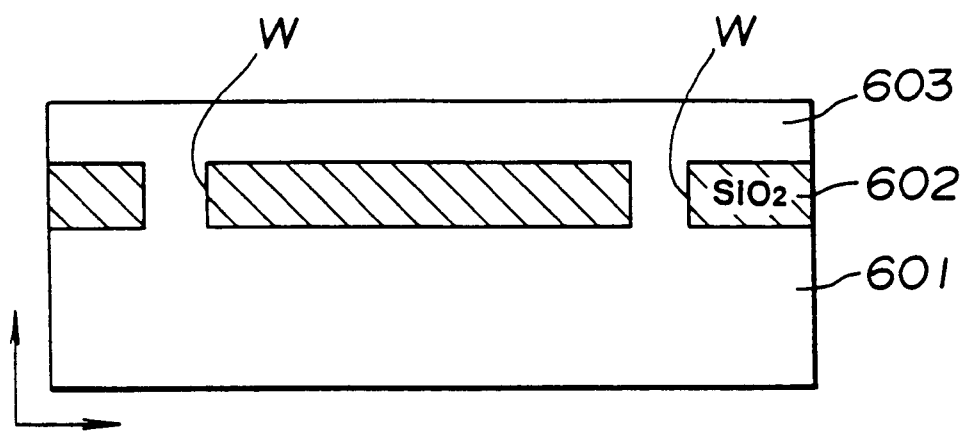
FIGS. 75(a) and 75(b) illustrate steps of a method for manufacturing a semiconductor device in accordance with the twenty-second embodiment of the present invention.
Figure 75B:
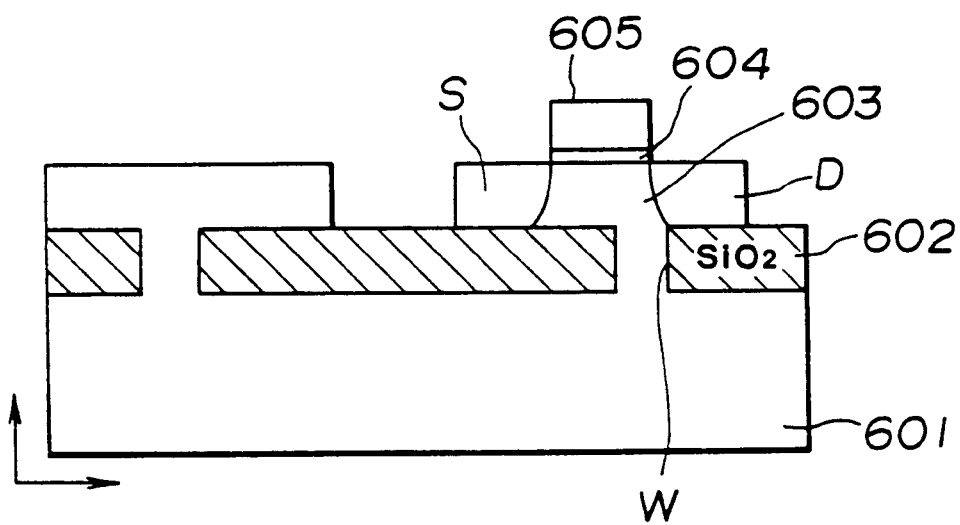

In this embodiment, as shown by manufacturing steps in FIG. 75, windows W are made in a silicon oxide film 602 covering the surface of a silicon substrate 601, the substrate is subjected to a solid phase growth process with the windows W used as seeds to form single crystalline silicon thin films 603 each having a source and drain regions S and D, and then a gate electrode 605 is formed between the source and drain regions through a gate insulating film 604.

A feature of this embodiment is that a single crystalline thin film having a crystal quality much more excellent than in the prior art is used as the channel region of a MOS device, whereby the obtained device can be operated at a high speed. The high speed operation of the device results from the fact that the crystal quality could be improved remarkably, and also largely from the fact that the channel region comprises a film as very thin as several tens of nanometers. When it is desired to obtain a very-thin film in the prior art method, it has been common practice to form a thick amorphous silicon layer, subject it to a solid phase growth process for re-crystallization and then to subject it to an etch back process to a desired thickness. However, it has been highly difficult to obtain an accurate film thickness through the etching. According to the present method of the present invention, since it is only required to control the film thickness in the formation of the amorphous silicon film, control can be realized with ease and high accuracy. Though its detailed principle is not explained here, it is considered that the good controllability is due to the loosened vertical electric field. Further, with this device structure, electrical connection between the substrate and channel region is established in a good boundary condition, when a current caused by impact ions generated in the vicinity of the drain is passed through the substrate, the stable operation of the device can be realized.

More specifically, in manufacturing, a silicon substrate is first subjected to a CVD process with a silane gas and oxygen to form a silicon oxide film 602 of 500 nm thick thereon. Next, the silicon oxide film is subjected to an etching process with resist used as a mask to make windows W therein and to expose part of the silicon substrate 601. Though the etching process can be carried out by a reactive ion etching process or by a wet etching process using hydrofluoric acid, the reactive ion etching process was used in this embodiment.

Thereafter, a silane gas was introduced into a CVD furnace at a high vacuum level and the resultant substrate was subjected to a heat treatment at 600° C. at a pressure of $1 \times 10^{-6}$ Torr for 2 hours to remove an oxide film formed on the silicon substrate of the 'seed' portion. Continuously after this, the conditions of the furnace was changed to 525° C. and 1 Torr to deposit an amorphous silicon film of 20 nm thick. Continuously after the introduction of the silane gas was stopped, the resultant substrate was subjected to a heat treatment at 600° C. for 30 minutes. In the steps carried out so far, the single crystalline silicon of 20 nm thick is embedded to the 'seed' portion. In this way, continuously, the amorphous silicon film was formed at 525° C. and crystallization is repeated at 600° C., whereby the embedding to the 'seed' portion was completed as shown in FIG. 75(a). The silicon film other than the 'seed' portion was removed through the etching.

When the then amorphous silicon film formed at 525° C. was measured by a Raman spectrometry, the average inter-atomic distance of the amorphous film was nearly 1.02 times the average inter-atomic distance of its silicon single crystal. Even when the crystallization is advanced continuously with the high-vacuum furnace, the average inter-atomic distance was maintained immediately before the crystallization. In this way, when the crystallization was advanced under such a condition that the bonding between silicon atoms is loose, a single crystal having a very good crystal quality was obtained and any defects could not be observed even when the crystal was examined with use of a transmission electron microscope.

In this way, in order to embed the silicon crystal to the 'seed' portion, the prior art selective epitaxial growth technique may be used with use of a dichloro-silane material gas at 850° C. at a pressure of 1 Torr. However, in accordance with the method of the present invention, the embedding of the silicon single crystal was carried out. In the present method, such a high temperature step as the selective epitaxial growth step becomes unnecessary and even when a device is already formed in other region, this causes not problems.

Next, formation of an active layer for the device was carried out with use of the 'seed' portion. First, an sample having a structure shown in FIG. 75(*a*) was placed in a high-vacuum CVD furnace and subjected to a heat treatment at 600° C. at a pressure of 1×10$^{-6}$ for 2 hours while introducing a silane gas into the furnace. Continuously after this step, the conditions within the furnace were changed to 600° C. and 1 Torr to deposit an amorphous silicon film of 50 nm thick on the sample. Further, the introduction of the silane gas was stopped and continuously thereafter subjected to a heat treatment at 600° C. for 30 minutes.

Even in this example, the average inter-atomic distance of the amorphous silicon film formed at 525° C. was nearly 1.02 times the average inter-atomic distance of the silicon single crystal, and even when the crystallization is continuously advancing in the high-vacuum furnace, the average inter-atomic distance was kept constant. When the film after its crystallization was examined with use of a transmission electron microscope but no defects were observed.

After the single crystalline silicon thin film 603 was formed in this way, device isolation was carried out by a chemical dry etching (CDE) process to form a device region. The device region was subjected to an ion implantation process to form source and drain regions as shown in FIG. 75(*b*). Further, a gate oxide film 604 and a gate electrode 605 were formed to the regions. The CDE step used for the device isolation and the ion implantation steps were carried out as nearly room temperature, and such an oxide film as a gate oxide film was formed at 450° C. by the CVD process using the silane gas and oxygen. The gate was formed by a CVD process at 350° C. with use of disilane and diborane material gases.

Figure 76:
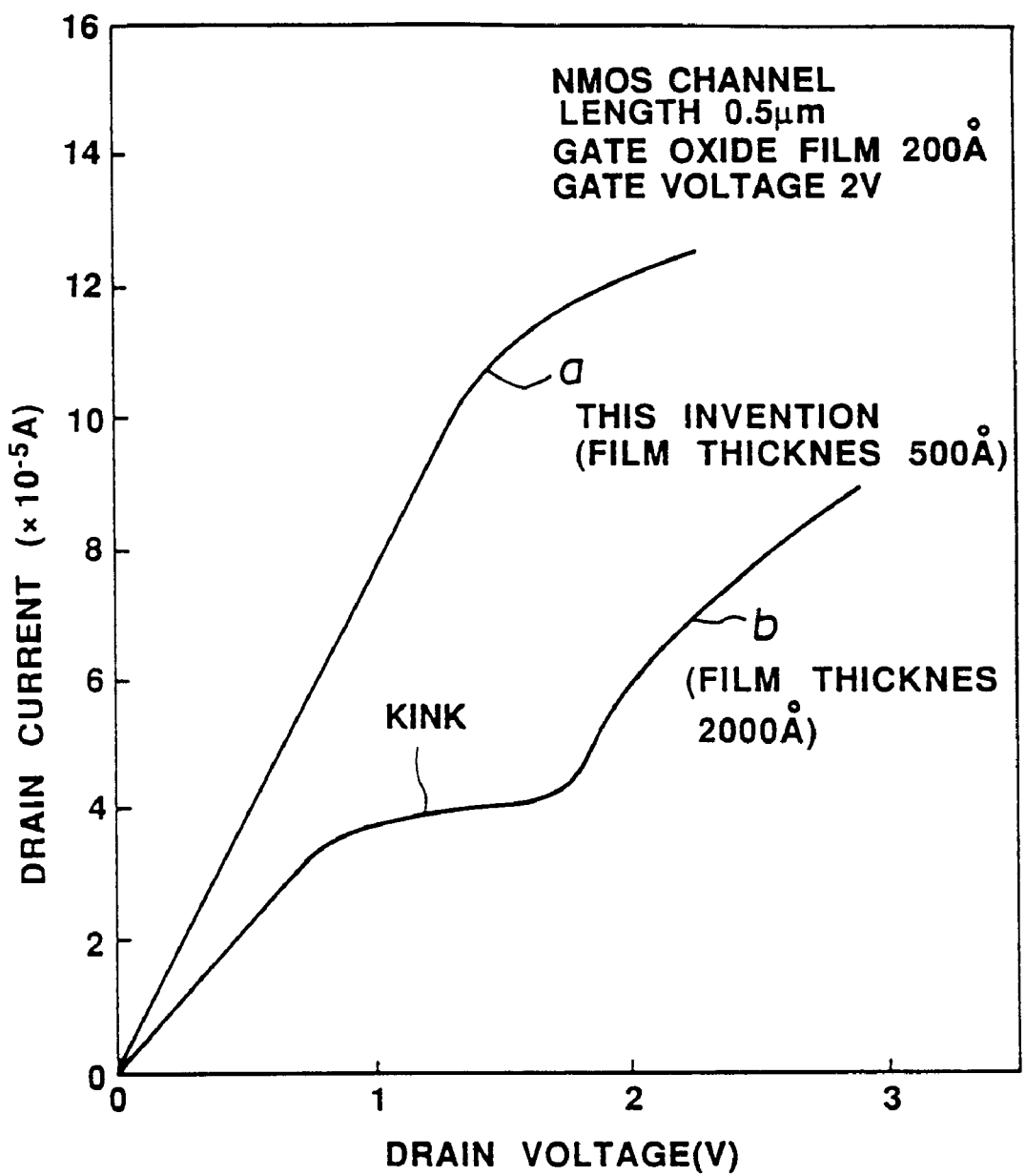
FIG. 76 illustrates characteristics of a MOS transistor obtained through the steps.

The characteristic of a MOS transistor thus formed are shown by a curve 'a' in FIG. 76. In the drawing, a curve 'b', which shows the characteristic of a typical prior art MOS transistor using a silicon film of 200 nm thick not contacted with its substrate, is shown for comparison. It will be seen from the comparison between the curves that the transistor of the present invention is larger than the prior art one with respect to an increase in drain current to an increase in drain voltage (that is, gradient). The gradient corresponds to the mobility of the associated device. When the mobility of the device, for example, NMOS transistor was measured, it was 700 cm$^2$ V/sec. This performance exceeds that of a prior art bulk device. In the curve of the MOS transistor in the drawing, there is a so-called 'kink' where the device characteristic irregularly varies. This is considered due to a phenomenon which is generated when air voids caused by impact ions stop within the silicon thin film. When it is desired to utilize such a device in an LSI circuit, such irregular variation in the characteristic is highly disadvantageous from its design viewpoint. In the device prepared according to the method of the present invention, however, such a characteristic irregularity was not observed at all.

Conventionally, for the purpose of obtaining a single crystalline thin film having an excellent crystal quality, there has been proposed a method for once melting silicon or a method for causing epitaxial growth at a temperature of about 850° C. However, these methods both require high temperatures. Further, a solid phase growth method for causing crystal growth at low temperature, already exist but has a problem that the obtained film is poor in crystal quality and thus cannot be used for a device. Under such circumstances, when a silicon thin film was formed by the aforementioned solid phase growth technique of the present invention, it crystal quality was improved to a large extent.

The aforementioned steps are all carried out at temperatures of below 600° C., and even when devices are already formed in other regions as in stacking devices, a new device can be sequentially additionally formed without exercising an adverse influence (such as thermal diffusion) on the already-formed devices. In addition, each of the formed devices is excellent in characteristics over devices formed on a silicon substrate. Shown in FIG. 77 is a table of measured results of characteristics of MOS devices already formed on a silicon substrate before and after a MOS device is formed on an insulating film according to the method of the present invention. In this table, as typical examples of the characteristics of the MOS device, threshold voltage and mobility were selected. In more detail, 1000 of n- and p-channel MOS devices were first prepared on the silicon substrate and measured with respect to their characteristics. Next, after the MOS device was prepared on the insulating film by performing all the steps of the present invention, the characteristics of the MOS devices already formed on the silicon substrate were again measured. As shown in Table, the threshold voltage and mobility were not changed both in the n- and p-channel devices. It will be appreciated from the table that the present invention is high effective for device integration and miniaturization.

The twenty-third embodiment of the present invention will then be explained in connection with an example where the invention is applied to formation of an silicon on insulator type (SOI) device.

A feature of the present invention is that, in short, when it is desired to form a single crystalline silicon thin film on an insulating film by a solid phase growth process using a 'seed' crystal, single crystal is grown to a position as far as several tens of micrometers from the 'seed' portion, whereby an SOI device can be prepared at a desired position, as shown in FIG. 78. In the prior art method, single crystallization could be extended only to a position as near as at most 2–3 µm from the 'seed', which corresponded to nearly the same area as the size of the single SOI device and thus gives substantially no flexibility in device layout.

Another disadvantage in the prior art is poor integration. For example, when it is desired to fabricate an SOI device by such a technique that allows formation of a 1-µm pattern, a region of 1 µm$^2$ becomes necessary for making a hole in an oxide film or form formation of a 'seed'. Since the region of 1 µm$^2$ is necessary for each of source, drain and gate, when single crystal can be extended only 3 µm, only one SOI for one 'seed' can be prepared. In this case, an area occupied by the 'seed' reaches ⅓ of an area occupied by the device, which is highly disadvantageous for integration. To an extreme, ¼ of the silicon substrate is wastefully used as the 'seed'. Further, even when such a technique that enables formation of 0.5 µm pattern is employed, ⅟7 of the area is wastefully used as the 'seed'. In addition, in the prior art, even in the region where the 'seed' grows into a single crystal, many defects such as twins were be observed.

The inventors have found the fact that, when the amorphous material is different from the single crystalline silicon in their density, a stress occurs in the amorphous film during its crystallization and impedes the crystal growth. In accordance with the present invention, thus, by making the density of the amorphous film closer to that of the single crystalline silicon, the single crystal growth of a film as thin as several tens of micrometers, which has been impossible in the prior art, became possible. In addition, since the stress was suppressed, the generation of crystal defects was also suppressed and such defects as twins were also not observed all over the several-ten-μm single crystalline zone.

In this embodiment, a silicon oxide film 602 of 500 nm thick was first formed on a (100) silicon substrate. The silicon oxide film 602, which may be formed by a thermal oxidization process, was formed in this embodiment by a CVD process with use of a silane gas with a pressure of 0.2 Torr, an oxygen gas with a pressure of 0.8 Torr at a deposition temperature of 450° C. Then the substrate was subjected to a reactive ion etching process to make an opening in the silicon oxide film 602. The sample having the silicon oxide film 602 with the opening made therein and having the silicon substrate 601 partially exposed to atmosphere, was processed with 5% of hydrofluoric acid solution for 5 minutes, and then introduced into a CVD furnace which can be vacuumized up to a high vacuum level of below $1 \times 10^{-6}$ Torr. After the furnace was increased to 480° C., 200 sccm of disilane gas with a pressure of 0.04 Torr was introduced into the furnace to deposit an amorphous film of 0.2 μm thick. As a result of measuring the density of the amorphous film by a Rutherford back scattering (RBS) method, the density of the amorphous film was nearly equal to that of its single crystalline silicon. For example, when the deposition of the amorphous film was carried out with the disilane gas with a pressure increased to 0.1 Torr, the density of the resultant amorphous film was 0.99 times that of the single crystal. In this case, when the film was subjected to an ion implantation process with an acceleration voltage of 80 keV at an implantation rate of $3 \times 10^{14}$ atoms/cm², the density of the resultant amorphous film could be made to be nearly equal to that of its single crystalline silicon. The inventors has found the fact that, when it is desired to deposit an amorphous silicon film, an amorphous film having the density close to that of its single crystal can be easily formed by optimizing the deposition rate and, in particularly, by decreasing the substrate temperature.

In this way, when the amorphous film was deposited and then subjected to a heat treatment at 580° C. for 20 hours, an single crystalline thin film having such a structure as shown in FIG. 78(a) could be formed. When the crystal quality of this single crystalline thin film is examined based on the cross-sectional TEM photograph of a high-resolution transmission electron microscope, it has been confirmed that the single crystal free of such crystal defects as twins and having a good crystal quality is formed over the several-ten-μm region.

Next, a MOS device was prepared with use of the above single crystalline thin film. In more detail, first, the single crystalline thin film was subjected to a chemical dry etching (CDE) process with use of a halide gas to separate devices in an island manner. Next, the resultant wafer was subjected to a chemical vapor deposition (CVD) process to deposit a gate oxide film of 40 nm thick and a gate electrode of 400 nm thick. The wafer was further subjected to a reactive ion etching process to form a pattern of gate. Thereafter, the source and drain regions of the wafer were subjected to an ion implantation process with use of boron ions for p-channel MOS transistor and phosphorus ions and then subjected to an activation heat treatment at 950° C. for 30 minutes.

Twelve of such a MOS device were disposed at intervals of 5 μm in the (010) direction from the 'seed' as shown in FIG. 78(b). When the characteristics of the devices prepared at position spaced differently from the 'seed' were measured, their mobility was 150 cm²/Vsec, for p-channel MOS transistor and 600 cm²/Vsec, for n-channel MOS transistor which values were nearly equal to those of the devices prepared on the silicon substrates respectively. In the prior art, it was impossible to form a device having such high mobility and the MOS device located 3 μm away from the 'seed' could not operated normally.

Figure 79:
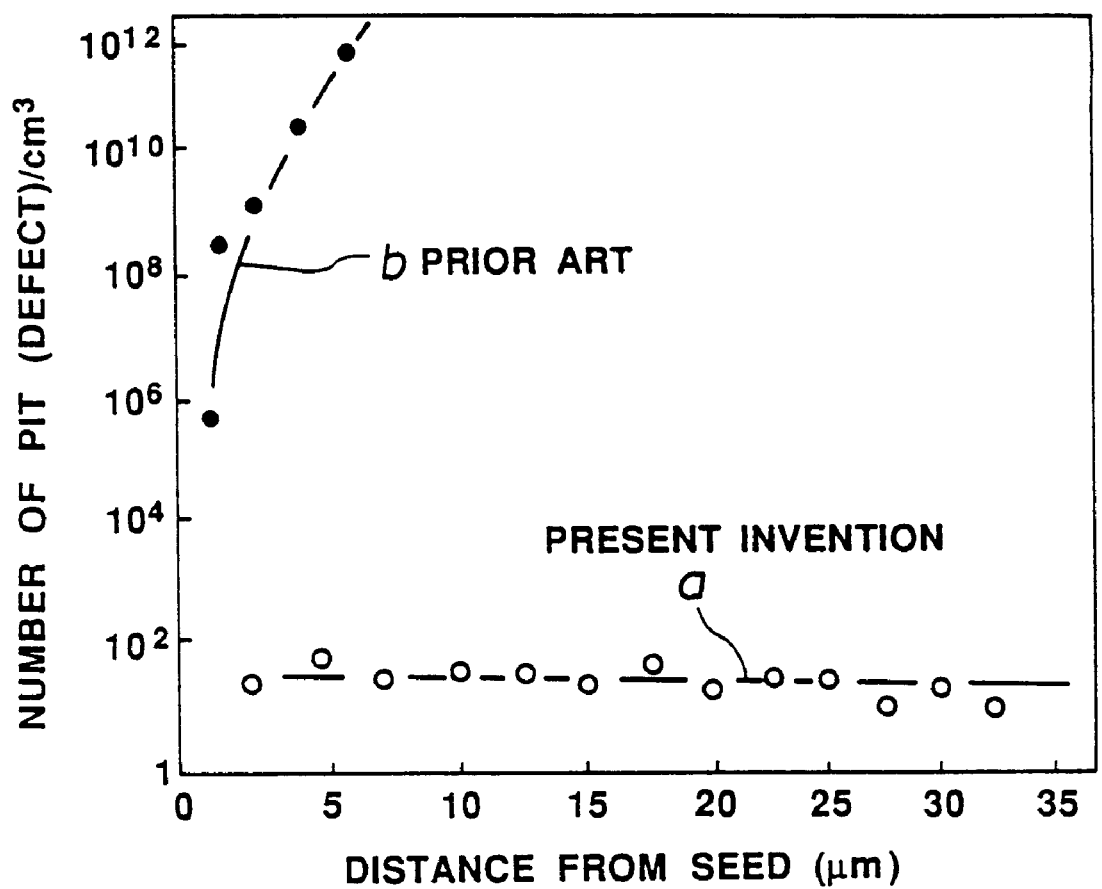
FIG. 79 illustrates relationships between the distance from a seed and the etch pit in transistors formed through the steps and in the prior art.

FIG. 79 shows results of the number of crystal defects in the silicon thin film (curve 'a') of the present method of the invention and in the prior art silicon thin film (curve 'b') evaluated in terms of etch pits. The etch pits can be observed as pit-like depressions on the surface of the silicon film processed with nitric acid mixed solution with use of an electronic microscope. The pits appear when crystal defects are selectively fast etched with use of nitric acid mixed solution, and the number of pits corresponds to the number of detects. In the prior art film, a large number of defects appear and its number amounts to $10^{10}$ pits/cm², in particular, at a position spaced several micrometers from the 'seed'. In accordance with the method of the present invention, the pit number could be reduced to below 100 atoms/cm² even at a position 35 μm away from the 'seed'.

Further, 100000 of the n- and p-channel MOS devices having the structure of FIG. 79 were prepared at positions away differently form the 'seed' and subjected to their characteristic measurements. FIG. 80 shows relationships between the threshold voltage and mobility as typical ones of the characteristics and their standard deviations. As shown in the drawing, with respect to both the p- and n-channel transistors, the mobility is nearly equal to that of the MOS transistor prepared on the silicon substrate, and substantially no drop in the mobility is observed even at positions away from the 'seed' and substantially no increase in threshold voltage variations is observed. Thus, when the present invention was used, the device characteristics could be improved remarkably over the prior art even at positions away from the 'seed'.

Explanation will next be made as to the twenty-fourth embodiment of the present invention.

In this embodiment, as shown by steps in FIG. 81(a) to (k), a p-type silicon region formed on a substrate as well as an n-type granular single crystalline silicon formed on the p-type silicon region according to the present method form a pn junction, whereby a diode small in the variations of its characteristics is obtained.

Figure 81A:
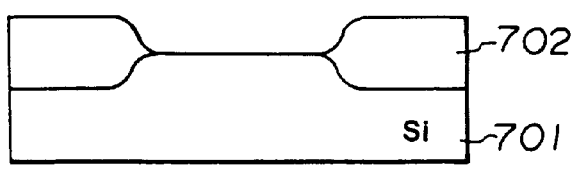
FIGS. 81(a) thru 81(k) steps of a method for manufacturing a semiconductor device in accordance with the twenty-fourth embodiment of the present invention.

More specifically, as shown in FIG. 81(a), an n-type Si (100) substrate was first prepared as a silicon substrate 701. The impurity concentration of the silicon substrate 701 was not specifically limited, but the inventors selected it to be about $10^{15}$ cm³. Formed on the silicon substrate 701 was a device isolation insulator 702 of about 350 nm thick through a selective thermal oxidization process at 1100° C.

Figure 81G:
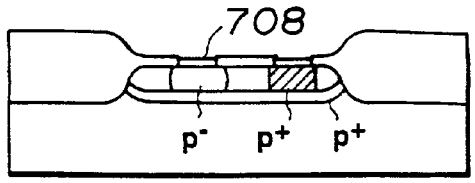
Figure 81B:
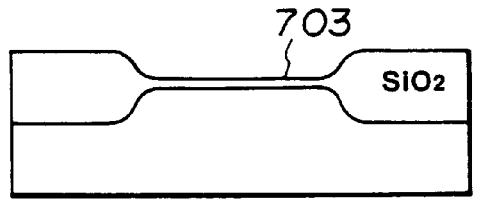

Next, as shown in FIG. 81(b), a thin oxide silicon film 703 of 35 nm thick was formed on the resultant wafer in a dry oxidization atmosphere.

Figure 81H:
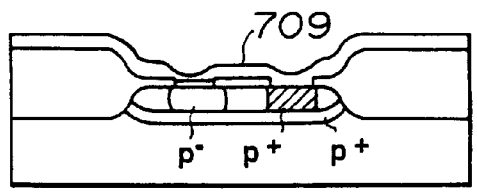
Figure 81C:
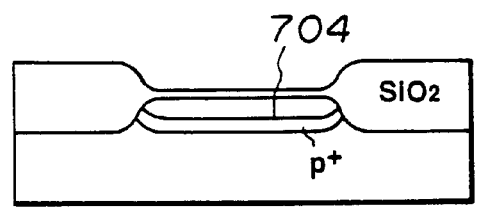

Thereafter, as shown in FIG. 81(c), the wafer was subjected to an ion implantation process with use of, e.g., boron impurities to form an embedded p+ electrode region 704. In this case, the ion implantation process may be replaced, for example, by an embedding epitaxial growth process. In the latter case, however, it becomes necessary to somewhat modify the procedure. The region 704 later becomes a diffusion layer for the lead of part of an electrode of a diode to be formed through the subsequent steps.

Figure 81I:
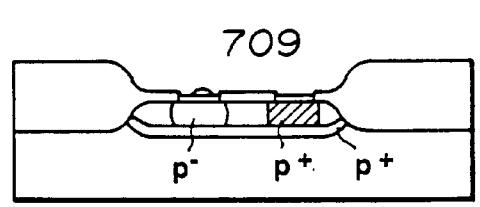
Figure 81D:
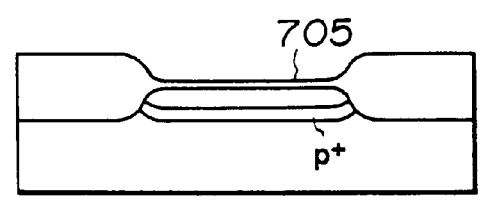

Next, the silicon oxide film 703 was subjected to a photolithography process to make openings 705 therein as shown in FIG. 81(d). Thereafter, the wafer was again subjected to a photolithography process to form a mask, and then subjected to an ion plantation process to form a high-concentration p+ impurity layer 706 as a lead of part of one of the opening 705 as shown in FIG. 81(e).

Figure 81J:
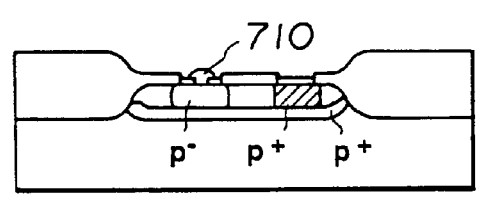
Figure 81E:
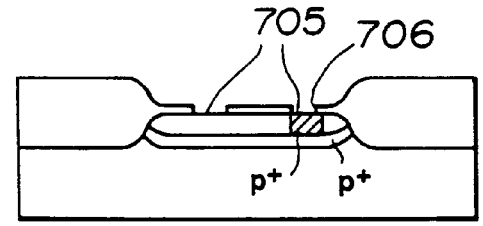
Figure 81K:
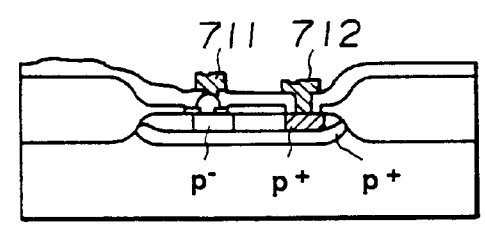
Figure 81F:
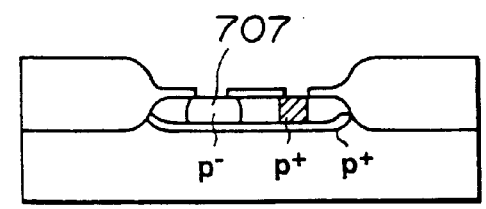

Formed for part of the other opening was a p-type region 707 for formation of an electrode part of the diode as shown in FIG. 81(f).

Next, as shown in FIG. 81(g), a very thin oxide film 708, which forms part of the essential constituent elements of the present invention, was formed. As this oxide film, a spontaneous oxide film for example may be employed.

Next, as shown in FIG. 81(h), an amorphous silicon film 709, which also forms part of the essential constituent elements of the present invention, was formed. In this case, the deposition temperature was 525° C. and the deposition material gas was $SiH_4$. The thickness of the amorphous film, which is very vital factor, was 19.8 nm. In the step, a $PH_3$ gas was used as its doping gas to contain a high-concentration of n+ impurities in the deposited film. The amorphous silicon film 709 was subjected to a patterning process to leave parts of the surface of the film 709 corresponding to the diode parts as shown in FIG. 81(i). Thereafter, since an oxide film might be coated on the film 709, the oxide film was fully removed and placed in a re-crystallization furnace. The furnace temperature was 600° C.

As shown in FIG. 81(j), the resultant wafer was subjected to a heat treatment at 600° C., the amorphous silicon film 709 was recrystallized into a single crystalline silicon 710. This is a feature of the present invention. In addition, the orientation of the single crystalline silicon is the same as the substrate. At this time, an annealing process may be provided, but due to the heat treatment of the re-crystallization, part of the oxide film shrinks and gets broken, whereby the upper and lower crystallization layers become continuous as shown in FIG. 81(k). This becomes the core of a single crystalline diode of the present invention. When electrodes 711 and 712 are formed, the diode is completed.

The inventors have analyzed the reasons why the underlying very thin oxide film was partly removed so that the upper and lower layers were integrally crystallized during the single crystalline grain growth, and further why the upper and lower crystals were aligned in orientation even at such low temperatures to provide a good quality of crystal. That is, the inventors have developed a new (molecule dynamics) simulation system, as mentioned above and carefully examined the aforementioned process phenomena. They have also improved potential expression and boundary generation parts between atoms in the molecule dynamics simulator to allow motion calculation of Si and O atoms including a boundary between Si and $SiO_2$. The following is part of the calculation works. The initial conditions of preparation of the $Si/SiO_2$ boundary is as follows. That is, as the initial conditions, (i) any dangling bonds should not be left at all, (ii) initial bonding length 'd' and initial bond angle 'θ' should be set to be $d_{Si-Si}=2.35$ angstroms, $d_{Si-O}=1.60$ angstroms, $θ_{Si}=109.47$ degrees, $θ_O=144.0$ degrees. After this, velocities following Maxwellian is allocated to Si and O atoms on a random basis respectively. Thereafter, in the entire system including the boundary, all the particles were moved in accordance with a motion equation so as to minimize the total energy. Thus, at the point when the calculation has been fully advanced, structural loosening phenomenon must take place and distributions of the bonding length and bond angle must be found. A great amount of outputs (data relating to the varying position, force and velocity of each atom, the stress in the vicinity of the boundary, etc.) were analyzed.

As a result of the analysis, the following matters became clear. First, the re-crystallization of the amorphous silicon film 709 starts to grow from the vicinity of the upper surface of the film and extends toward the underlying thin oxide film 708. At this time, the crystal orientation of the film is not aligned with the substrate 701 at all. It has been found that, as the growth of the silicon single crystal advances, tensile stresses are accumulated in the vicinity of the growth front. Meanwhile, compressive stresses resulting form the interatomic structure between the substrate 701 and oxide film 708 are also accumulated even in the underlying oxide film 708 from the beginning. Accordingly, it will be appreciated that a large compressive stress is stored in the oxide film 708 so that, when the accumulated stress reaches a certain level, this causes the oxide film 708 to be partially broken. Further, it has been found that, at the moment of partial breakage of the oxide film 708, the recrystallized grains 710 act to lower the energy based on the crystal orientation difference with the silicon substrate 701. Thereafter, it has also been found that the recrystallized grains 710 have almost completely the same axis as the underlying substrate 701.

Figure 82:
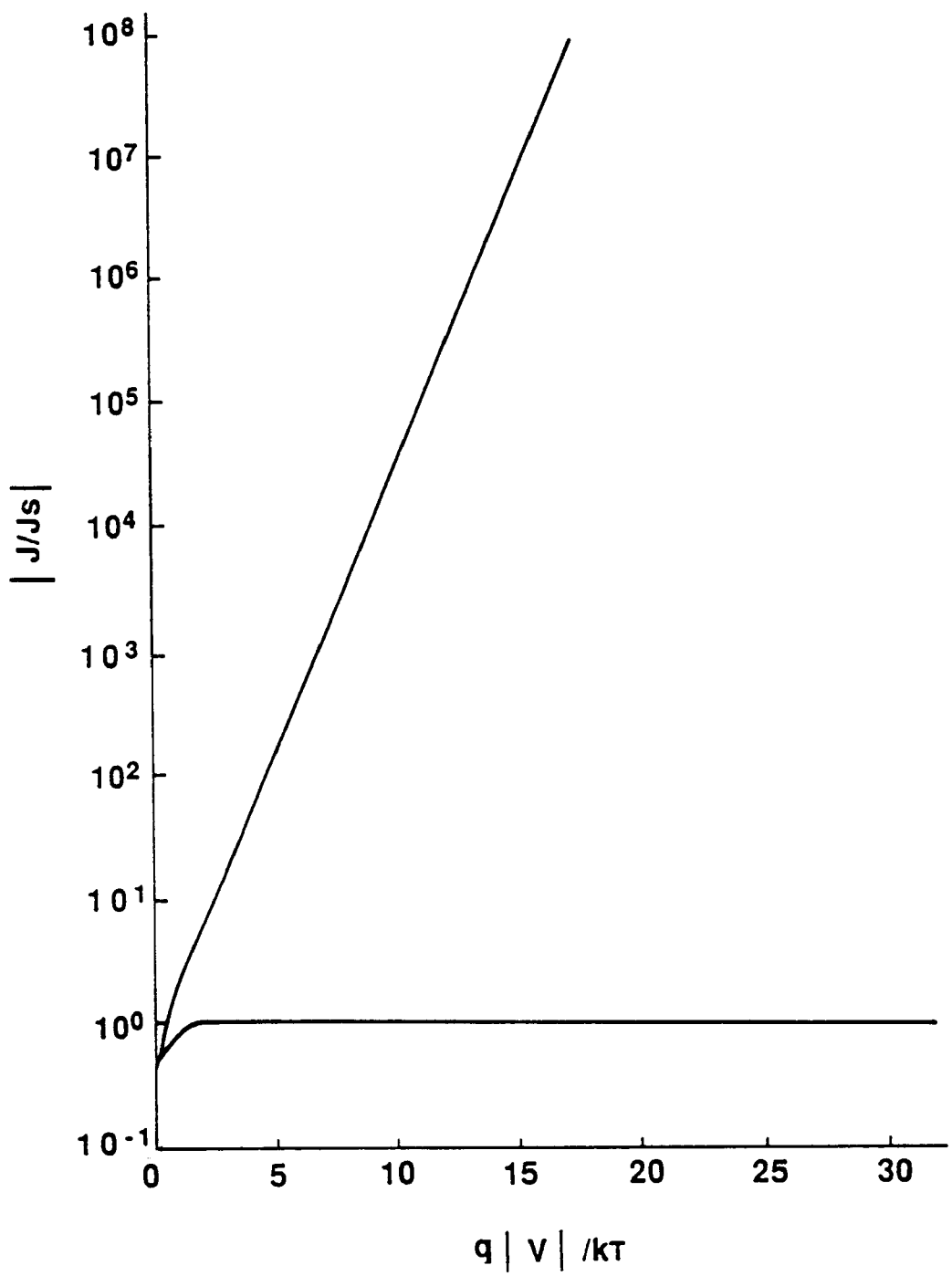
FIG. 82 illustrates characteristics of a semiconductor device obtained through the steps.

After this, the characteristics of the single crystalline fine diode according to the present invention were evaluated, which results are given in FIG. 82. In the drawing, quantity 'q' denotes elementary electric charge. V denotes voltage, and 'k' denotes Boltzmann's constant. Further, T denotes absolute temperature. As will be seen from the drawing, a good rectifying characteristic is obtained. Furthermore, when the diode is observed in its backward direction in terms of q|V|/kT value, its breakdown voltage is not seen in its measurement rage and the diode operates substantially ideally. Although the inventors failed to understand fully the reason why such almost ideal rectifying and breakdown voltage characteristics were obtained, but considered the reason may result from the two points, i.e., (1) good crystal quality and (2) no impurity redistribution and a very abrupt characteristic.

For comparison with the prior art, the inventors prepared an pn junction by a prior art technique. Its preparation procedure and characteristic results will be reported below briefly.

In the prior art, among the steps of FIG. 81, the steps up to FIG. 81(g) may be used. After the step of FIG. 81(g), a polycrystalline Si film in place of the amorphous silicon film of FIG. 81(h) was deposited. The deposition temperature was 625° C. Note that this temperature is very high compared to the invention. Such a high temperature processing is highly disadvantageous when a device is present in the underlying layer.

Figure 83:
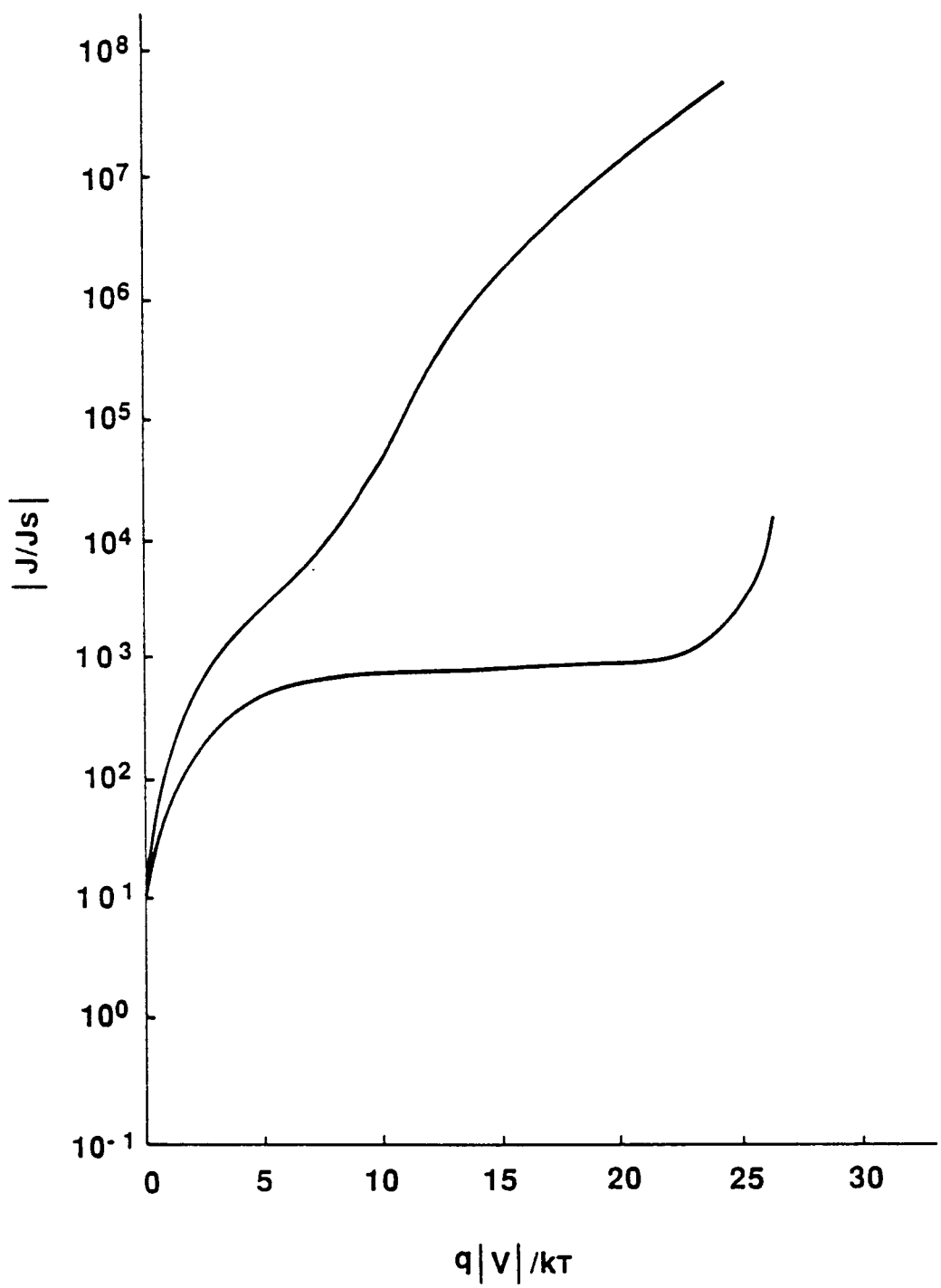
FIG. 83 illustrates junction characteristics of a semiconductor device obtained through the steps.
Figure 84A:
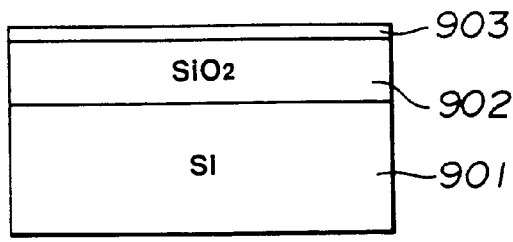
FIGS. 84(a) thru 84(g) steps of a method for manufacturing a semiconductor device in accordance with the twenty-fifth embodiment of the present invention.
Figure 84E:
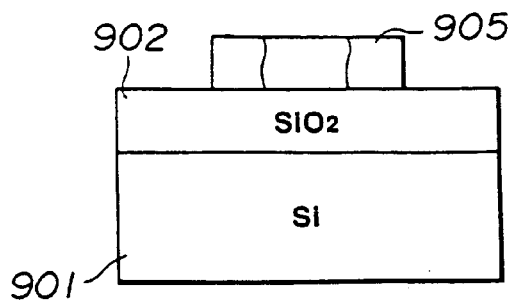
Figure 84B:
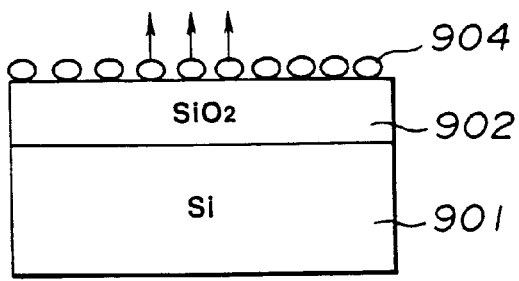
Figure 84F:
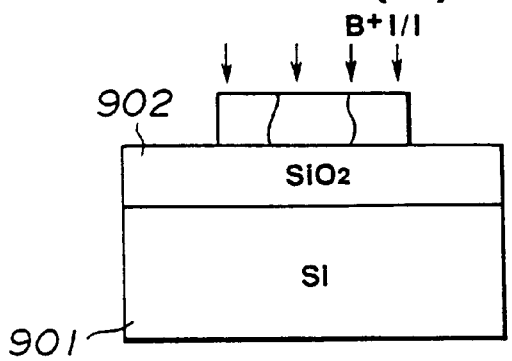
Figure 84C:
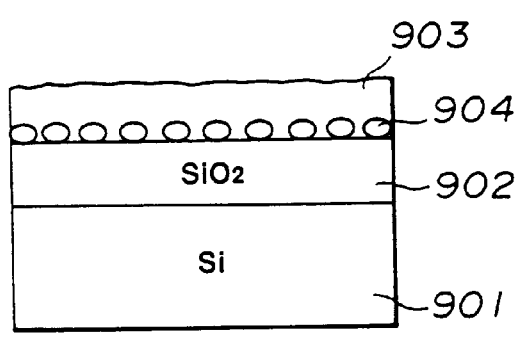
Figure 84G:
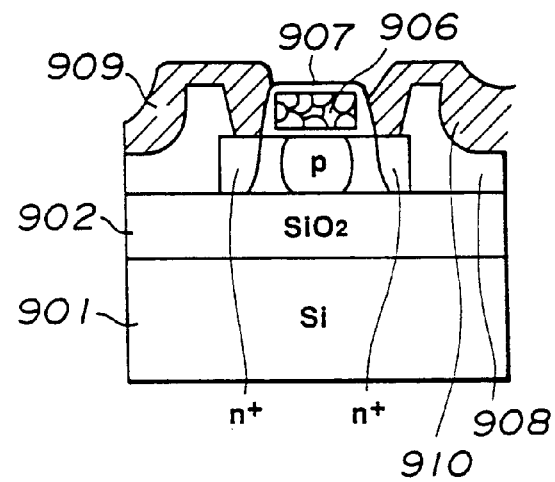
Figure 84D:
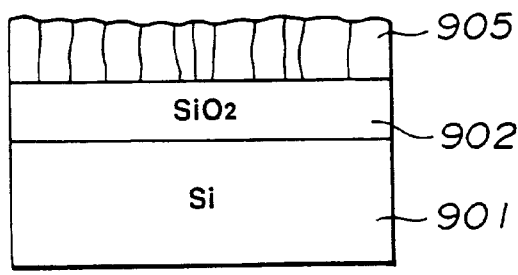

After this, as often carried out in the prior art, the wafer was subjected to a mixing ion implantation process toward the boundary of the substrate and polycrystalline Si. Thereafter, the wafer was subjected to a heat treatment at 970° C., formed thereon with electrodes, etc., and then subjected to measurements of its junction characteristics. Its results are given in FIG. 83. It is obvious that a breakdown voltage is low. It is considered that the cause of the low breakdown voltage results from two points. That is, (1) the single crystalline junction region is imperfect in crystallization so that many crystal defects probably during the mixing remain therein. Further, (2) as a result of observation of its impurity distribution by a secondary ion mass spectroscopy (SIMS) method, its characteristic is relatively not abrupt compared to the present invention. These are considered to result in deterioration of its characteristics.

Next, the twenty-fifth embodiment of the present invention will be explained.

In this embodiment, as shown in FIG. 84, a granular single crystalline silicon formed based on solid phase growth is used and processed into a polycrystalline silicon which is uniform in crystal grain diameter and very good in the crystal quality of the grains, thereby forming a thin film transistor which is free of variations in its mobility and stable in characteristics.

In more detail, an insulating film was first deposited on a silicon substrate 901. After this, in order to obtain a single crystalline silicon, a film, whose average inter-atomic distance of an amorphous silicon is previously set to correspond to that of a silicon single crystal, was employed. Further, in order to suppress the growth and deposition of an oxide film on the amorphous film, the wafer was subjected to a heat treatment in an $H_2$ atmosphere as a reduction atmosphere. The film formation was carried out by the same system as shown in FIG. 32.

As shown in FIG. 84(*a*), a silicon oxide film 902 of 500 nm thick was deposited on a silicon substrate, and then an amorphous silicon film 903 was deposited on the silicon oxide film 902. The thickness of the amorphous silicon film 903 was set to be 75 nm. As already reported in the earlier part of this embodiment, measurement results of the film immediately after the deposition showed that the average inter-atomic distance of the film was 1.005 times of the single crystalline substrate. Thereafter, with use of the same device as the deposition device, the wafer was subjected to a heat treatment at 580° C. for 5 hours while suppressing the deposition of a spontaneous oxide film thereon to form a single crystalline silicon. As a result, the amorphous silicon film was changed to a granular silicon single crystalline grain layer 904, as shown in FIG. 84(*b*).

Figure 85A:
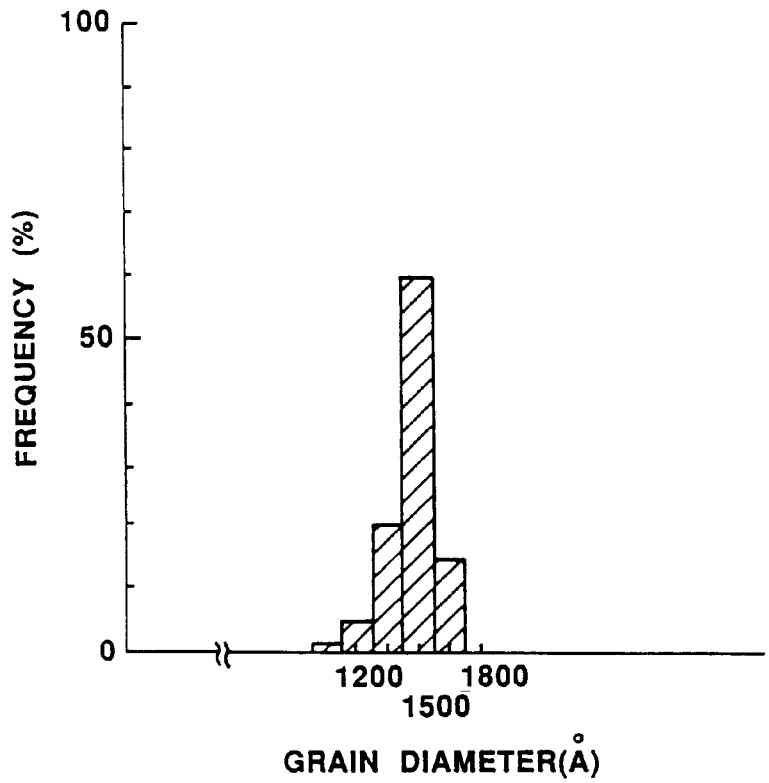
FIGS. 85(a) and 85(b) grain diameter distributions of the semiconductor thin films obtained through the steps.
Figure 85B:
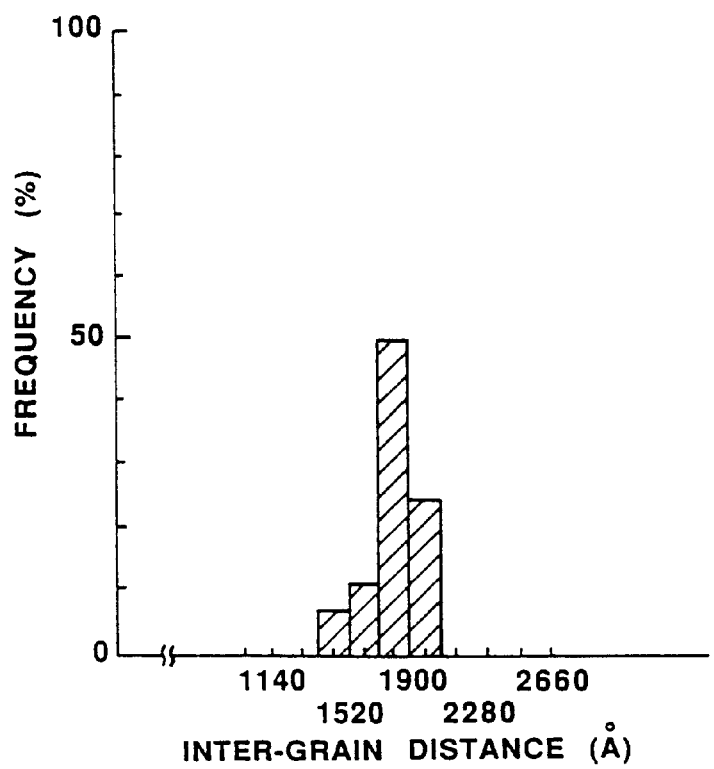

As a result of detailed observation of the resultant film with use of a transmission electron microscopy (TEM) photograph, it has been found that the (100) axes of the single crystalline grains are orientated in a vertical direction and the grains are substantially uniform in size and grain spacing. For example, when the grain diameter distribution was examined with use of a scanning electron microscopy (SEM) photograph taken from the direct top of the substrate, more than 90% of grains had diameters belonging to a range of ±20% around its maximum appearance frequency diameter of 1500 angstroms, as shown in FIG. 85(*a*). In particular, substantially no grains having sizes 10% larger than the maximum appearance size were observed. This phenomenon is considered to be probably due to the fact that the generation of most crystal nuclei takes place simultaneously in a relatively short time from the start of the heat treatment. When the grain spacing between the centers of adjacent grains was examined, more than 90% of grains had grain spacings belonging to a range of ±10% around its maximum appearance frequency spacing of 1900 angstroms, as shown in FIG. 85(*b*). In this way, the single crystalline grains were uniform in size and spacing and separated from each other.

Deposited on the grain layer was a second amorphous silicon 903 of 200 angstroms thick as shown in FIG. 84(*c*). The average inter-atomic distance of the amorphous silicon was 1.005.

Figure 86A:
FIGS. 86(a) and 86(b) illustrate planar TEM photographs of semiconductor thin films obtained through the steps of the present invention and through conventional steps.
Figure 86B:

After this, the wafer was subjected to a heat treatment at 580° C. for 30 minutes so that, the second amorphous silicon grows in solid phase with the granular single crystalline silicon 904 used as the 'seed', whereby a polycrystalline silicon 905 was formed, as shown in FIG. 84(*d*). When the grains of the polycrystalline silicon were examined based on its TEM photograph, the grains were of a columnar shape having a width of about 1900 angstroms and the (100) axes of the columnar grains were orientated in the vertical direction. Further, even within the grain of the polycrystalline silicon, as shown in FIG. 86(*a*), its crystal quality was good when compared to the solid phase growth film made by the ordinary nucleus formation. Though not clear, it is estimated that this is because the crystal quality of the single crystalline grains used as the crystal seeds is very good.

For comparison, FIG. 86(*b*) shows a TEM photograph of the crystal quality of a large size grain of the polycrystalline film formed based on the solid phase growth of the ordinary amorphous film. Within the grain, many such defects as twins are seen. In addition, such defects cannot be easily extinguished so long as the film is not subjected to a heat treatment at a temperature of more than 1200° C.

After the polycrystalline silicon film having uniform-size grains was thus formed, the polycrystalline silicon film was subjected thereon to an etching process to be flattened thereon, subjected to a patterning process, and then the polycrystalline silicon film 905 having a flat surface was subjected to a reactive ion etching (RIE) process or the like to be formed in an island manner as shown in FIG. 84(*e*). Next, the wafer was subjected to an $B^+$ channel ion implantation process at a dose of $1 \times 10^{13}$ atoms/cm$^2$ at 40 keV (see FIG. 84(*f*)). Thereafter, the surface of the polycrystalline silicon film 905 was thermally oxidized to form a gate insulating film 906. The surface of an ordinary polycrystalline film comprises grains having various surface orientations. Thus, when the gate insulating film is thermally oxidized, the grains have oxidization rates different in their surface orientations, whereby the thickness of the oxide film varies in a range of about 10%. When a transistor is formed with the thickness of the oxide film varied in the about 10% range, this leads to the fact that the threshold voltage of the resultant transistor largely varies. When the transistor is formed according to the present method, however, the surface of the polycrystalline film has almost the (100) plane. Thus, when the resultant film was examined based on its TEM photograph, the film thickness variation was suppressed within an about 3% range.

Next, as shown in FIG. 84(*g*), after a gate electrode 907 was formed, an insulating film was deposited on its side wall, and then subjected to an $As^+$ ion implantation process at a dose of $2 \times 10^{19}$ atoms/cm$^2$ at 40 keV for formation of a source and drain conductive layer. An interlayer insulating film 908 was deposited and formed therein with an opening for formation of the electrodes, and then source and drain electrodes 909 and 910 were formed.

Figure 87:
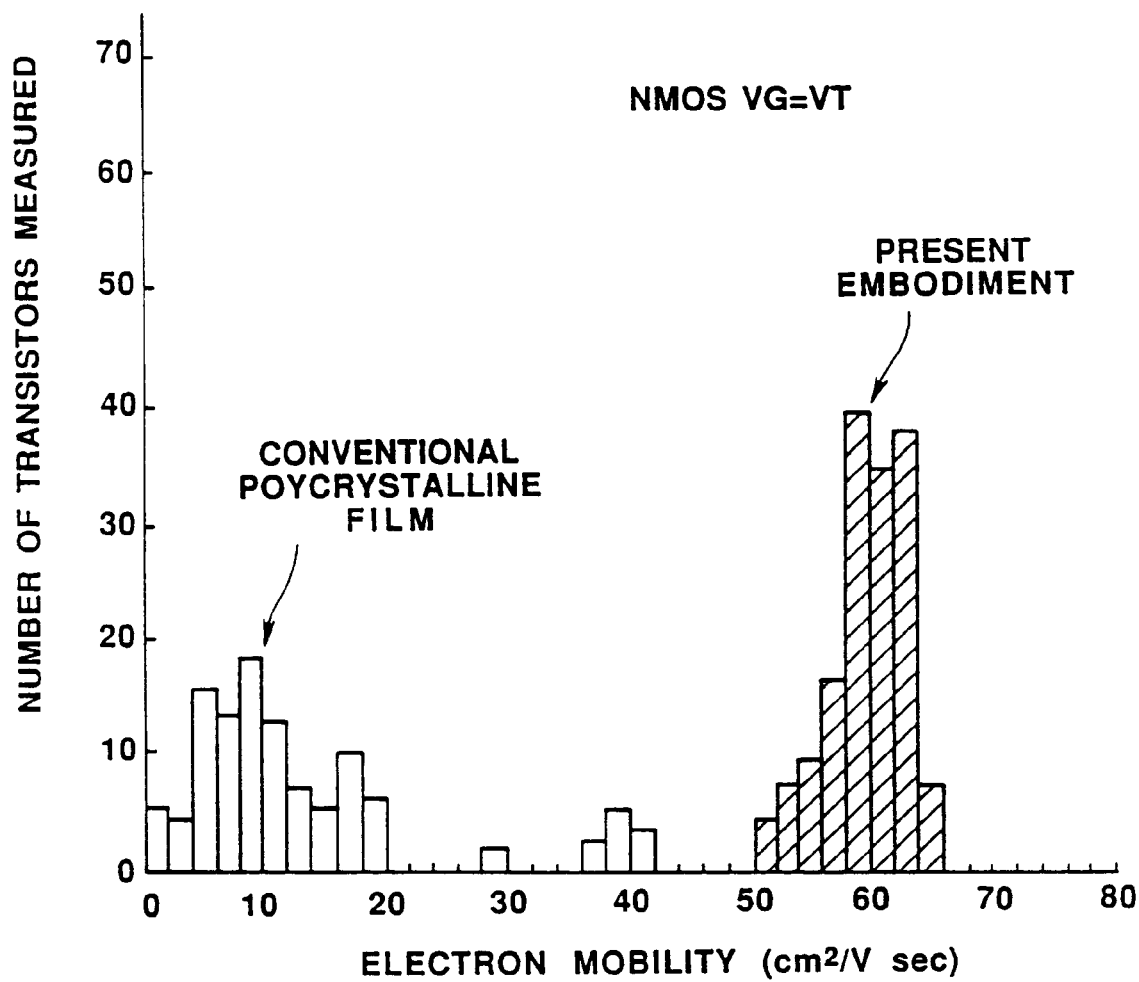
FIG. 87 illustrates measured results of the transistors formed through the steps with respect to electron mobility.

When a thin film transistor thus formed was measured with respect to its electric characteristics, grains were as large as 1900 angstroms and grains having sizes of below 1500 angstroms were not present. Thus, even when the channel region of the transistor was positioned at any location on the surface of the polycrystalline film, the device characteristics were stable. For example, when the mobility of the transistor was examined at room temperature, a variation in the mobility of the present invention was much smaller than that of the prior art solid phase growth film as shown in FIG. 87.

Figure 88:
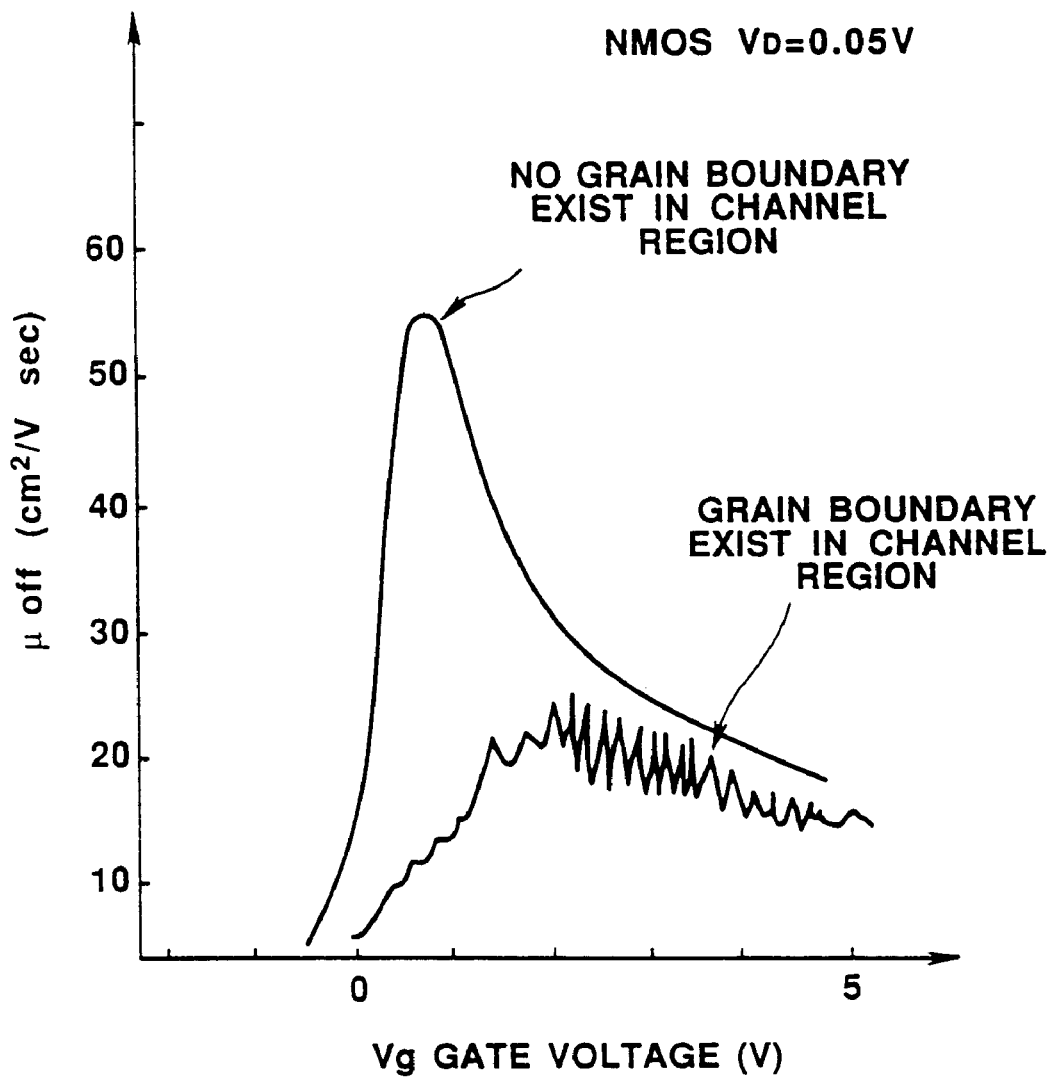
FIG. 88 illustrates Vg-Id characteristics of the transistors formed through the steps.
Figure 89:
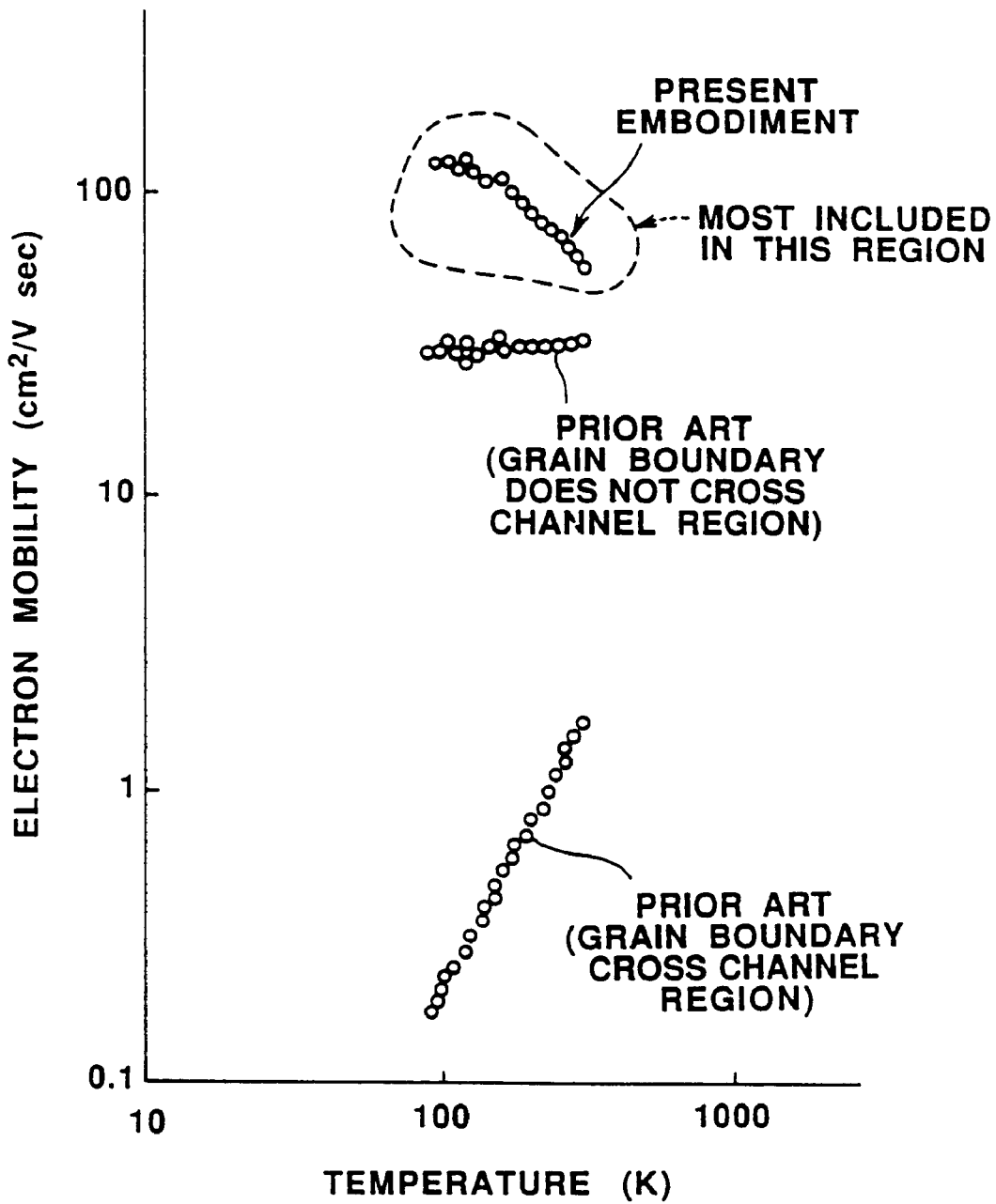
FIG. 89 illustrates measured results of the transistors formed through the steps and the conventional transistors with respect to the temperature dependence of electron mobility.

The Vg-electron mobility characteristic when the prior art film is used varies largely depending on the presence and absence of a grain boundary in the channel region as shown in FIG. 88. FIG. 89 shows results of the temperature dependence of the electron mobility in the above case. In the case of the prior art film, when the grain boundary is present in the channel region, the mobility greatly decreases with the decreased temperature and a difference in mobility between the presence and absence of the grain boundary becomes more remarkable. In the case of the film of this embodiment, on the other hand, since the grain boundary is present in the channel region, the device characteristics are stable as shown in FIG. 88. Further, its temperature dependence was also stable in a zone shown in FIG. 89.

Although the average inter-atomic distance of the amorphous silicon at the time of the heat treatment has been set to be nearly equal to that of its silicon single crystal to obtain the distortion-less single crystalline silicon film in the foregoing embodiment, the average inter-atomic distance may be set at 1.02 or more.

The first amorphous silicon film deposited all over the substrate has been subjected to the heat treatment to form the single crystalline grains in the foregoing embodiment, but after the deposition the first amorphous silicon film may be subjected to a RIE process or the like to from the single crystalline grains. Explanation will next be made as to the twenty-sixth embodiment of the present invention.

Figure 90A:
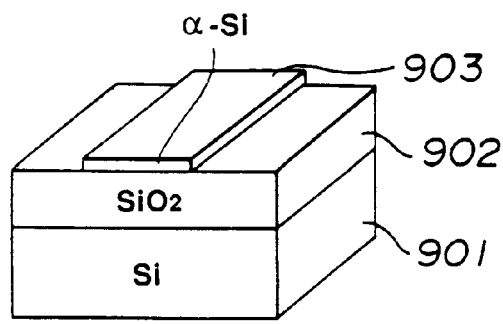
FIGS. 90(a) thru 90(e) illustrate steps of a method for manufacturing a semiconductor device in accordance with the twenty-sixth embodiment of the present invention.
Figure 90D:
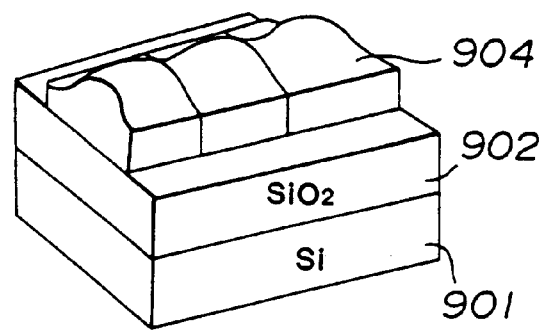
Figure 90B:
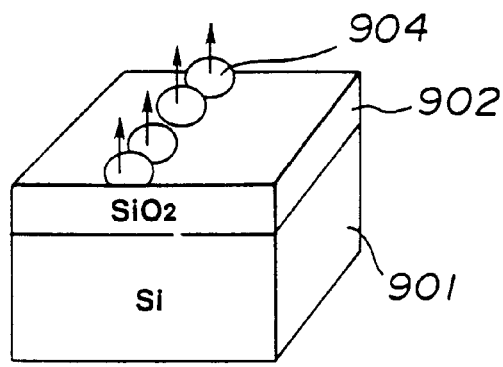
Figure 90E:
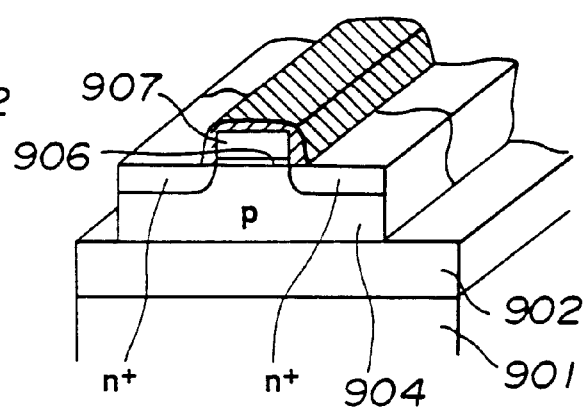
Figure 90C:
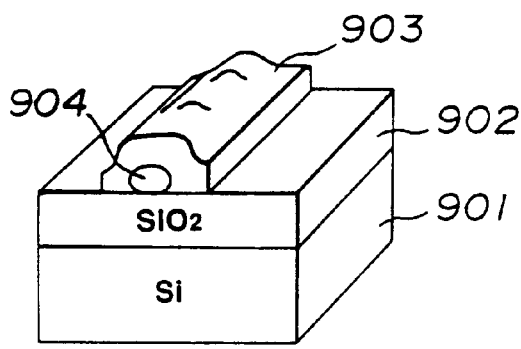
Figure 91:
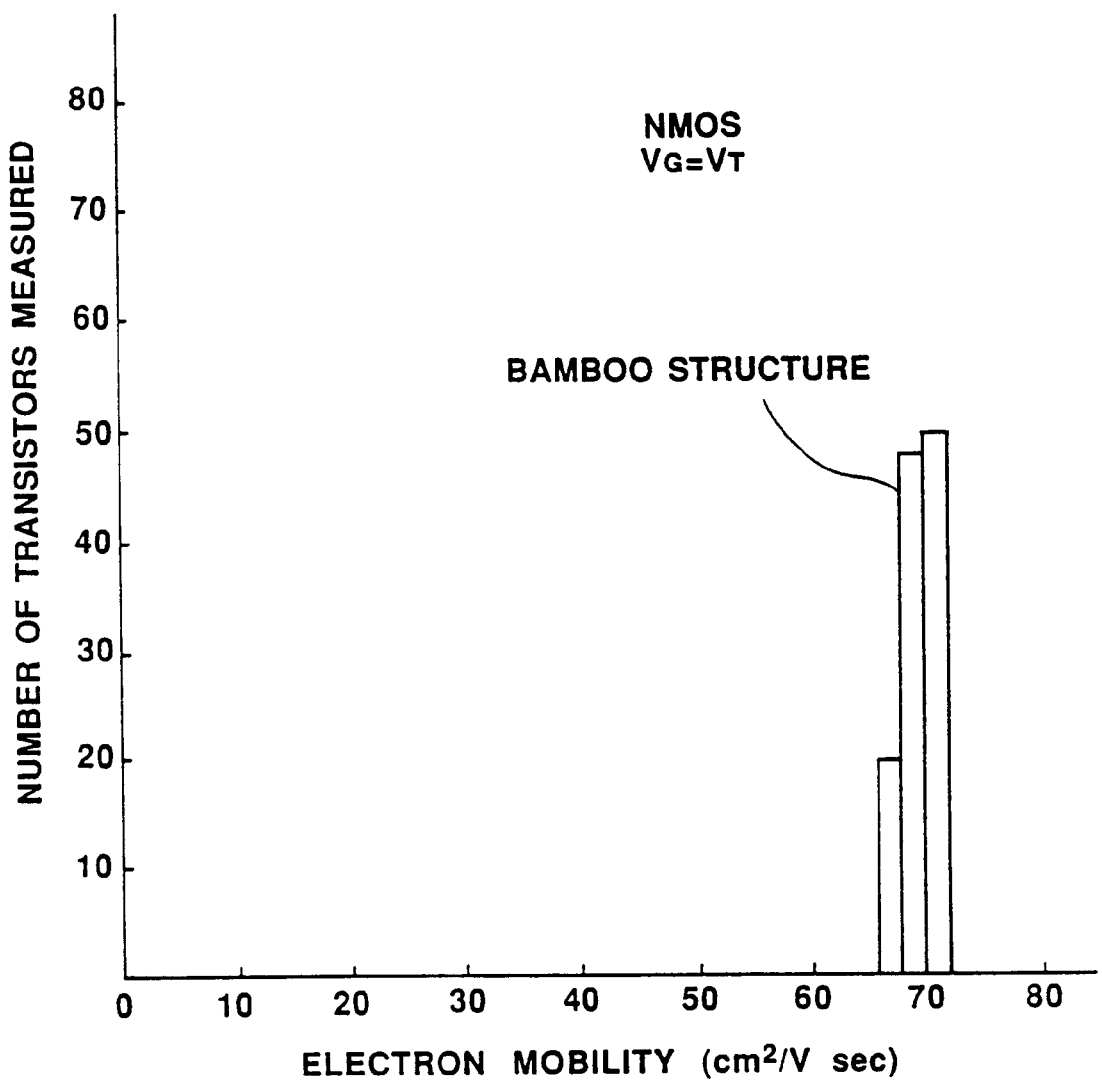
FIG. 91 illustrates measured results of the transistors formed through the steps with respect to electron mobility.

First, after the above amorphous silicon film was deposited, the wafer was once taken out from the deposition device and the amorphous silicon film was formed into such a linear shape having a width of 0.2 $\mu$m as shown in FIG. 90(a). Thereafter, a spontaneous oxide film was removed from the surface of the amorphous film and again transported into the deposition device. At this time, the average inter-atomic distance of the amorphous film was measured as 1.02. Under this condition, the wafer was exposed in a hydrogen atmosphere at 550° C. for 2 hours and then taken out from the deposition device. When the array of the resultant single crystalline grains 904 was examined based on its SEM photograph, the single crystalline grains were arranged substantially in a row as shown in FIG. 90(b). Then, a second amorphous silicon film 903 was deposited on the single crystalline grains 904 and shaped as shown in FIG. 90(c). When the second amorphous silicon film 903 was grown in solid phase growth with use of the single crystalline silicon grains 904 formed based on the first amorphous silicon film 903 as crystal seeds, the second amorphous silicon film was changed to a polycrystalline film having a so-called bamboo structure in which a grain boundary vertically runs, as shown in FIG. 90(d). In this example, a transistor was formed so that a channel was formed to be parallel to the grain boundary as shown in FIG. 90(e). The grain size of the polycrystalline film was about 2000 angstroms. With such a structure, mobility variation was further improved and could be controlled within such a very narrow range as shown in FIG. 91.

The twenty-seventh embodiment of the present invention will then be explained.

Even in this embodiment, as in the twenty-sixth embodiment, in order to obtain a single crystalline silicon, an amorphous silicon previously set so that the average inter-atomic distance is 1.02 times or more that of its silicon single crystal was used. The amorphous silicon was subjected to a heat treatment to form a good quality of granular single crystalline silicon based on solid phase growth. The single crystalline silicon was used to form a polycrystalline silicon uniform in crystal grain size, whereby there is formed a thin film transistor which is high in mobility and small in mobility variation. The present example is featured in that a device region of a polycrystalline silicon is formed on a gate electrode.

Figure 92A:
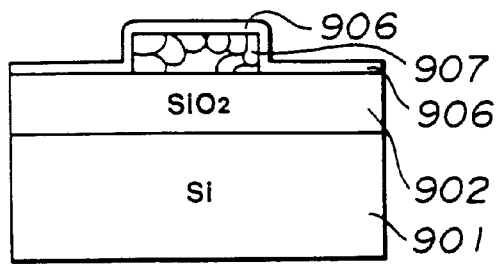
FIGS. 92(a) thru 92(f) illustrate steps of a method for manufacturing a semiconductor device in accordance with the twenty-seventh embodiment of the present invention.

More specifically, as shown in FIG. 92(a), an insulating film 902 is deposited on a silicon substrate 901, and then a gate electrode 907 made of a polycrystalline silicon film is formed on the insulating film 902. Next, the wafer was subjected to a CVD process to deposit a gate insulating film 906 on the gate electrode.

Figure 92B:
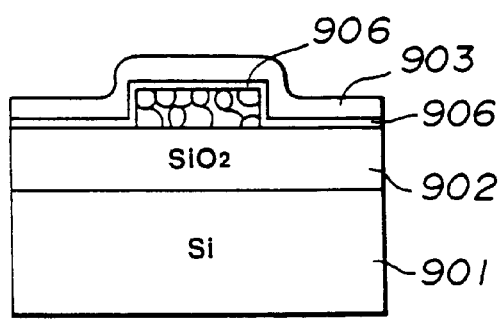
Figure 92C:
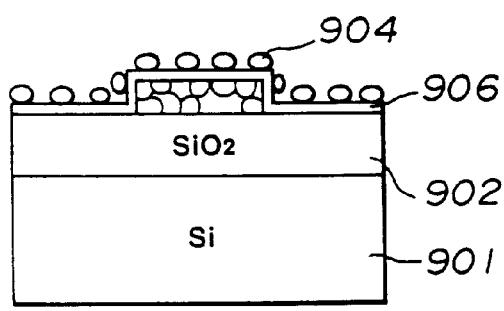
Figure 93:
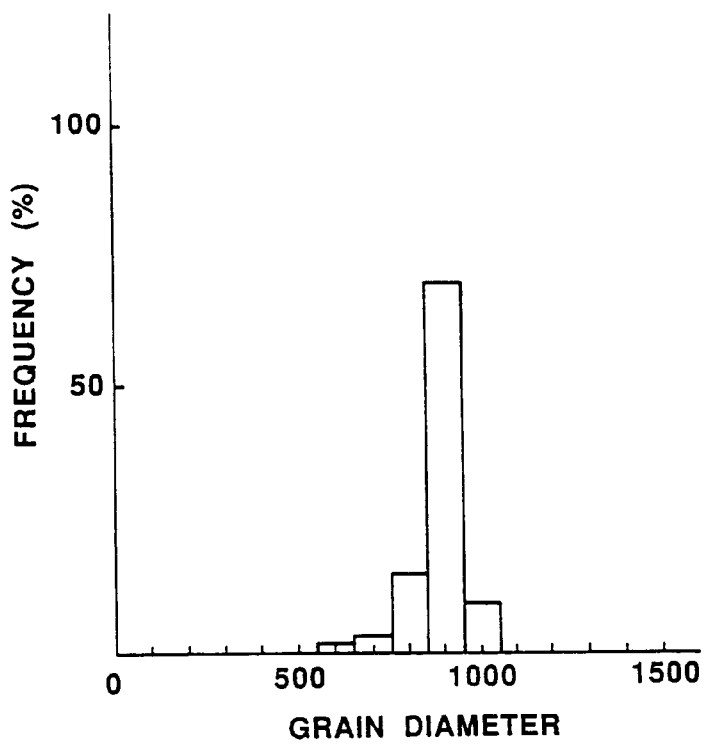
FIG. 93 illustrates a grain diameters distribution of a semiconductor thin film obtained through the steps.
Figure 94:
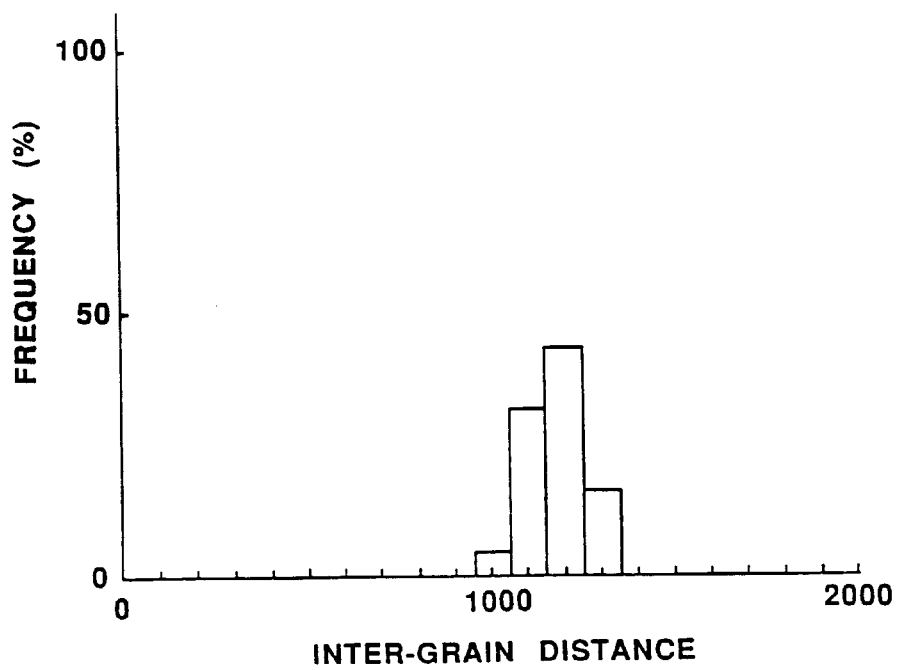
FIG. 94 illustrates a grain spacing distribution of the semiconductor thin film obtained through the steps.

Next, as shown in FIG. 92(b), an amorphous silicon film 903 of 40 nm thick was deposited on the gate insulating film 906 so that the average inter-atomic distance of the film 903 equal to or more than 1.01 times that of its single crystal silicon. When the average inter-atomic distance of the amorphous silicon film was actually measured, the average inter-atomic distance of the amorphous film was 1.02 times that of its single crystal. The resultant substrate was placed in the device shown in FIG. 2 and subjected to a heat treatment in a non-oxidization atmosphere at 550° C. for 2 hours. As a result, such granular single crystalline silicon as shown in FIG. 92(c) was obtained. When the single crystalline silicon was closely examined based on its TEM photograph, the (100) axes of its single crystalline grains were also orientated in a vertical direction and the grains were substantially uniform in size and grain spacing. As shown in FIG. 93, when a grain diameter distribution was examined, more than 90% of the grains existed in a size range of ±20% around its maximum appearance frequency size of 900 angstroms. As shown in FIG. 94, when a grain spacing was examined, more than 90% of the grains existed in a spacing range of ±20% around its maximum appearance frequency grain spacing of 1200 angstroms.

Figure 92D:
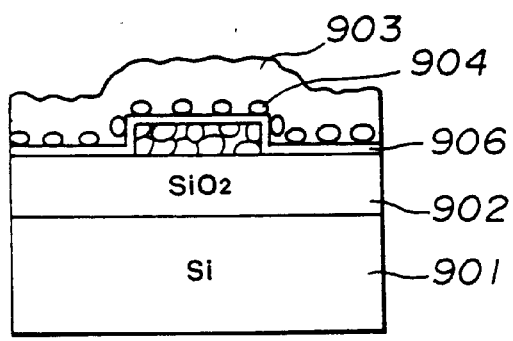
Figure 92E:
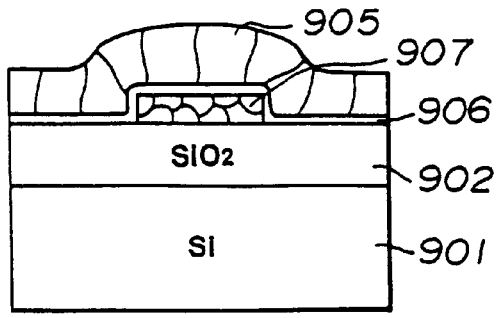

Next, a second amorphous silicon film 903 of 1200 angstroms thick was deposited in the same device as shown in FIG. 92(d). The average inter-atomic distance of the amorphous silicon film was 1.009 times that of its single crystal. When the wafer was subjected to a heat treatment at 600° C. for 15 minutes within the deposition device, the second amorphous silicon film 903 was single crystallized based on solid phase growth with the single crystalline silicon grains used as crystal seeds to thereby form a polycrystalline silicon as shown in FIG. 92(e). When the polycrystalline silicon was measured based on its TEM photograph, as in the foregoing embodiment 26, the polycrystalline thin film comprised grains which are uniform in size and whose (100) axes are preferentially orientated in a vertical direction.

Figure 92F:
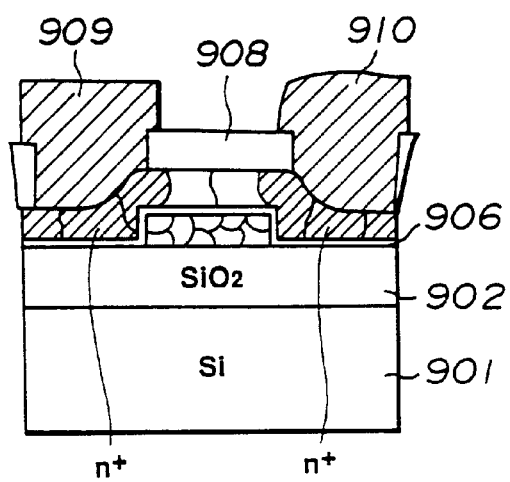

After the polycrystalline silicon film made of the uniform-size grains was formed, the polycrystalline silicon film was subjected to a RIE process or the like to be formed in an island form as shown in FIG. 92(f). Then, the resultant wafer was subjected to a channel ion implantation process with use of $P^+$ ions at a dose of $1 \times 10^{13}$ atoms/cm² at 40 keV. The wafer was further subjected to a heat treatment at 900° C. for 30 minutes for activation.

The wafer was next subjected to a $B^+$ ion implantation process at a dose of $3 \times 10^{15}$ atoms/cm² at 20 keV for formation of a source and drain conductive layer. An interlayer insulating film 908 was deposited and then an opening for formation of electrodes was made therein to form a source and drain electrodes 909 and 910.

Figure 95:
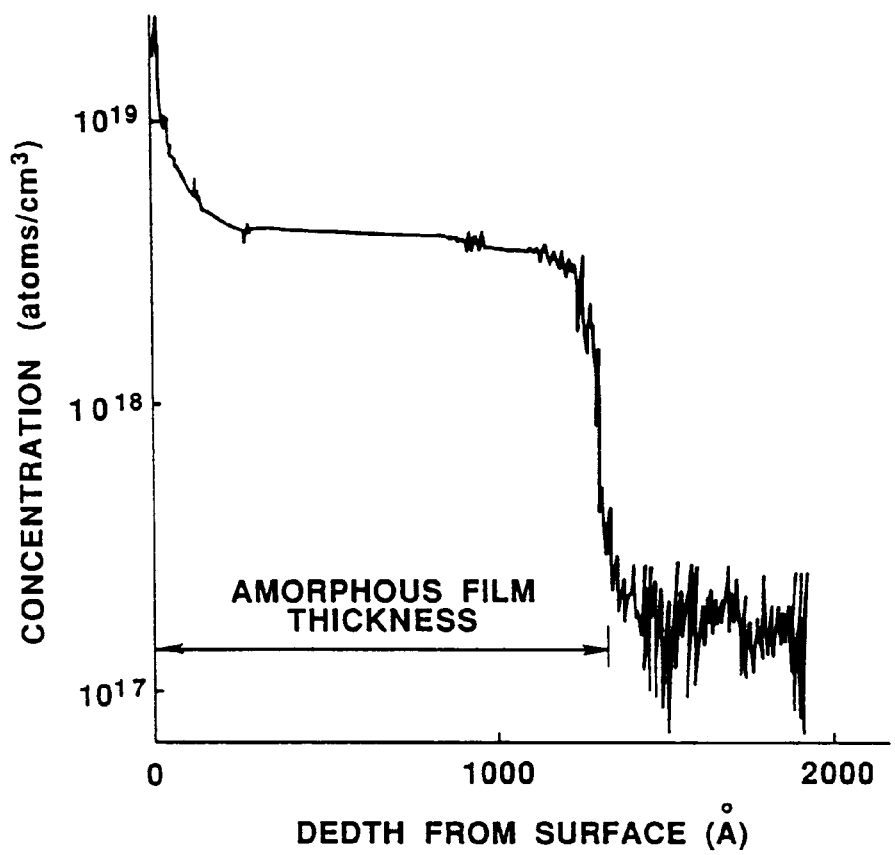
FIG. 95 illustrates an in-film oxygen concentration distribution of the semiconductor device obtained through the steps.

In a thin film transistor of the single crystalline silicon formed in accordance with a method set forth in claim 1, the underlying channel region is also made of grains which have a uniform grain diameter of about 1200 angstroms. When a polycrystalline silicon having a low conductive impurity concentration is deposited by an ordinary CVD process, the diameter of grains is merely up to about 300 angstroms. This results in that its carrier mobility becomes very small due to the scattering in the grain boundary. Even a polycrystalline silicon formed based on the solid phase growth of an ordinary amorphous film had many pebble-shaped fine grains in the boundary with the underlaying layer, which caused reduction of the mobility. Meanwhile, with the polycrystalline film formed according to the present method, since no fine grains is present at all in the underlying boundary of the channel region and its crystal quality is remarkably improved, mobility variation is improved and an average mobility is remarkably improved. When the in-film oxygen concentration of the film affecting the mobility was measured based on its secondary ion mass spectroscopy (SIMS) analysis, the oxygen concentration of the vicinity of the underlying boundary affected by the first amorphous film was very low as shown in FIG. 95. As a result, the scattering by oxygen atoms was reduced and a high-mobility device could be prepared.

Explanation will be made as to the twenty-eighth embodiment of the present invention.

The present embodiment is directed to preparing an elevated source/drain MOS device which uses a single crystalline silicon formed based on solid phase growth and having a very good crystal quality. The MOS device formed by present method is featured in that, since a substantially impurity-free layer can be formed in a channel region immediately below a gate oxide film, the running of carriers cannot be prevented by impurities and thus a high-mobility transistor can be obtained. Immediately below the gate oxide film, the higher the impurity concentration is the stronger a vertical electric field at the time of forming an inversion layer is, so that carriers run as more-strongly attached to the boundary between the oxide silicon and silicon, whereby even the slightly raised and recessed boundary results in the scattering of carriers. In the MOS device of the present invention, however, such a problem will not occur.

Figure 96:
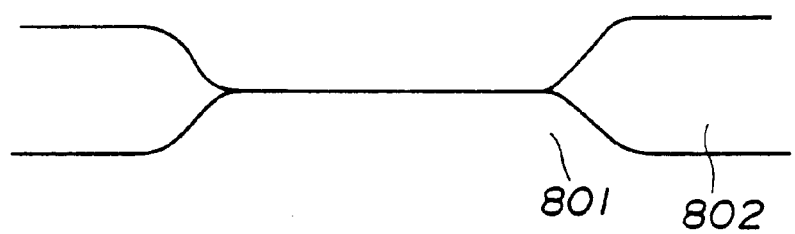
FIGS. 96 to 104 illustrate different steps of a method for manufacturing a semiconductor device in accordance with the twenty-eight embodiment of the present invention respectively.

More specifically, as shown in FIG. 96, a silicon substrate 801 was first subjected to a selective oxidization process to form a field oxide film 802 on the silicon substrate. The substrate was subjected to an ion implantation process to adjust a threshold voltage as necessary.

Figure 97:
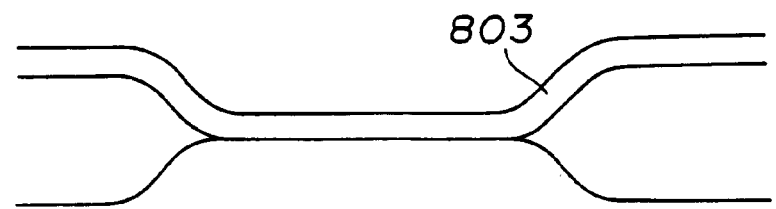

As shown in FIG. 97, the surface of the device region was cleaned and a non-doped amorphous silicon film 803 of 20 nm thick was deposited on the device region. A measurement result of the film immediately after its deposition showed that its average inter-atomic distance is 1.03 times the average inter-atomic distance of its single crystal silicon.

Figure 98:
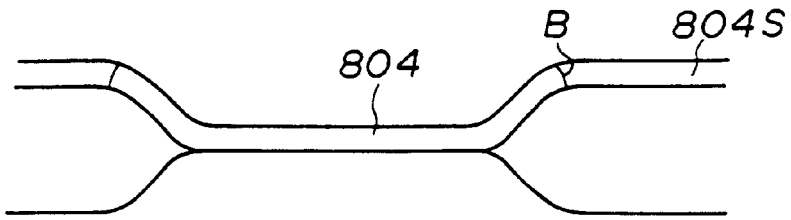

Thereafter, as shown in FIG. 98, the substrate was subjected to a heat treatment at 550° C. for one hour within the same device as the deposition device while suppressing the deposition of a spontaneous oxide film thereon to thereby form a single crystalline silicon 804. At this time, the silicon film is made of a single crystal film on the silicon substrate but of a polycrystalline silicon film 804S on the filed oxide film 802.

Figure 99:
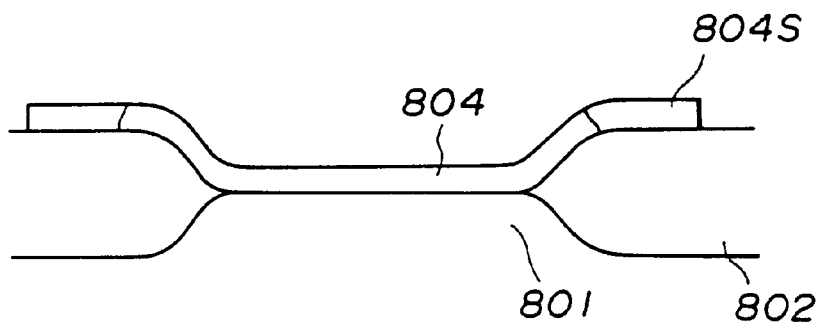
Figure 100:
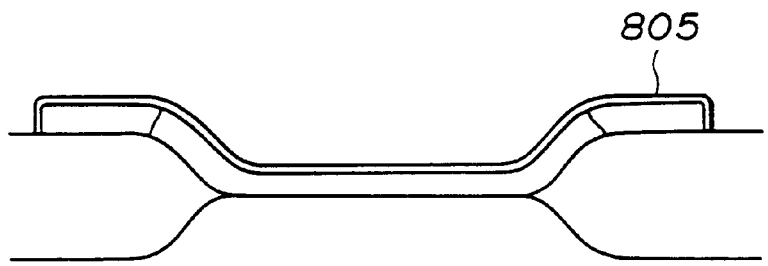

The substrate was then subjected to a patterning process of the device region as shown in FIG. 99 to form a gate oxide film 805 as shown in FIG. 100.

Figure 101:
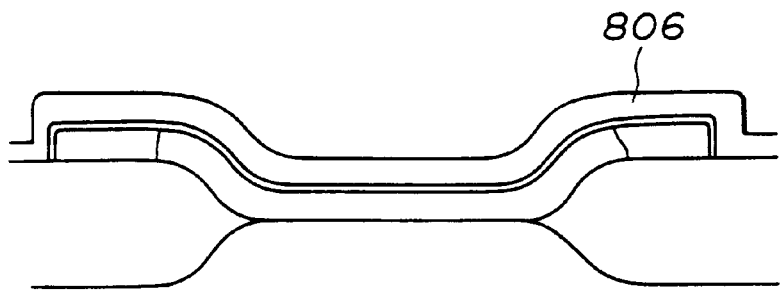
Figure 102:
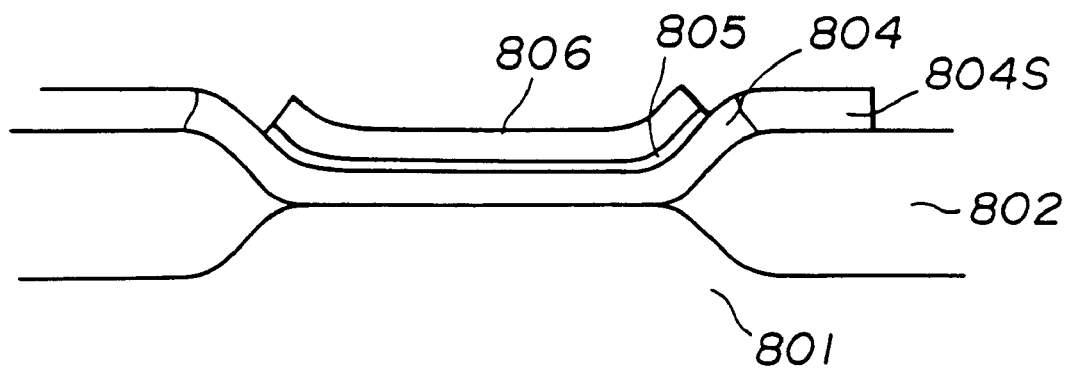

Further, a polycrystalline silicon film 806 was deposited on the gate oxide film 805 as shown in FIG. 101 and then subjected to a patterning process to form a gate electrode 806 as shown in FIG. 102.

Figure 103:
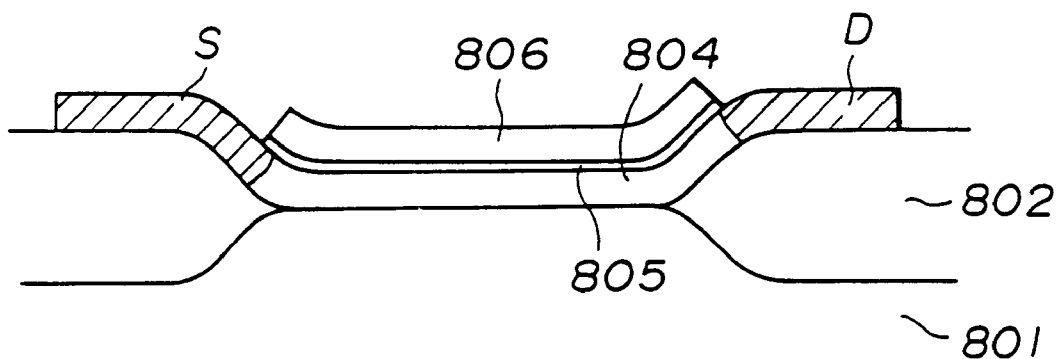
Figure 104:
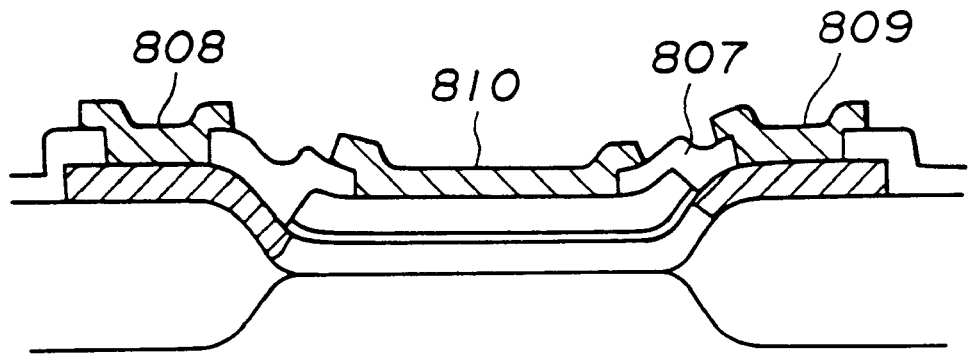

Next, as shown in FIG. 103, the substance was subjected to an ion implantation process with the gate electrode 806 used as a mask to form a source S and drain D. Further, an interlayer insulating film 807 was formed, and then a source electrode 808, a drain electrode 809 and a gate electrode 810 were formed through a contact hole, thus completing such a MOS device as shown in FIG. 104.

Figure 105:
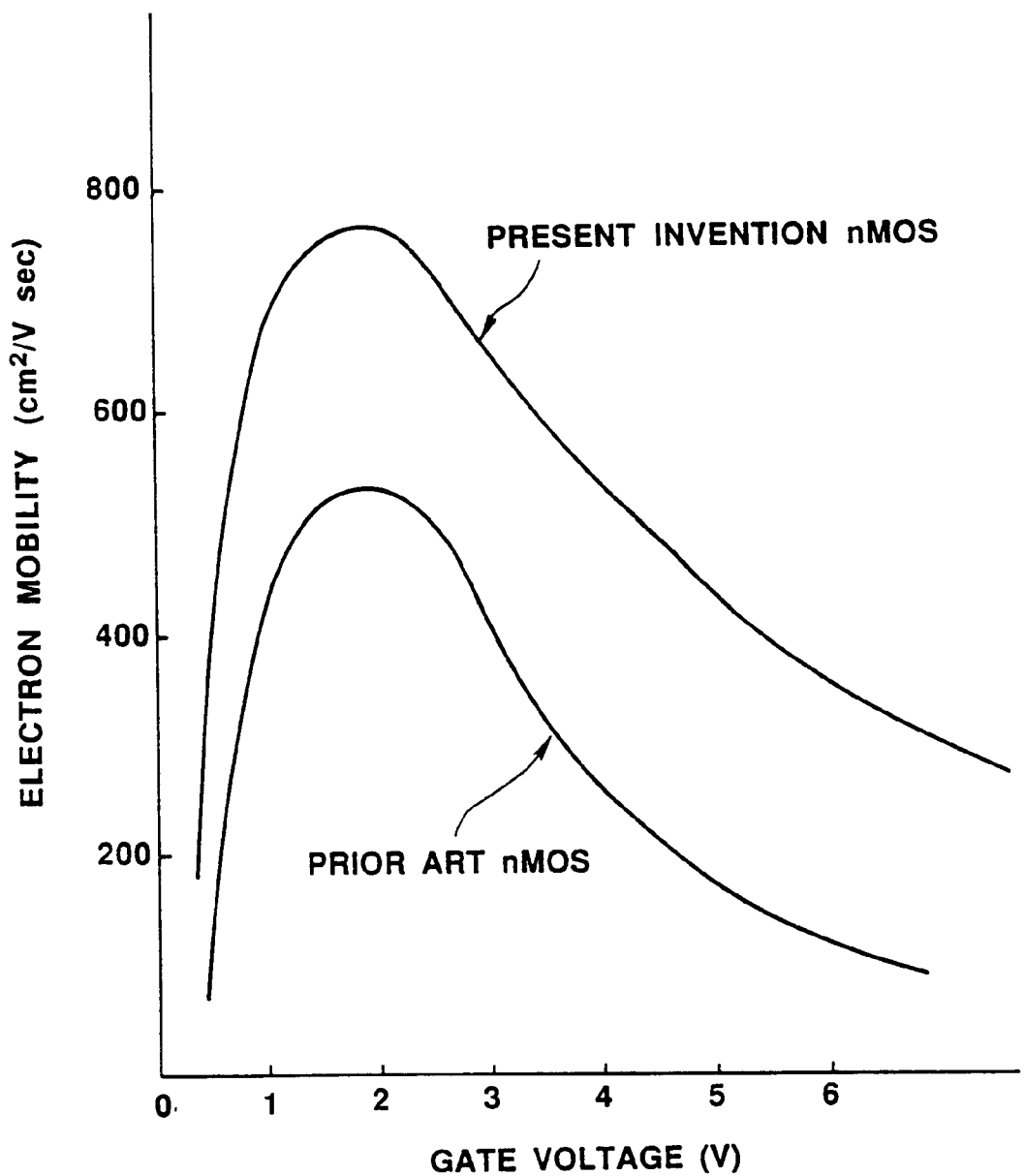
FIG. 105 illustrates a relationship between gate voltage and mobility in the transistor obtained through the steps.

The MOS device thus prepared was measured with respect to a relationship between its gate voltage and mobility. As a result, such a very high mobility characteristic as shown by a curve 'a' in FIG. 105 was obtained. For comparison, a measurement result of the prior art is also given by a curve 'b'. In the prior art method, since the single crystalline silicon is formed based on epitaxial growth at high temperature, auto-doping from the substrate inevitably causes impurities to be doped into the channel region immediately below the gate oxide film. In the present method, however, since a single crystalline film having a good crystal quality can be formed at low temperature, such auto-doping from the substrate will not take place and a layer substantially free of impurities can be formed in the channel region immediately below the gate oxide film. In this way, since a single crystalline layer without impurities causing the scattering of running of carriers, a high mobility can be obtained. Immediately below the gate oxide film, the higher the impurity concentration is the higher a vertical electric field at the time of forming an inversion layer. When the vertical electric field is high, carriers run as more strongly attached to the boundary between the oxide silicon and silicon, whereby the slight raised and recessed boundary causes carriers to be scattered, which leads to reduction of the mobility. In the device structure of the present method, however, the impurity concentration below the gate oxide film can be made small and thus mobility reduction can be prevented.

Figure 106:
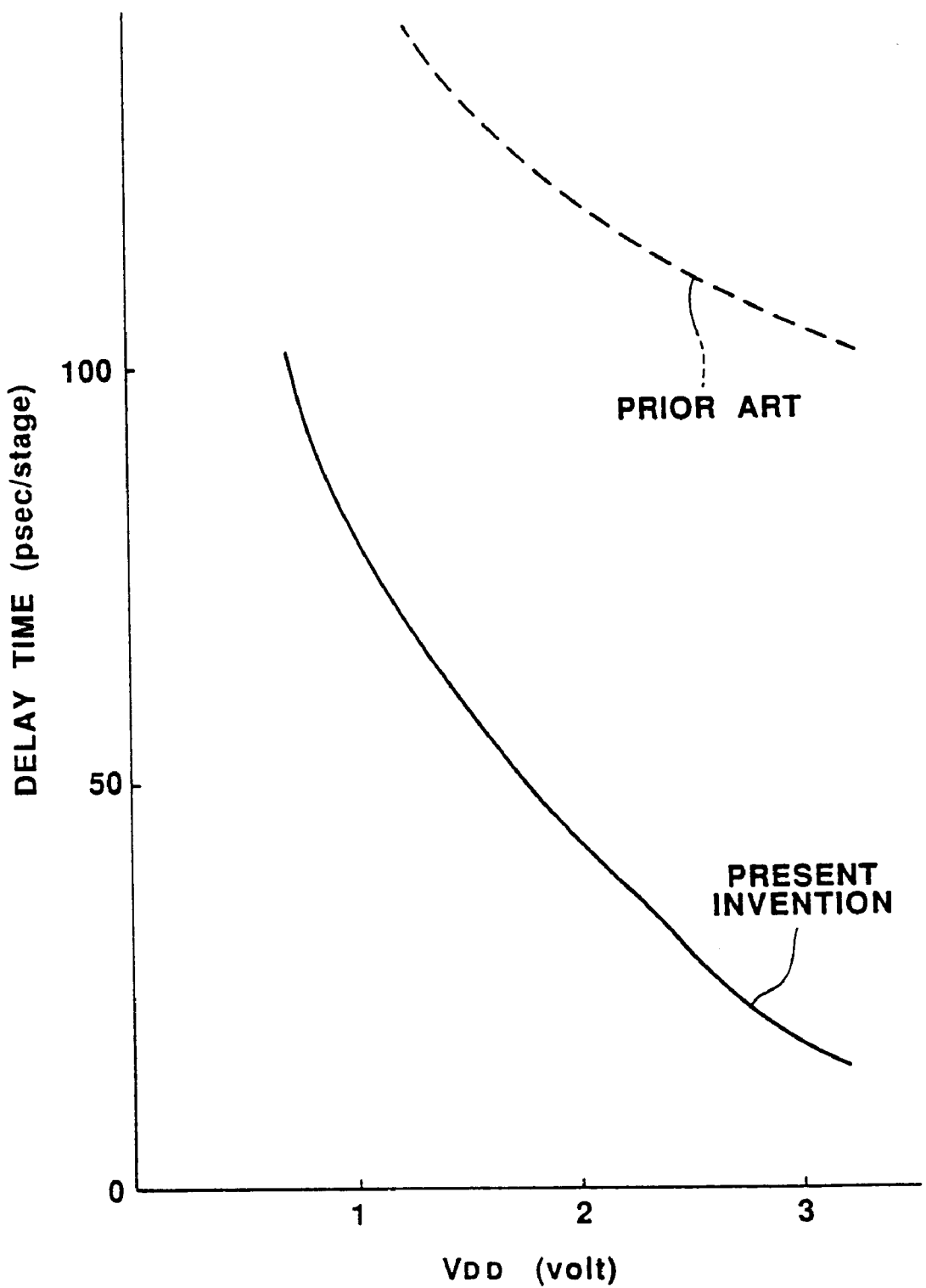
FIG. 106 illustrates a relationship between delay time and voltage $V_{dd}$ in a ring oscillator obtained through the steps.

A relationship between the delay time and $V_{dd}$ of a ring oscillator formed according to the present method was measured and its results are shown in FIG. 106. It will also be seen from the results that the oscillator can operate at high speed. This is, in the device of the present invention, because, in addition to the above effect, source and drain regions are formed on the field oxide film, so that the diffusion of a depletion layer toward the substrate with its applied voltage can be prevented and such a problem can be avoided that a delay takes place each time its charging and discharging operation is carried out.

In this way, the ring oscillator formed by the present method can offer a remarkably high speed operation because both the improvement of the mobility and the reduction of the source/drain capacitance can be realized.

The twenty-ninth embodiment of the present invention will be explained.

Even this embodiment is also directed to an elevated source/drain MOS device using a single crystalline silicon which is formed based on solid phase growth and which has an excellent crystal quality. The present method is featured in that, as shown in FIGS. 107 to 115, a gate electrode is formed in a trench-separated device region, only source and drain regions are formed based as the solid phase growth of the present invention on the gate electrode, and a channel is formed in the surface of a substrate. The device is featured in that, since the source and drain can be formed at low temperature, its impurity distribution can be made abrupt and punch-through can be suppressed.

Even the present method is characterized, as in the foregoing twenty-eighth embodiment, in that, since a layer substantially free of impurities can be formed in a channel region immediately below a gate oxide film, it can be prevented that the running of carriers is disturbed and thus a high mobility transistor can be obtained. Immediately below the gate oxide film, the higher the impurity concentration is the higher a vertical electric field at the time of forming an inversion layer is, so that carriers run as more strongly attached to the boundary between the oxide silicon and silicon, whereby the slight raised and recessed boundary causes carriers to be scattered. In the MOS device of the present invention, however, such a problem will be avoided.

Figure 107:
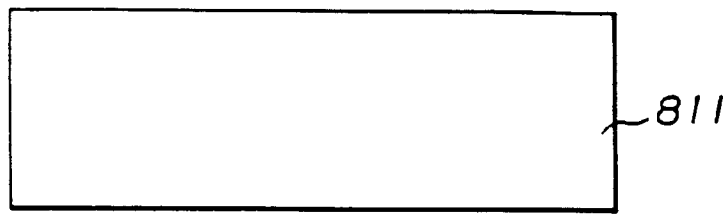
FIGS. 107 to 115 illustrate different steps of a method for manufacturing a semiconductor device in accordance with the twenty-ninth embodiment of the present invention, respectively.
Figure 108:
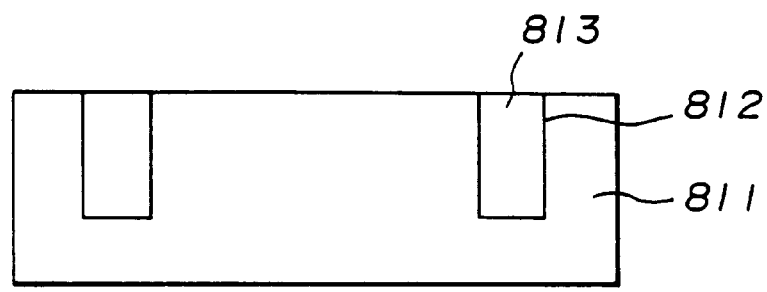

More in detail, as shown in FIG. 107, a silicon substrate 811 was subjected to a silicon on insulator (SOI) process to make a trench 812 in the silicon substrate. As shown in FIG. 108, an insulating film 813 was embedded in the trench for device separation and as necessary, subjected to an ion implantation process for adjustment of a threshold voltage.

Figure 109:
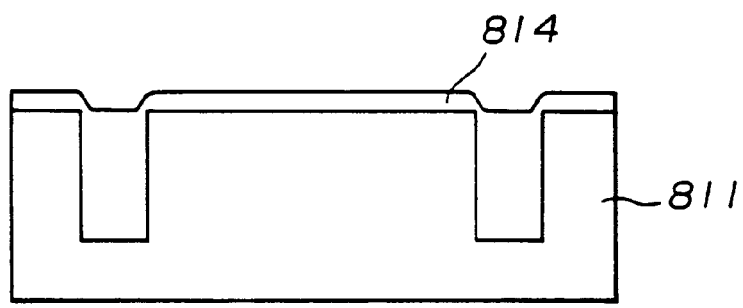
Figure 110:
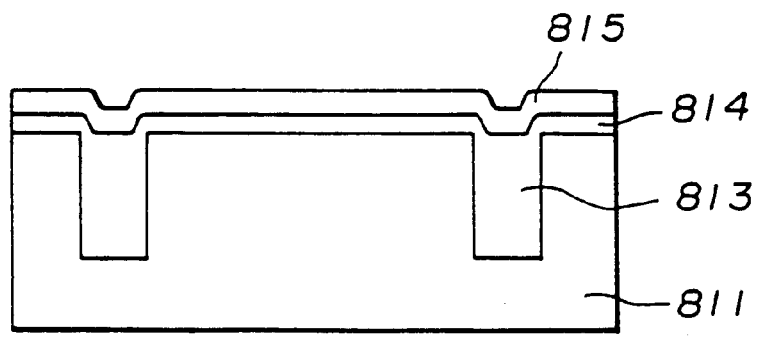
Figure 111:
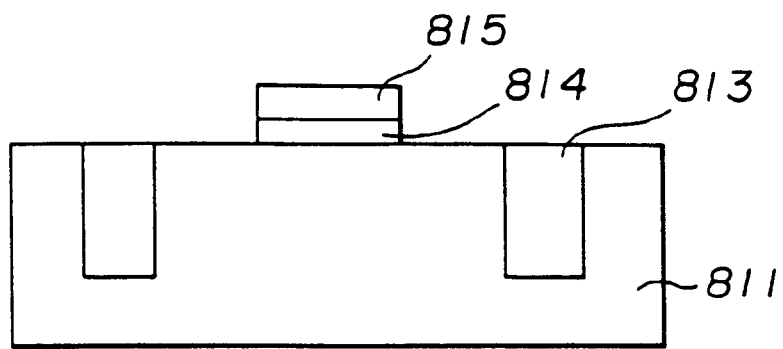

As shown in FIG. 109, a gate oxide film 814 was formed. Further, a polycrystalline silicon film was deposited on the gate oxide film as shown in FIG. 110, and then subjected to a patterning process to form a gate electrode 815 as shown in FIG. 111.

Figure 112:
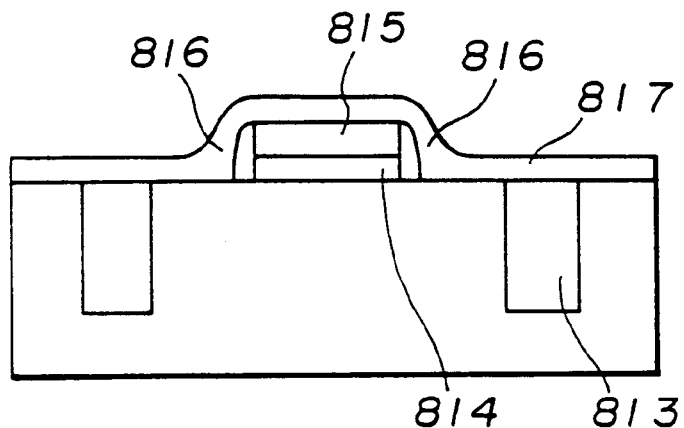

As shown in FIG. 112, a silicon oxide film 816 is formed on the gate electrode 815 by a CVD process as shown in FIG. 112. The substrate was subjected to a RIE process so that that part of the silicon oxide film corresponding to the side walls of the gate electrode 815 are left, and then the left silicon oxide film was subjected to a phosphorus ion implantation process to form an n-layer (not shown) on the surface of the substrate. After the surface of the substrate was cleaned, a no-doped amorphous silicon film 817 of 20 nm thick was deposited on the substrate. As a result of measuring the amorphous silicon immediately after its formation, its average inter-atomic distance was 1.03 times that of its single crystal silicon.

Figure 113:
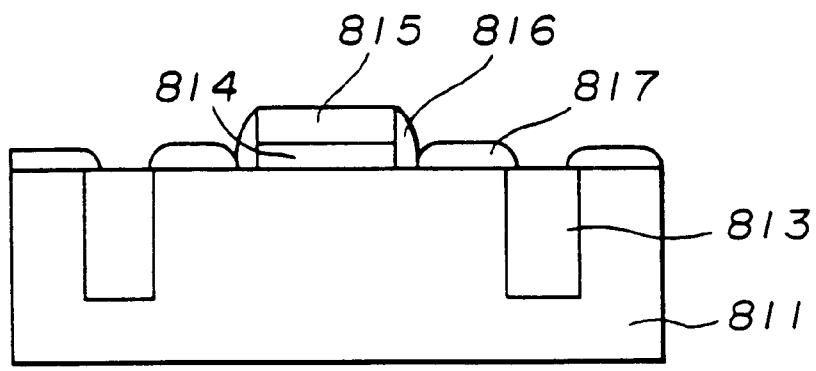

Thereafter, as shown in FIG. 113, the resultant substrate was subjected to a heat treatment at 550° C. for one hour within the same device as the deposition device while suppressing the deposition of a surface spontaneous oxide film thereon, thereby form a single crystalline silicon layer. At this time, the single crystalline silicon layer was made of a single crystalline silicon layer 817S on the silicon substrate and of a polycrystalline silicon film on the insulating film. The substrate was subjected to a selective etching process between the single crystalline and polycrystalline silicons to remove the polycrystalline silicon and leave only the single crystalline silicon 817S.

Figure 114:
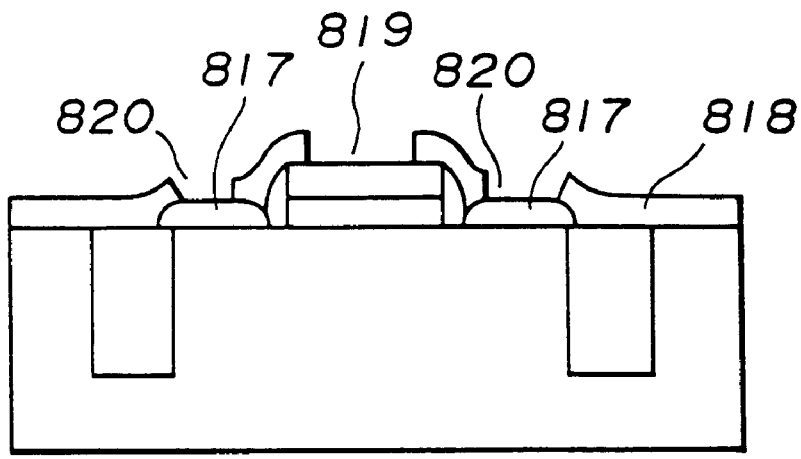
Figure 115:
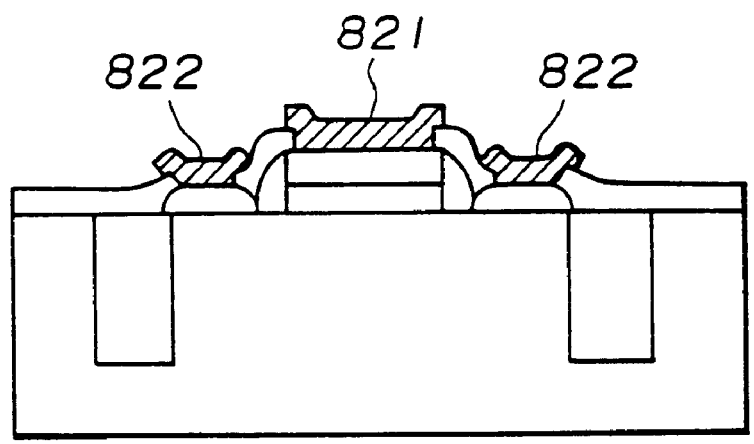

As shown in FIG. 114, a silicon oxide film 818 was formed as a passivation film, a source/drain electrode 821 and a gate electrode 822 was formed thereon through a contact hole, thus completing such an elevated MOS transistor as shown in FIG. 115.

Figure 116:
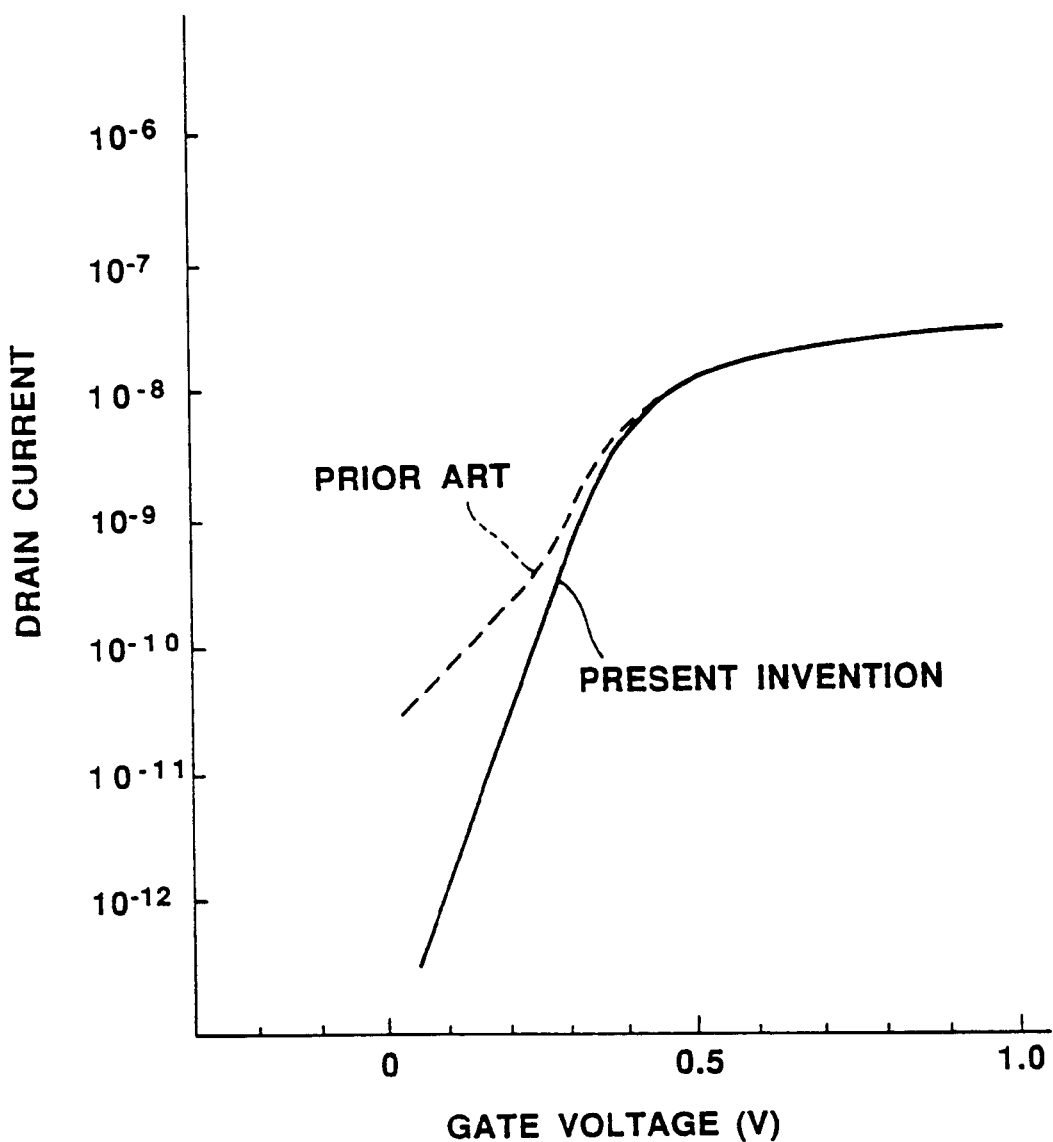
FIG. 116 illustrates a relationship between gate voltage and drain current in a transistor obtained through the steps.

The MOS transistor thus formed was actually measured with respect to a relationship between its gate voltage and drain current, which results are given by a curve 'a' i FIG. 116. For comparison, measured results of the prior art are shown by a curve 'b'. In the illustrated transistor, a channel length was 0.23 μm. In this way, in spite of the fact that it is a very fine device, good characteristics can be obtained even for a sub-threshold region. In spite of such a fine device, its punch-through is sufficiently good, which reason is not clear yet but it is considered due to the abrupt source/drain impurity distribution. This is because the steps are carried out, in particular, at low temperatures.

Figure 117:
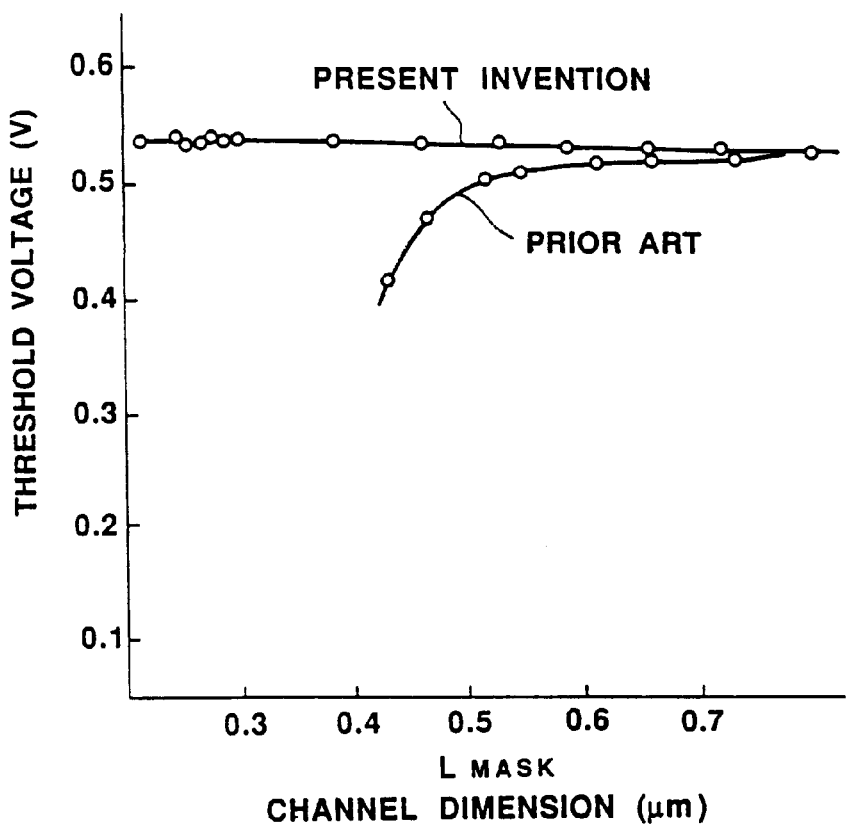
FIG. 117 illustrates a relationship between channel dimension and threshold voltage in the transistor obtained through the steps.

A relationship between the threshold voltage and channel length is shown by a curve 'a' in FIG. 117. It will be appreciated from the drawing that, in the present invention, even when the channel length is about 0.22 μm the threshold voltage is not reduced. This is also considered due to the absence of impurity re-distribution. For comparison, a characteristic of a transistor formed by a prior art is given by a curve 'b'. In the prior art transistor, when the channel length is about 0.5 μm, a short channel effect already appears.

Explanation will next be made as to the thirtieth embodiment of the present invention.

The present embodiment is directed to an example where a bipolar transistor and a MOS transistor are integrated by a solid phase growth method of the present invention.

In comparison between the MOS and bipolar transistors, the MOS transistor is advantageous in that large scale integration can be realized while disadvantageous in that its operation is slow. Meanwhile, the bipolar transistor is advantageous in that a large current output can be obtained and high speed operation can be realized, but disadvantageous in that a device area becomes large and thus integration becomes difficult. A large scale integrated circuit utilizing the advantages of both of the two types of transistors is already known.

Figure 133:
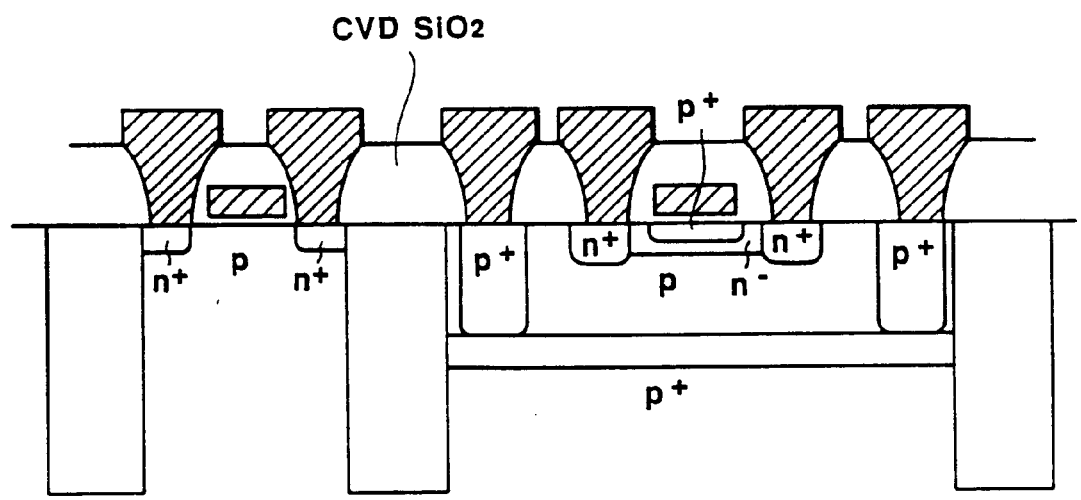
FIG. 133 illustrates a conventional semiconductor device.

Such an integrated circuit as shown in FIG. 133 has a merit that a MOS transistor and a bipolar transistor are arranged horizontally side by side on a silicon substrate, the base of the bipolar transistor is electrically connected to the drain of the MOS transistor, the drain current is amplified by the bipolar transistor to provide a large current output. However, the integrate circuit also has a demerit that, since the drain is separated from the base, a wiring therebetween is required, a large area is necessary, the wiring must be done without adversely affecting the mutual device regions, which requires a very complicated and long step.

In this embodiment, for the purpose of solving such a problem, a bipolar transistor is formed in a single crystalline silicon formed based on the solid phase growth method of the present invention as an upper layer, so that the base of the bipolar transistor is connected directly to the drain of a MOS transistor.

Figure 131:
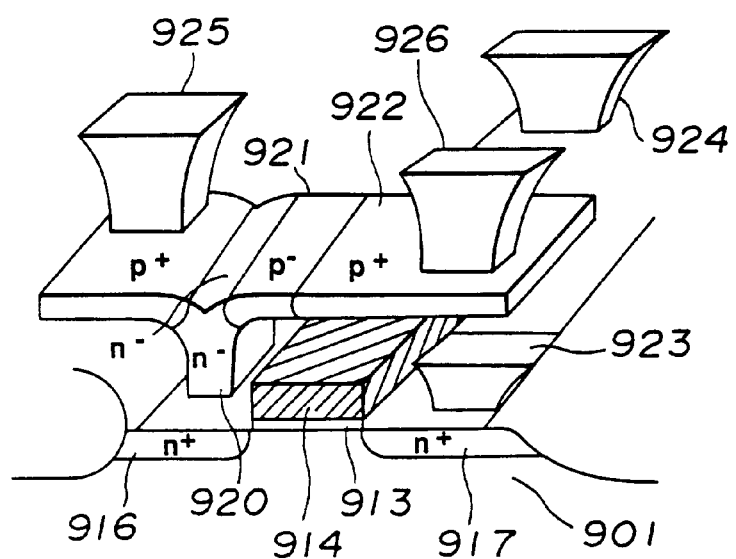
Figure 132:
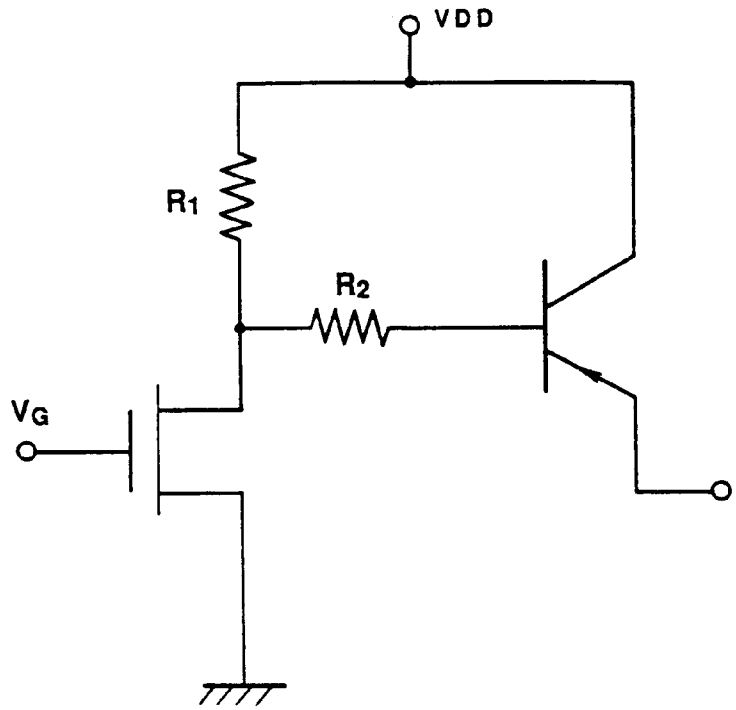
FIG. 132 is an equivalent circuit of the semiconductor device.

FIGS. 118 to 131 show its manufacturing steps and FIG. 132 shows its equivalent circuit.

Figure 118:
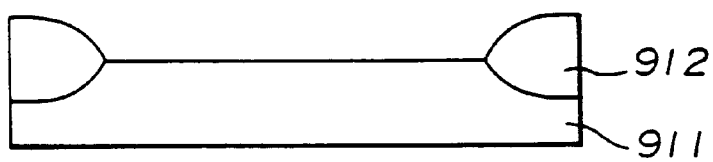
FIGS. 118 to 131 illustrate different steps of a method for manufacturing a semiconductor device in accordance with the thirtieth embodiment of the present invention, respectively.

First, as shown in FIG. 118, a field oxide film 912 was formed on a silicon substrate 911 by a selective oxidization process. As necessary, the substrate was subjected to an ion implantation process for adjustment of its threshold voltage.

Figure 119:
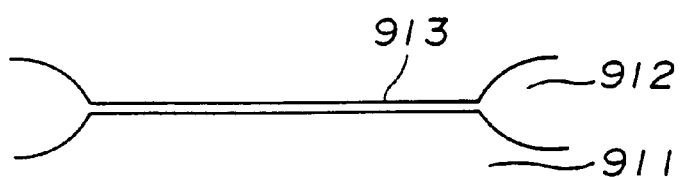
Figure 120:
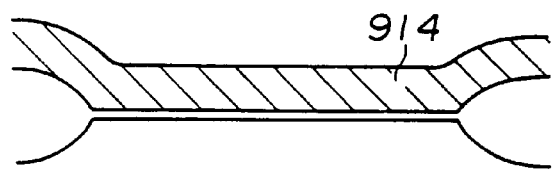
Figure 121:
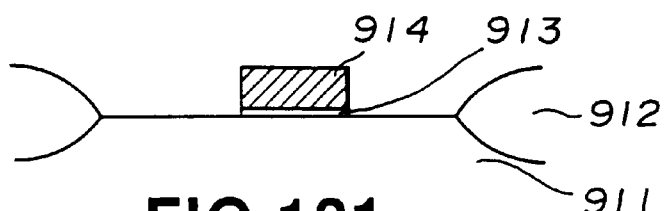

As shown in FIG. 119, the resultant substrate was subjected to a thermal oxidization process to form a silicon oxide film of 10 nm thick for formation of a gate insulating film 913. Further, as shown in FIG. 120, a phosphorus-doped polycrystalline silicon film for formation of a gate electrode 914 was formed and then subjected to a patterning process as shown in FIG. 121.

Figure 122:
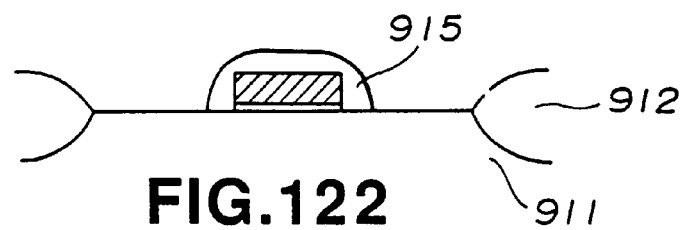
Figure 123:
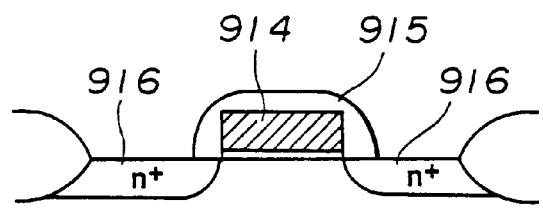

Thereafter, as shown in FIG. 122, the resultant substrate was subjected to a CVD process to form a silicon oxide film, subjected to a RIE process to form a silicon oxide film 915 on the side wall of the gate electrode 914, subjected to an ion implantation process with use of As ions at a dose of $1 \times 10^{15}$ atoms/cm$^2$ with use of the silicon oxide film as a mask, and then subjected to a heat treatment at 900° C. for 30 minutes in a nitrogen atmosphere to form a source/drain region 916 as shown in FIG. 123.

Figure 124:
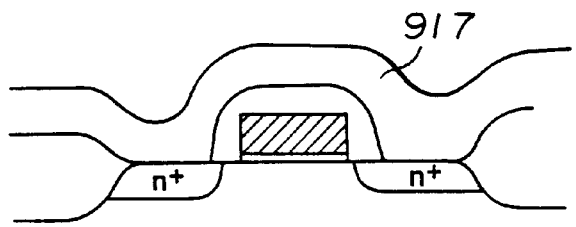
Figure 125:
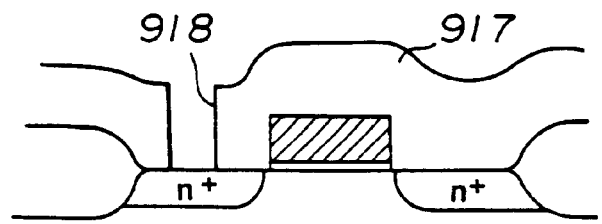
Figure 126:
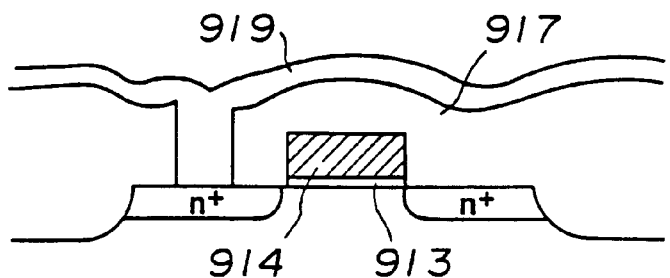

As shown in FIG. 124, the resultant substrate was subjected to a CVD process to deposit a silicon oxide film of 300 nm thick all thereover to thereby make a contact hole 918 in the drain region 916 as shown in FIG. 125.

As shown in FIG. 124, an amorphous silicon film 919 of about 50 nm thick was deposited all over the wafer so that the average inter-atomic distance of the amorphous silicon film becomes nearly equal to that of its single crystalline silicon. At this time, a phosphine PH$_3$ gas was introduced into the furnace simultaneously with the silane gas to form such an amorphous silicon gas as to previously contain phosphorus elements.

Figure 127:
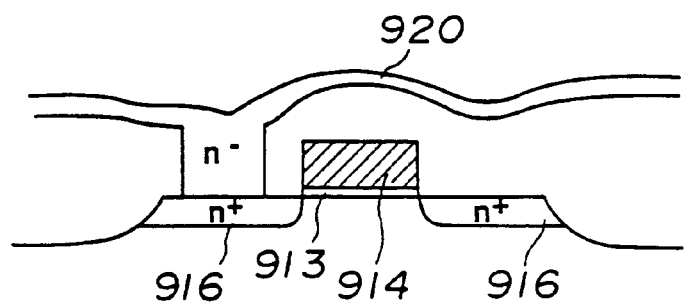

Thereafter, as shown in FIG. 127, the substrate was subjected to a heat treatment at 600° C. for 3 hours within the same device as the deposition device while suppressing the deposition of a surface spontaneous oxide film thereon to form an n$^-$ single crystalline silicon 920. When the single crystalline silicon was examined with use of a previously prepared monitor device for measuring a single crystallization distance, its crystallization distance was 15 μm. When a phosphorus concentration was measured as $8 \times 10^{17}$ atoms/cm².

Figure 128:
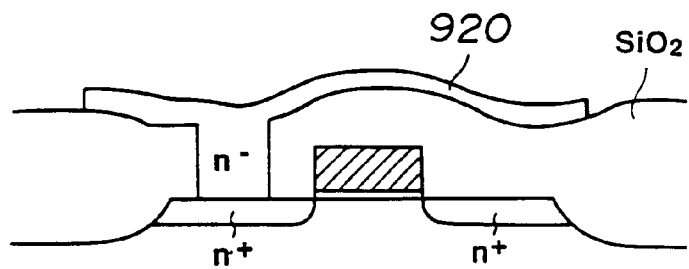
Figure 129:
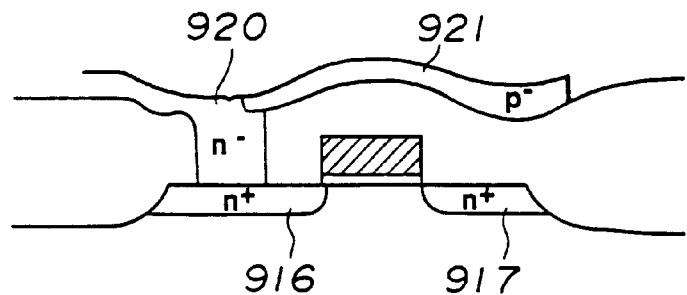

The resultant substrate was subjected to a patterning process for the device region as shown in FIG. 128, and then subjected to a boron ion implantation process to dope boron ions into part of the single crystalline silicon 920 to thereby form a p⁻ region 921.

Figure 130:
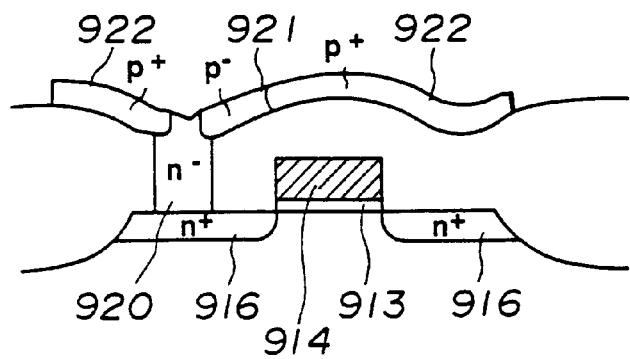

Next, the substrate was subjected to a boron ion implantation process to dope them into the emitter/collector region to thereby form a p⁺ region 922 as shown in FIG. 130, subjected to a rapid thermal processing (RTA) (annealing) process at 850° C. for 5 minutes for activation of impurities to form a source electrode 923, a gate electrode 924 to form an emitter electrode 925 and a collector electrode 926, thus completing an integrated circuit as shown in FIG. 131.

In this way, in spite of the fact that this is a stacked structure, a single crystalline silicon having a good crystal quality is obtained at such a low temperature as 600° C., the boundary characteristic with the underlying layer is very good, the ohmic resistance at a connection between the drain and base is very low, and expansion of the diffusion length into the diffusion layer of the MOS transistor will be prevented.

With this integrated circuit, not only its device area can be remarkably reduced due to its stacked structure but also the bipolar transistor is formed upwardly of the MOS transistor. Thus, when compared with the conventional structure of FIG. 133, heat generated in the bipolar region is less transmitted to the MOS transistor and thus this less affects the operational characteristics of the MOS transistor. In addition, since the bipolar transistor per se is located in the upper layer, its heat radiation is good and thus temperature increase can be suppressed.

Explanation will next be made as to the thirty-first embodiment of the present invention.

The present embodiment shows an example wherein the present invention is applied to single crystallization of a gate electrode of a MOS device as shown in FIG. 148.

More specifically, two sets of silicon substrates 1001 having device regions separated by insulating films 1002 were prepared and then subjected to a heat treatment to form thereon a silicon oxide film 1003 of about 10 nm thick (refer to FIG. 148(*a*)). The oxide film was partially provided therein with an opening 1004 to expose a silicon surface (refer to FIG. 148(*b*)). Thereafter, the paired substrate 1001 in one of the two sets was subjected to a CVD process with use of a silane gas to deposit an amorphous Si film 1005*a* of 52 nm thick in the same manner as in the embodiment 1 (refer to FIG. 148(*c*)). Then the substrate was heated to 600° C. while the surface of the amorphous silicon film being kept clean to single-crystallize the amorphous silicon film and to obtain a recrystallized film 1006*a* (refer to FIG. 148(*e*)).

The paired silicon substrate 1001 in the other set was subjected to a crystallizing process under such a condition that a spontaneous oxide film was formed on the amorphous silicon prior to a heat treatment for recrystallization, to thereby form a recrystallization film 1006*b* (refer to FIG. 148(*f*)) as shown in FIG. 148(*d*). However, a deposition time was controlled so that an amorphous film 1005*b* has a thickness of about 50 nm.

Then, the two sets of substrates were subjected to exactly the same processes. More in detail, the substrates were subjected to a phosphorus diffusion process at 900° C. to introduce phosphorus atoms into the recrystalline films 1006*a* and 1006*b* to provide high phosphorus concentrations. Next, the recrystalline films were subjected to a patterning process to form gate electrodes 1007*a* and 1007*b*, and then the gate electrodes were covered with respective CVD oxide films 1008 to provide contacts to source/drain zones. The resultant substrates were subjected to an ion injection process with $BF_2^+$ to form source/drain regions 1009 respectively and then subjected to an annealing process for activation. The resultant substrates were subjected to a deposition process to form an aluminum layer and then subjected to a RIE process to pattern the aluminum layer and to form an electrode 1010, thus preparing two sets of MOS devices a and b as shown in FIG. 148, (g) and (h).

Figure 149:
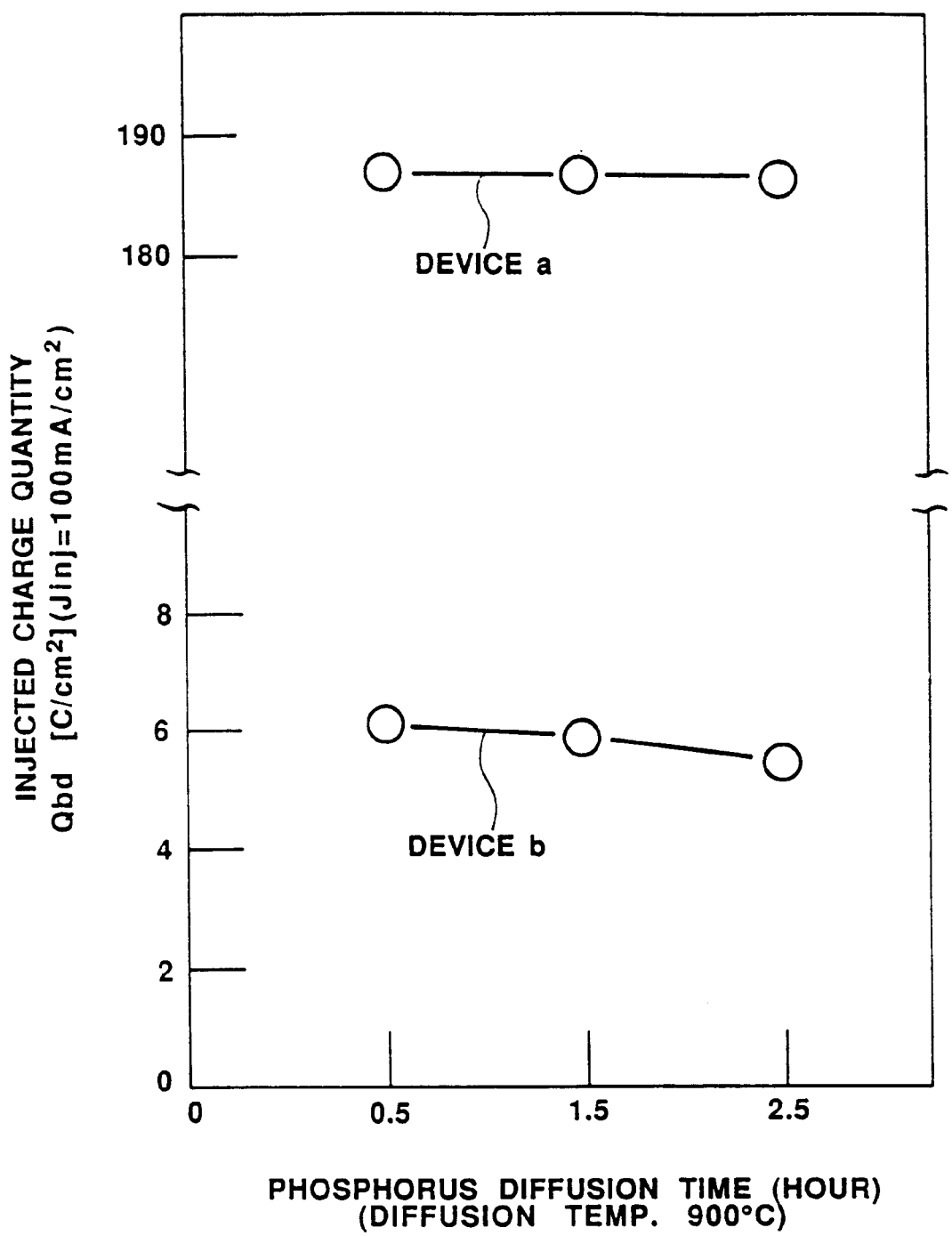
FIG. 149 illustrates a relationship between phosphorus diffusion time and TDDB intrinsic breakdown charge.

Deterioration of the gate oxide film of the device thus formed was evaluated, which results are given in FIG. 149. In the drawing, ordinate denotes injected charge quantity ($Q_{bd}$) to which charges are injected into the gate oxide film to thereby cause intrinsic destruction of the oxide film. Abscissa denotes phosphorus diffusion time. Measurements were carried out over the two sets of devices a and b with use of the same device. It will be seen from the drawing that the device a is remarkably high in $Q_{bd}$ when compared with the device b. This means that the high $Q_{bd}$ of the device a can provide a sufficient life in its usual usage conditions. Even when the heat treatment time is made long with respect to the device a, substantially no deterioration takes place for the device. It will be appreciated from the above consideration that, when the method of the present invention is employed, the reliability of the gate insulating film can be made remarkably high.

In order to examine the cause, differences in the film quality of the gate electrode between the devices a and b were examined with use of a transmission electron microscope. As a result, it has been turned out that the gate electrode of the device a is made of single crystalline silicon having good quality while the gate electrode of the device b is made of polycrystalline silicon having a grain boundary run in the vertical direction. The inventors of the present application also considered the grain boundary greatly influences the TDDB characteristics and further examined the cause.

The inventors measured the phosphorus concentration of the recrystalline film and the phosphorus concentration of the gate insulating film with use of the high resolution electronic microscope EDX which can measure the impurity concentration of a very small zone. In order to measure a very small zone, a field emission type beam was used and an EDX which has a high spatial resolution and which can narrow the diameter of the beam to 1 nm was employed. FIG. 150(*b*) shows results when the phosphorus concentration of the polycrystalline gate electrode of the device b was measured with use of a beam having a diameter of about 1 nm. The measurement result by EDX shows that a phosphorus signal appears in a tail part of a silicon signal. The device b is featured in that the intensity of the phosphorus signal varies depending on the measuring point, that is, the intensity is strong in the grain boundary of the polycrystalline silicon and weak in the grains. It has been found from the foregoing that the phosphorus concentration is irregular in the polycrystalline silicon gate and the phosphorus concentration is high in the grain boundary. With respect to the device 1, on the other hand, the phosphorus signal is as weak as below its detection limit as shown in FIG. 150(*a*). In the present device, when the beam is narrowed, the detection limit of the phosphorus concentration was about 0.5% Next, the phosphorus concentration of the gate insulating film was measured with use of the EDX. In this case, the diameter of the beam was made as large as possible but the beam is not out of the gate oxide film to increase a measuring sensitivity. FIG. 151(b) shows results when the phosphorus concentration of the gate oxide film of the device b was measured with use of a beam having a diameter of 10 nm. As will be observed in the drawing, a phosphorus signal appears in the gate oxide film. Similarly, FIG. 151(a) shows results when the phosphorus concentration of the gate oxide film of the device a was measured. A phosphorus signal was not substantially observed and was as low as below the detection limit.

From the results of the phosphorus concentration measurements with use of the EDX, the inventors have considered the cause of the difference in the TDDB characteristic between the devices a and b, as follows. That is, when the polycrystalline silicon gate electrode is used as in the device b, phosphorus atoms gather in the grain boundary and diffuse the grain boundary and even enter the gate oxide film to deteriorate the quality of the gate oxide film. However, when the single crystalline gate is used as in the device a, the grain boundary diffusion and phosphorus separation in the grain boundary do not take place, whereby phosphorus atoms are prevented from entering the oxide film and thus the quality of the gate oxide film can be kept good.

Figure 152:
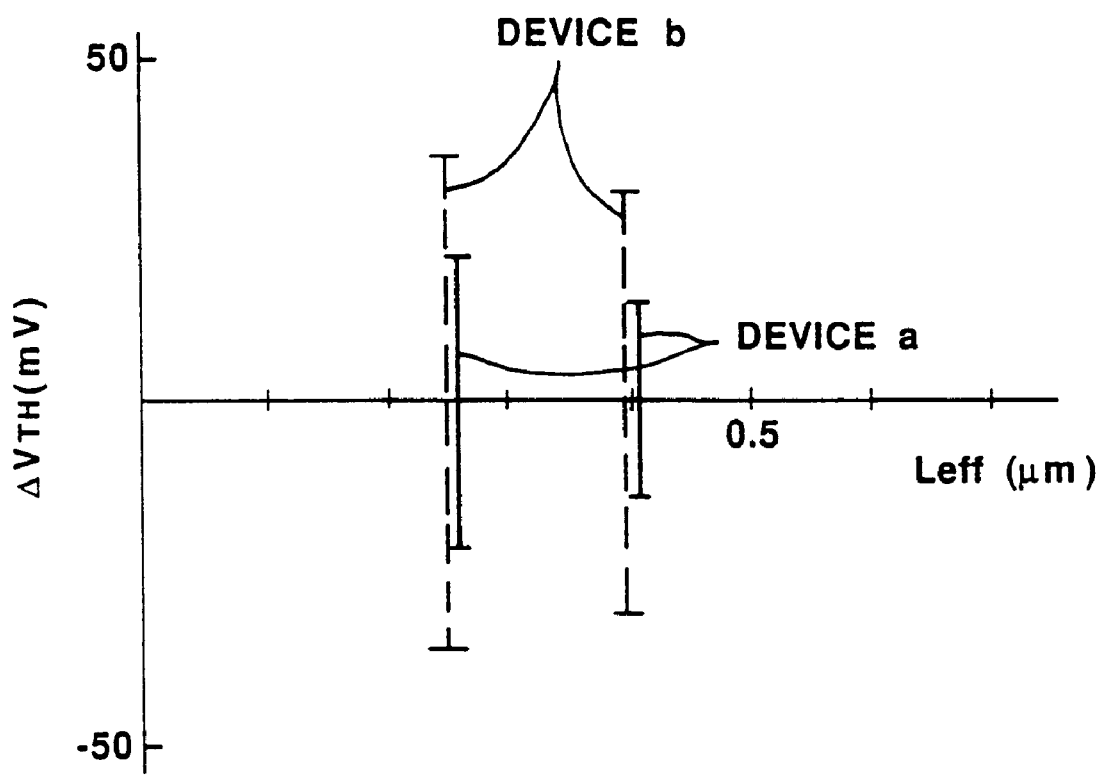
FIG. 152 illustrates variations in $V_{TH}$ of devices prepared according to the method of the embodiment 31 and according to the prior art for comparison.

Further, the inventors compared the devices a with b with respect to variations in the $V_{TH}$ thereof. It is already known that, when a MOS device is made small, its $V_{TH}$ becomes irregular due to various causes. The devices a and b were subjected to measurements of the $V_{TH}$ variations by changing their channel length, channel impurity concentration, and oxide film thickness to various values. 100 of the devices a and 100 of the devices b were measured with respect to the $V_{TH}$ to find "$V_{TH}$" in two cases where the channel length is 0.25 μm, the channel impurity concentration is about $6 \times 10^{17}$ atoms/cm$^3$, and the oxide film thickness is 8 nm and where the channel length is 0.4 μm, the channel impurity concentration is about $2 \times 10^{17}$ atoms/cm$^3$, and the oxide film thickness is 12 nm, which results are given in FIG. 152. Even the device a is irregular in the $V_{TH}$ but its irregularity is clearly smaller than that of the device b. The inventors have estimated that although not clearly clarified, the cause is due to the removal of the $V_{TH}$ variations caused by variations in the grain boundary appearance frequency.

Next, the thirty-third embodiment of the present invention relating to the single crystallization of the gate electrode will be explained.

A ring oscillator as a transmission circuit may be explained as an odd number of stages of inverters connected. Accordingly, even when the surface area occupied by one stage of inverter is decreased, the absolute value of a total surface area of the ring oscillator can be greatly decreased.

Figure 153:
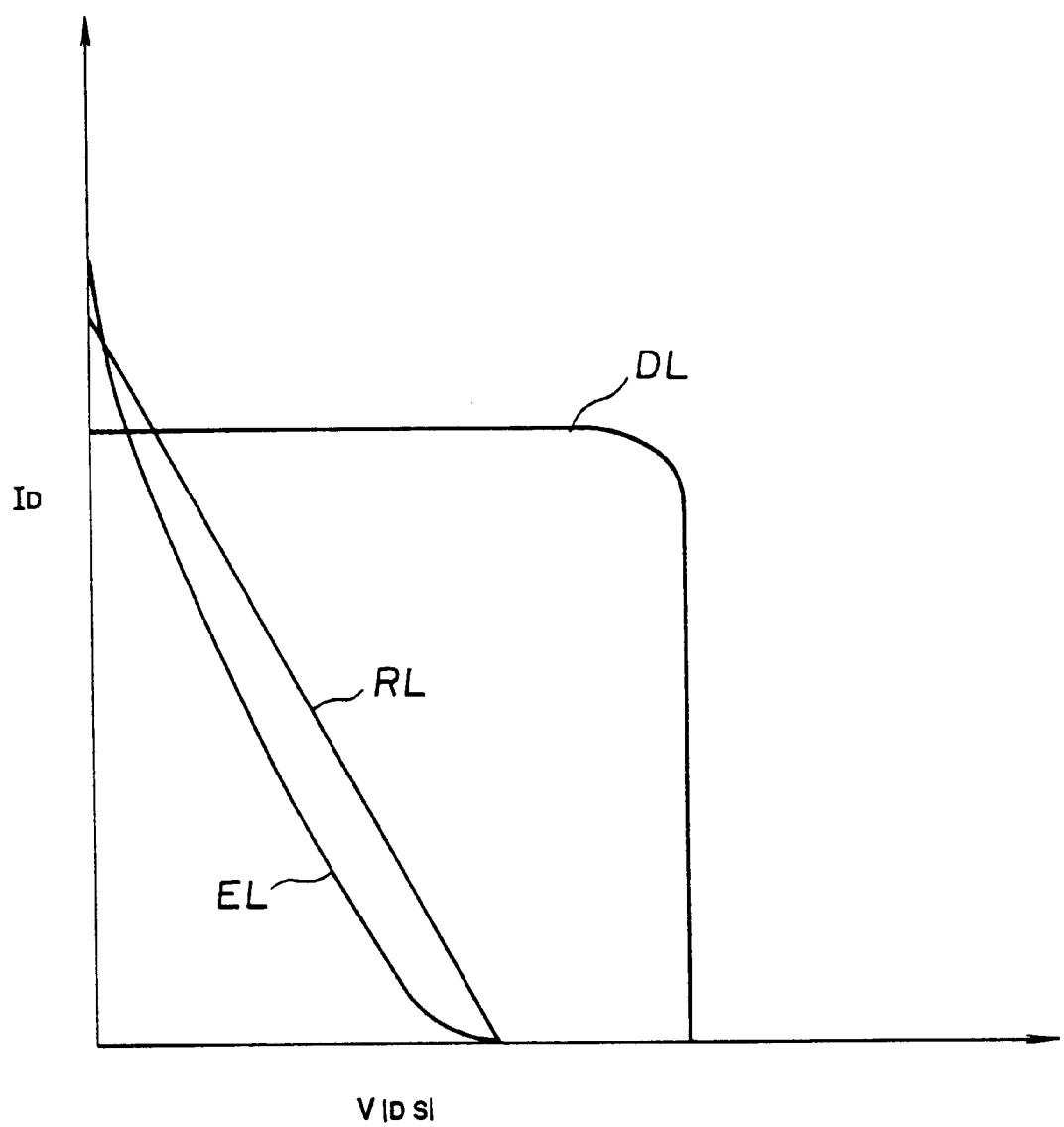
FIG. 153 illustrates schematically illustrate characteristics of three types of load transistors for comparison.

With respect to the ring oscillator, there are three types of load transistors, i.e., register load RL, enhancement load EL and depletion mode load DL, as shown in FIG. 153.

FIG. 153 schematically shows three current ($I_D$)/voltage ($V_{DS}$) characteristics. As will be seen from the drawing, the inverter using the depletion mode device as a load transistor has a nearly rectangular current $I_D$-$V_{DS}$ characteristic curve and thus is advantageous in its response characteristic. With regard to the inverter using the depletion mode device as the load transistor, since a gate electrode is usually connected directly to a drain, only one power line is required and thus wiring can advantageously be simplified.

The inverter using the depletion mode device as the load transistor, in spite of such advantages, has not widely utilized, because the device surface area becomes disadvantageously large. That is, the disadvantage impedes the full exhibition of the above advantages.

Figure 154:
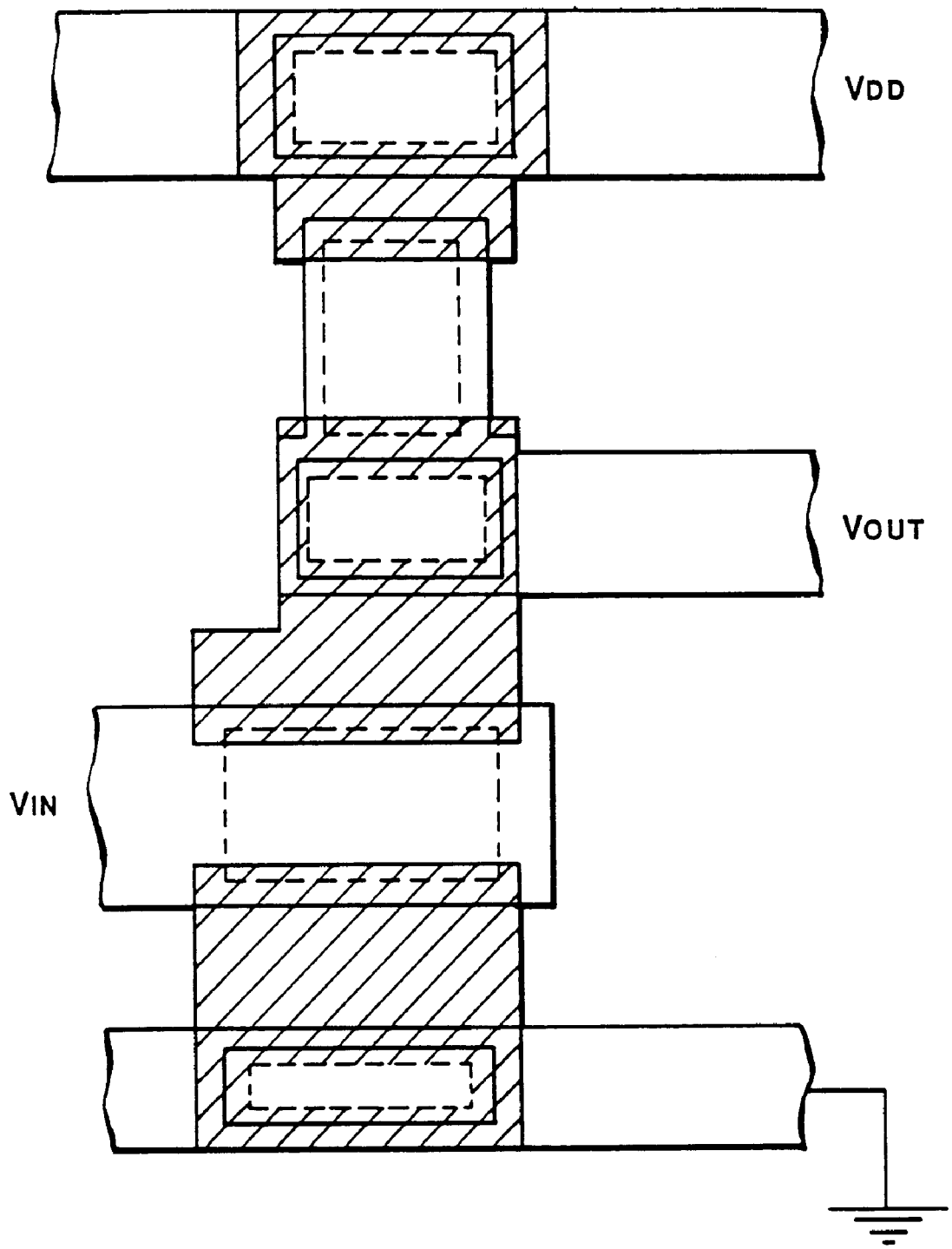
FIG. 154 illustrates a mask pattern of an inventor in which a prior-art p-channel pentode mode deletion device is used as a load.
Figure 155:
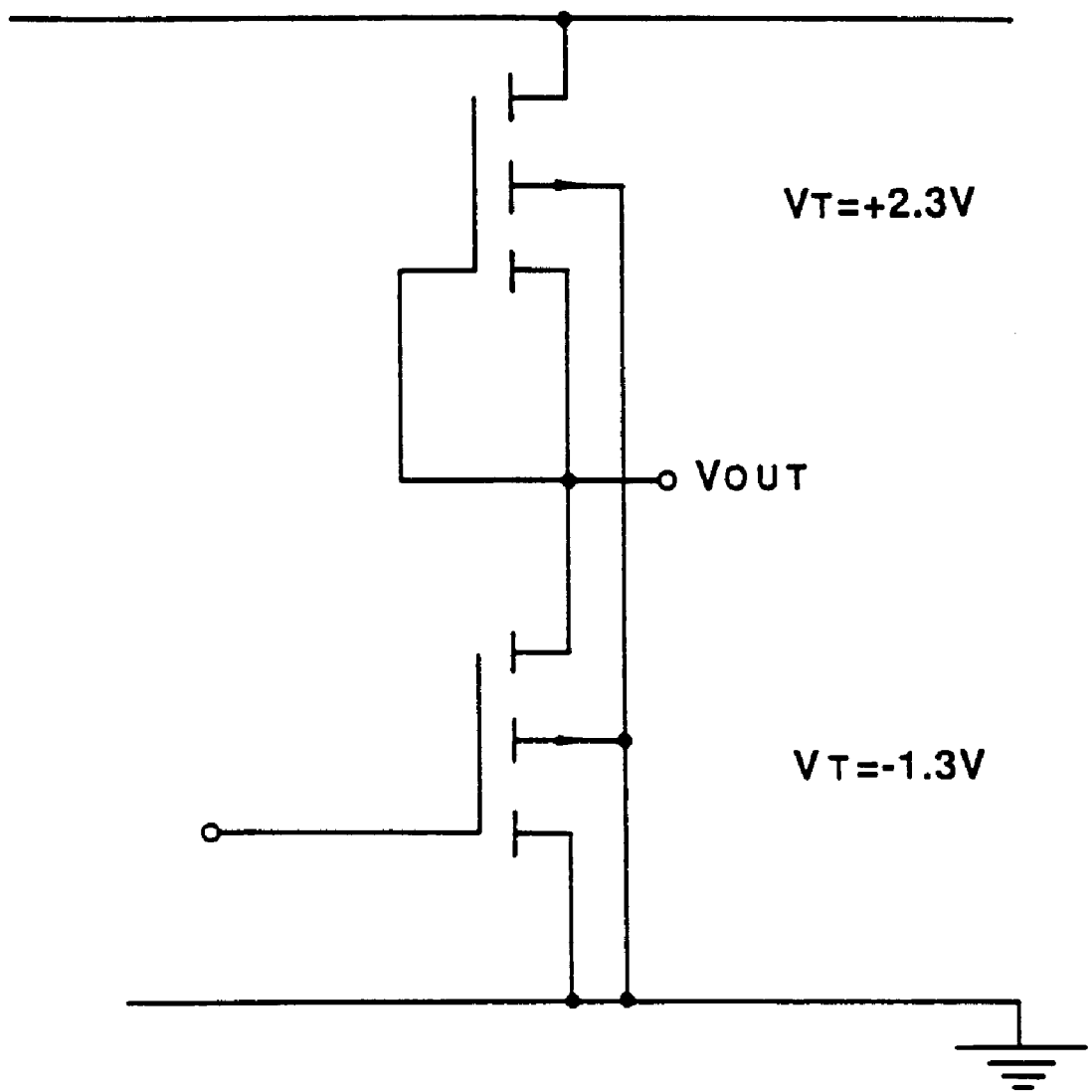
FIG. 155 is an equivalent circuit of the mask pattern.

FIG. 154 shows a mask pattern of an inverter using a prior-art p-channel pentode mode depletion device as a load transistor. In FIG. 154, white parts shown by solid lines refer to A1 wiring parts. FIG. 155 shows an equivalent circuit of the mask pattern. When the both drawings are put side by side, in particular, a relationship therebetween will be clear. As will be seen from FIG. 154, a $V_{dd}$ line is extended in the uppermost pat of the drawing. Reference symbol $V_{in}$ denotes an input terminal which is used also as an output of the previous stage. Symbol $V_{out}$ at the right side denotes an output of the present stage which is used also as an input of the next stage. Most important is the structure of the $V_{out}$ part. This $V_{out}$ electrode is once contacted with the diffusion layer of the load transistor, from which contacted part the electrode is extended to the gate part of the depletion transistor. This part means the redundant surface area mentioned above in the prior art.

Figure 156:
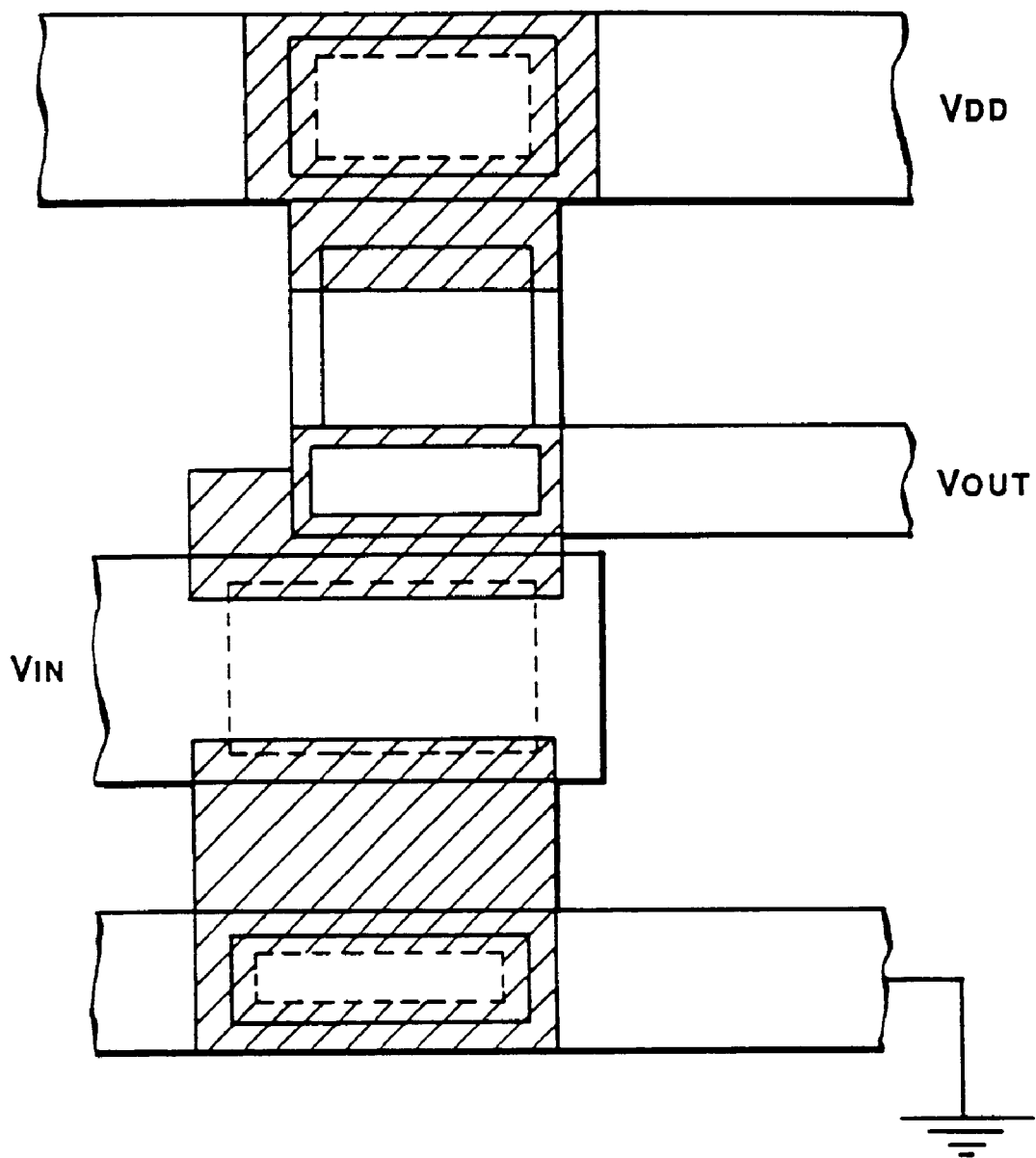
FIG. 156 is a circuit design illustrating a semiconductor device in accordance with the thirty-second embodiment of the present invention.

When the technique for single crystallizing the gate electrode and also the method suggested by the inventors are employed, such a circuit design as shown in FIG. 156 is obtained. The structure of the present invention will first be explained with reference to FIG. 156, and then its manufacturing method and characteristic results will be given later.

Figure 157:
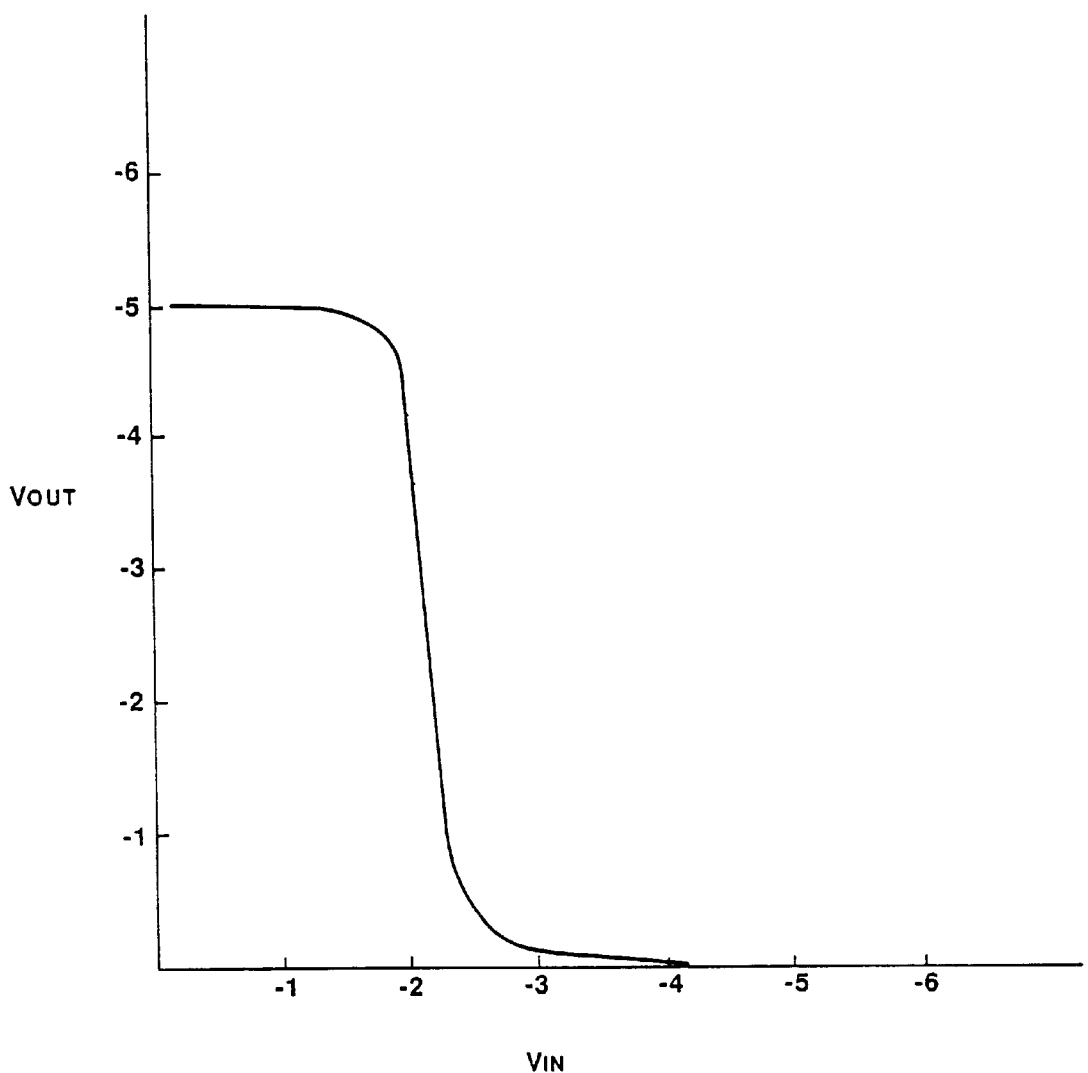
FIG. 157 illustrates a characteristic result of the circuit element of the embodiment.

Paying attention, in particular, to the vicinity of the $V_{out}$ part in FIG. 156, it will be observed that the $V_{out}$ part is simplified compared to that in FIG. 154 and further the surface area of a depletion load transistor part is made small. From the comparison of FIGS. 2 and 4, it will be seen that the surface area corresponds to 82% of the prior art. The reason why such reduction in the surface area could be obtained will be explained in the following. That is, in the present invention, the drain is contacted directly with the recrystalline single-crystal doped electrode. Because of such a structure, the necessity of providing such once contacting as in the prior art can be eliminated. Further, because of the single crystal, its resistivity is low and thus even when the direct electrode is provided, this can prevent the cause of a delay. FIG. 157 shows a characteristic result of a circuit element in accordance with the embodiment of the present invention. In FIG. 157, it will be seen that as the $V_{out}$ is increased, the $V_{in}$ is lowered to substantially zero V. It will also be seen that the $V_{in}$ is positively kept until the power voltage (−5V). Since the $V_{out}$ and $V_{in}$ reliably keep the swing width of the previous stage, even when multiple stages of inverters or a ring oscillator is formed, it will be appreciated that substantially no attenuation takes place in the signal.

In the prior art method, when the polycrystalline Si is merely wired or arranged, the resultant ring oscillator was insufficient in its amplitude waveform and speed because of the resistive value of the polycrystalline Si.

FIG. 158 shows a novel method for manufacturing a ring oscillator of depletion type load transistors according to the present invention. FIG. 158 shows steps in the manufacturing method, in particular, concentrated on a directly connected part between the single crystalline gate and drain of the depletion type load transistor.

A general sequence of FIG. 158 will be appreciated when the respective steps are followed with the process of an A1 gate in mind. More in detail, FIG. 158(a) shows a substrate part. In the illustrated example, an n-type (100) silicon substrate was used as an example. As shown in FIG. 158(b), a first oxide film 1102 of, e.g., 300 nm thick was deposited on the substrate at a low temperature. Thereafter, as shown in FIG. 158(d), the resultant substrate was subjected to a photolithographic process to form an opening 1103, and then subjected to an ion implantation process to form a source/drain zone in the opening.

Figure 158A:
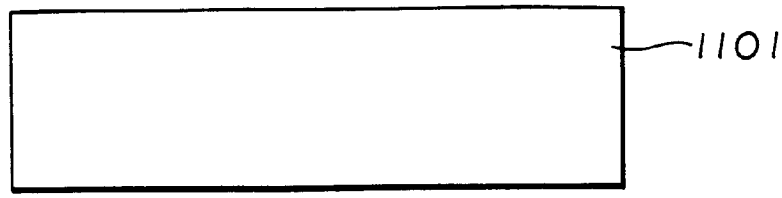
FIGS. 158(a) thru 158(h) illustrate steps in a method for manufacturing a ring oscillator of a depletion type load transistor of the embodiment.
Figure 158B:
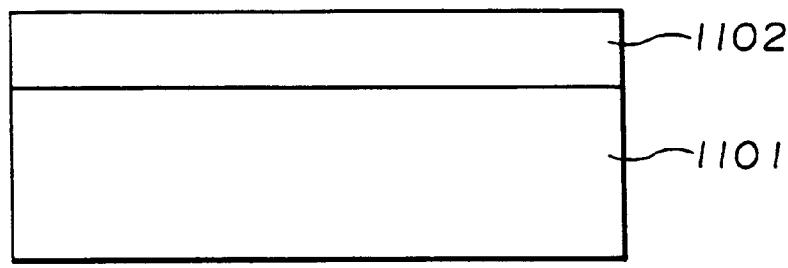
Figure 158C:
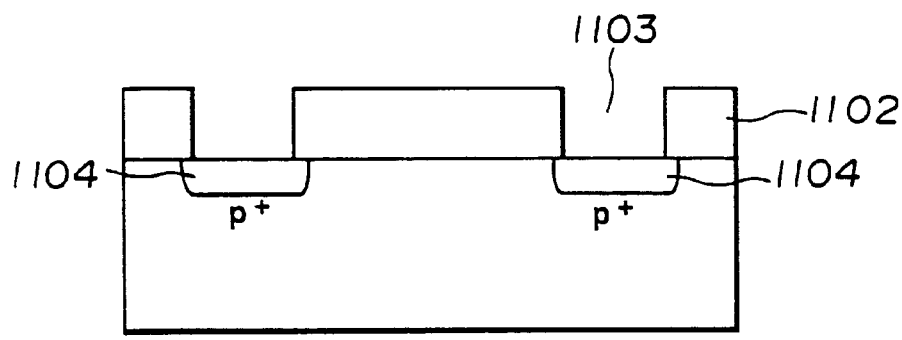
Figure 158D:
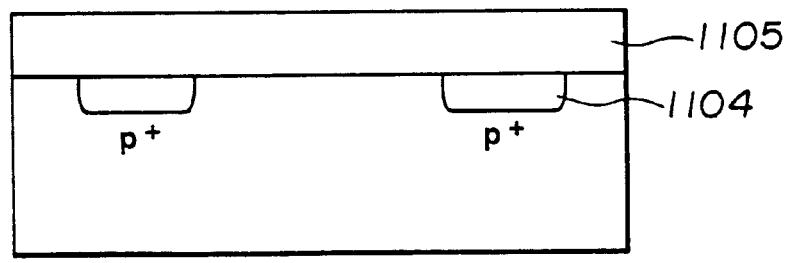
Figure 158E:
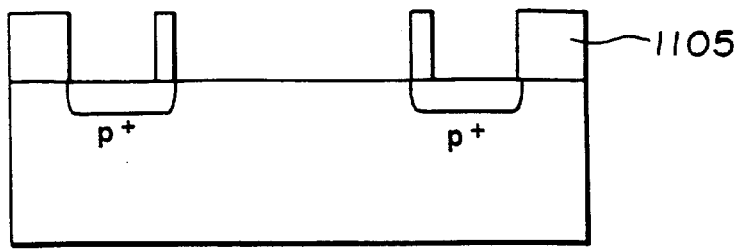
Figure 158F:
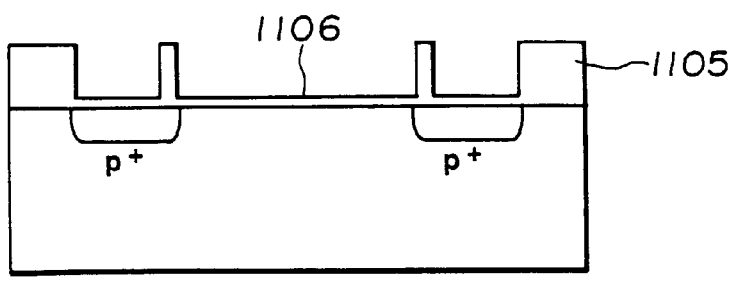

Thereafter, as shown in FIG. 158(d), a oxide film 1105 of 350 nm thick was deposited on the resultant substrate as a second oxide film at a low temperature. After this, as shown in FIG. 158(e), the resultant substrate was subjected to a patterning process and then sent to a gate oxidization process. The substrate immediately after subjected to the gate oxidization process is shown in FIG. 158(f). Reference numeral 1106 denotes a gate oxide film. In this case, the oxide film 1106 had a thickness of, e.g., 20 nm.

Figure 158G:
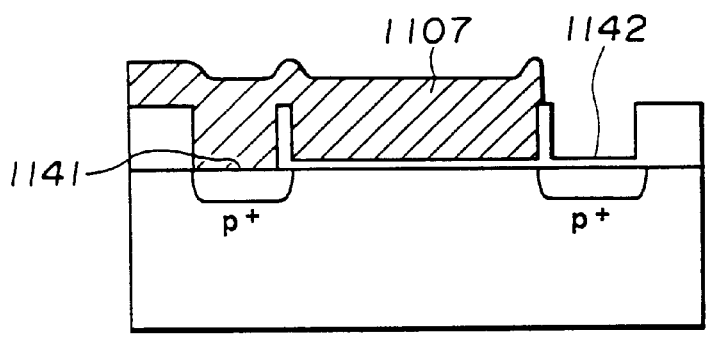
Figure 158H:
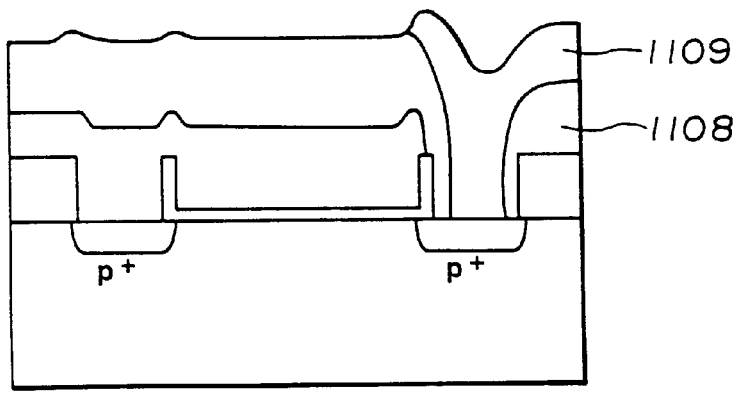

Next, the formation of drain and gate electrodes was effected in accordance with the present invention. That is, as shown in FIG. 158(g), only a drain part 1141 is opened while a source part 1142 is left with the oxide film therewith. Now, an amorphous film 1107, which forms a major part of the present invention, is deposited on the resultant substrate. The thickness of the amorphous film was set to be 25 nm and impurities were doped into the amorphous film, for example, at the same time with the deposition. It goes without saying that the aforementioned points explained above were carried out including the point, when an opening is made in the drain part 1141, this part is cleaned. That is, at a temperature of e.g., 600° C., the amorphous film 1107 was kept so as to prevent the formation of any spontaneous oxide film on the film 1107 and a clean $N_2$ atmosphere was kept. As explained in the foregoing, a very good single crystal was obtained. FIG. 158(h) shows the last metallization step, in which numeral 1108 denotes a CVD oxide film and 1109 denotes an electrode.

INDUSTRIAL APPLICATION

In accordance with the present invention, a thin amorphous semiconductor thin film is deposited on a semiconductor substrate or an insulating film so that the average inter-atomic distance of the amorphous film is 1.02 times of more of that of its single crystal, the surface of the amorphous semiconductor thin film is heated in a non-oxidization atmosphere while keeping the surface of the amorphous film in its free state, and single crystallized based on solid phase growth to form a single crystal which is free of defects at low temperature.

In accordance with the invention, further, a thin amorphous semiconductor thin film is deposited on a semiconductor substrate or an insulating film so that the average inter-atomic distance of the amorphous film is substantially equal to the average inter-atomic distance of its single crystal, the surface of the amorphous semiconductor thin film is heated in a non-oxidization atmosphere, and single crystallized based on solid phase growth to form a single crystal which is free of defects at low temperature.

What is claimed is:

1. A method of manufacturing a semiconductor device comprising the steps of:

forming a conductive layer on a substrate with an insulating film formed on said conductive layer;

depositing an amorphous thin film on said conductive layer;

applying crystallization energy to said amorphous thin film to perform solid phase growth, thereby to form single crystal grains;

performing heat treatment on said insulating film so as to break the insulating film to electrically conduct said conductive layer with said single crystal grains, thereby to form a first electrode layer consisting of said conductive layer and said single crystal grains;

forming a capacitor insulating film on said first electrode layer; and forming a second electrode layer such that said capacitor insulating film is held between said first and second electrode layers, thereby to form a capacitor.

* * * * *